US012715889B2

(12) United States Patent
Sang et al.

(10) Patent No.: US 12,715,889 B2
(45) Date of Patent: Aug. 25, 2026

(54) ORGANIC ELECTROLUMINESCENT MATERIAL AND DEVICE

(71) Applicant: BEIJING SUMMER SPROUT TECHNOLOGY CO., LTD., Beijing (CN)

(72) Inventors: Ming Sang, Beijing (CN); Zhen Wang, Beijing (CN); Hongbo Li, Beijing (CN); Wei Cai, Beijing (CN); Zheng Wang, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 983 days.

(21) Appl. No.: 17/859,970

(22) Filed: Jul. 7, 2022

(65) Prior Publication Data

US 2023/0063868 A1 Mar. 2, 2023

(30) Foreign Application Priority Data

Jul. 9, 2021 (CN) ......................... 202110759395.3
May 20, 2022 (CN) ......................... 202210548431.6

(51) Int. Cl.
*C07F 15/00* (2006.01)
*H10K 50/125* (2023.01)
(Continued)

(52) U.S. Cl.
CPC ........ *C07F 15/0086* (2013.01); *C07F 15/006* (2013.01); *H10K 50/125* (2023.02);
(Continued)

(58) Field of Classification Search
CPC ........................... C07F 15/006; C07F 15/0086
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 107573383 A 1/2018
CN 108409794 A 8/2018
(Continued)

OTHER PUBLICATIONS

Office Action received for Chinese Patent Application No. 202210548431.6, mailed on Dec. 24, 2024, 17 pages (9 pages of English Translation and 8 pages of Original Office Action).
(Continued)

*Primary Examiner* — Vu A Nguyen
(74) *Attorney, Agent, or Firm* — ArentFox Schiff LLP; Joseph M. Maraia

(57) ABSTRACT

Disclosed are organic electroluminescent material and device. The organic electroluminescent material is a metal complex with a structure of Formula 1. These novel metal complexes can be used in electroluminescent device, and show more excellent performance, for example, they can reduce the driving voltage and full width at half maximum, obtain more saturated light emission, improve the efficiency and the lifetime of the device, and finally, it can improve the comprehensive performance of the device significantly.

32 Claims, 1 Drawing Sheet

(51) Int. Cl.
*H10K 85/00* (2023.01)
*H10K 85/30* (2023.01)
*H10K 85/60* (2023.01)

(52) U.S. Cl.
CPC ......... *H10K 85/341* (2023.02); *H10K 85/346* (2023.02); *H10K 85/615* (2023.02); *H10K 85/622* (2023.02); *H10K 85/654* (2023.02); *H10K 85/6572* (2023.02); *H10K 85/6574* (2023.02); *H10K 85/701* (2023.02); *C07B 2200/05* (2013.01)

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 9,783,564 | B2 | 10/2017 | Kottas et al. | |
| 2003/0230980 | A1 | 12/2003 | Forrest et al. | |
| 2004/0174116 | A1 | 9/2004 | Lu et al. | |
| 2012/0223634 | A1 | 9/2012 | Xia et al. | |
| 2013/0048963 | A1 | 2/2013 | Beers et al. | |
| 2015/0349273 | A1 | 12/2015 | Hung et al. | |
| 2016/0104848 | A1* | 4/2016 | Boudreault | C09K 11/06 546/4 |
| 2016/0240800 | A1* | 8/2016 | Ma | C07F 15/0086 |
| 2016/0359122 | A1 | 12/2016 | Boudreault et al. | |
| 2019/0036045 | A1* | 1/2019 | Hwang | C07F 15/0086 |
| 2019/0248820 | A1 | 8/2019 | Li | |
| 2020/0354393 | A1 | 11/2020 | Bae et al. | |
| 2021/0159431 | A1 | 5/2021 | Lee et al. | |
| 2023/0422601 | A1* | 12/2023 | Fleetham | C07F 15/0086 |
| 2024/0224781 | A1* | 7/2024 | Dyatkin | H10K 85/342 |

FOREIGN PATENT DOCUMENTS

| | | | | | |
|---|---|---|---|---|---|
| CN | 112939940 | A | * | 6/2021 | C07F 7/0816 |
| CN | 112940015 | A | | 6/2021 | |
| CN | 112940042 | A | * | 6/2021 | C07F 15/0086 |
| CN | 113717232 | A | * | 11/2021 | C09K 11/06 |

OTHER PUBLICATIONS

Office Action received for Chinese Patent Application No. 202210548431.6, mailed on Jul. 18, 2025, 13 pages (8 pages of English Translation and 5 pages of Original Office Action).

Tang et al., "Organic Electroluminescent Diodes", Applied Physics Letters, vol. 51, No. 12, Sep. 21, 1987, pp. 913-915.

Uoyama et al., "Highly Efficient Organic Light-emitting Diodes From Delayed Fluorescence", Nature, vol. 492, Dec. 13, 2012, pp. 234-238.

* cited by examiner

ORGANIC ELECTROLUMINESCENT MATERIAL AND DEVICE

CROSS-REFERENCE TO RELATED APPLICATION(S)

This application claims priority to Chinese Patent Application No. 202110759395.3 filed on Jul. 9, 2021 and Chinese Patent Application No. 202210548431.6 filed on May 20, 2022, the disclosure of which are incorporated herein by reference in their entireties.

TECHNICAL FIELD

The present disclosure relates to compounds for organic electronic devices such as organic light-emitting devices. More particularly, the present disclosure relates to metal complexes having the structure represented by Formula 1, and an organic electroluminescent device comprises the metal complex and a compound composition comprises the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US2016240800A1 discloses a platinum complex, which has the following general structure:

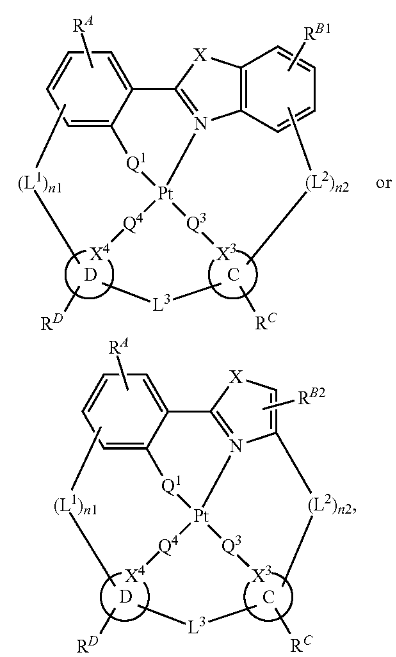

and further discloses the following specific structure:

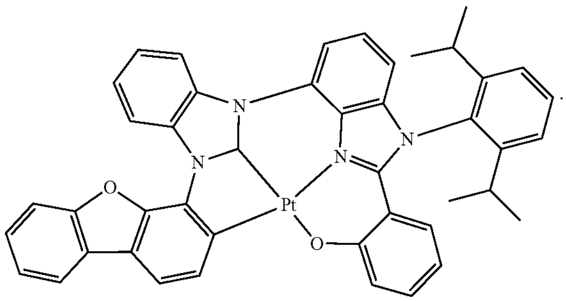

This application does not disclose the influence of the platinum complexes containing the fused 6-5-6 members ring structure on the performance of device, and does not disclose or teach the platinum complex with a specific substituted the structure of the fused ring of rings with 6-5-6 members and its influence on the performance of the device.

SUMMARY

The present disclosure aims to improve the performance of organic electroluminescent device by introducing a fused 6-5-6 members ring with cyano or fluorine substitution into a metal complex with a multidentate ligand; for example, the reduction of full width at half maximum (FWHM), the improvement of color saturation, the improvement of life and efficiency, the reduction of device voltage, etc.

According to an embodiment of the present disclosure, disclosed is a metal complex, which has a structure represented by Formula 1:

Formula 1

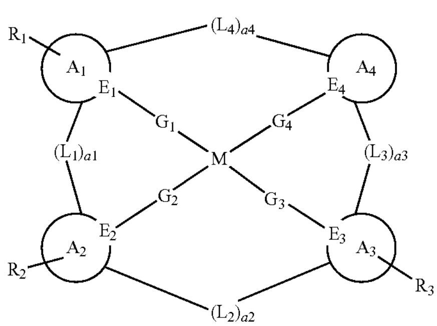

wherein, the metal M is, at each occurrence identically or differently, selected from a metal with a relative atomic mass greater than 40;

ring $A_1$ to ring $A_3$ are, at each occurrence identically or differently, selected from an aromatic ring having 6 to 30 carbon atoms, a heteroaromatic ring having 5 to 30 ring atoms or combinations thereof;

$L_1$ to $L_4$ are, at each occurrence identically or differently, selected from single bond, BR', CR'R', NR', O, SiR'R', PR', S, GeR'R', Se, substituted or unsubstituted vinylidene, ethynylene, substituted or unsubstituted arylene having 6 to 30 carbon atoms, substituted or unsubstituted heteroarylene having 3 to 30 carbon atoms, and combinations thereof; when two R' exist at the same time, the two R' are the same or different;

$a_1$ to $a_4$ are, at each occurrence identically or differently, selected from 0 or 1; and at least two of $a_1$ to $a_4$ are selected from 1;

$E_1$ to $E_4$ are, at each occurrence identically or differently, selected from C or N;

$G_1$ to $G_4$ are, at each occurrence identically or differently, selected from single bond, O or S;

$R_1$ to $R_3$ represent, at each occurrence identically or differently, mono-substitution or multiple substitutions, non-substitution;

ring $A_4$ has a structure represented by Formula 2:

Formula 2

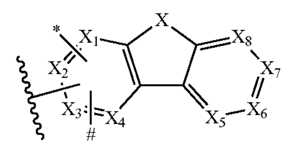

X is selected from the group consisting of: O, S, Se, NR", CR"R", SiR"R" and GeR"R"; when two R" exist at the same time, the two R" are the same or different;

$X_1$ to $X_8$ are, at each occurrence identically or differently, selected from C, $CR_x$ or N;

at least one of $X_1$ to $X_4$ is selected from C and connected with $L_3$ or $L_4$;

at least one of $X_1$ to $X_8$ is selected from $CR_x$ and the $R_x$ is a cyano group or fluorine;

$R_1$, $R_2$, $R_3$, R', R" and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

wherein, "*" represents the position where the ring $A_4$ is connected to the ring $A_1$ through $L_4$, "⊣" represents the position where the ring $A_4$ is connected to the metal M through $G_4$, and "#" represents the position where the ring $A_4$ is connected to the ring $A_3$ through $L_3$;

adjacent substituents $R_1$, $R_2$, $R_3$, R', R" and $R_x$ can be optionally joined to form a ring.

According to another embodiment of the present disclosure, further disclosed is an electroluminescent device which comprises an anode, a cathode, and an organic layer disposed between the anode and the cathode, wherein the organic layer comprises the metal complex described in the previous embodiment.

According to another embodiment of the present disclosure, further disclosed is a compound composition which comprises the metal complex described in the previous embodiment.

The present disclosure disclosed a series of metal complexes with the structure of Formula 1, the metal complex can be used as light-emitting material in electroluminescent device.

These novel metal complexes can be used in electroluminescent device, and show better performance, for example, they can reduce the driving voltage, reduce FWHM, obtain more saturated light emission, improve the efficiency and the lifetime of the device, and finally, it can improve the comprehensive performance of the device significantly.

DETAILED DESCRIPTION

Figure 1:
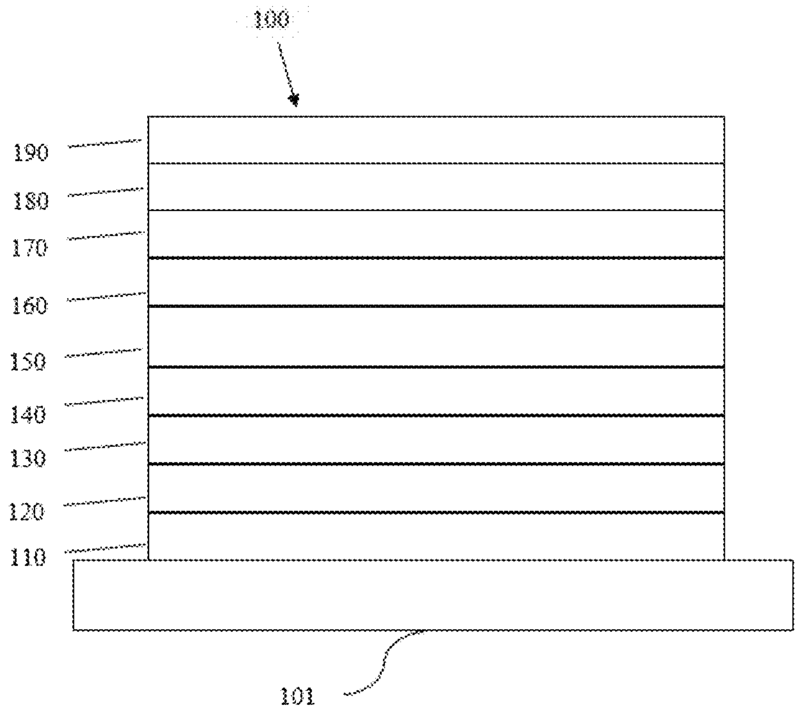
FIG. 1 is a schematic diagram of an electroluminescent device comprising a metal complex and a compound composition disclosed in the present disclosure.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
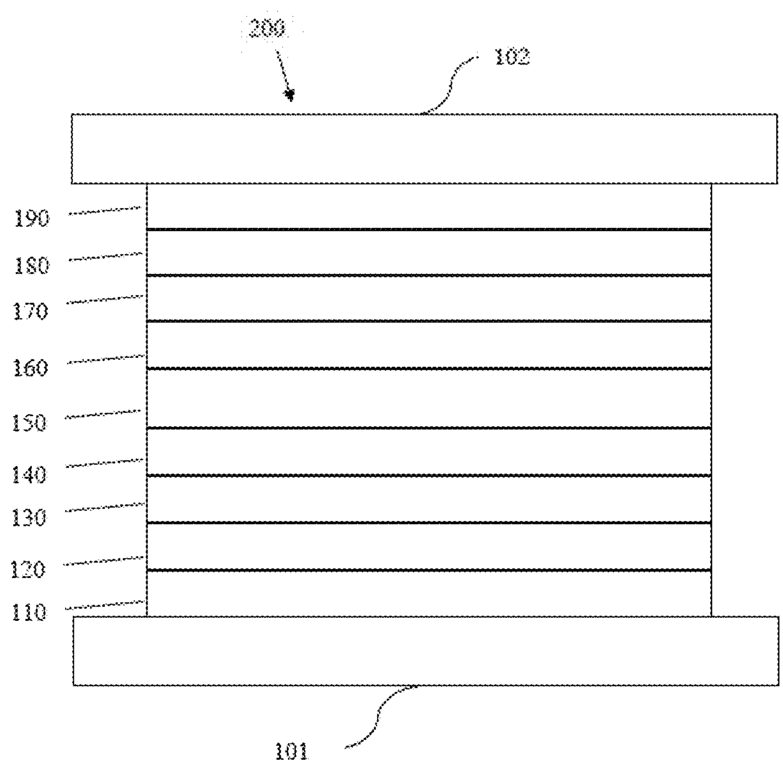
FIG. 2 is a schematic diagram of another electroluminescent device comprising a metal complex and a compound composition disclosed in the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta_{ES-T}$). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1 -pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthio ethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butyl dimethylgermanylmethyl, triethylgermanylmethyl, triethylgermanylethyl, triisopropylgermanylmethyl, triisopropylgermanylethyl, trimethylsilylmethyl, trimethylsilyl ethyl, trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, propenyl, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group or aromatic ring—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl or heteroaromatic ring—as used herein, includes non-condensed and condensed hetero-aromatic groups having 1 to 5 hetero-atoms, wherein at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include nitrogen heterocyclic carbene, dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, imidazocarbene, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, benzimidazole carbene, indazole, indenoazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with alkyl groups. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyl di-t-butylsilyl. Additionally, the alkylsilyl group may be optionally substituted.

Arylsilyl—as used herein, contemplates a silyl group substituted with at least one aryl group. Arylsilyl groups may be those having 6 to 30 carbon atoms, preferably those having 8 to 20 carbon atoms. Examples of arylsilyl groups include triphenylsilyl, phenyldibiphenylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates a germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

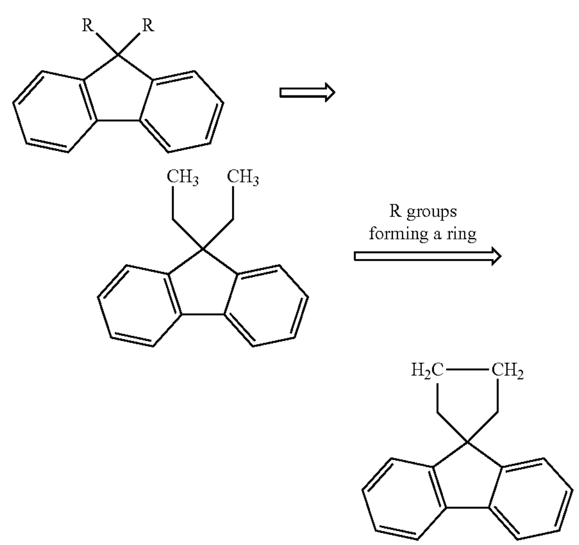

The expression that adjacent substituents can be optionally joined to form a ring is also intended to mean that two substituents bonded to carbon atoms which are directly bonded to each other are joined to each other via a chemical bond to form a ring, which can be exemplified by the following formula:

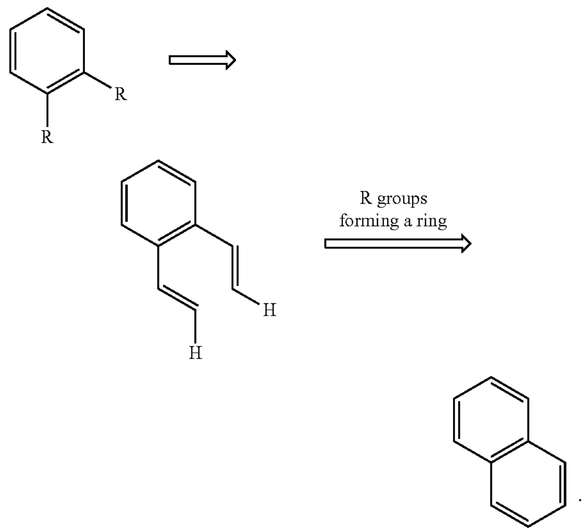

The expression that adjacent substituents can be optionally joined to form a ring is also intended to mean that two substituents bonded to a further distant carbon atom are joined to each other via a chemical bond to form a ring, which can be exemplified by the following formula:

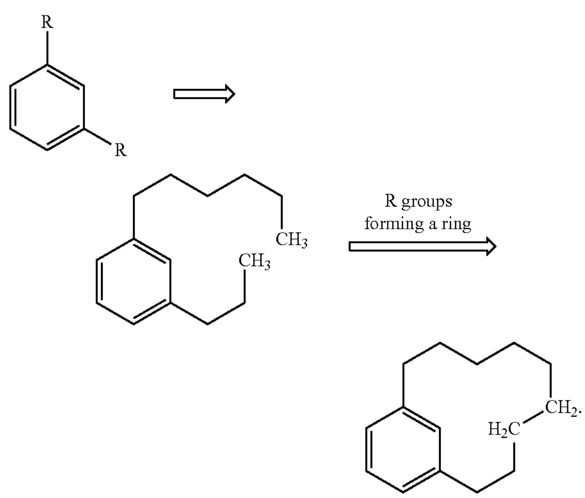

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

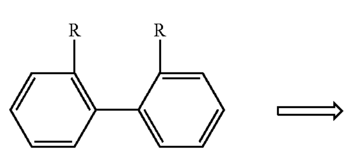

-continued

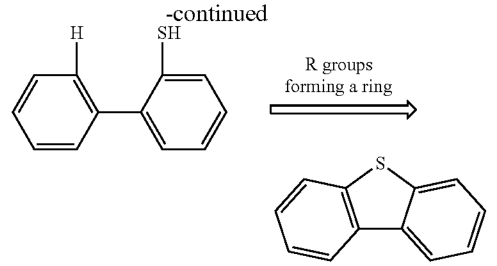

According to an embodiment of the present disclosure, disclosed is a metal complex, which has a structure represented by Formula 1:

Formula 1

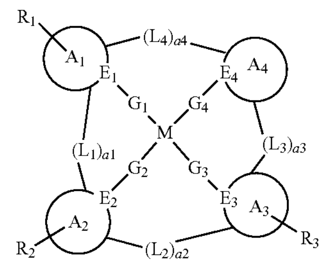

wherein, the metal M is, at each occurrence identically or differently, selected from a metal with a relative atomic mass greater than 40;

ring $A_1$ to ring $A_3$ are, at each occurrence identically or differently, selected from an aromatic ring having 6 to 30 carbon atoms, a heteroaromatic ring having 5 to 30 ring atoms or combinations thereof;

$L_1$ to $L_4$ are, at each occurrence identically or differently, selected from single bond, BR', CR'R', NR', O, SiR'R', PR', S, GeR'R', Se, substituted or unsubstituted vinylidene, ethynylene, substituted or unsubstituted arylene having 6 to 30 carbon atoms, substituted or unsubstituted heteroarylene having 3 to 30 carbon atoms, and combinations thereof; when two R' exist at the same time, the two R' are the same or different;

$a_1$ to $a_4$ are, at each occurrence identically or differently, selected from 0 or 1; and at least two of $a_1$ to $a_4$ are selected from 1;

$E_1$ to $E_4$ are, at each occurrence identically or differently, selected from C or N;

$G_1$ to $G_4$ are, at each occurrence identically or differently, selected from single bond, O or S;

$R_1$ to $R_3$ represent, at each occurrence identically or differently, mono-substitution or multiple substitutions, non-substitution;

ring $A_4$ has a structure represented by Formula 2:

Formula 2

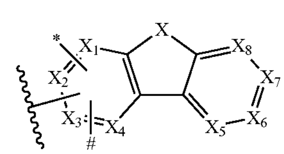

X is selected from the group consisting of: O, S, Se, NR", CR"R", SiR"R" and GeR"R"; when two R" exist at the same time, the two R" are the same or different;

$X_1$ to $X_8$ are, at each occurrence identically or differently, selected from C, $CR_x$ or N;

at least one of $X_1$ to $X_4$ is selected from C and connected with $L_3$ or $L_4$;

at least one of $X_1$ to $X_8$ is selected from $CR_x$ and the $R_x$ is a cyano group or fluorine;

$R_1$, $R_2$, $R_3$, R', R" and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

wherein, "*" represents the position where the ring $A_4$ is connected to the ring $A_1$ through $L_4$, "⊣" represents the position where the ring $A_4$ is connected to the metal M through $G_4$, and "#" represents the position where the ring $A_4$ is connected to the ring $A_3$ through $L_3$;

adjacent substituents $R_1$, $R_2$, $R_3$, R', R" and $R_x$ can be optionally joined to form a ring.

In the present disclosure, the adjacent substituents $R_1$, $R_2$, $R_3$, R', R" and $R_x$ can be optionally joined to form a ring is intended to mean that for the groups of adjacent substituents, such as two substituents R', two substituents R", two substituents $R_1$, two substituents $R_2$, two substituents $R_x$, two substituents $R_3$, substituents $R_1$ and R', substituents $R_2$ and R', substituents $R_x$ and R', substituents $R_3$ and R', and substituents $R_x$ and R", any one or more of these groups of the adjacent substituents can be joined to form a ring; obviously, any of these groups of substituents may not be joined to form a ring.

In the present disclosure, $a_1$ to $a_4$ are, at each occurrence identically or differently, selected from 0 or 1 is intended to mean that when $a_1$ is 0, the ring $A_1$ and the ring $A_2$ are not connected; when $a_2$ is 0, the ring $A_2$ and the ring $A_3$ are not connected; when $a_3$ is 0, the ring $A_3$ and the ring $A_4$ are not connected; when $a_4$ is 0, the ring $A_1$ and the ring $A_4$ are not connected; when $a_1$, $a_2$, $a_3$ or $a_4$ is 1, it means that $L_1$, $L_2$, $L_3$ or $L_4$ exist and are selected from the group consisting of: single bond, BR', CR'R', NR', O, SiR'R', PR', S, GeR'R', Se, substituted or unsubstituted vinylidene, ethynylene, substituted or unsubstituted arylene having 6 to 30 carbon atoms, substituted or unsubstituted heteroarylene having 5 to 30 carbon atoms, and combinations thereof.

In the present disclosure, when $L_1$, $L_2$, $L_3$ or $L_4$ is selected from a single bond, it means that the ring $A_1$ and the ring $A_2$, the ring $A_2$ and the ring $A_3$, the ring $A_3$ and the ring $A_4$, or the ring $A_4$ and the ring $A_1$ are directly connected by a single bond. When $G_1$, $G_2$, $G_3$, or $G_4$ is selected from a single bond, it means that the ring $A_1$, the ring $A_2$, the ring $A_3$, or the ring $A_4$ is directly connected to the M through a single bond.

In the present disclosure, wherein the connection mode of $L_1$ to $L_4$ and ring $A_1$ to ring $A_4$ in Formula 1 is intended to represent: $L_1$ can be connected to any ring atom in the ring $A_1$ or the ring $A_2$, instead of $L_1$ connected to the atom adjacent to $E_1$ in the ring $A_1$ or the atom adjacent to $E_2$ in the ring $A_2$; similarly, $L_2$ in Formula 1 can be connected to any atom in the ring $A_2$ or the ring $A_3$, instead of $L_2$ connected to the atom adjacent to $E_2$ in the ring $A_2$ or the atom adjacent to $E_3$ in the ring $A_3$; the situation of $L_3$ and $L_4$ can be deduced by analogy. For example, when the ring $A_1$ is selected from benzimidazole, the connection mode of the ring $A_1$ in Formula 1 includes but is not limited to the following structures:

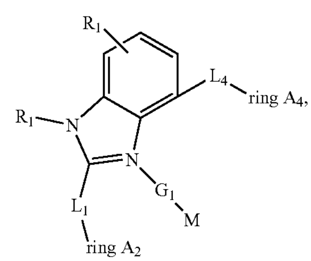

that is, at this time, $E_1$ is N, and $L_4$ is not connected to atoms that adjacent to $E_1$.

In this embodiment, "at least one of $X_1$ to $X_4$ is selected from C and connected with $L_3$ or $L_4$" it means that when one of $X_1$ to $X_4$ is selected from C, the C is connected with $L_3$ or $L_4$; when two of $X_1$ to $X_4$ are selected from C, the two C are connected with $L_3$ and $L_4$ respectively. There may also be three of $X_1$ to $X_4$ are selected from C, wherein two C are connected with $L_3$ and $L_4$ respectively, and the remaining C is connected to M through $G_4$.

In the present disclosure, wherein ""#" represents the position where the ring $A_4$ is connected to the ring $A_3$ through $L_3$" is intended to mean that when $a_3$ is selected from 1, "#" represents the position where the Formula 2 is connected to the ring $A_3$ through $L_3$; when $a_3$ is selected from 0, that is, the ring $A_3$ and the ring $A_4$ are not connected, that is, the Formula 2 and the ring $A_3$ are not connected.

In the present disclosure, wherein ""*" represents the position where the ring $A_4$ is connected to the ring $A_1$ through $L_4$" is intended to mean that when $a_4$ is selected from 1, "*" represents the position where the Formula 2 is connected to the ring $A_1$ through $L_4$; when $a_4$ is selected from 0, that is, the ring $A_4$ and the ring $A_1$ are not connected, that is, the Formula 2 and the ring $A_1$ are not connected.

According to an embodiment of the present disclosure, wherein $a_1$ to $a_4$ are, at each occurrence identically or differently, selected from 0 or 1; and at least three of $a_1$ to $a_4$ are selected from 1.

According to an embodiment of the present disclosure, wherein the ring $A_4$ is represented by any one of Formula 2-1 to Formula 2-4:

Formula 2-1

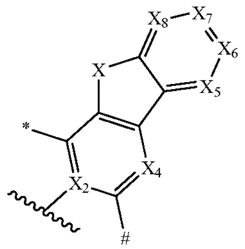

Formula 2-2

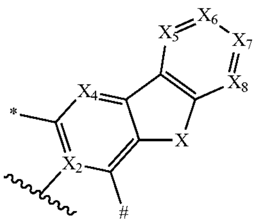

Formula 2-3

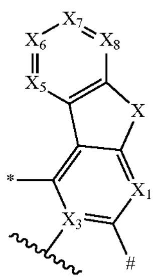

Formula 2-4

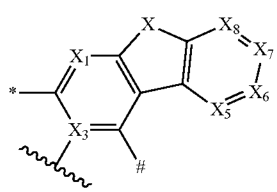

wherein,

X is selected from the group consisting of: O, S, Se, NR", CR"R", SiR"R" and GeR"R"; when two R" exist at the same time, the two R" are the same or different;

in Formula 2-1 and Formula 2-2, $X_4$ to $X_8$ are, at each occurrence identically or differently, selected from $CR_x$ or N; and at least one of them is $CR_x$, and the $R_x$ is a cyano group or fluorine;

in Formula 2-1 and Formula 2-2, $X_2$ is, at each occurrence identically or differently, selected from C or N;

in Formula 2-3 and Formula 2-4, $X_1$, $X_3$ and $X_5$ to $X_8$ are, at each occurrence identically or differently, selected from C, $CR_x$ or N; and at least one of them is $CR_x$, and the $R_x$ is a cyano group or fluorine;

$R_x$ and R" are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R" and $R_x$ can be optionally joined to form a ring;

wherein, “*” represents the position where the ring $A_4$ is connected to the ring $A_1$ through $L_4$, “⊣” represents the position where the ring $A_4$ is connected to the metal M through $G_4$, and “#” represents the position where the ring $A_4$ is connected to the ring $A_3$ through $L_3$.

In this embodiment, “the adjacent substituent R" and $R_x$ can be optionally joined to form a ring” is intended to mean that for the groups of adjacent substituents, such as two substituents R", two substituents $R_x$, and substituents $R_x$ and R", any one or more of these groups of adjacent substituents can be joined to form a ring; obviously, any of these groups of substituents may not be joined to form a ring.

According to an embodiment of the present disclosure, wherein the ring $A_1$, the ring $A_2$ and the ring $A_3$ are, at each occurrence identically or differently, selected from an aromatic ring having 6 to 18 ring atoms, a heteroaromatic ring having 5 to 18 ring atoms, or combinations thereof.

According to an embodiment of the present disclosure, wherein the ring $A_1$, the ring $A_2$ and the ring $A_3$ are, at each occurrence identically or differently, selected from an aromatic ring having 6 to 13 ring atoms, a heteroaromatic ring having 5 to 13 ring atoms, or combinations thereof.

According to an embodiment of the present disclosure, wherein one or two of the ring $A_1$, the ring $A_2$ and the ring $A_3$ are selected from an aromatic ring having 6 to 13 ring atoms, a heteroaromatic ring having 5 to 13 ring atoms, or combinations thereof.

According to an embodiment of the present disclosure, wherein one of the ring $A_1$, the ring $A_2$ and the ring $A_3$ is, selected from a heteroaromatic ring having 5 ring atoms, the remaining of them are selected from an aromatic ring having 6 ring atoms, or a heteroaromatic ring having 6 ring atoms.

According to an embodiment of the present disclosure, wherein two of the ring $A_1$, the ring $A_2$ and the ring $A_3$ are, selected from a heteroaromatic ring having 5 ring atoms, the remaining of them are selected from an aromatic ring having 6 ring atoms, or a heteroaromatic ring having 6 ring atoms.

According to an embodiment of the present disclosure, wherein the ring $A_1$, the ring $A_2$ and the ring $A_3$ are, at each occurrence identically or differently, selected from the group consisting of: pyrrole ring, furan ring, thiophene ring, selenophene ring, imidazole ring, imidazole carbene ring, oxazole ring, thiazole ring, selenazole ring, benzene ring, pyridine ring, pyrimidine ring, pyrazine ring, pyridazine ring, triazine ring, benzopyrrole ring, benzofuran ring, benzothiophene ring, benzoselenophene ring, benzimidazole ring, benzimidazole carbene ring, benzoxazole ring, benzothiazole ring, benzoselenazole ring, fluorene ring, carbazole ring, dibenzofuran ring, dibenzothiophene ring, dibenzoselenophene, azafluorene ring, azacarbazole ring, azadibenzofuran ring, azadibenzo thiophene ring, azadibenzoselenophene ring, and combinations thereof.

According to an embodiment of the present disclosure, wherein at least one of $G_1$ to $G_4$ is selected from O or S.

According to an embodiment of the present disclosure, wherein at least one of $G_1$ to $G_4$ is O.

According to an embodiment of the present disclosure, wherein $G_2$ is O.

According to an embodiment of the present disclosure, wherein $G_1$ is O.

According to an embodiment of the present disclosure, wherein the ring $A_1$ is, at each occurrence identically or differently, selected from imidazole ring, imidazole carbene ring, oxazole ring, thiazole ring, benzimidazole ring, benzimidazole carbene ring, benzoxazole ring, or benzothiazole ring.

According to an embodiment of the present disclosure, wherein the metal M is selected from the group consisting of: Cu, Ag, Au, Ru, Rh, Pd, Os, Ir and Pt.

According to an embodiment of the present disclosure, wherein the metal M is selected from Pt or Pd.

According to an embodiment of the present disclosure, wherein the metal complex has a structure represented by any one of Formula 1-1 to Formula 1-45:

Formula 1-1

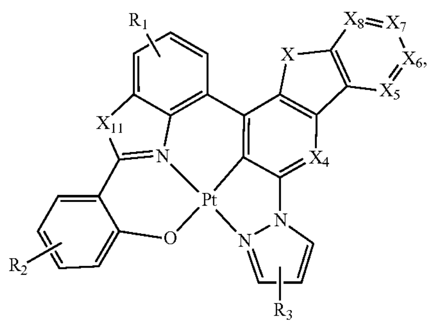

Formula 1-2

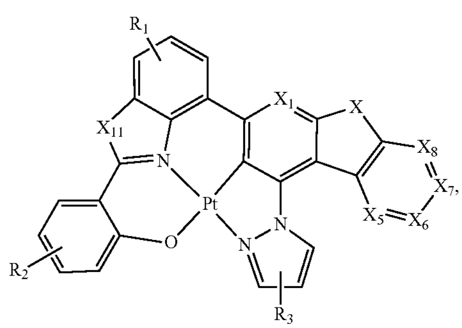

Formula 1-3

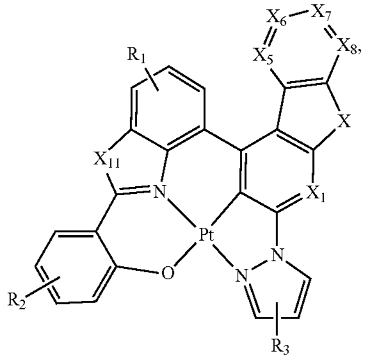

-continued

Formula 1-4

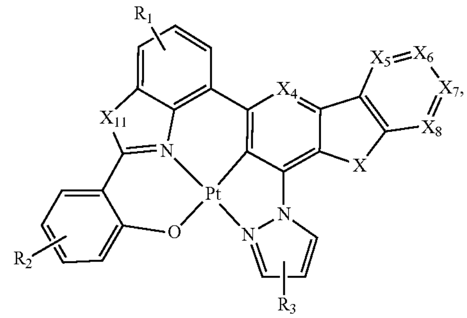

Formula 1-5

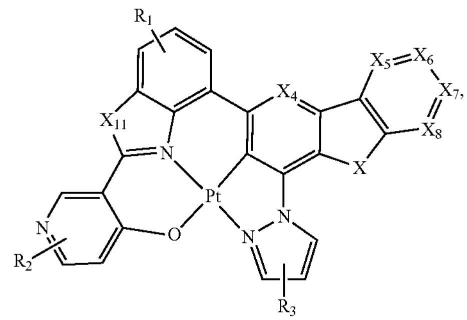

Formula 1-6

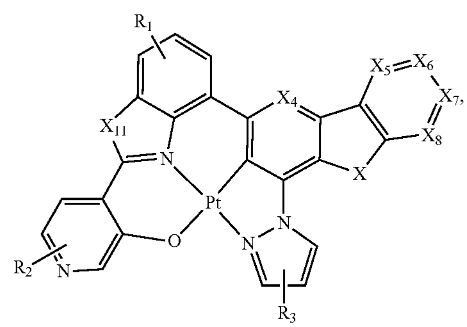

Formula 1-7

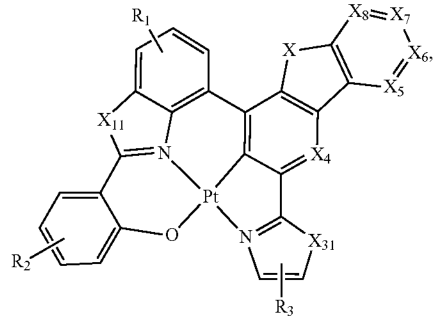

Formula 1-8
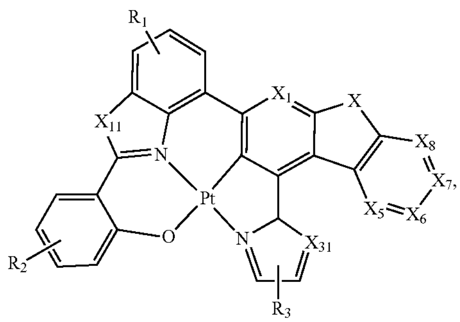
Formula 1-9
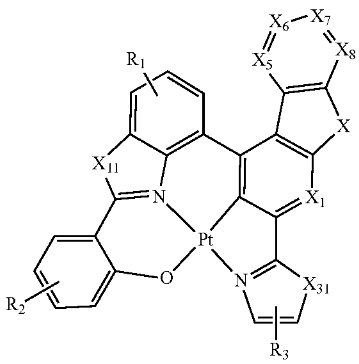
Formula 1-10
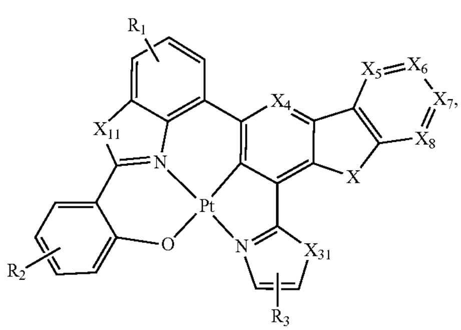
Formula 1-11
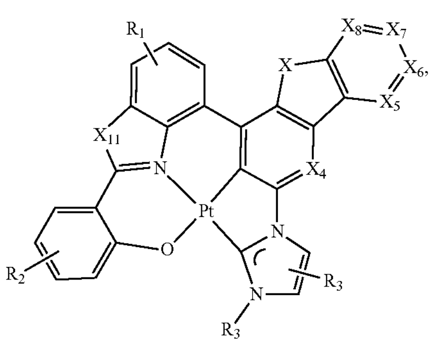
Formula 1-12
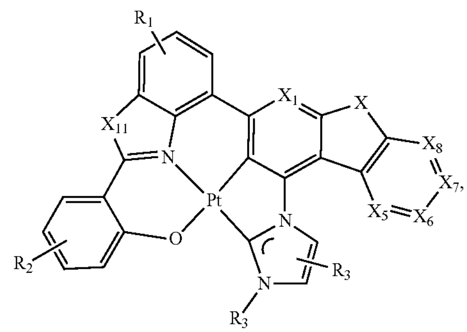
Formula 1-13
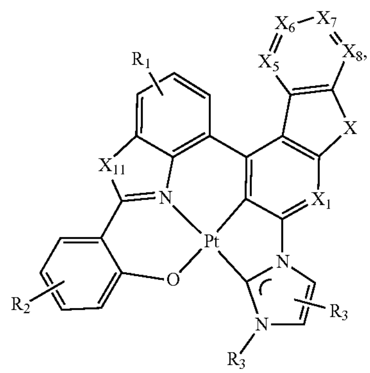
Formula 1-14
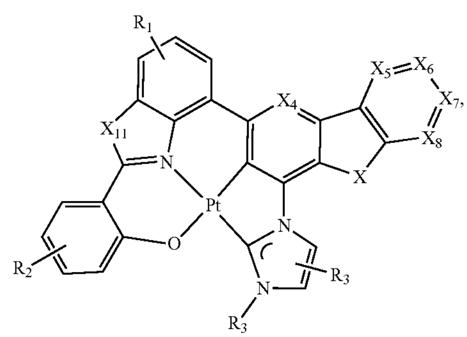
Formula 1-15
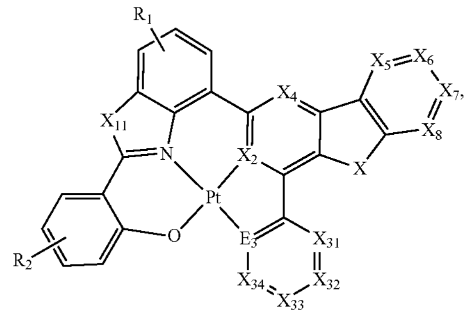

-continued
Formula 1-16
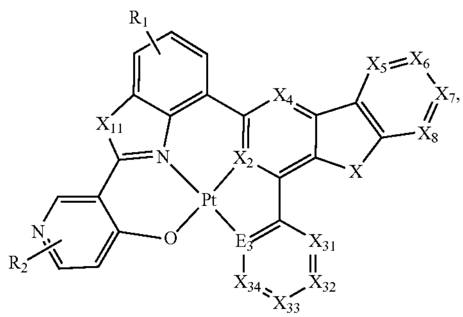
Formula 1-17
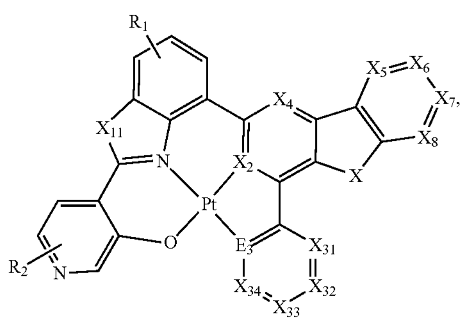
Formula 1-18
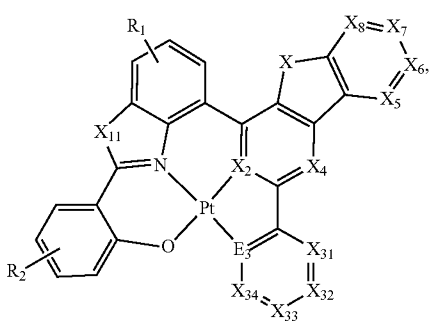
Formula 1-19
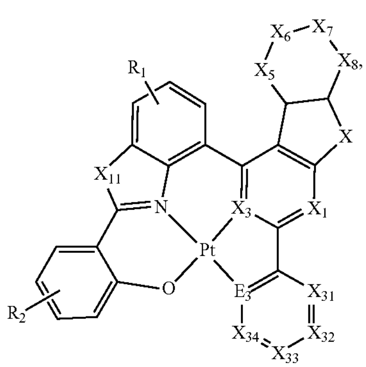
-continued
Formula 1-20
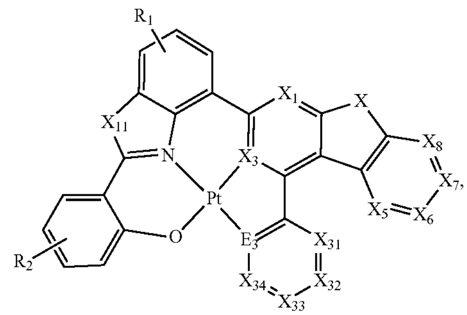
Formula 1-21
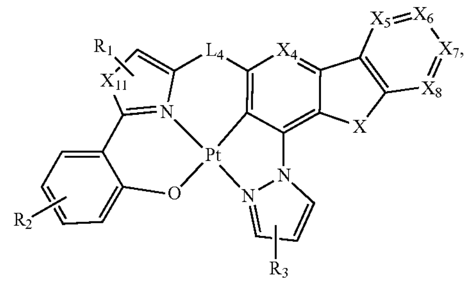
Formula 1-22
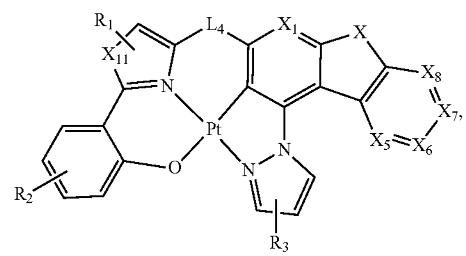
Formula 1-23
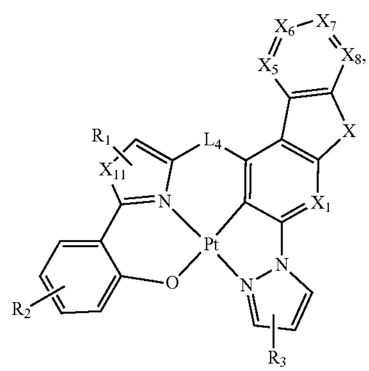
Formula 1-24
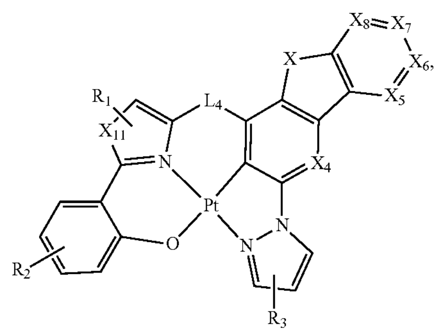

Formula 1-25
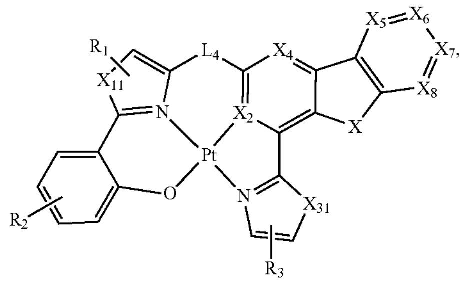
Formula 1-26
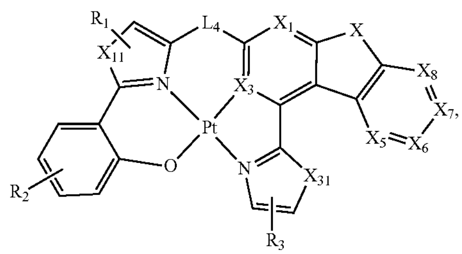
Formula 1-27
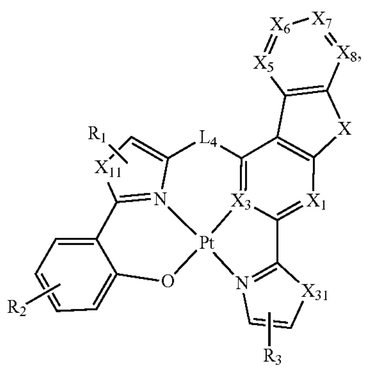
Formula 1-28
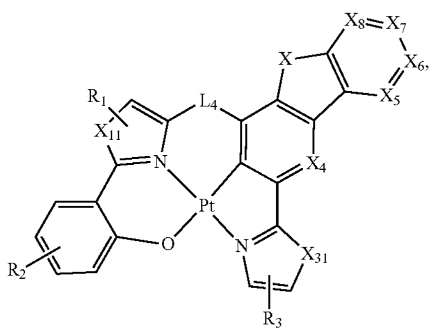
Formula 1-29
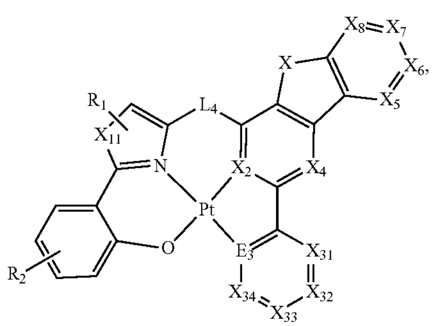
Formula 1-30
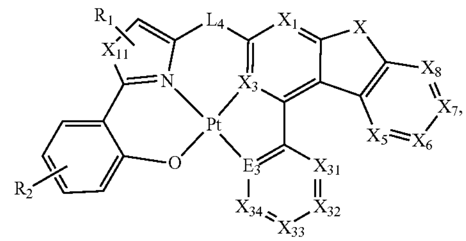
Formula 1-31
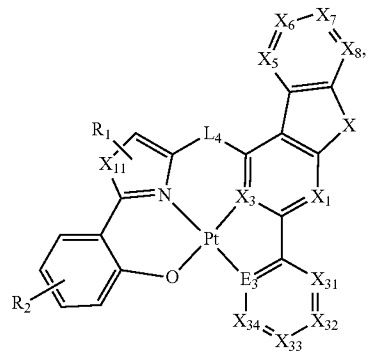
Formula 1-32
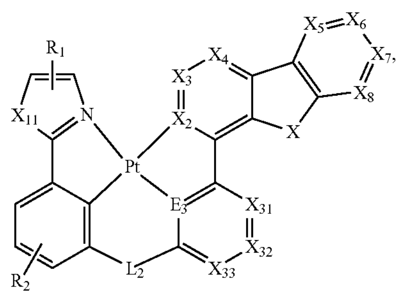
Formula 1-33
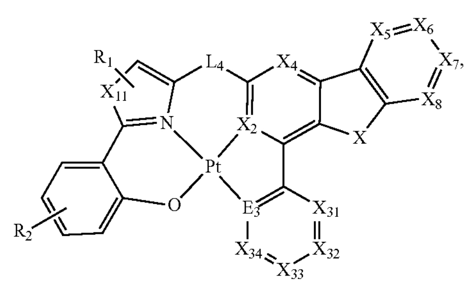
Formula 1-34
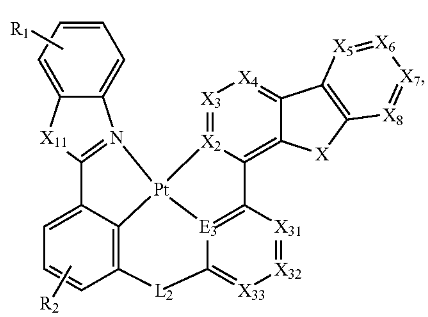

-continued
Formula 1-35
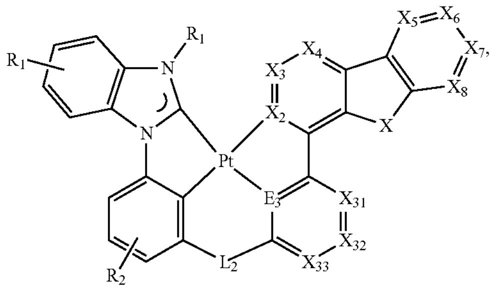
Formula 1-36
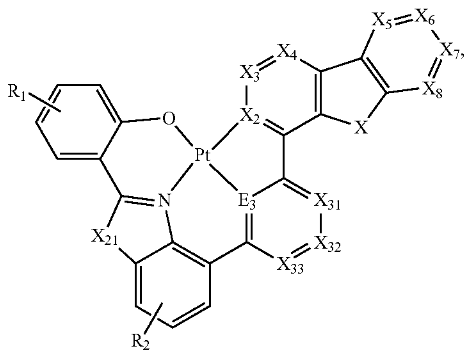
Formula 1-37
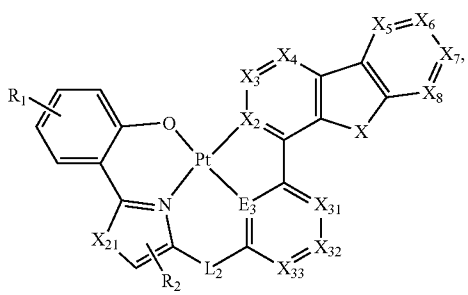
Formula 1-38
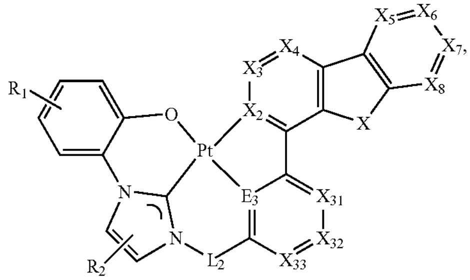
-continued
Formula 1-39
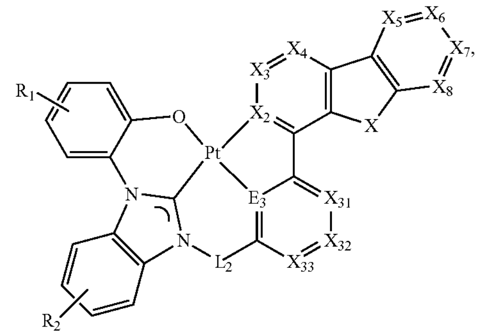
Formula 1-40
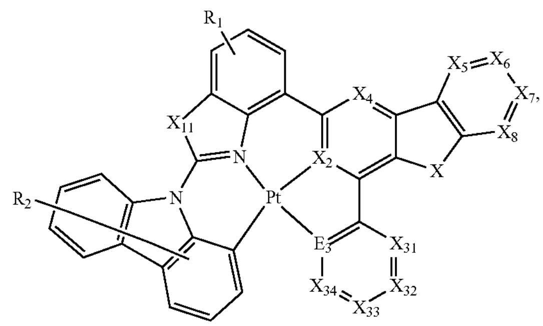
Formula 1-41
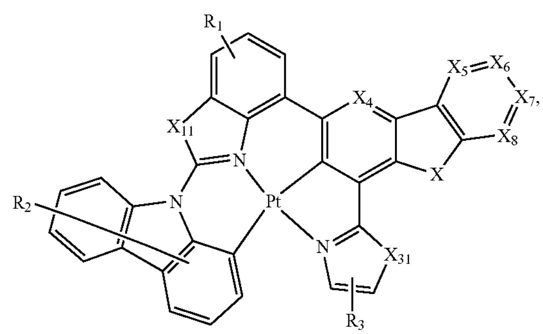
Formula 1-42
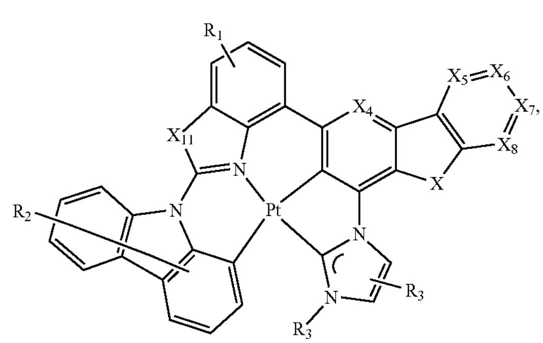

-continued

Formula 1-43

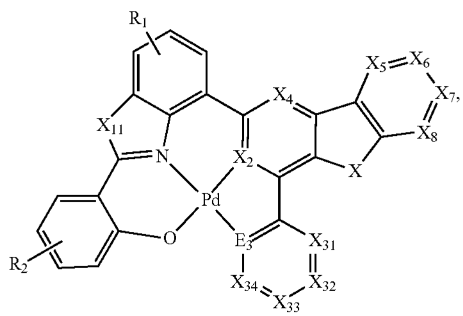

Formula 1-44

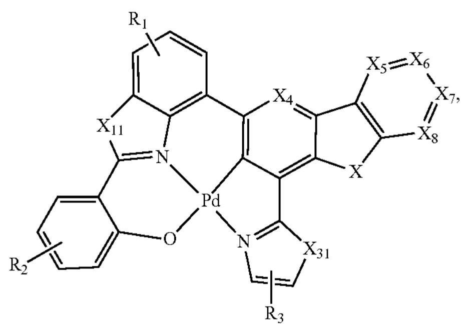

Formula 1-45

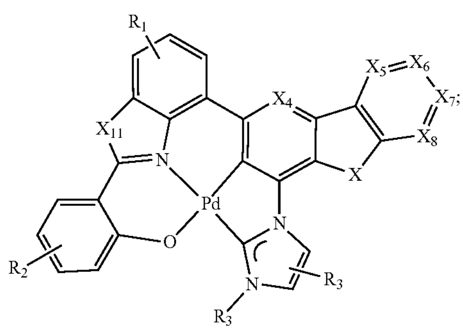

wherein,

X is selected from the group consisting of: O, S, Se, NR", CR"R", SiR"R" and GeR"R"; when two R" exist at the same time, the two R" are the same or different;

$E_3$ is selected from C or N;

in Formula 1-1 to Formula 1-34 and Formula 1-40 to Formula 1-45, $X_{11}$ is, at each occurrence identically or differently, selected from O, S, Se or $NR_1$;

in Formula 1-36 to Formula 1-37, $X_{21}$ is, at each occurrence identically or differently, selected from O, S, Se or $NR_2$;

in Formula 1-7 to Formula 1-10, Formula 1-25 to Formula 1-28, Formula 1-41 and Formula 1-44, $X_{31}$ is, at each occurrence identically or differently, selected from O, S, Se or $NR_3$;

in Formula 1-15 to Formula 1-20, Formula 1-29 to Formula 1-33, Formula 1-40 and Formula 1-43, $X_{31}$ to $X_{34}$ are, at each occurrence identically or differently, selected from $CR_3$ or N;

in Formula 1-34 to Formula 1-39, $X_{31}$ to $X_{33}$ are, at each occurrence identically or differently, selected from $CR_3$ or N;

$L_2$ and $L_4$ are, at each occurrence identically or differently, selected from single bond, BR', CR'R', NR', O, SiR'R', PR', S, GeR'R', Se, substituted or unsubstituted vinylidene, ethynylene, substituted or unsubstituted arylene having 5 to 30 carbon atoms, substituted or unsubstituted heteroarylene having 5 to 30 carbon atoms, and combinations thereof; when two R' exist at the same time, the two R' are the same or different;

$X_1$ to $X_8$ are, at each occurrence identically or differently, selected from C, $CR_x$ or N;

at least one of $X_1$ to $X_8$ is selected from $CR_x$ and the $R_x$ is a cyano group or fluorine;

$R_1$, $R_2$ and $R_3$ represent, at each occurrence identically or differently, mono-substitution or multiple substitutions, non-substitution;

$R_1$, $R_2$, $R_3$, R', R" and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$, $R_2$, $R_3$, R', R" and $R_x$ can be optionally joined to form a ring.

According to an embodiment of the present disclosure, wherein X is selected from O or S.

According to an embodiment of the present disclosure, wherein X is O.

According to an embodiment of the present disclosure, wherein $X_{11}$ is selected from the group consisting of: O, S, Se and $NR_1$.

According to an embodiment of the present disclosure, wherein $X_{11}$ is $NR_1$.

According to an embodiment of the present disclosure, wherein $X_{21}$ is selected from the group consisting of: O, S, Se and $NR_2$.

According to an embodiment of the present disclosure, wherein $X_{21}$ is $NR_2$.

According to an embodiment of the present disclosure, wherein $R_1$, $R_2$ and $R_3$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof.

According to an embodiment of the present disclosure, wherein $R_1$, $R_2$ and $R_3$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, and combinations thereof.

According to an embodiment of the present disclosure, wherein $R_1$, $R_2$ and $R_3$ are, at each occurrence identically or differently, selected from the group consisting of: hydrogen, deuterium, halogen, substituted or unsubstituted alkyl having 1 to 6 carbon atoms, substituted or unsubstituted cycloalkyl having 3 to 6 ring carbon atoms, substituted or unsubstituted aryl having 6 to 18 carbon atoms, substituted or unsubstituted heteroaryl having 3 to 18 carbon atoms, substituted or unsubstituted alkylsilyl having 3 to 18 carbon atoms, and combinations thereof.

According to an embodiment of the present disclosure, wherein $R_1$, $R_2$ and $R_3$ are, at each occurrence identically or differently, selected from the group consisting of: hydrogen, deuterium, fluorine, methyl, ethyl, propyl, isopropyl, n-butyl, isobutyl, tert-butyl, cyclopentyl, cyclohexyl, deuterated methyl, deuterated ethyl, deuterated propyl, deuterated isopropyl, deuterated n-butyl, deuterated isobutyl, deuterated tert-butyl, deuterated cyclopentyl, deuterated cyclohexyl, phenyl, pyridyl, trimethylsilyl, and combinations thereof.

According to an embodiment of the present disclosure, wherein at least one or two or three of the $R_1$, $R_2$ and $R_3$ is/are selected from substituted or unsubstituted alkyl having 3 to 12 carbon atoms.

According to an embodiment of the present disclosure, wherein at least one or two or three of the $R_1$, $R_2$ and $R_3$ is/are selected from substituted or unsubstituted alkyl having 4 to 12 carbon atoms.

According to an embodiment of the present disclosure, wherein at least one of $X_5$ to $X_8$ is $CR_x$, and the $R_x$ is a cyano group or fluorine.

According to an embodiment of the present disclosure, wherein $X_7$ and/or $X_8$ is $CR_x$, and the $R_x$ is a cyano group or fluorine.

According to an embodiment of the present disclosure, wherein at least one of $X_5$ to $X_8$ is $CR_x$, and the $R_x$ is a cyano group.

According to an embodiment of the present disclosure, wherein $X_7$ and/or $X_8$ is $CR_x$, and the $R_x$ is a cyano group.

According to an embodiment of the present disclosure, wherein at least two of $X_1$ to $X_8$ are $CR_x$, and one of the $R_x$ is a cyano group or fluorine; at least one of the remaining $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

According to an embodiment of the present disclosure, wherein at least two of $X_1$ to $X_8$ are $CR_x$, and one of the $R_x$ is a cyano group or fluorine; at least one of the remaining $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, a cyano group, a hydroxyl group, a sulfanyl group, and combinations thereof.

According to an embodiment of the present disclosure, wherein at least two of $X_1$ to $X_8$ are $CR_x$, and one of the $R_x$ is a cyano group or fluorine; at least one of the remaining $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, wherein at least two of $X_1$ to $X_8$ are $CR_x$, and one of the $R_x$ is a cyano group or fluorine; at least one of the remaining $R_x$ is selected from the group consisting of: deuterium, halogen, substituted or unsubstituted alkyl having 1 to 10 carbon atoms, substituted or unsubstituted cycloalkyl having 3 to 10 ring carbon atoms, substituted or unsubstituted aryl having 6 to 15 carbon atoms, substituted or unsubstituted heteroaryl having 3 to 15 carbon atoms, and combinations thereof.

According to an embodiment of the present disclosure, wherein at least two of $X_5$ to $X_8$ are selected from $CR_x$, and one of the $R_x$ is a cyano group or fluorine; at least one of the remaining $R_x$ is selected from substituted or unsubstituted aryl having 6 to 30 carbon atoms, substituted or unsubstituted heteroaryl having 3 to 30 carbon atoms, or combinations thereof.

According to an embodiment of the present disclosure, $X_7$ and $X_8$ are selected from $CR_x$, and one of the $R_x$ is a cyano group or fluorine; another one of the $R_x$ is selected from substituted or unsubstituted aryl having 6 to 30 carbon atoms, substituted or unsubstituted heteroaryl having 3 to 30 carbon atoms, or combinations thereof.

According to an embodiment of the present disclosure, $X_7$ is selected from $CR_x$, and the $R_x$ is a cyano group or fluorine; $X_8$ is selected from $CR_x$, and the $R_x$ is selected from substituted or unsubstituted aryl having 6 to 30 carbon atoms, substituted or unsubstituted heteroaryl having 3 to 30 carbon atoms, or combinations thereof.

According to an embodiment of the present disclosure, at least two of $X_5$ to $X_8$ are selected from $CR_x$, and one of the $R_x$ is a cyano group or fluorine; at least one of the remaining $R_x$ is selected from the substituted or unsubstituted group consisting of: benzene, pyridine, pyrimidine, triazine, naphthalene, phenanthrene, anthracene, fluorene, silicon fluorene, quinoline, isoquinoline, dithiophene, difuran, benzofuran, benzothiophene, dibenzofuran, dibenzothiophene, triphenylene, carbazole, azacarbazole, azafluorene, azasilfluorene, azadibenzofuran, azadibenzothiophene and combinations thereof.

According to an embodiment of the present disclosure, wherein at least two of $X_5$ to $X_8$ are selected from $CR_x$, and one of the $R_x$ is a cyano group or fluorine; at least one of the remaining $R_x$ is selected from substituted or unsubstituted alkyl having 1 to 20 carbon atoms, substituted or unsubstituted cycloalkyl having 3 to 20 ring carbon atoms or combinations thereof.

According to an embodiment of the present disclosure, wherein $X_7$ and $X_8$ are selected from $CR_x$, and one of the $R_x$ is a cyano group or fluorine; another one of the $R_x$ is selected from substituted or unsubstituted alkyl having 1 to 20 carbon atoms, substituted or unsubstituted cycloalkyl having 3 to 20 ring carbon atoms or combinations thereof.

According to an embodiment of the present disclosure, wherein at least two of $X_5$ to $X_8$ are selected from $CR_x$, and one of the $R_x$ is a cyano group or fluorine; at least one of the remaining $R_x$ is selected from the substituted or unsubstituted group consisting of: methyl, ethyl, propyl, isopropyl, n-butyl, isobutyl, tert-butyl, cyclopentyl, cyclohexyl, deuterated methyl, deuterated ethyl, deuterated propyl, deuterated iso Propyl, deuterated n-butyl, deuterated isobutyl, deuterated tert-butyl, deuterated cyclopentyl, deuterated cyclohexyl, and combinations thereof.

According to an embodiment of the present disclosure, $X_7$ and $X_8$ are selected from $CR_x$, and one of the $R_x$ is a cyano group or fluorine; another one of the $R_x$ is selected from the substituted or unsubstituted group consisting of: methyl, ethyl, propyl, isopropyl, n-butyl, isobutyl, tert-butyl, cyclopentyl, cyclohexyl, deuterated methyl, deuterated ethyl, deuterated propyl, deuterated iso Propyl, deuterated n-butyl, deuterated isobutyl, deuterated tert-butyl, deuterated cyclopentyl, deuterated cyclohexyl, and combinations thereof.

According to an embodiment of the present disclosure, wherein at least two of $X_1$ to $X_8$ are selected from $CR_x$, and one of the $R_x$ is a cyano group or fluorine; at least one of the remaining $R_x$ is selected from the structure represented by Formula 3 or Formula 4.

According to an embodiment of the present disclosure, wherein at least two of $X_5$ to $X_8$ are selected from $CR_x$, and one of the $R_x$ is a cyano group or fluorine; at least one of the remaining t $R_x$ is selected from the structure represented by Formula 3 or Formula 4.

According to an embodiment of the present disclosure, wherein $X_7$ and $X_8$ are selected from $CR_x$, and one of the $R_x$ is a cyano group or fluorine; another one of the remaining $R_x$ is selected from the structure represented by Formula 3 or Formula 4.

According to an embodiment of the present disclosure, wherein at least one of $X_1$ to $X_8$ are selected from $CR_x$, and the $R_x$ is a cyano group or fluorine; at least one of the remaining $R_x$ is selected from $CR_x$, and the $R_x$ has the structure represented by Formula 3.

Formula 3

$$**—K_1\left(K_2\right)_b R_{k1}$$

b is selected from 0, 1, 2, 3, 4 or 5;

$K_1$ and $K_2$ are, at each occurrence identically or differently, selected from O, S, Se, $NR_k$, $SiR_kR_k$, $GeR_kR_k$, $BR_k$, $PR_k$, $P(O)R_k$, substituted or unsubstituted alkylene groups having 1 to 20 carbon atoms, substituted or unsubstituted heteroalkylene having 1 to 20 carbon atoms, substituted or unsubstituted cycloalkylene having 3 to 20 carbon atoms alkyl, substituted or unsubstituted heterocyclylene having 3 to 20 ring atoms, substituted or unsubstituted arylene having 6 to 30 carbon atoms, substituted or unsubstituted heteroarylene having 3 to 30 carbon atoms, and combinations thereof;

$R_k$ and $R_{k1}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents can be optionally joined to form a ring;

"* *" represents the position that is connected to formula 3.

In this embodiment, "the adjacent substituent can be optionally joined to form a ring" is intended to mean that for the groups of adjacent substituents, such as two substituents $R_k$, and substituents $R_k$ and $R_{k1}$, adjacent substituents of $K_1$, adjacent substituents of $K_2$, any one or more of these groups of substituents can be joined to form a ring. Obviously, any of these groups of adjacent substituents may not be joined to form a ring.

According to an embodiment of the present disclosure, wherein the Formula 3 is selected from the group consisting of the following structure:

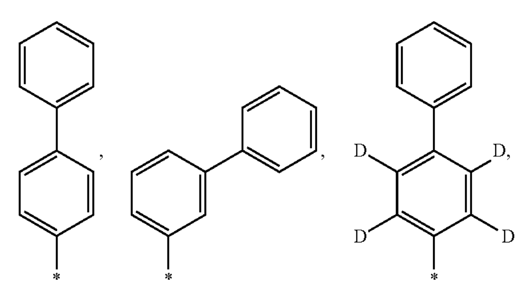

-continued
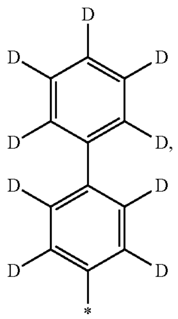
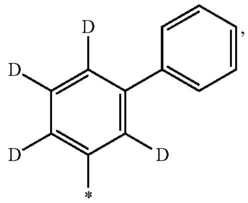
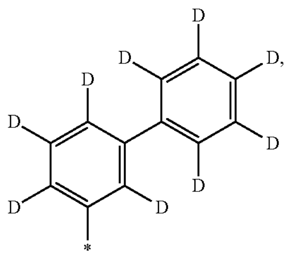
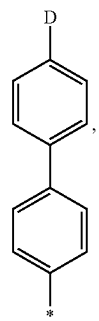
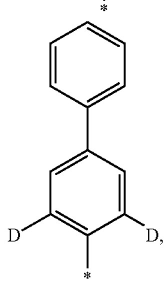
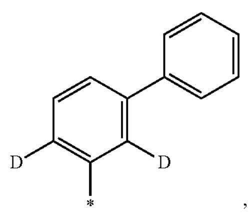
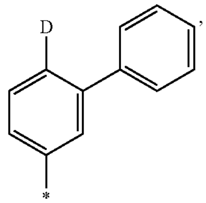
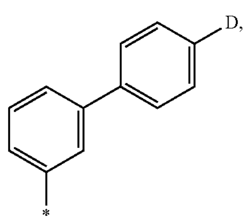
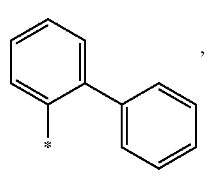
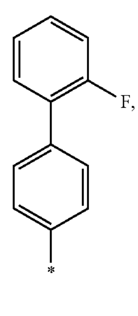
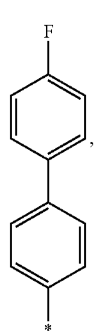
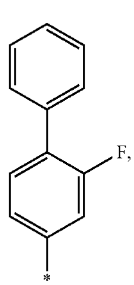
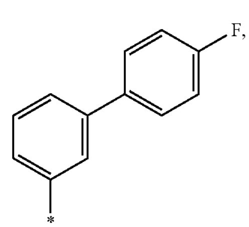
-continued
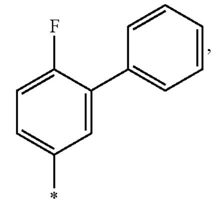
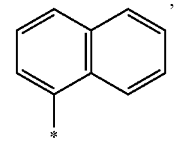
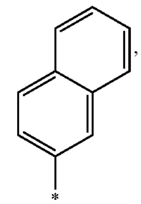
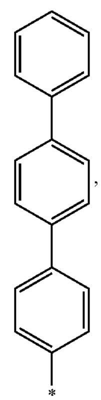
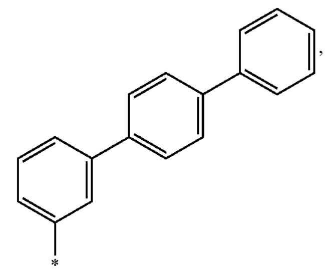
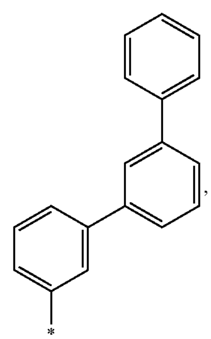
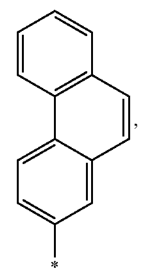
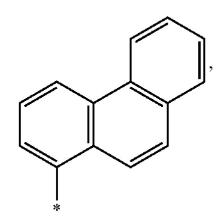
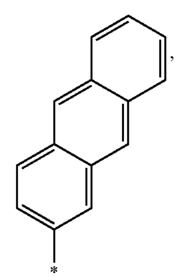
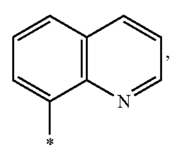
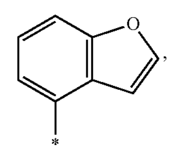
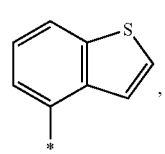
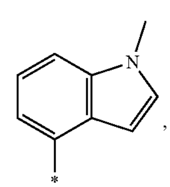
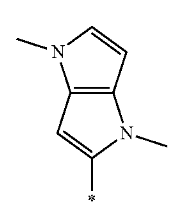
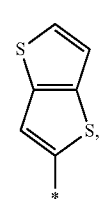
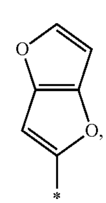
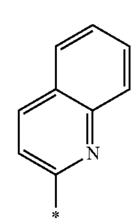

-continued
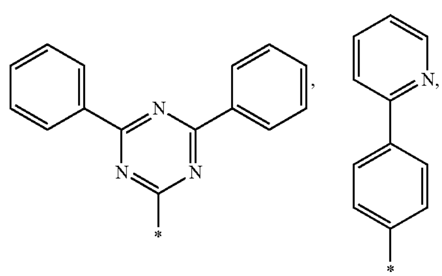
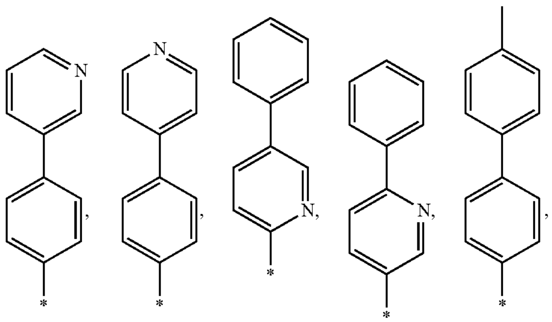
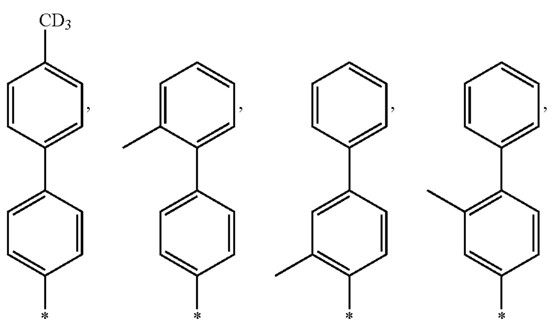
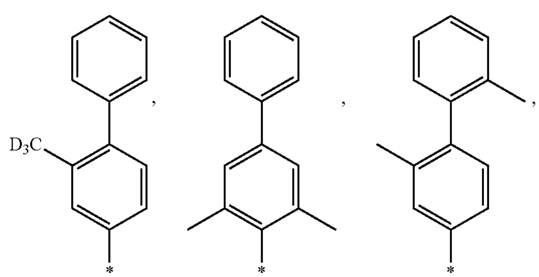
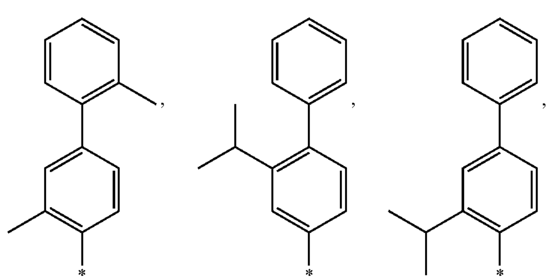
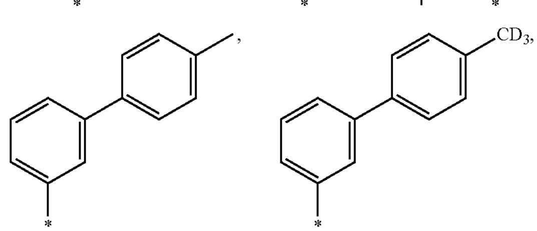
-continued
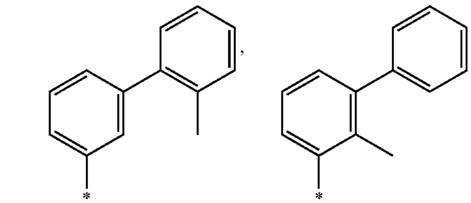
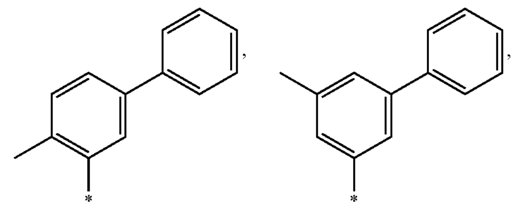
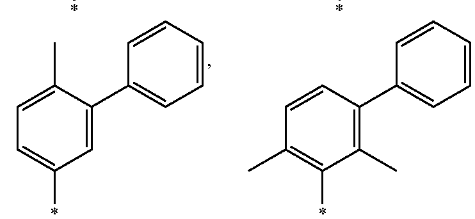
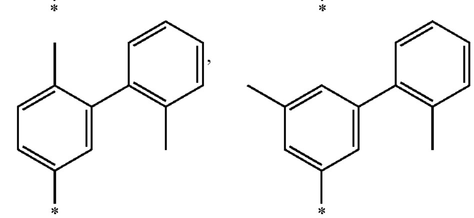
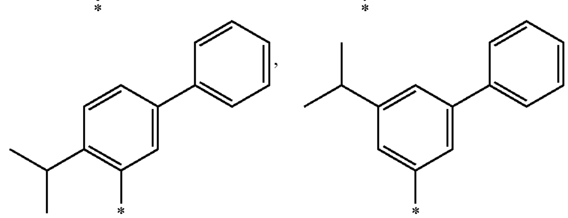
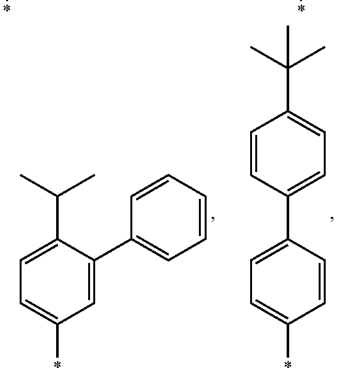
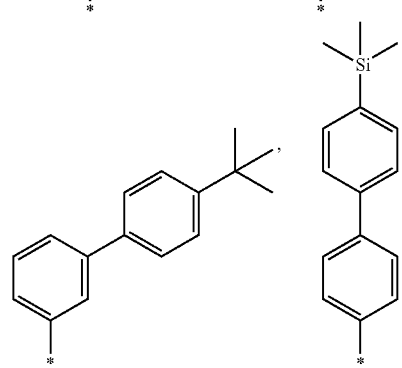

-continued
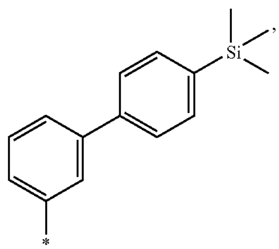
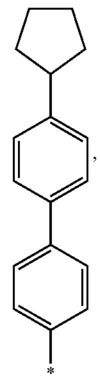
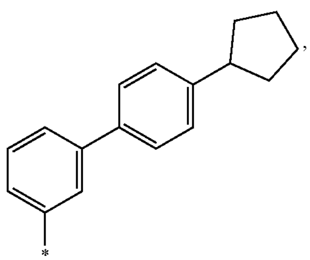
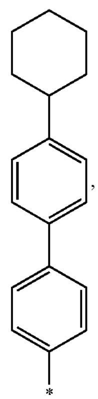
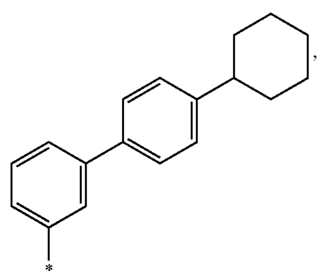
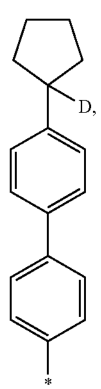
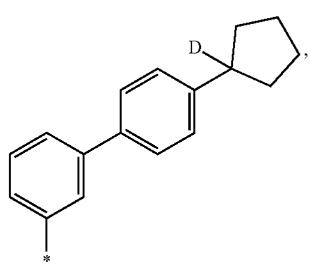
-continued
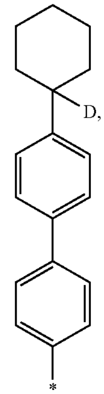
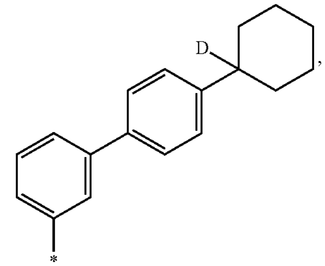
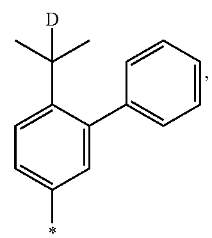
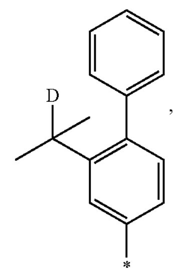
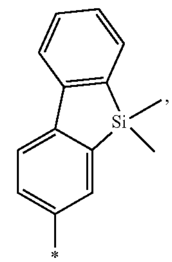
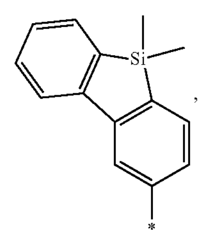
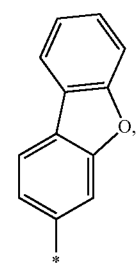
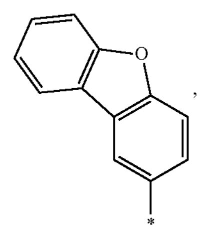
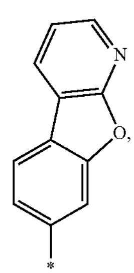
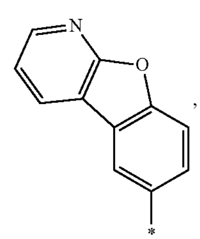
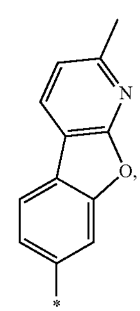
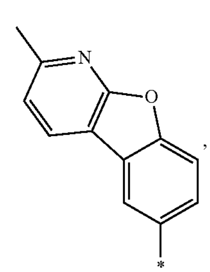
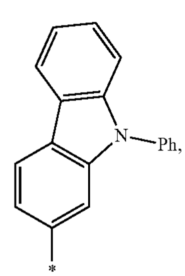

-continued
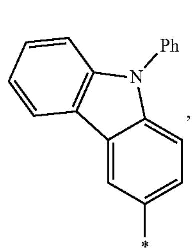
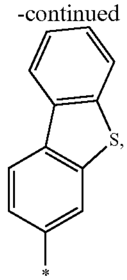
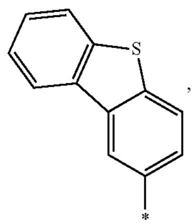
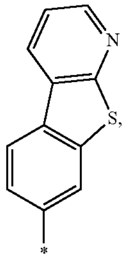
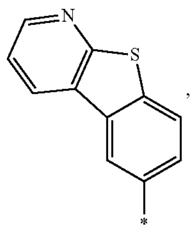
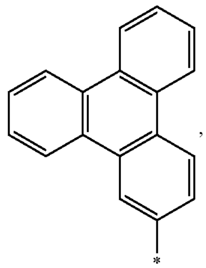
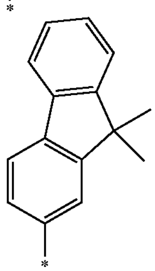
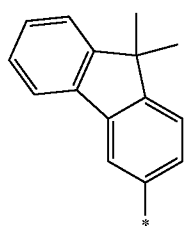
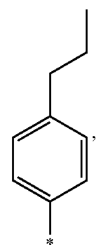
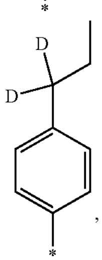
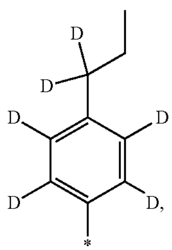
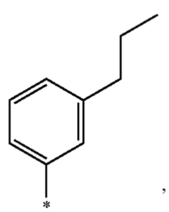
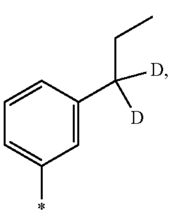
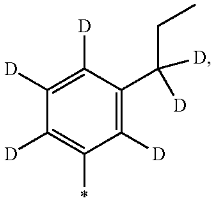
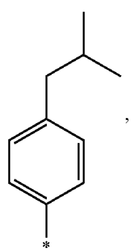
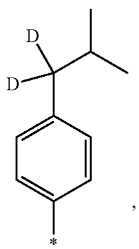
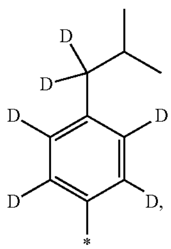
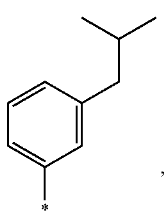
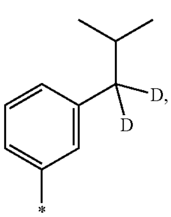
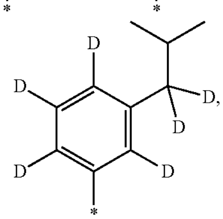
-continued
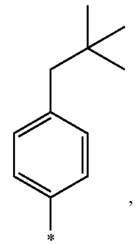
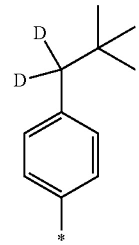
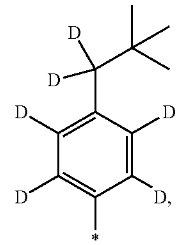
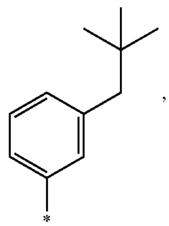
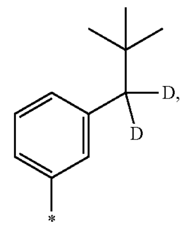
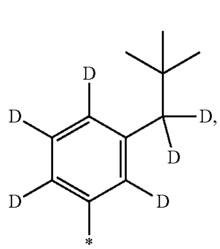
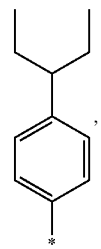
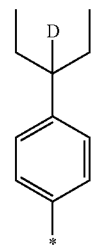
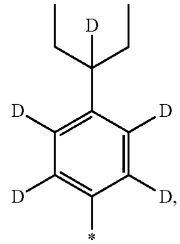
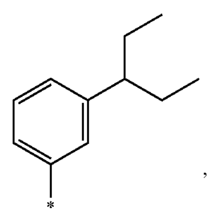
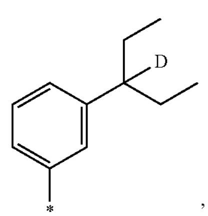
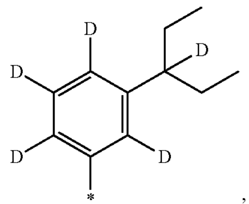
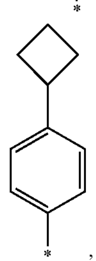
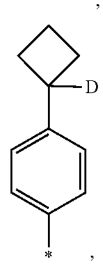
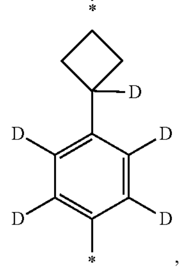
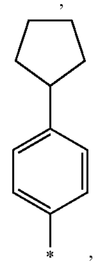

-continued
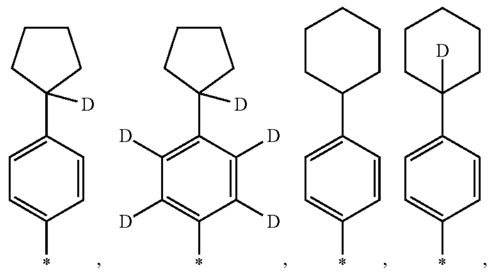
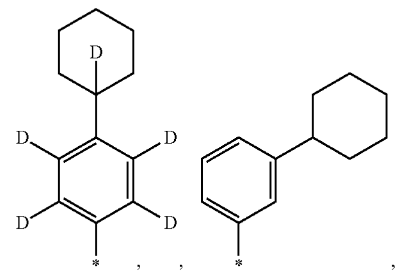
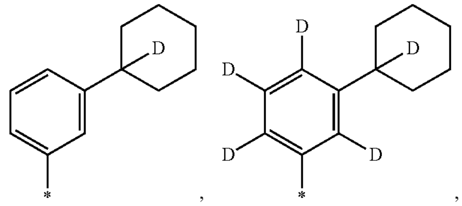
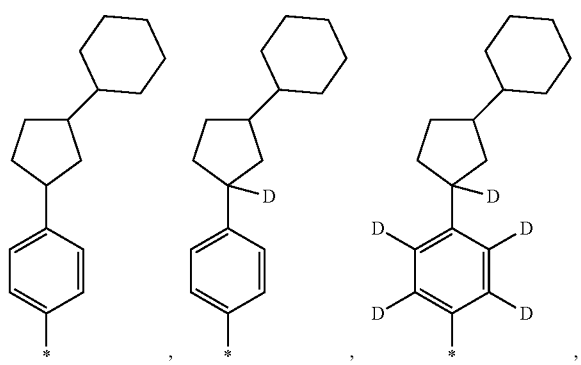
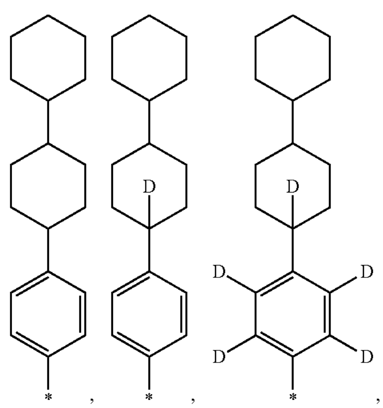
-continued
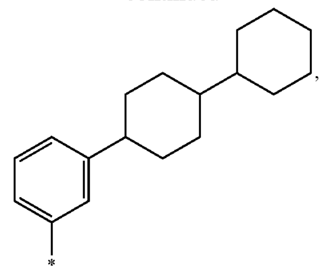
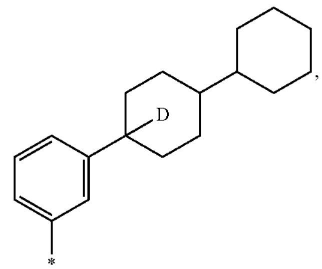
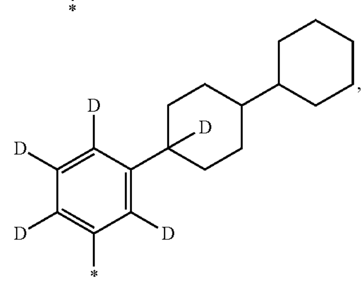
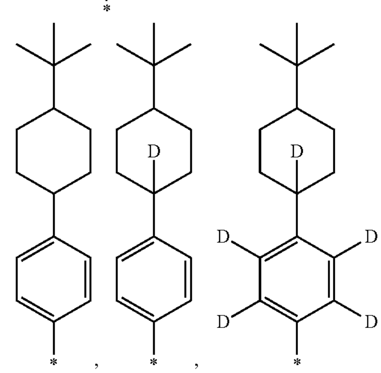
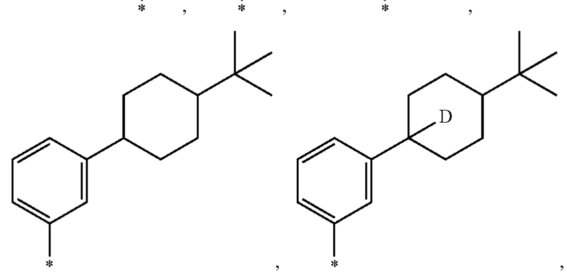
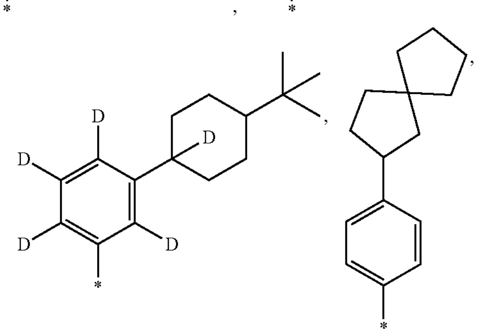

-continued
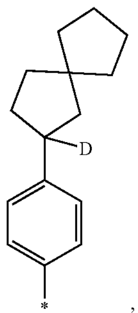,
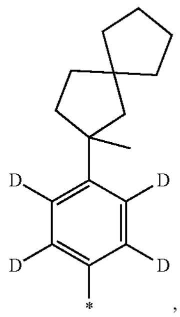,
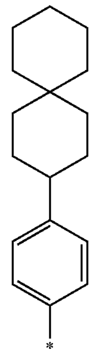,
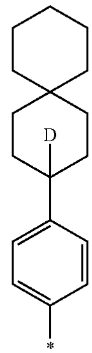,
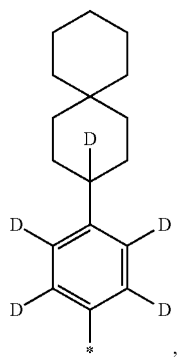,
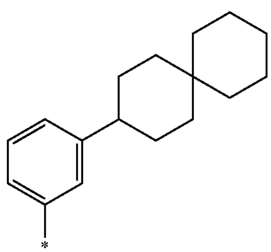,
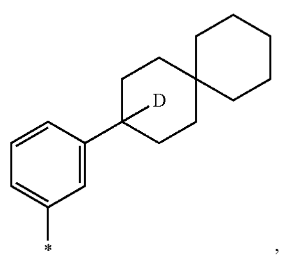,
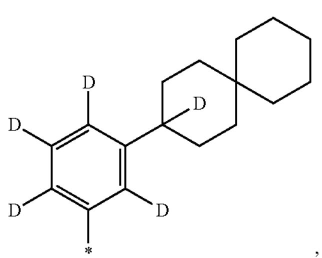,
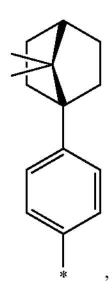,
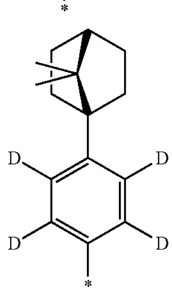,
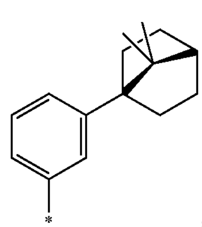,
-continued
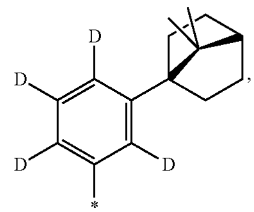,
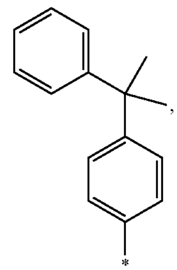,
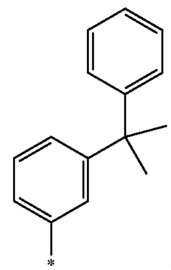,
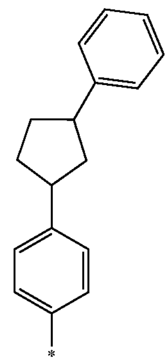,
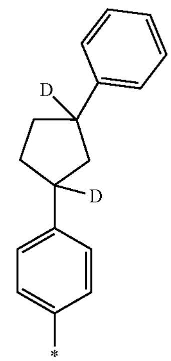,
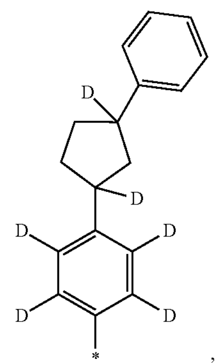,
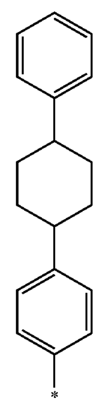,
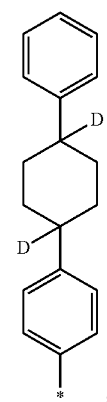,
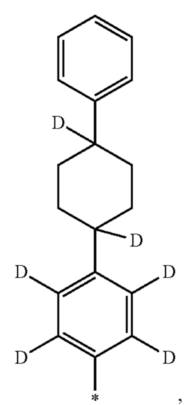,
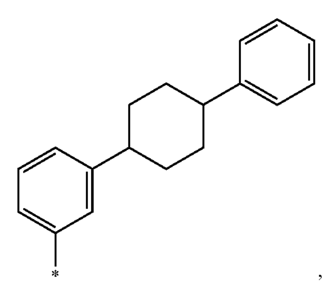,
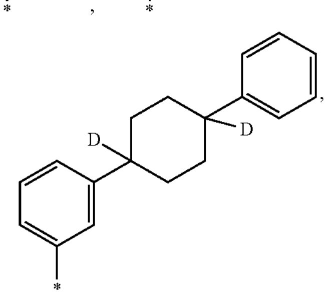, -continued
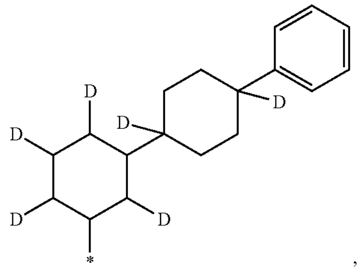,
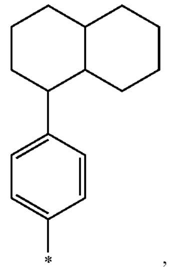,
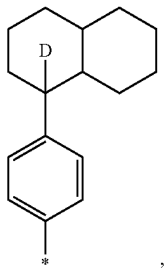,
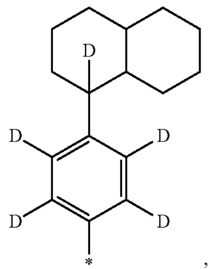,
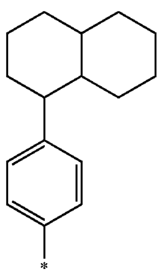,
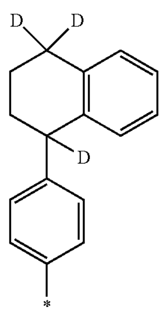,
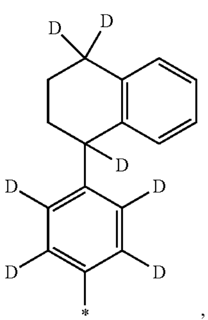,
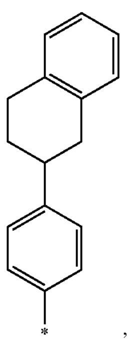,
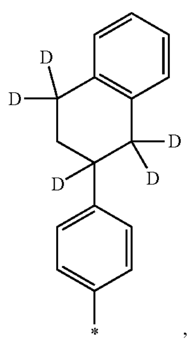,
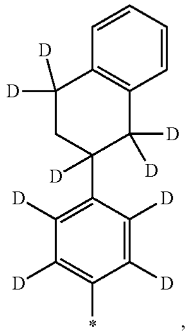,
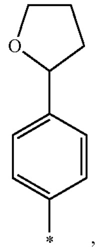,
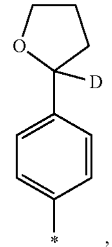,
-continued
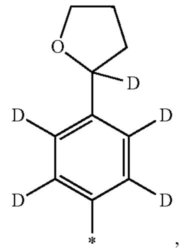,
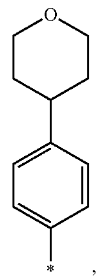,
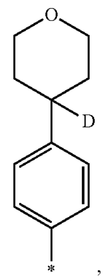,
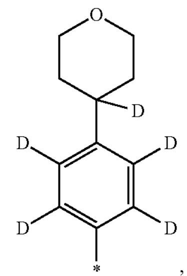,
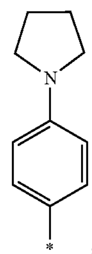,
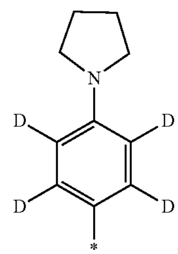,
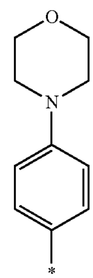,
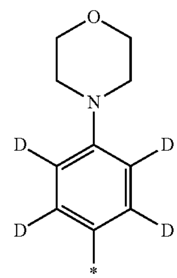,
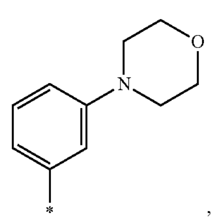,
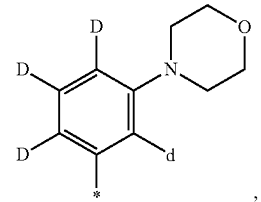,
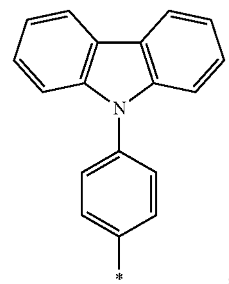,
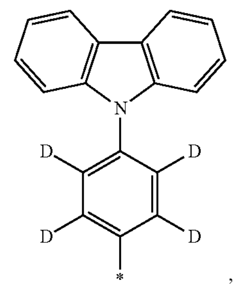,
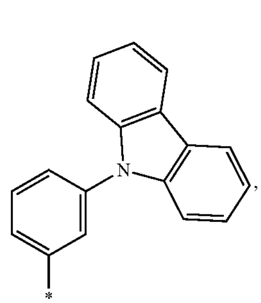,
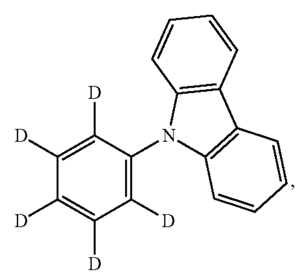,
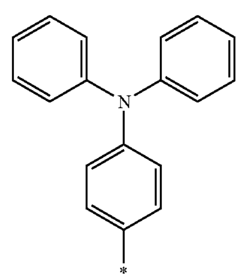,
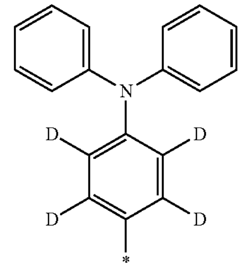, -continued
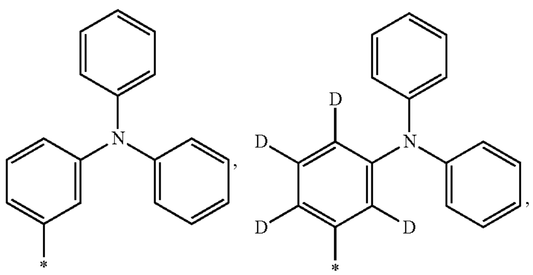
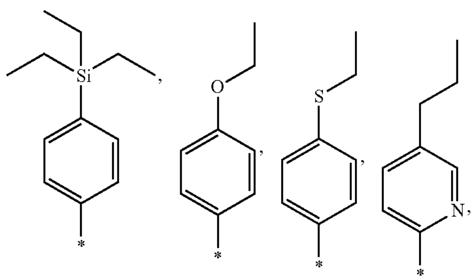
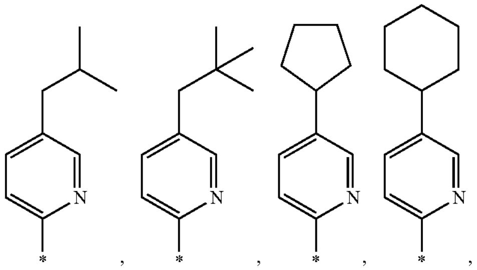
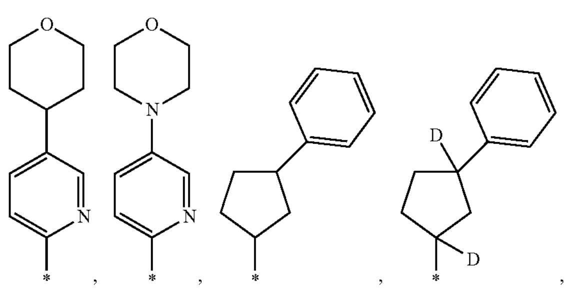
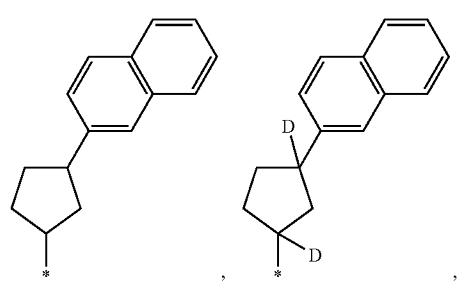
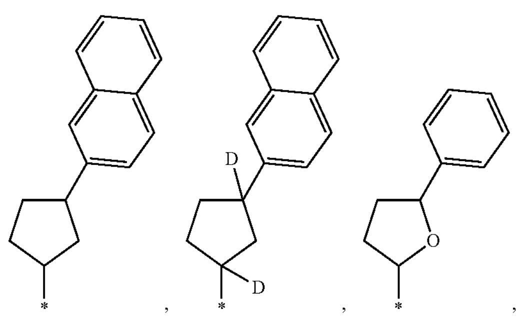
-continued
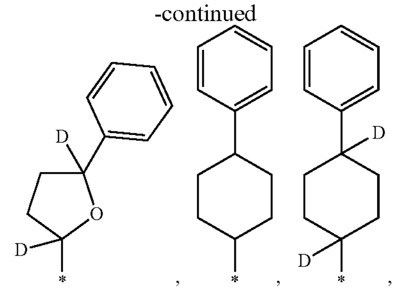
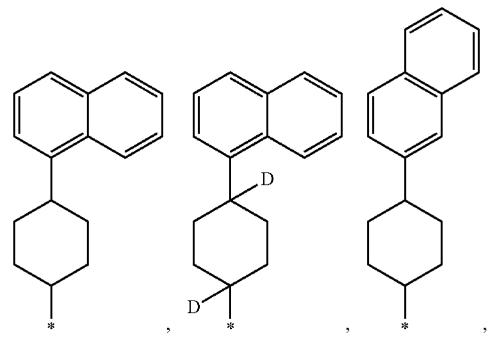
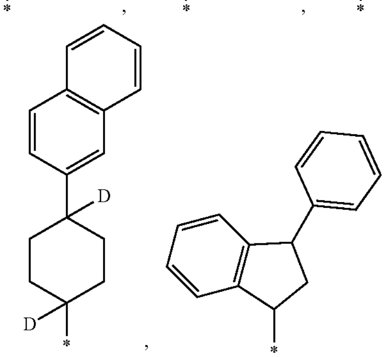
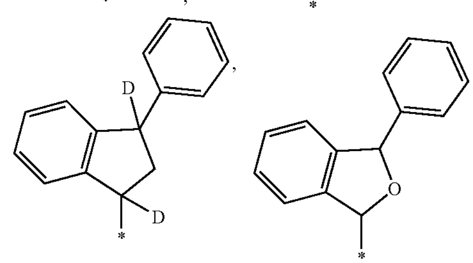
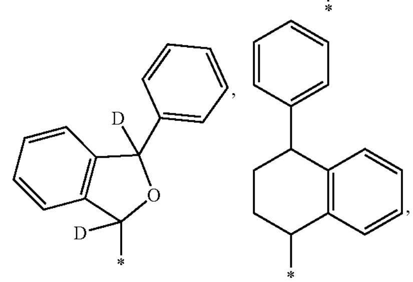
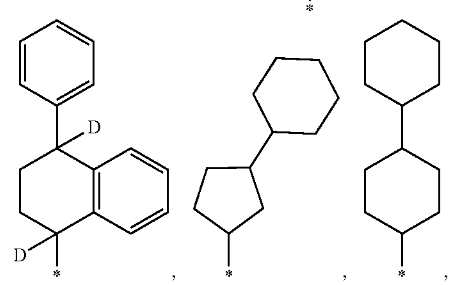

-continued

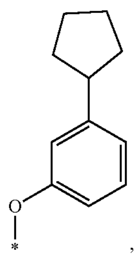

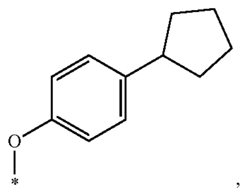

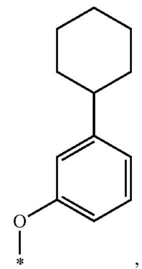

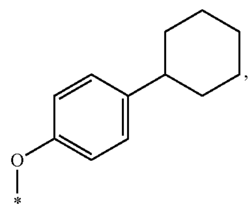

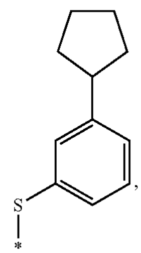

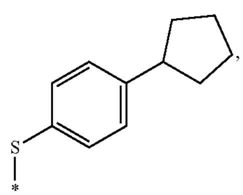

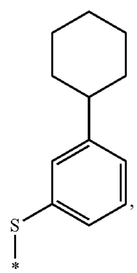

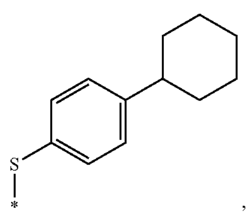

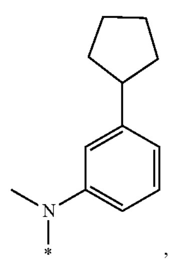

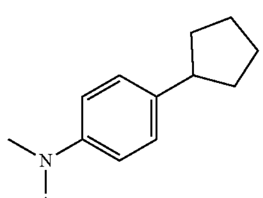

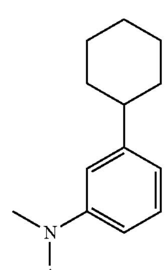

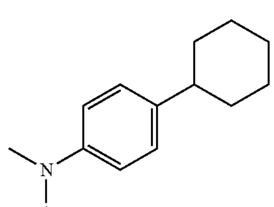

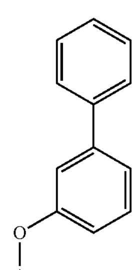

-continued

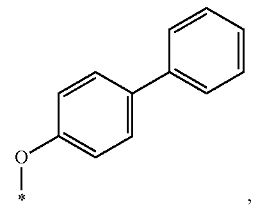

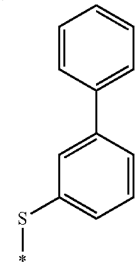

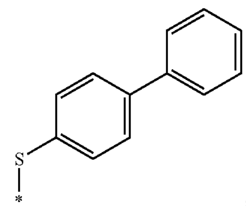

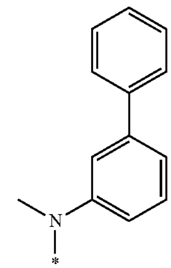

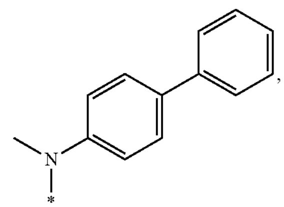

and combinations thereof;

optionally, the hydrogen in the above group can be partially or completely replaced by deuterium; wherein "*" represents the connection position of the Formula 3.

According to an embodiment of the present disclosure, wherein the length of the Formula 3 is greater than 3.8 Å.

According to an embodiment of the present disclosure, wherein the length of the Formula 3 is greater than 6.6 Å.

According to an embodiment of the present disclosure, wherein the length of the Formula 3 is greater than 3.8 Å, and less than or equal to 22 Å.

According to an embodiment of the present disclosure, wherein the length of the Formula 3 is greater than 6.6 Å, and less than or equal to 22 Å.

According to an embodiment of the present disclosure, wherein the length of the Formula 3 is greater than 6.6 Å, and less than 13.3 Å.

According to an embodiment of the present disclosure, wherein the length of the Formula 3 is greater than or equal to 7.0 Å and less than 13.3 Å.

According to an embodiment of the present disclosure, wherein the length of the Formula 3 is greater than or equal to 7.0 Å, and less than or equal to 10.5 Å.

In this disclosure, "the length of the formula 3 is greater than 3.8 Å" is intended to mean that the atom in Formula 3 which is directly connected to Formula 2, and the distance between the atom and the atom farthest from this atom in Formula 3 is the length of Formula 3, the length is greater than 3.8 Å. In this disclosure, the length of Formula 3 is calculated by ChemBio3D Ultra 14.0.0.117 after optimization by MM2. For example, when Formula 3 is 4-trimethylsilylphenyl, that is, the Formula 3 is

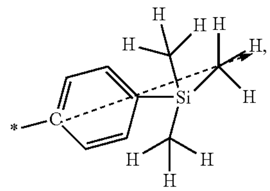

the longest distance is the distance from the "C" directly connected to Formula 2 to the farthest hydrogen atom (as indicated by the dashed arrow), the length of the substituent obtained by the calculation method of this application is 6.6 Å. For another example, when A is 4-propylphenyl, that is, Formula 2 is

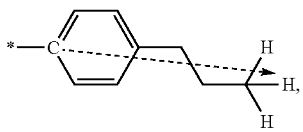

the longest distance is the distance from the "C" directly connected to Formula 1 to the farthest hydrogen atom (as indicated by the dashed arrow), the length of the substituent obtained by the calculation method of this application is 7.3 Å. The other cases can be deduced by analogy.

In this disclosure, the length of Formula 3 is calculated by ChemBio3D Ultra 14.0.0.117 after optimization by MM2, the following table exemplarily shows some substituent structures and lengths:

| Structure | Length (Å) |
|---|---|
| 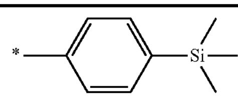 | 6.6 |
| 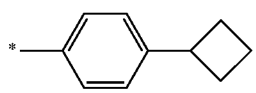 | 6.9 |
| 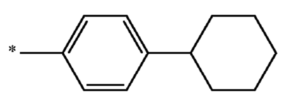 | 8.1 |
| 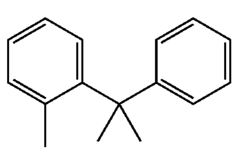 | 7.0 |
| 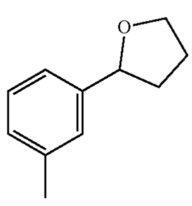 | 6.9 |

-continued

| Structure | Length (Å) |
|---|---|
| 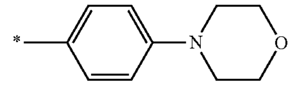 | 7.1 |
| 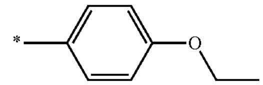 | 7.2 |
| 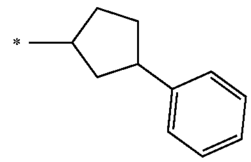 | 7.5 |
| 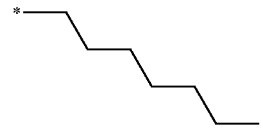 | 7.3 |
| 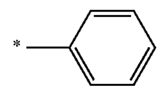 | 3.8 |
| 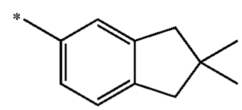 | 5.9 |
| 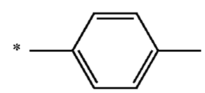 | 4.7 |
| 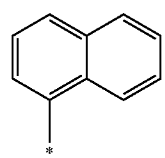 | 5.1 |
| 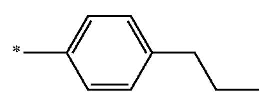 | 7.3 |
| 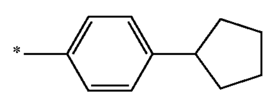 | 7.3 |
| 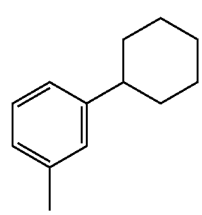 | 7.7 |
| 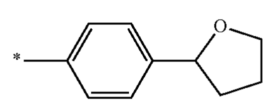 | 7.1 |

-continued
| Structure | Length (Å) |
|---|---|
| 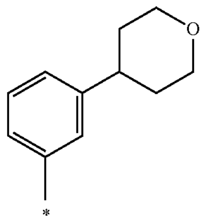 | 6.9 |
| 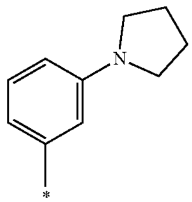 | 6.8 |
| 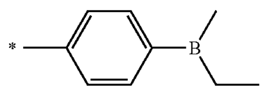 | 7.4 |
| 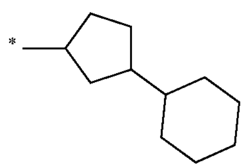 | 7.8 |
| 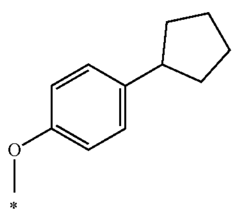 | 8.6 |
| 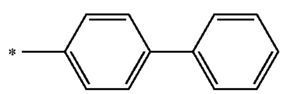 | 8.0 |
| 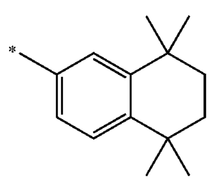 | 5.8 |
| 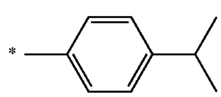 | 6.1 |
| 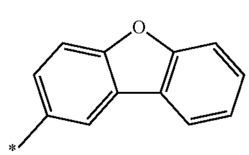 | 7.3 |
-continued
| Structure | Length (Å) |
|---|---|
| 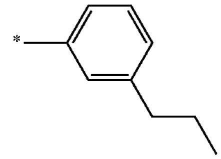 | 7.1 |
| 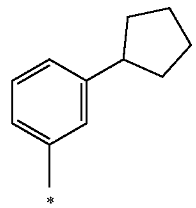 | 7.0 |
| 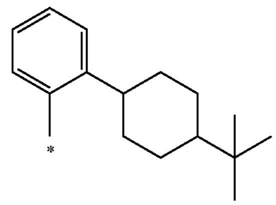 [SMILES: Cc1ccccc1C1CCC(C(C)(C)C)CC1] | 8.9 |
| 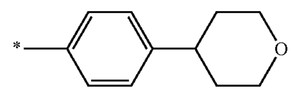 | 7.2 |
| 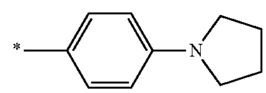 | 7.2 |
| 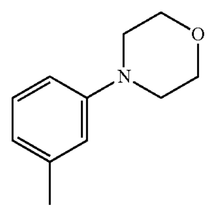 | 6.9 |
| 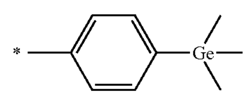 | 6.7 |
| 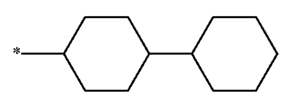 | 8.5 |
| 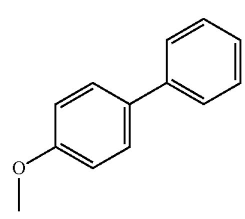 | 9.4 |

-continued

| Structure | Length (Å) |
|---|---|
| 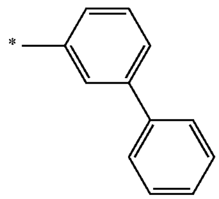 | 7.4 |
| 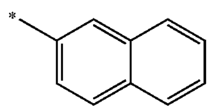 | 5.9 |
| 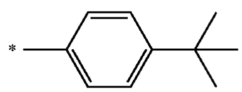 | 6.1 |
| 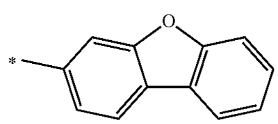 | 7.5 |

According to an embodiment of the present disclosure, wherein at least one of $X_1$ to $X_8$ is $CR_x$, and the $R_x$ is a cyano group or fluorine; at least one of $X_1$ to $X_8$ is selected from $CR_x$, and the $R_x$ has a structure represented by Formula 4:

Formula 4

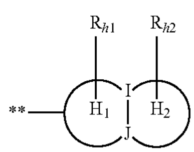

I and J are, at each occurrence identically or differently, selected from C, CR''', N, SiR''', and GeR''';

$R_{h1}$ and $R_{h2}$ represent, at each occurrence identically or differently, mono-substitution or multiple substitutions, non-substitution;

ring $H_1$ and ring $H_2$ are fused through I and J;

ring $H_1$ and ring $H_2$ are, at each occurrence identically or differently, selected from an alicyclic ring having 3 to 30 ring atoms, a heterocyclic ring having 3 to 30 ring atoms, an aromatic ring having 6 to 30 ring atoms, a heteroaromatic ring having 5 to 30 ring atoms, or a combination thereof;

R''', $R_{h1}$ and $R_{h2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R''', $R_{h1}$ and $R_{h2}$ can be optionally joined to form a ring;

"* *" represents the position that is connected to Formula 4.

In this embodiment, I and J shown in Formula 4 are intended to represent two adjacent atoms or groups that are shared when "ring $H_1$" and "ring $H_2$" are fused, and Formula 4 only schematically shows that I and J are connected, however, depending on the choice of "ring $H_1$" and "ring $H_2$", I and J can be connected by a single bond or a double bond. When I and J are connected by a double bond, that is, both I and J are selected from C. The "ring $H_1$" and the "ring $H_2$" in the Formula 4 respectively refer to the ring formed by "I" and "J" in the formula, that is, when referring to the ring $H_1$, the ring $H_1$ has the following structure:

when referring to the ring $H_2$, the ring $H_2$ has the following structure:

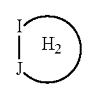

For example, when Formula 4 has the following structure:

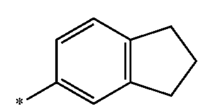

the ring $H_1$ is a benzene ring, the ring $H_2$ is cyclopentene, and I and J are connected by a double bond; when Formula 4 has the following structure:

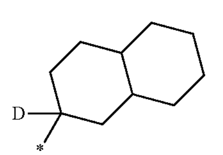

the ring $H_1$ is cyclohexane substituted by deuterium, and the ring $H_2$ is cyclohexane, and I and J are connected by a single bond; when Formula 4 has the following structure:

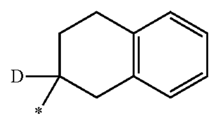

the ring $H_1$ is cyclohexene substituted by deuterium, the ring $H_2$ is a benzene ring, and I and J are connected by a double bond. The various examples described here are only examples, and the other cases can be deduced by analogy.

In this disclosure, "ring atom" means that the atom is bonded into a cyclic structure (for example: monocyclic (hetero)aromatic ring, heterocyclic ring, alicyclic ring, fused ring (hetero)aromatic ring, heterocyclic ring, alicyclic ring) which constitutes the ring itself of the atom. The carbon atoms and heteroatoms (includes but not limited to O, S, N, Se, Si or Ge, etc.) in the ring are included in the number of ring atoms. When the ring is substituted by a substituent, the atoms contained in the substituent are not included in the number of ring atoms. For example, the number of ring atoms of cyclopentane, cyclopentene, tetrahydrofuran, thiophene, furan, pyrrole, imidazole, oxazole, and thiazole is 5; the number of ring atoms of cyclohexane, cyclohexene, benzene, pyridine, triazine, and pyrimidine are 6; the number of ring atoms of benzothiophene, benzofuran, and indene are 9; the number of ring atoms of naphthalene, quinoline, isoquinoline, quinazoline, and quinoxaline are 10; dibenzothiophene, Dibenzofuran, fluorene, 9,9-diphenylfluorene, azadibenzothiophene, azadibenzofuran and azafluorene having 13 ring atoms; the various examples described here are only examples, and so on in other cases.

According to an embodiment of the present disclosure, wherein the Formula 4 is selected from the group consisting of the following structure:

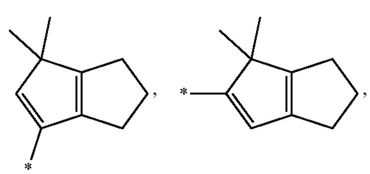

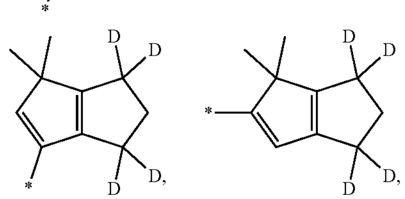

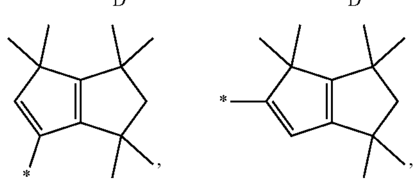

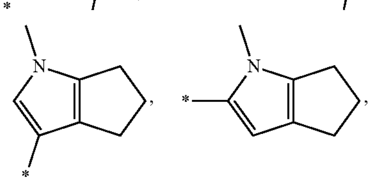

-continued

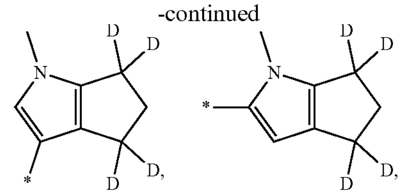

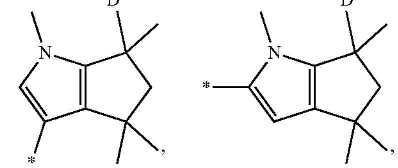

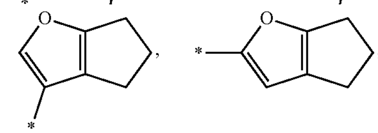

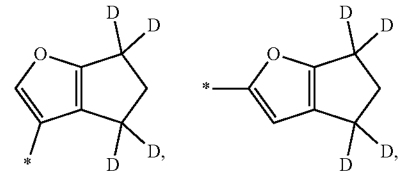

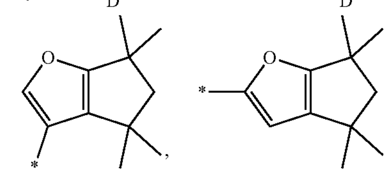

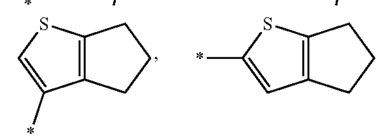

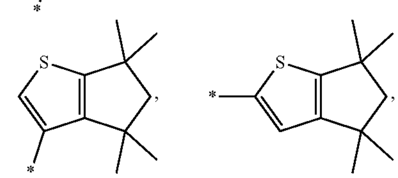

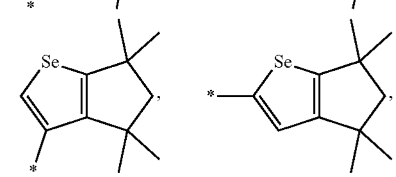

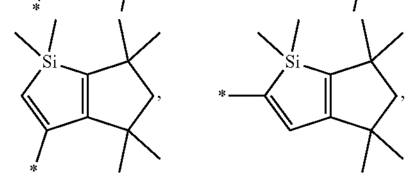

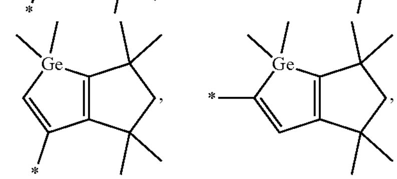

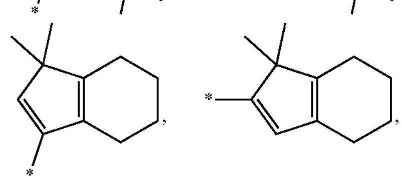

-continued
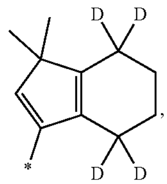
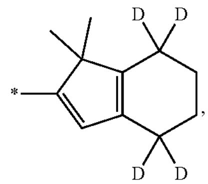
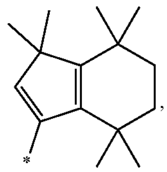
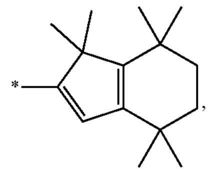
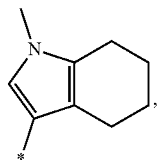
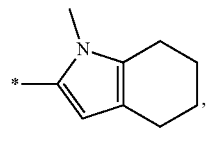
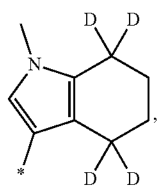
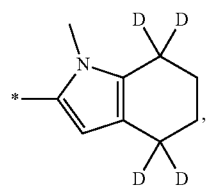
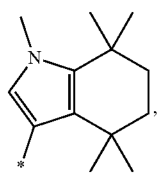
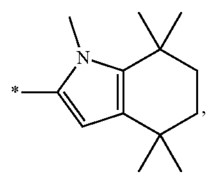
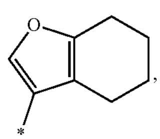
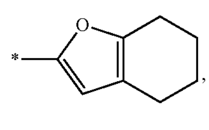
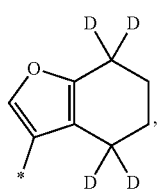
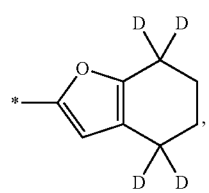
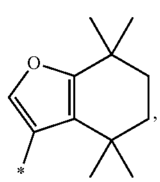
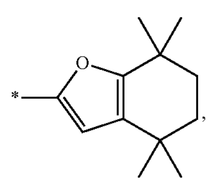
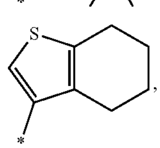
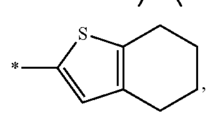
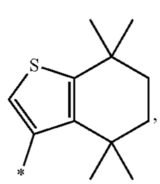
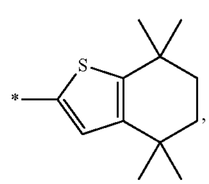
-continued
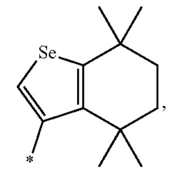
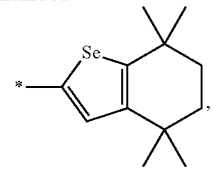
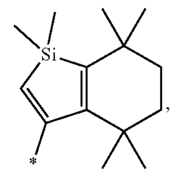
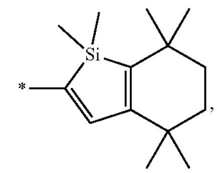
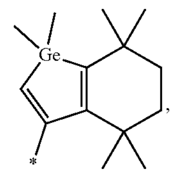
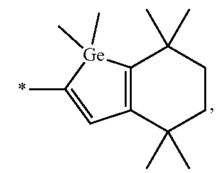
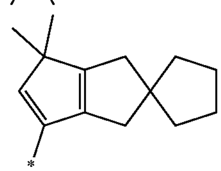
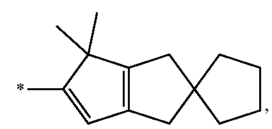
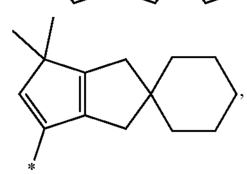
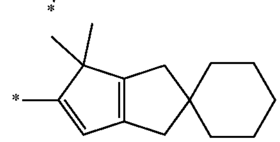
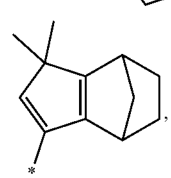
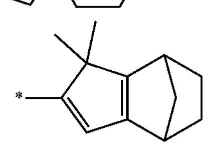
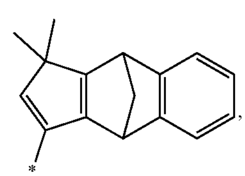
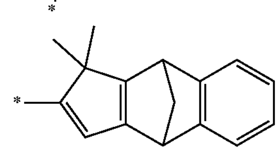
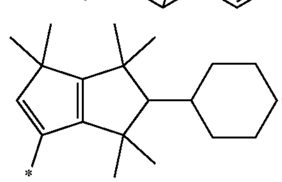

-continued
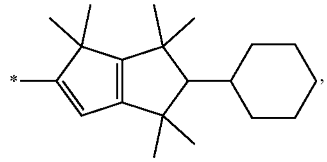
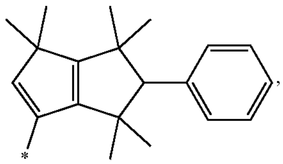
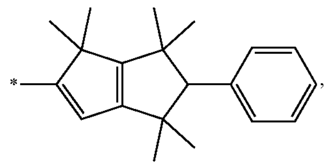
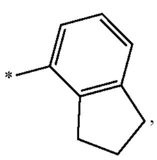
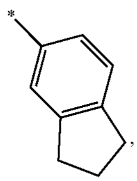
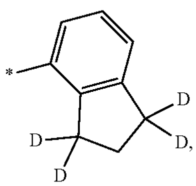
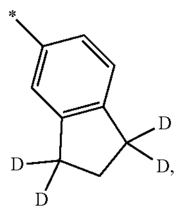
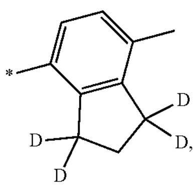
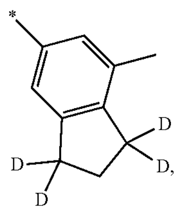
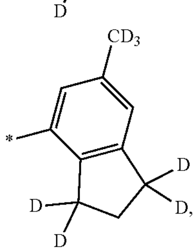
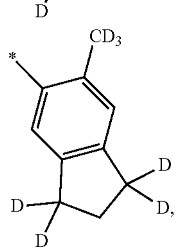
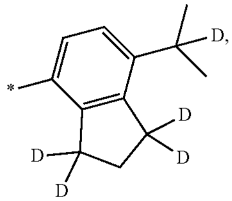
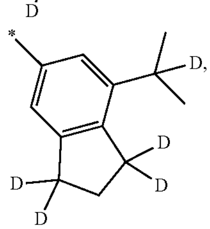
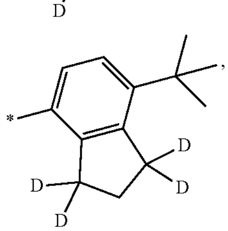
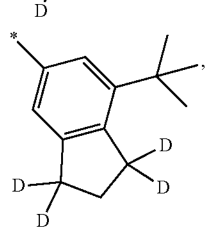
-continued
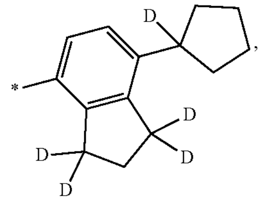
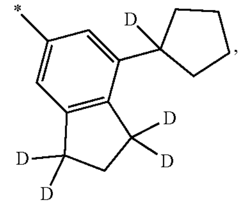
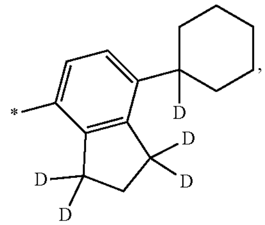
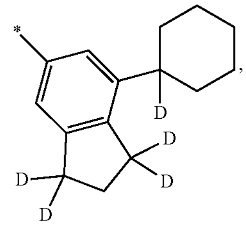
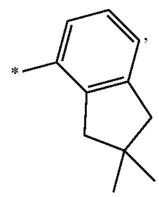
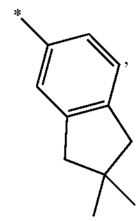
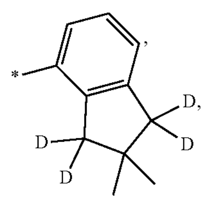
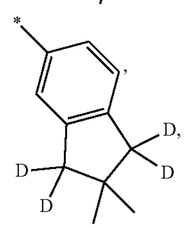
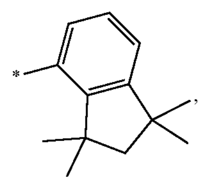
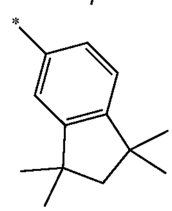
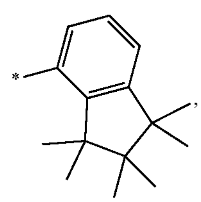
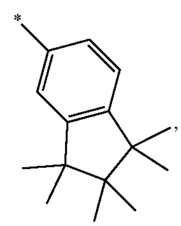
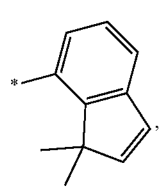
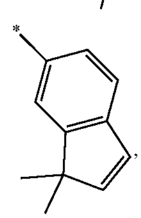
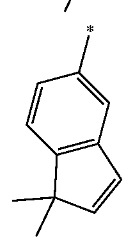
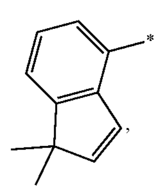

-continued
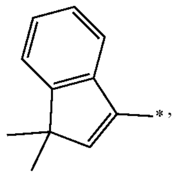
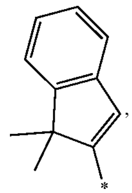
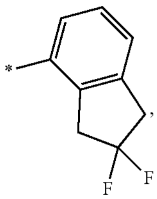
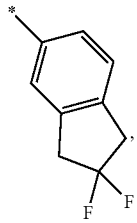
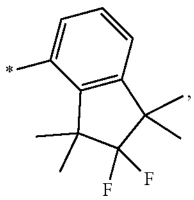
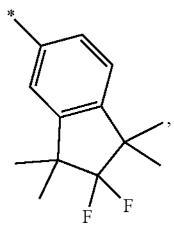
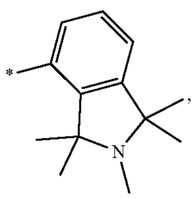
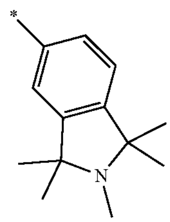
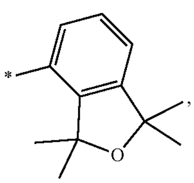
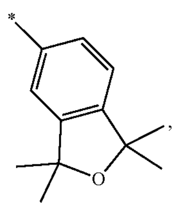
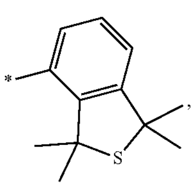
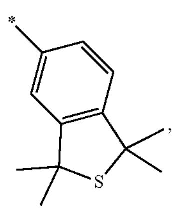
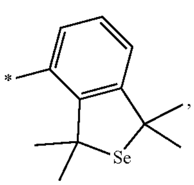
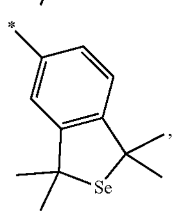
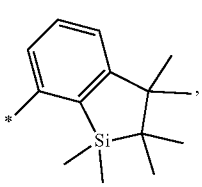
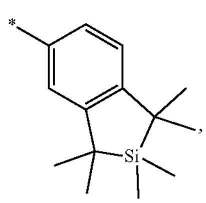
-continued
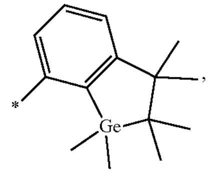
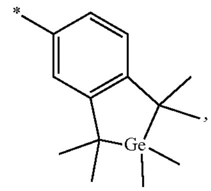
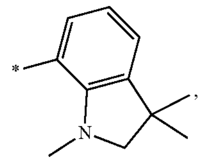
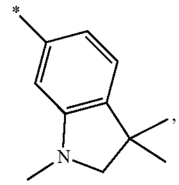
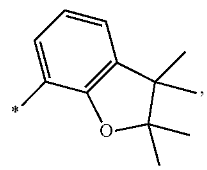
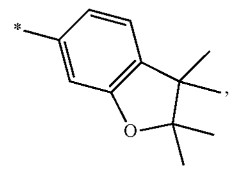
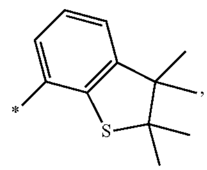
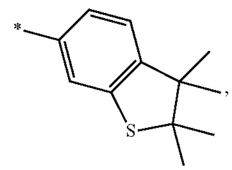
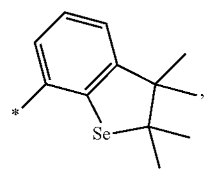
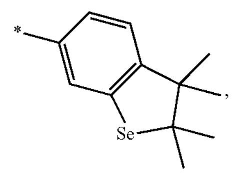
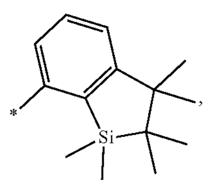
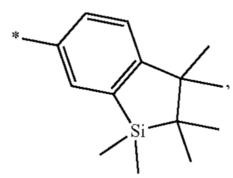
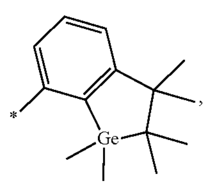
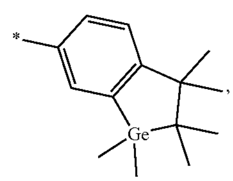
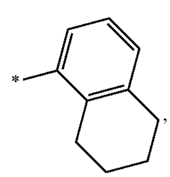
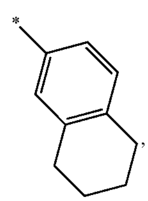
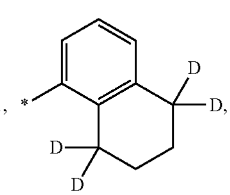

-continued
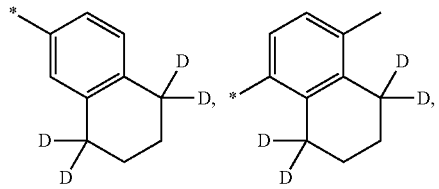
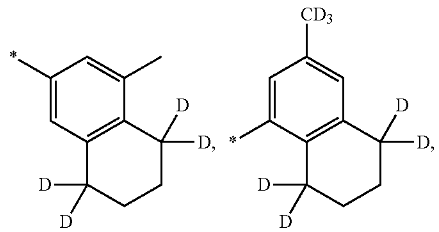
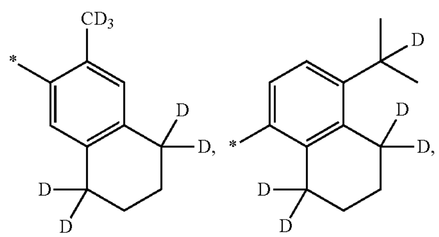
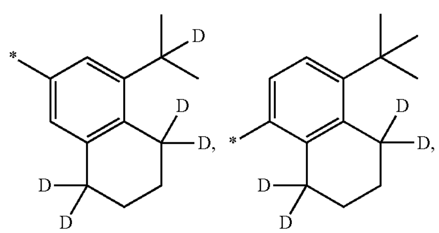
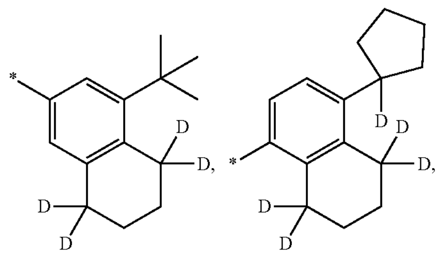
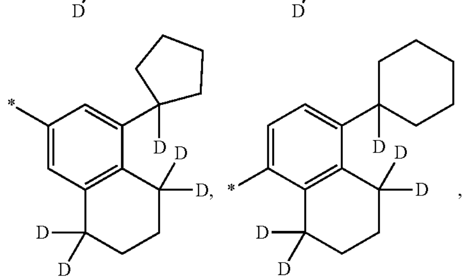
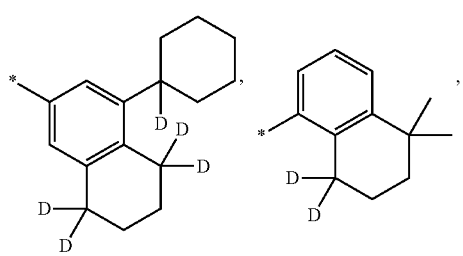
-continued
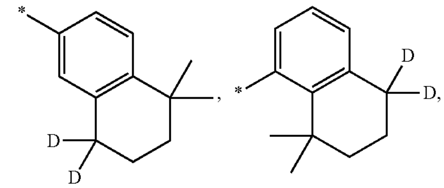
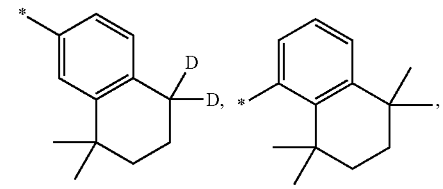
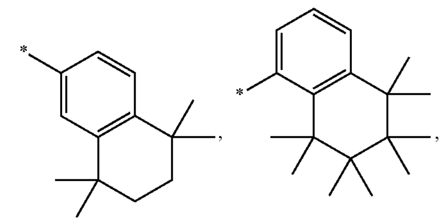
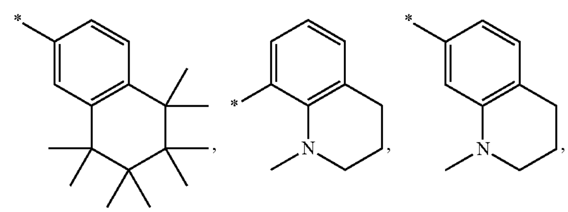
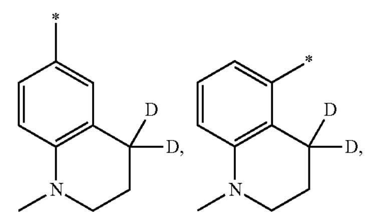
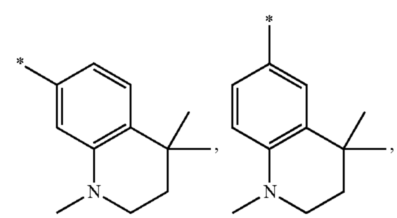
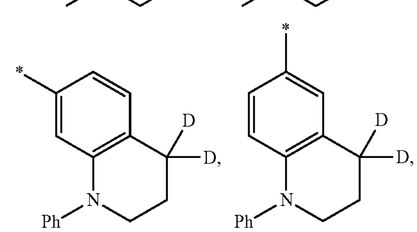
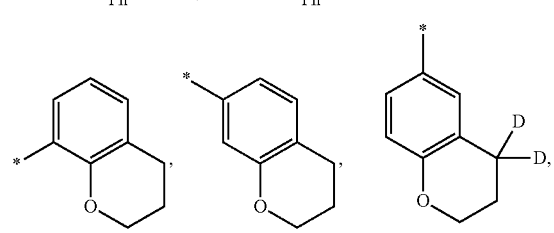

-continued
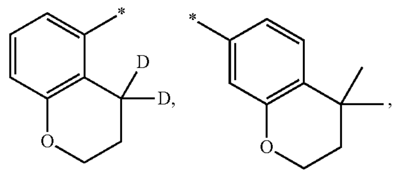
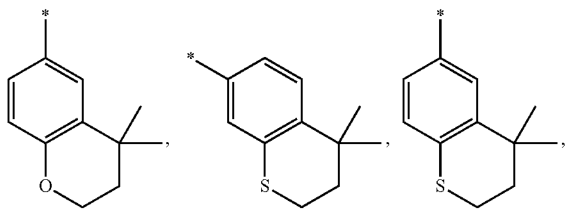
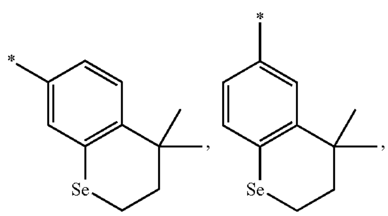
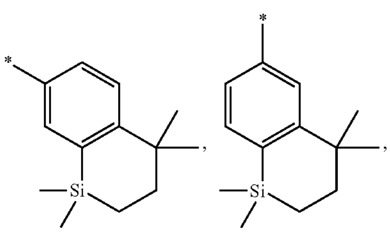
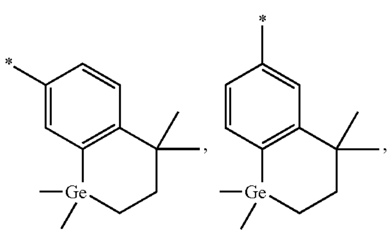
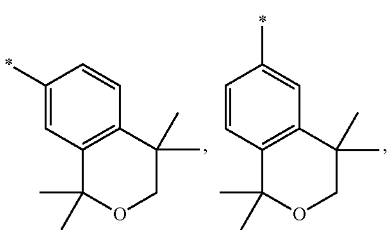
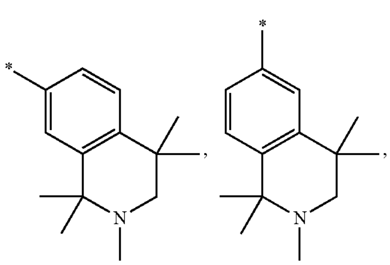
-continued
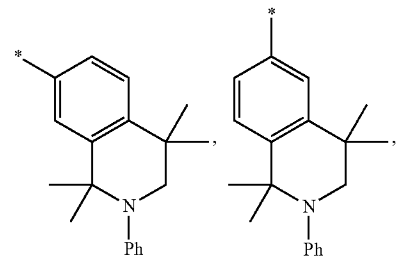
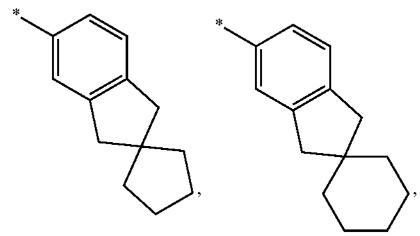
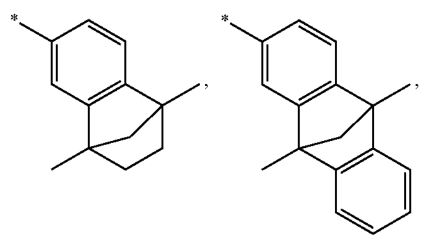
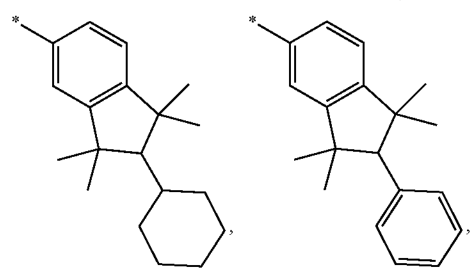
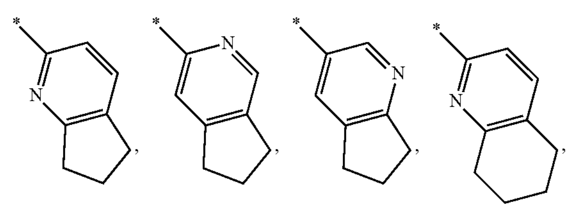
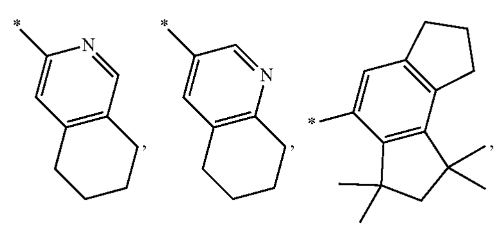
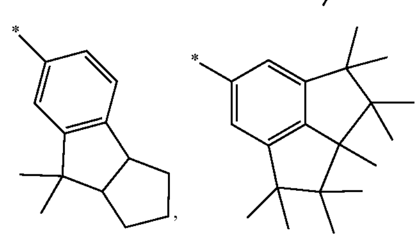

-continued
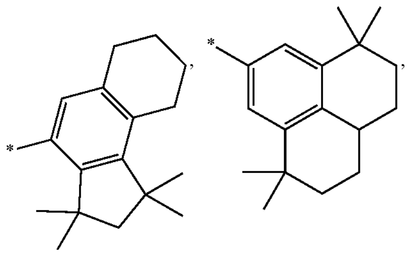
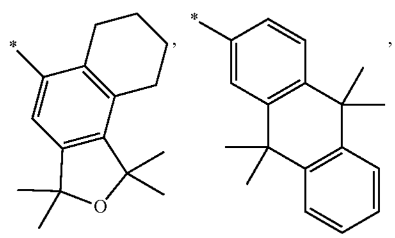
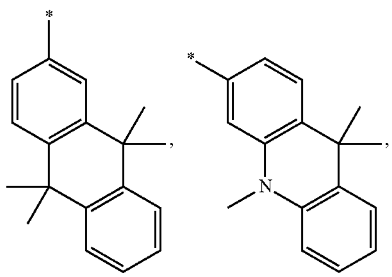
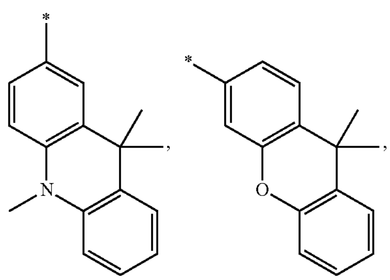
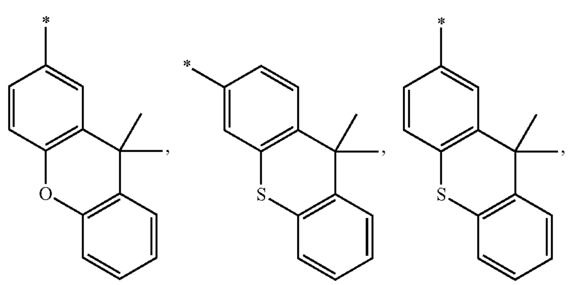
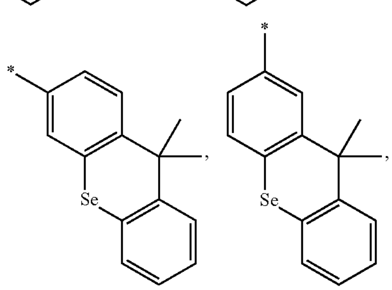
-continued
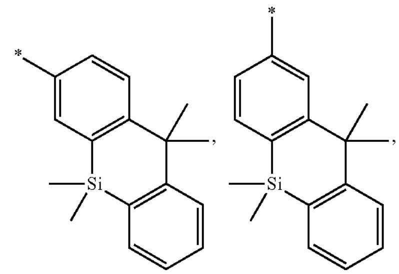
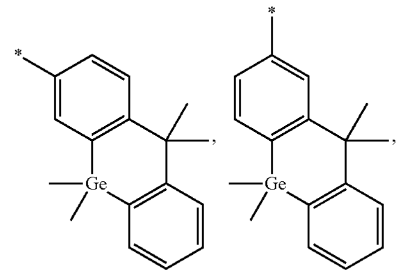
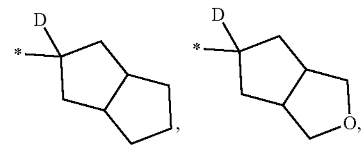
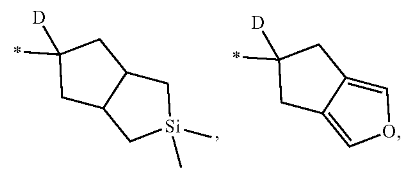
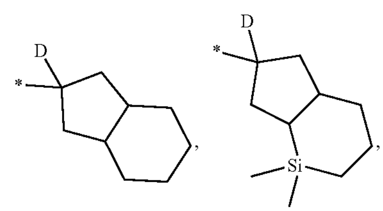
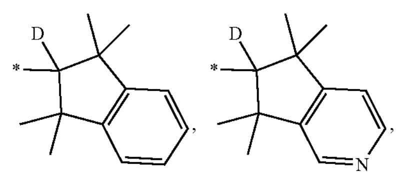
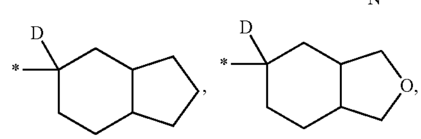
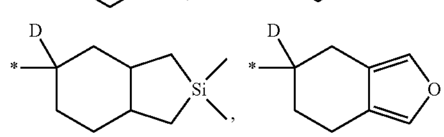
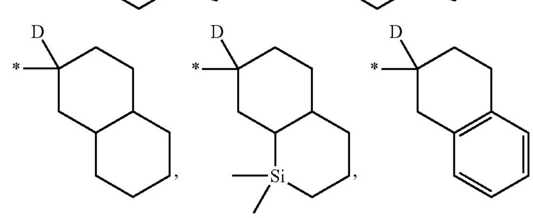

-continued

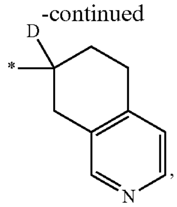

optionally, the hydrogen in the above group can be partially or completely replaced by deuterium; wherein "*" represents the connection position of the Formula 4.

According to an embodiment of the present disclosure, wherein the metal M is selected from the group consisting of: metal complex M-$n_1$-1 to metal complex M-$n_1$-10 (wherein $n_1$ is an integer from 1 to 452), metal complex M-453 to metal complex M-468, metal complex M-$n_2$-1 to metal complex M-$n_2$-10 (wherein $n_2$ is an integer from 469 to 580), metal complex M-581 to metal complex M-592 and metal complex M-$n_3$-1 to metal complex M-$n_3$-10 (wherein $n_3$ is an integer from 593 to 691); wherein the specific structures of metal complex M-$n_1$-1 to metal complex M-$n_1$-10 (wherein $n_1$ is an integer from 1 to 452), metal complex M-453 to metal complex M-468, metal complex M-$n_2$-1 to metal complex M-$n_2$-10 (wherein $n_2$ is an integer from 469 to 580), metal complex M-581 to metal complex M-592 and metal complexes M-$n_3$-1 to metal complex M-$n_3$-10 (wherein $n_3$ is an integer from 593 to 691) are referred to claim 20.

In this embodiment, the expression of the metal complex is shown as an example: when $n_1$ is selected from 1, that is, "M-$n_1$-1 to metal complex M-$n_1$-10" is "M-1-1 to metal complex M- 1-10":

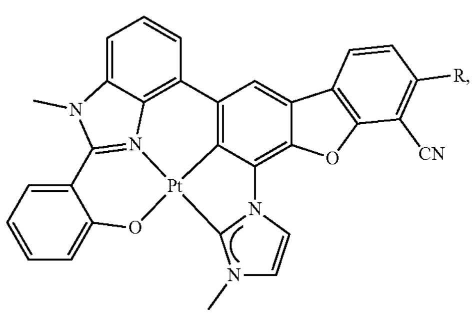

| | | | |
|---|---|---|---|
| R = H | M-1-1, | R = D | M-1-2 |
| R = $CD_3$ | M-1-3, | R = Ph | M-1-4 |
| R = $R_a$ | M-1-5, | R = $R_b$ | M-1-6 |
| R = $R_c$ | M-1-7, | R = $R_d$ | M-1-8 |
| R = $R_e$ | M-1-9, | R = $R_f$ | M-1-10 |

wherein, the M-1-5 is the structure where R is $R_a$ in the general formula:

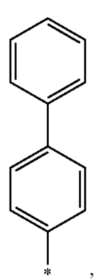

the M-1-5 has the following structure:

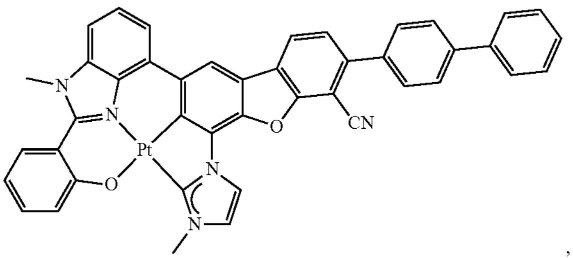

the other compounds under this general formula are analogous to this situation. Similarly, when $n_1$ is selected from an integer from 2 to 452 or $n_2$ is selected from an integer from 469 to 580 or $n_3$ is selected from an integer from 593 to 691, the other cases can be deduced by analogy.

According to an embodiment of the present disclosure, wherein the hydrogen in the metal complex M-$n_1$-1 to the metal complex M-$n_1$-10 (wherein $n_1$ is an integer from 1 to 452), the metal complex M-453 to the metal complex M-468, the metal complex M-$n_2$-1 the metal complex M-$n_2$-10 (wherein $n_2$ is an integer from 469 to 580), the metal complex M-581 to the metal complex M-592 and metal complexes M-$n_3$-1 to metal complex M-$n_3$-10 (wherein $n_3$ is an integer from 593 to 691) can be partially or completely replaced by deuterium.

According to an embodiment of the present disclosure, disclosed is an electroluminescent device, comprising:

an anode, a cathode, and an organic layer disposed between the anode and the cathode, wherein the organic layer comprises the metal complex that is as shown in any one of the embodiments described above.

According to an embodiment of the present disclosure, in the device, the organic layer which comprises the metal complex is a light-emitting layer.

According to an embodiment of the present disclosure, the device emits green light.

According to an embodiment of the present disclosure, the device emits white light.

According to an embodiment of the present disclosure, the device emits yellow light.

According to an embodiment of the present disclosure, the device emits blue light.

According to an embodiment of the present disclosure, the light-emitting layer of the device further comprises a first host compound.

According to an embodiment of the present disclosure, the light-emitting layer of the device further comprises a first host compound and a second host compound.

According to an embodiment of the present disclosure, in the device, the first host compound and/or the second host compound is selected from the group consisting of: benzene, pyridine, pyrimidine, triazine, carbazole, azacarbazole, indole carbazole, dibenzothiophene, azadibenzothiophene, dibenzofuran, azadibenzofuran, dibenzoselenium Phenene, triphenylene, azatriphenylene, fluorene, silicofluorene, naphthalene, quinoline, isoquinoline, quinazoline, quinoxaline, phenanthrene, azaphenanthrene, and combinations thereof.

According to an embodiment of the present disclosure, in the device, the first host compound has a structure represented by Formula 5:

Formula 5

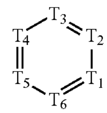

wherein, $T_1$ to $T_6$ are, at each occurrence identically or differently, selected from C, $CR_t$ or N, and at least two of $T_1$ to $T_6$ are N, at least one of $T_1$ to $T_6$ is C and connected with at least one of Formula A, Formula B, Formula C or Formula D;

Formula A

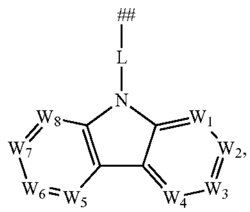

Formula B

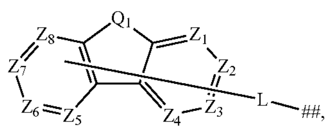

Formula C

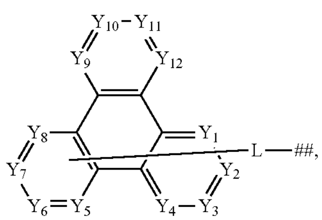

Formula D

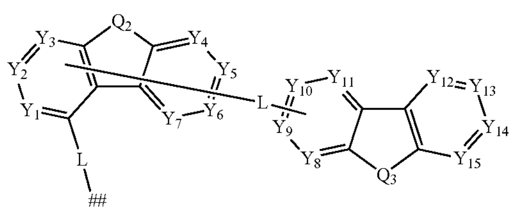

wherein, in Formula A, Formula B, Formula C and Formula D;

$Q_1$, $Q_2$ and $Q_3$ are, at each occurrence identically or differently, selected from the group consisting of: O, S, Se, $NR_q$, $CR_qR_q$, and $SiR_qR_q$; when two $R_q$ exist at the same time, the two $R_q$ are the same or different;

L is, at each occurrence identically or differently, selected from single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or a combination thereof;

$W_1$ to $W_8$ are, at each occurrence identically or differently, selected from $CR_w$ or N;

$Z_1$ to $Z_8$ are, at each occurrence identically or differently, selected from C, $CR_z$ or N, and at least one of $Z_1$ to $Z_8$ is C and connected with L;

$Y_1$ to $Y_{15}$ are, at each occurrence identically or differently, selected from C, $CR_y$ or N, and in Formula C at least one of $Y_1$ to $Y_8$ is C and connected with L; in Formula D at least one of $Y_1$ to $Y_7$ is C, $Y_8$ to $Y_{11}$ is C and connected with L;

$R_t$, $R_q$, $R_w$, $R_y$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

"##" represents the position where Formula A, Formula B, Formula C and Formula D is connected to Formula 5;

adjacent substituents $R_t$, $R_q$, $R_w$, $R_y$ and $R_z$ can be optionally joined to form a ring.

In this embodiment, "the adjacent substituent $R_t$, $R_q$, $R_w$, $R_y$ and $R_z$ can be optionally joined to form a ring" is intended to mean that for the groups of adjacent substituents, such as two substituents $R_t$, two substituents $R_q$, two substituents $R_w$, two substituents $R_y$, two substituents $R_z$, substituents $R_q$ and $R_z$ and substituents $R_q$ and $R_y$, any one or more of these groups of adjacent substituents can be joined to form a ring; obviously, any of these groups of substituents may not be joined to form a ring.

According to an embodiment of the present disclosure, in the device, the first host compound has a structure represented by one of Formula 5a to Formula 5e:

Formula 5a

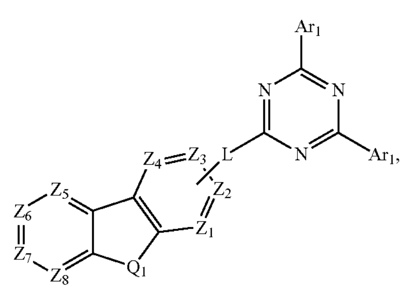

-continued

Formula 5b

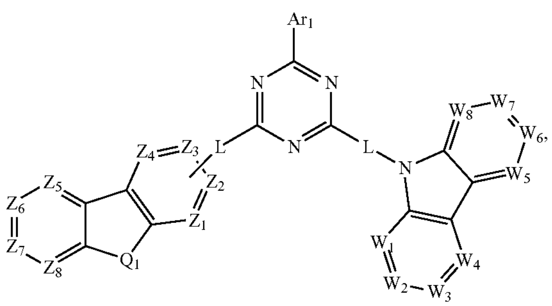

Formula 5c

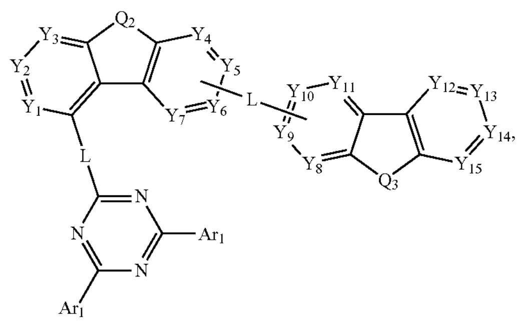

Formula 5d

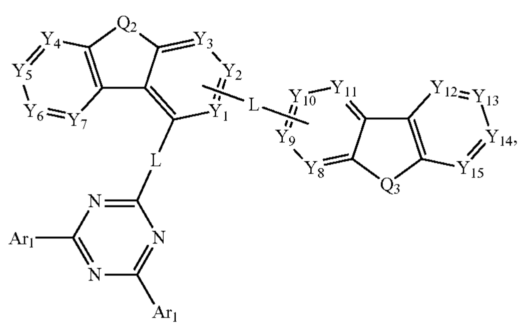

Formula 5e

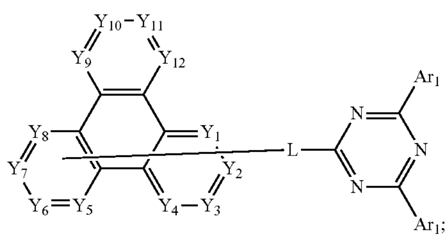

wherein in Formula 5a to Formula 5e;

$Q_1$, $Q_2$ and $Q_3$ are, at each occurrence identically or differently, selected from the group consisting of: O, S, Se, $NR_q$, $CR_qR_q$, and $SiR_qR_q$; when two $R_q$ exist at the same time, the two $R_q$ are the same or different;

L is, at each occurrence identically or differently, selected from single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or a combination thereof;

$Ar_1$ is, at each occurrence identically or differently, selected from substituted or unsubstituted aryl group having 6 to 30 carbon atoms, substituted or unsubstituted heteroaryl having 3 to 30 carbon atoms, or a combination thereof;

$W_1$ to $W_8$ are, at each occurrence identically or differently, selected from $CR_w$ or N;

$Z_1$ to $Z_8$ are, at each occurrence identically or differently, selected from C, $CR_z$ or N, and at least one of $Z_1$ to $Z_8$ is C and connected with L;

$Y_1$ to $Y_{15}$ are, at each occurrence identically or differently, selected from C, $CR_y$ or N, and in Formula C at least one of $Y_1$ to $Y_8$ is C and connected with L; in Formula D at least one of $Y_1$ to $Y_7$ is C, $Y_8$ to $Y_1$ is C and connected with L;

$R_q$, $R_w$, $R_y$ and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof; adjacent substituents $R_t$, $R_q$, $R_w$, $R_y$ and $R_z$ can be optionally joined to form a ring.

According to an embodiment of the present disclosure, wherein in Formula 5a or Formula 5b, at least one of $Z_1$ to $Z_8$ is $CR_z$, and the $R_z$ is selected from substituted or unsubstituted aryl having 6 to 30 carbon atoms, substituted or unsubstituted heteroaryl having 3 to 30 carbon atoms, or a combination thereof.

According to an embodiment of the present disclosure, wherein in the device, the first host compound is selected from the group consisting of: Compound 2a-1 to Compound 2a-45, Compound 2b-1 to Compound 2b-63, Compound 2c-1 to Compound 2c-80, Compound 2d-1 to Compound 2d-27, Compound 2e-1 to Compound 2e-27, Compound 2f-1 to Compound 2f-21, Compound 2g-1 to Compound 2g-81; wherein, the specific structures of Compound 2a-1 to Compound 2a-45, Compound 2b-1 to Compound 2b-63, Compound 2c-1 to Compound 2c-80. Compound 2d-1 to Compound 2d-27, Compound 2e-1 to Compound 2e-27, Compound 2f-1 to Compound 2f-21, Compound 2g-1 to Compound 2g-81 are referred to claim 25.

According to an embodiment of the present disclosure, wherein in the device, the second host compound has a structure represented by Formula X:

Formula X

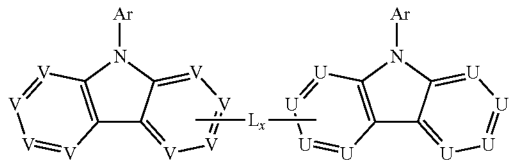

wherein, $L_x$ is, at each occurrence identically or differently, selected from single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or a combination thereof;

V is, at each occurrence identically or differently, selected from C, $CR_v$ or N; and at least one of V is C and connected with $L_x$;

U is, at each occurrence identically or differently, selected from C, $CR_u$ or N; and at least one of U is C and connected with $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

Ar is, at each occurrence identically or differently, selected from substituted or unsubstituted aryl having 6 to 30 carbon atoms, substituted or unsubstituted heteroaryl having 3 to 30 carbon atoms, or combinations thereof;

adjacent substituents $R_v$ and $R_u$ can be optionally joined to form a ring.

In this disclosure, "the adjacent substituent $R_v$ and $R_u$ can be optionally joined to form a ring" is intended to mean that for the groups of adjacent substituents, such as two substituents $R_v$, two substituents $R_u$, and substituents $R_v$ and $R_u$, any one or more of these groups of adjacent substituents can be joined to form a ring; obviously, any of these groups of substituents may not be joined to form a ring.

According to an embodiment of the present disclosure, wherein in the device, the second host compound has a structure represented by any one of Formula X-a to Formula X-j:

X-a

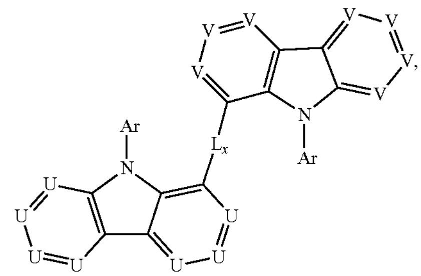

X-b

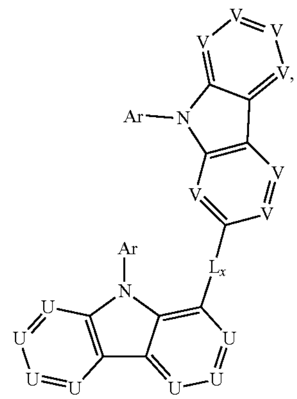

X-c

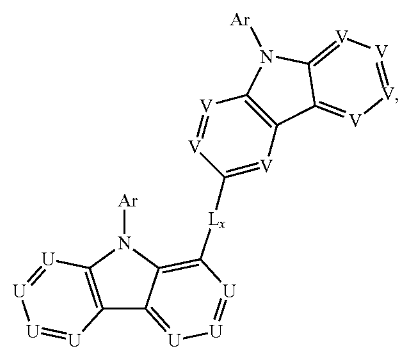

X-d

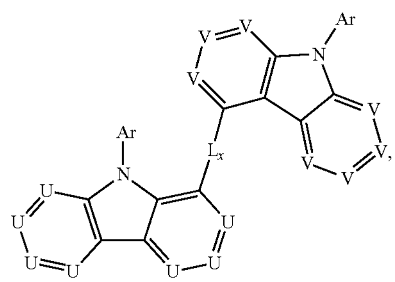

X-e

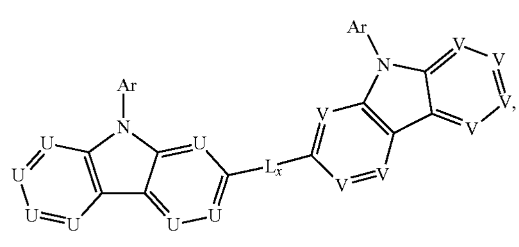

-continued

X-f

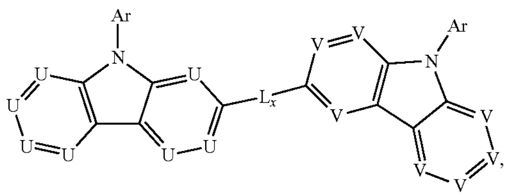

X-g

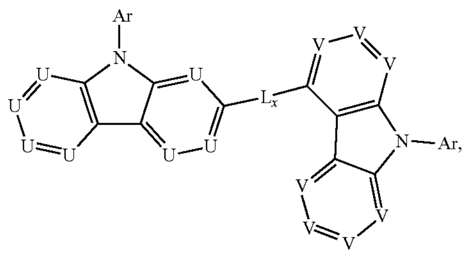

X-h

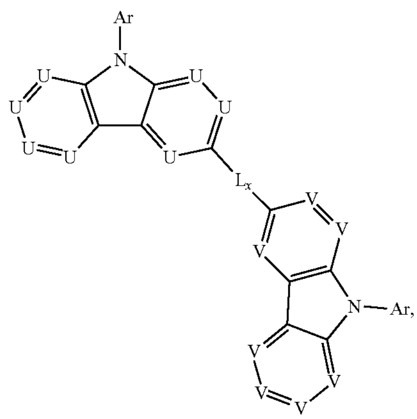

X-i

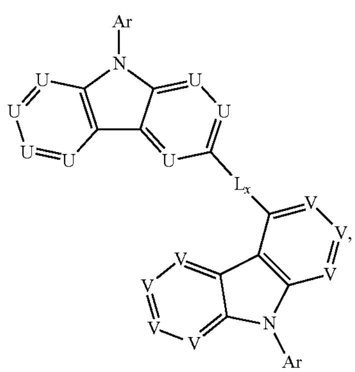

X-j

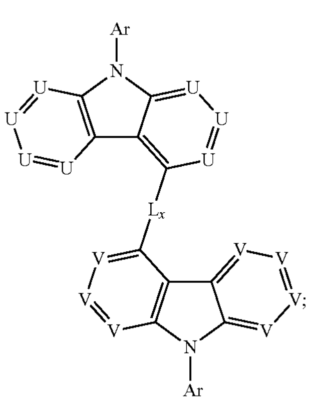

wherein, $L_x$ is, at each occurrence identically or differently, selected from single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or a combination thereof;

V is, at each occurrence identically or differently, selected from C, $CR_v$ or N;

U is, at each occurrence identically or differently, selected from C, $CR_u$ or N;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

Ar is, at each occurrence identically or differently, selected from substituted or unsubstituted aryl having 6 to 30 carbon atoms, substituted or unsubstituted heteroaryl having 3 to 30 carbon atoms, or combinations thereof;

adjacent substituents $R_v$ and $R_u$ can be optionally joined to form a ring.

According to an embodiment of the present disclosure, wherein in the device, the second host compound is selected from the group consisting of: Compound X-1 to Compound X-144, wherein the specific structures of Compound X-1 to Compound X-144 are referred to claim 27.

According to an embodiment of the present disclosure, wherein in the device, the metal complex is doped in the first host compound and the second host compound, and the weight of the metal complex accounts for 1% to 30% of the total weight of the light-emitting layer.

According to an embodiment of the present disclosure, wherein in the device, the metal complex is doped in the first host compound and the second host compound, and the weight of the metal complex accounts for 3% to 13% of the total weight of the light-emitting layer.

According to an embodiment of the present disclosure, disclosed is a compound composition and the compound composition comprises the metal complex which is as shown in any one of the embodiments described above.

Combination with Other Materials

The materials described in the present disclosure for a particular layer in an organic light emitting device can be used in combination with various other materials present in the device.

The combinations of these materials are described in more detail in U.S. Pat. App. No. 20160359122 at paragraphs 0132-0161, which is incorporated by reference herein in its entirety.

The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, the light-emitting dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Material Synthesis Example

The method for preparing a compound of the present disclosure is not limited herein. Typically, the following compounds are taken as examples without limitations, and synthesis routes and preparation methods thereof are described below.

The synthetic route and preparation method of metal complex M-214-1 are as follows:

Step 1:

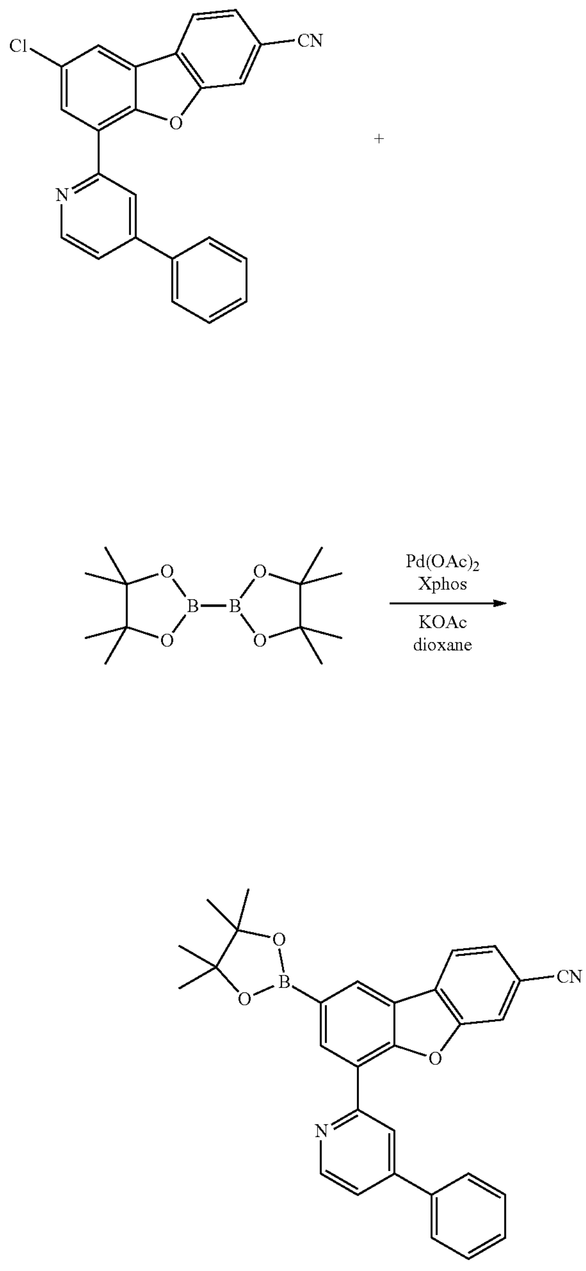

Intermediate 1

8-chloro-6-(4-phenylpyridine)-2-dibenzofuran-3-benzonitrile (1.9 g, 5.0 mmol), bis(pinacolato)diboron (1.5 g, 6.0 mmol), Xphos (0.2 g, 0.4 mmol), palladium acetate (0.05 g, 0.2 mmol), potassium acetate (0.7 g, 7.5 mmol) and dioxane (60 mL) were sequentially added to a dry 250 mL round-bottom flask, heated to reflux under nitrogen protection and stirred overnight.

After the reaction was completed, the product was filtered with Celite and anhydrous magnesium sulfate, washed twice with ethyl acetate, and the organic phase were collected and concentrated under reduced pressure to obtain intermediate 1 (crude product), which was directly used in the next step.

Step 2:

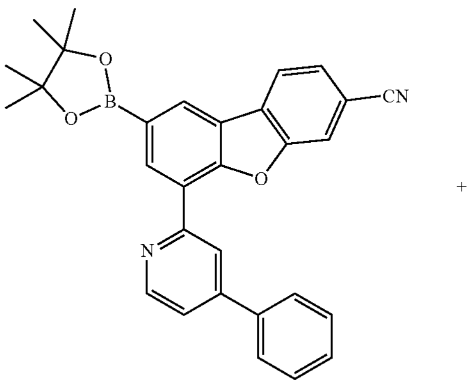

Intermediate 1

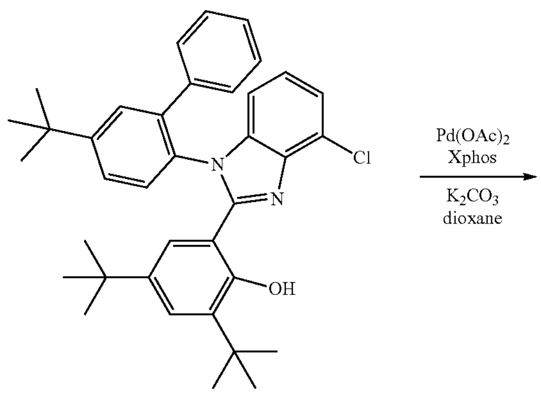

Intermediate 2

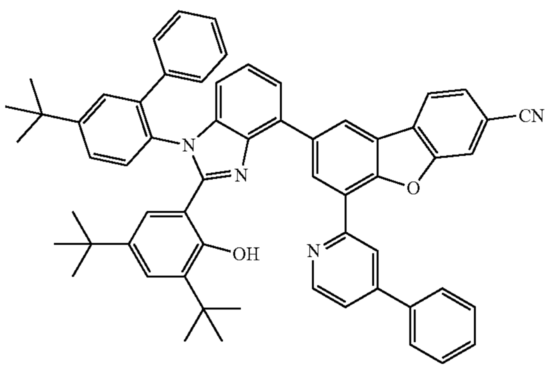

Intermediate 3

Intermediate 1 (crude product), intermediate 2 (3.1 g, 5.5 mmol), Xphos (0.2 g, 0.4 mmol), palladium acetate (0.05 g, 0.2 mmol), potassium carbonate (1.1 g, 7.5 mmol), dioxane (60 mL) and water (20 mL) were sequentially added to a dry 250 mL round-bottom flask, heated to reflux for 72 h under nitrogen protection. After the completion of the reaction, the mixture was extracted with dichloromethane, washed three times with saturated brine, dried over anhydrous magnesium sulfate, and concentrated under reduced pressure. The crude product was purified by column chromatography to give 3.9 g of intermediate 3 as a white solid (89.2% yield). The structure of the product was confirmed by NMR and LCMS, and the molecular weight was 874.4.

Step 3:

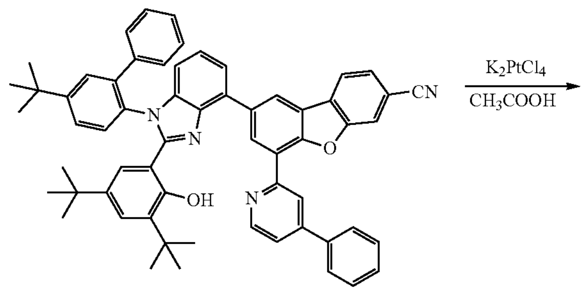

Intermediate 3

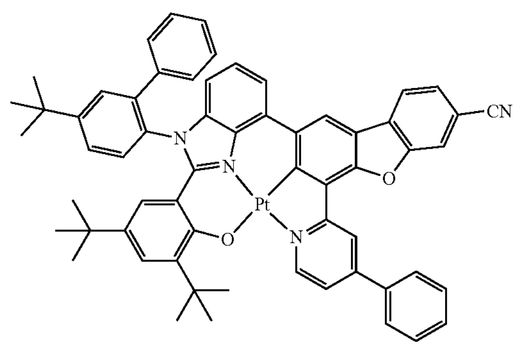

M-214-1

Intermediate 3 (1.5 g, 1.7 mmol), potassium chloroplatinate (0.66 g, 1.6 mmol), and acetic acid (40 mL) were sequentially added to a dry 250 mL round-bottom flask, heated to reflux for 60 h under nitrogen protection. After the reaction was cooled, water was added and filtered. Methanol and n-hexane were washed twice respectively, the filter cake was dissolved in dichloromethane, the organic phase was collected, concentrated under reduced pressure, and purified by column chromatography to give metal complex M-214-1 as a yellow solid (0.5 g, 30.0% yield). The structure of the product was confirmed as the target product by NMR and LCMS, and the molecular weight was 1067.4.

The synthetic route and preparation method of metal complex M-174-1 are as follows:

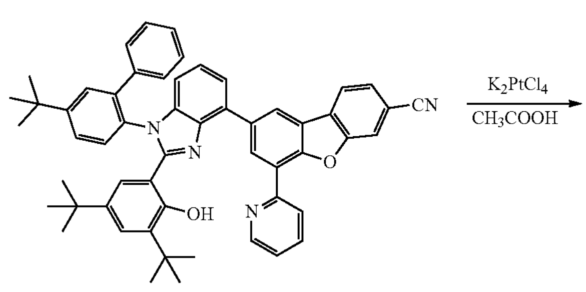

Intermediate 4

-continued

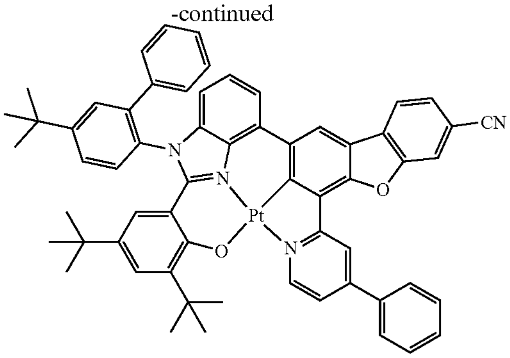

M-174-1

Intermediate 4 (2.3 g, 3.0 mmol), potassium chloroplatinate (1.09 g, 2.6 mmol), and acetic acid (60 mL) were sequentially added to a dry 250 mL round-bottom flask, heated to reflux for 60 h under nitrogen protection. After the reaction was cooled, water was added and filtered. Methanol and n-hexane were washed twice respectively, the filter cake was dissolved in dichloromethane, the organic phase was collected, concentrated under reduced pressure, and purified by column chromatography to give metal complex M-174-1 as a yellow solid (1.3 g, 50.0% yield). The structure of the product was confirmed as the target product by NMR and LCMS, and the molecular weight was 991.3.

The synthetic route and preparation method of metal complex M-179-1 are as follows:

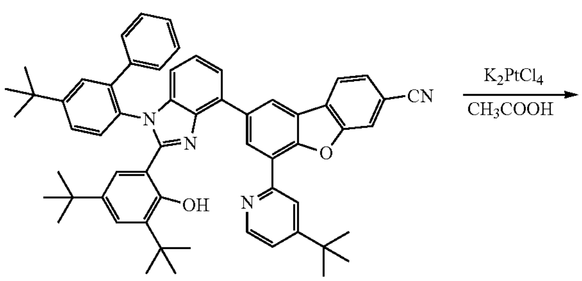

Intermediate 5

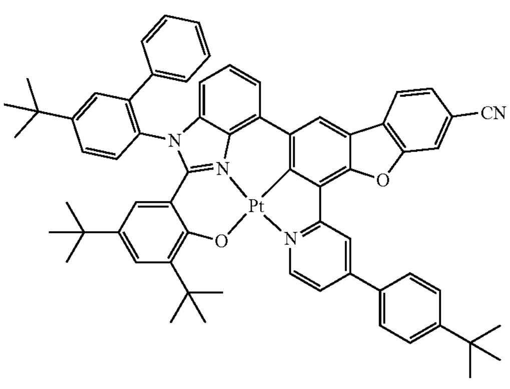

M-179-1

Intermediate 5 (1.4 g, 1.7 mmol), potassium chloroplatinate (0.63 g, 1.5 mmol), and acetic acid (60 mL) were sequentially added to a dry 250 mL round-bottom flask, heated to reflux for 60 h under nitrogen protection. After the reaction was cooled, water was added and filtered. Methanol and n-hexane were washed twice respectively, the filter cake was dissolved in dichloromethane, the organic phase was collected, concentrated under reduced pressure, and purified by column chromatography to give metal complex M-179-1 as a yellow solid (0.54 g, 34.4% yield). The structure of the product was confirmed as the target product by NMR and LCMS, and the molecular weight was 1047.4.

The synthetic route and preparation method of metal complex M-270-1 are as follows:

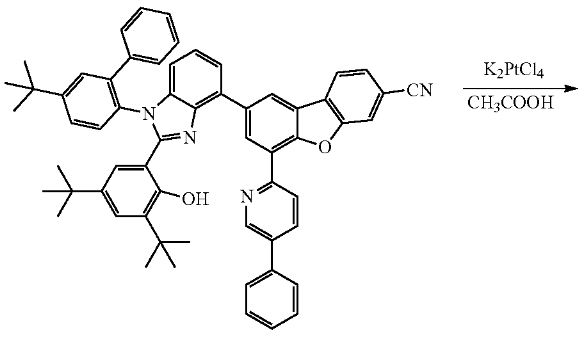

Intermediate 6

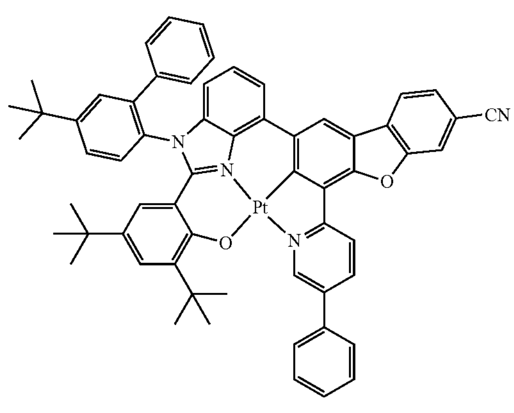

M-270-1

Intermediate 6 (0.57 g, 0.65 mmol), potassium chloroplatinate (0.24 g, 0.59 mmol), and acetic acid (60 mL) were sequentially added to a dry 250 mL round-bottom flask, heated to reflux for 60 h under nitrogen protection. After the reaction was cooled, water was added and filtered. Methanol and n-hexane were washed twice respectively, the filter cake was dissolved in dichloromethane, the organic phase was collected, concentrated under reduced pressure, and purified by column chromatography to give metal complex M-270-1 as a yellow solid (0.28 g, 44.4% yield). The structure of the product was confirmed as the target product by NMR and LCMS, and the molecular weight was 1067.4.

The persons skilled in the art will appreciate that the above preparation methods are merely examples. The persons skilled in the art can obtain other compound structures of the present disclosure through the modifications of the preparation methods.

Device Example 1

First, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about 108 torr. Compound HI was used as a hole injection layer (HIL). Compound HT was used as a hole transporting layer (HTL). Compound X-4 was used as an electron blocking layer (EBL). Metal Complex M-214-1 of the present disclosure was used as a dopant and co-deposited with Compound X-4 and Compound 2c-31 as an emissive layer (EML). On the EML, Compound H-1 was used as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited as an electron injection layer with a thickness of 1 nm and Al was deposited as a cathode with a thickness of 120 nm. The device was transferred back to the glovebox and encapsulated with a glass lid to complete the device.

Device Comparative Example 1

The implementation mode in Device Comparative Example 1 was the same as that in Device Example 1, except that in the EML, Metal Complex M-214-1 of the present disclosure was replaced with Comparative Compound GD1.

Detailed structures and thicknesses of layers of the devices are shown in the following table. The layers using more than one material are obtained by doping different compounds at a weight ratio as recorded in the following stable.

TABLE 1

Device structures of Example 1 and Comparative Example 1

| Device ID | HIL | HTL | EBL | EML | HBL | ETL |
|---|---|---|---|---|---|---|
| Example 1 | Compound HI (100 Å) | Compound HT (350 Å) | Compound X-4 (50 Å) | Compound X-4:Compound 2c-31:Metal Complex M-214-1 (31:63: 6) (400 Å) | Compound H-1 (50 Å) | Compound ET:Liq (40:60) (350 Å) |
| Comparative Example 1 | Compound HI (100 Å) | Compound HT (350 Å) | Compound X-4 (50 Å) | Compound X-4:Compound 2c-31:Metal Complex GD1 (31:63: 6) (400 Å) | Compound H-1 (50 Å) | Compound ET:Liq (40:60) (350 Å) |

The structures of the materials used in the devices are shown as follows:

Compound HI

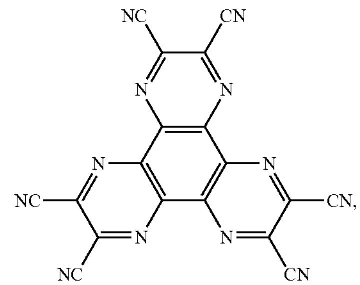

Compound HT

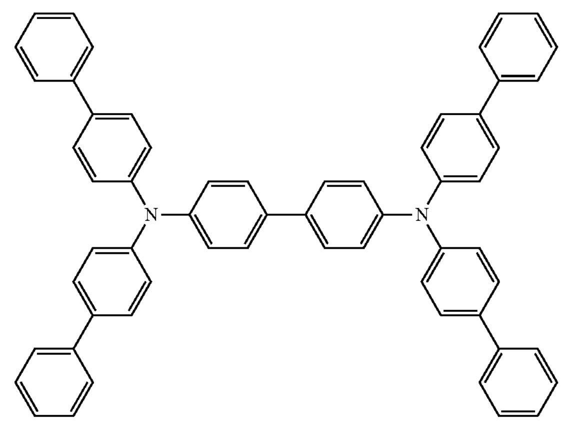

Compound X-4

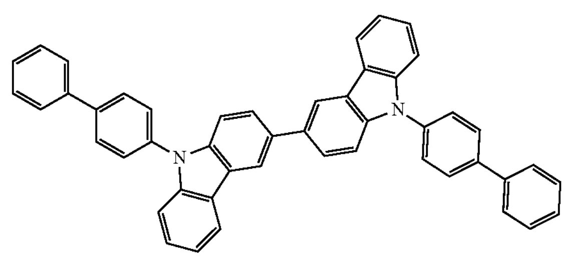

-continued 2C-31

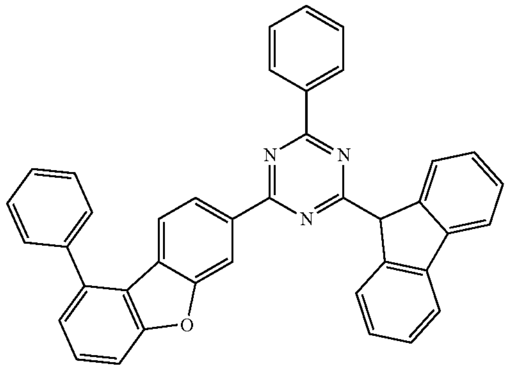

H-1

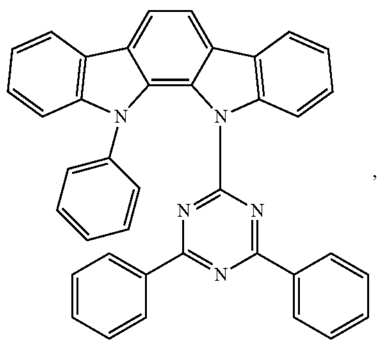

,

M-214-1

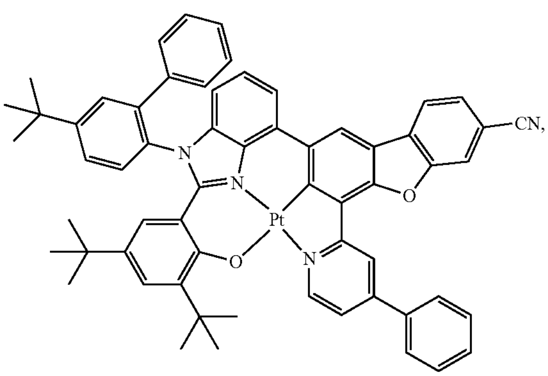

-continued

GD1

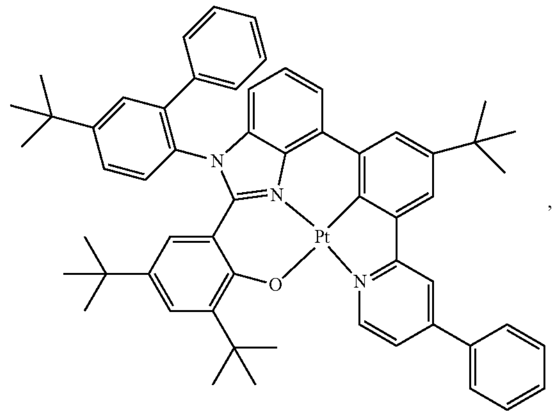

,

Liq

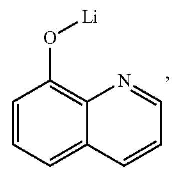

,

Compoud ET

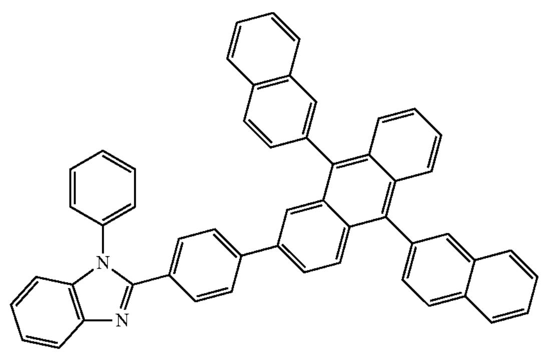

.

Current-voltage-luminance (IVL) characteristics of the devices were measured. The CIE data, maximum emission wavelength ($\lambda_{max}$), full width at half maximum (FWHM), voltage (V), current efficiency (CE), power efficiency (PE) and external quantum efficiency (EQE) of each device were measured at 1000 cd/m$^2$. The Lifetime (LT97) data was tested at a constant current of 80 mA/cm$^2$. The data was recorded and shown in Table 2.

TABLE 2

Device data of Example 1 and Comparative Example 1

| Device ID | CIE (x, y) | $\lambda_{max}$ (nm) | FWHM (nm) | Voltage (V) | CE (cd/A) | PE (lm/W) | EQE (%) | LT 97 (h) |
|---|---|---|---|---|---|---|---|---|
| Example 1 | (0.404, 0.585) | 546 | 32.3 | 2.81 | 109 | 122 | 28.37 | 20.0 |
| Comparative Example 1 | (0.342, 0.625) | 528 | 62.0 | 3.10 | 102 | 103 | 26.83 | 8.0 |

Discussion:

As can be seen in Table 2, the Device Example 1 using the metal complex of the present disclosure exhibit several advantages over the Comparative Example 1. Compared with Comparative Example 1, Example 1 exhibits many properties unexpectedly, Example 1 achieves a very high EQE efficiency of 28.37%, Compared with Comparative Example 1, the driving voltage is reduced by 0.29 V, the CE is increased by nearly 6.8%, and the PE is increased by nearly 18.4%. More unexpectedly, Example 1 has a very narrow emission peak width of only 32.3 nm, which is significantly lower than that of Comparative Example 1 of 62.0 nm, that is unprecedented in green phosphorescent devices. $n addition, the device lifetime of Example 1 was improved by 150% compared to Comparative Example 1.

Device Example 2

The implementation mode in Device Example 2 was the same as that in Device Example 1, except that in the EML, Metal Complex M-214-1 of the present disclosure was replaced with Metal Complex M-174-1 of the present disclosure.

Device Example 3

The implementation mode in Device Example 3 was the same as that in Device Example 1, except that in the EML, Metal Complex M-214-1 of the present disclosure was replaced with Metal Complex M-179-1 of the present disclosure.

Device Example 4

The implementation mode in Device Example 4 was the same as that in Device Example 1, except that in the EML, Metal Complex M-214-1 of the present disclosure was replaced with Metal Complex M-270-1 of the present disclosure.

TABLE 3

Device structures of Examples 2-4

| Device ID | HIL | HTL | EBL | EML | HBL | ETL |
|---|---|---|---|---|---|---|
| Example 2 | Compound HI (100 Å) | Compound HT (350 Å) | Compound X-4 (50 Å) | Compound X-4:Compound 2c-31:Metal Complex M-174-1 (31:63:6) (400 Å) | Compound H-1 (50 Å) | Compound ET:Liq (40:60) (350 Å) |
| Example 3 | Compound HI (100 Å) | Compound HT (350 Å) | Compound X-4 (50 Å) | Compound X-4:Compound 2c-31:Metal Complex M-179-1 (31:63:6) (400 Å) | Compound H-1 (50 Å) | Compound ET:Liq (40:60) (350 Å) |
| Example 4 | Compound HI (100 Å) | Compound HT (350 Å) | Compound X-4 (50 Å) | Compound X-4:Compound 2c-31:Metal Complex M-270-1 (31:63:6) (400 Å) | Compound H-1 (50 Å) | Compound ET:Liq (40:60) (350 Å) |

The structures of the new materials used in the devices are shown as follows:

M-174-1

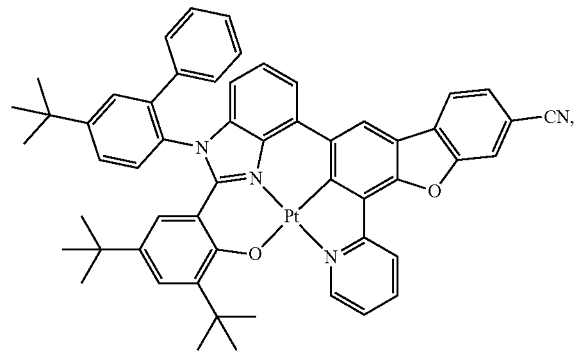

M-179-1

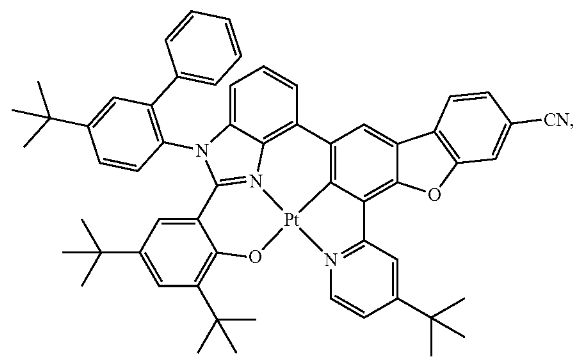

-continued

M-270-1

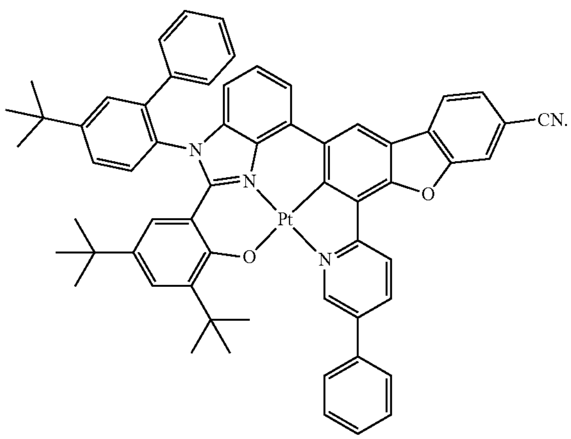

Current-voltage-luminance (IVL) characteristics of the devices were measured. The CIE data, maximum emission wavelength ($\lambda_{max}$), full width at half maximum (FWHM), voltage (V) of each device were measured at 1000 cd/m$^2$. The Lifetime (LT97) data was tested at a constant current of 80 mA/cm$^2$. The data was recorded and shown in Table 4.

TABLE 4

Device data of Example 2-4

| 器件 ID | CIE (x, y) | $\lambda_{max}$ (nm) | FWHM (nm) | Voltage (V) | LT 97 (h) |
|---|---|---|---|---|---|
| Example 2 | (0.396, 0.598) | 538 | 25.8 | 2.70 | 14.1 |
| Example 3 | (0.377, 0.605) | 536 | 26.6 | 2.71 | 15.1 |
| Example 4 | (0.464, 0.531) | 556 | 30.4 | 2.70 | 25.3 |

Discussion:

As can be seen in Table 4, the Device Examples with the metal complexes of the present disclosure exhibit many advantages over the device Comparative Example 1. Compared with Comparative Example 1, the driving voltage of Examples 2-4 is reduced by about 0.4 V, and more unexpectedly, Examples 2-4 have very narrow full width at half maximum of 25.8 nm, 26.6 nm and 30.4 nm, respectively, a significant decrease compared to 62.0 nm of Comparative Example 1, which is unprecedented in phosphorescent devices. In addition, compared with Comparative Example 1, the device lifetimes of Examples 2-4 have been greatly improved to different degrees, and have been increased by 76%, 88% and 216%, respectively.

To sum up, in the application of the device, the metal complex of the present disclosure can significantly improve the lifetime, reduce the FWHM and driving voltage, and at the same time improve the device efficiency and greatly improve the comprehensive performance of the device. The advantages exhibited by the metal complex of the present disclosure in device performance are of great help for improving the level of the device, and have great advantages and broad prospects in industrial applications.

It is to be understood that various embodiments described herein are merely exemplary and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It is to be understood that various theories as to why the present disclosure works are not intended to be limitative.

What is claimed is:

1. A metal complex, which has a structure represented by Formula 1-15:

Formula 1-15

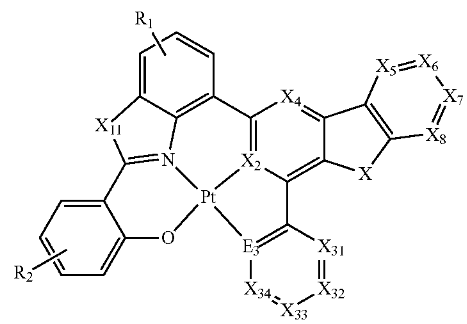

wherein, $E_3$ is, at each occurrence identically or differently, selected from C or N;

$R_1$ and $R_2$ represent, at each occurrence identically or differently, mono-substitution, multiple substitutions, or non-substitution;

X is selected from the group consisting of: O, S, Se, NR", CR"R", SiR"R" and GeR"R"; when two R" exist at the same time, the two R" are the same or different;

$X_2$, $X_4$ to $X_8$ are, at each occurrence identically or differently, selected from C, $CR_x$ or N;

$X_{11}$ is selected from O, S, Se or $NR_1$;

$X_{31}$ to $X_{34}$ are, at each occurrence identically or differently, selected from $CR_3$ or N;

at least one of $X_5$ to $X_8$ is selected from $CR_x$ and the $R_x$ is a cyano group;

$R_1$, $R_2$, $R_3$, R" and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$, $R_2$, $R_3$, R" and $R_x$ can be optionally joined to form a ring.

2. The metal complex according to claim 1, wherein the metal complex has a structure that is represented by Formula 1-15:

Formula 1-15

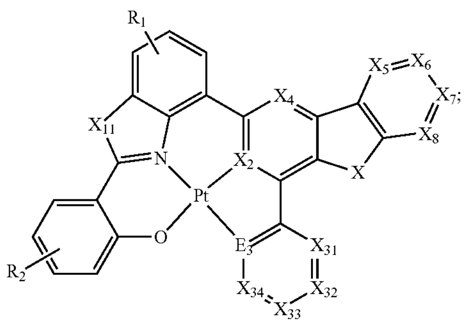

wherein,

X is selected from the group consisting of: O, S, and Se;

$E_3$ is selected from C or N;

in Formula 1-15, $X_{31}$ to $X_{34}$ are, at each occurrence identically or differently, selected from $CR_3$ or N;

$X_2$, $X_4$ to $X_8$ are, at each occurrence identically or differently, selected from C, $CR_x$ or N;

at least one of $X_5$ to $X_8$ is selected from $CR_x$ and the $R_x$ is a cyano group;

$R_1$ and $R_2$ represent, at each occurrence identically or differently, mono-substitution, multiple substitutions, or non-substitution;

$R_1$, $R_2$, $R_3$, and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents $R_1$, $R_2$, $R_3$, and $R_x$ can be optionally joined to form a ring.

3. The metal complex according to claim 2, wherein X is O.

4. The metal complex according to claim 2, wherein $X_{11}$ is $NR_1$.

5. The metal complex according to claim 1, wherein $R_1$, $R_2$ and $R_3$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof.

6. The metal complex according to claim 1, wherein at least one or two or three of $R_1$, $R_2$ and $R_3$ is/are selected from substituted or unsubstituted alkyl having 3 to 12 carbon atoms.

7. The metal complex according to claim 1, wherein at least two of $X_5$ to $X_{80}$ are $CR_x$, and one of the $R_x$ is a cyano group; at least one of the remaining $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

8. The metal complex according to claim 2, wherein at least two of $X_5$ to $X_8$ are selected from $CR_x$, and one of the $R_x$ is a cyano group; at least one of the remaining $R_x$ is selected from substituted or unsubstituted aryl having 6 to 30 carbon atoms, substituted or unsubstituted heteroaryl having 3 to 30 carbon atoms, or combinations thereof.

9. The metal complex according to claim 2, wherein at least two of $X_5$ to $X_8$ are selected from $CR_x$, and one of the $R_x$ is a cyano group; at least one of the remaining $R_x$ is selected from the substituted or unsubstituted group consisting of: benzene, pyridine, pyrimidine, triazine, naphthalene, phenanthrene, anthracene, fluorene, silicon fluorene, quinoline, isoquinoline, dithiophene, difuran, benzofuran, benzothiophene, dibenzofuran, dibenzothiophene, triphenylene, carbazole, azacarbazole, azafluorene, azasilfluorene, azadibenzofuran, azadibenzothiophene and combinations thereof.

10. The metal complex according to claim 1, wherein at least one of $X_5$ to $X_8$ is $CR_x$, and the $R_x$ is a cyano group; at least another one of $X_5$ to $X_8$ is selected from $CR_x$, and the $R_x$ has a structure represented by Formula 3:

Formula 3

$$**—K_1—(K_2)_b—R_{k1}$$

b is selected from 0, 1, 2, 3, 4 or 5;

$K_1$ and $K_2$ are, at each occurrence identically or differently, selected from O, S, Se, $NR_k$, $SiR_kR_k$, $GeR_kR_k$, $BR_k$, $PR_k$, $P(O)R_k$, substituted or unsubstituted alkylene groups having 1 to 20 carbon atoms, substituted or unsubstituted heteroalkylene having 1 to 20 carbon atoms, substituted or unsubstituted cycloalkylene having 3 to 20 carbon atoms alkyl, substituted or unsubstituted heterocyclylene having 3 to 20 ring atoms, substituted or unsubstituted arylene having 6 to 30 carbon atoms, substituted or unsubstituted heteroarylene having 3 to 30 carbon atoms, and combinations thereof;

$R_k$ and $R_{k1}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof, adjacent substituents can be optionally joined to form a ring;

"* *" represents the position that is connected to Formula 3.

11. The metal complex according to claim 10, wherein the length of the Formula 3 is greater than 3.8 Å.

12. The metal complex according to claim 1, wherein at least one of $X_5$ to $X_8$ is $CR_x$, and the $R_x$ is a cyano group; at least another one of $X_5$ to $X_8$ is selected from $CR_x$, and the $R_x$ has a structure represented by Formula 4:

Formula 4

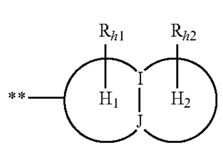

I and J are, at each occurrence identically or differently, selected from C, CR''', N, SiR''', and GeR''';

$R_{h1}$ and $R_{h2}$ represent, at each occurrence identically or differently, mono-substitution, multiple substitutions, or non-substitution;

ring $H_1$ and ring $H_2$ are fused through I and J;

ring $H_1$ and ring $H_2$ are, at each occurrence identically or differently, selected from an alicyclic ring having 3 to 30 ring atoms, a heterocyclic ring having 3 to 30 ring atoms, an aromatic ring having 6 to 30 ring atoms, a heteroaromatic ring having 5 to 30 ring atoms, or a combination thereof;

R''', $R_{h1}$ and $R_{h2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

adjacent substituents R''', $R_{h1}$ and $R_{h2}$ can be optionally joined to form a ring;

"* *" represents the position that is connected to Formula 4.

13. The metal complex according to claim 1, wherein the metal complex is selected from any one of the following groups:

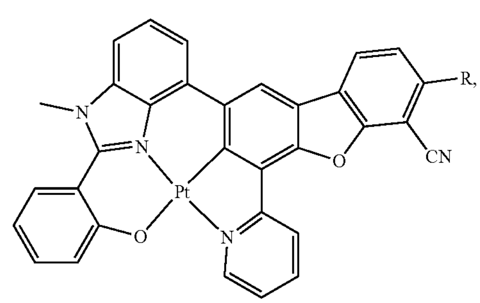

R = H M-65-1, R = D M-65-2
R = $CD_3$ M-65-3, R = Ph M-65-4
R = $R_a$ M-65-5, R = $R_b$ M-65-6
R = $R_c$ M-65-7, R = $R_d$ M-65-8
R = $R_e$ M-65-9, R = $R_f$ M-65-10

-continued

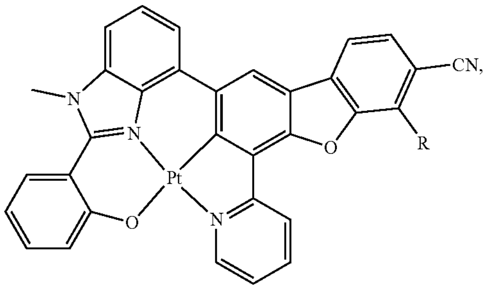

R = H M-66-1, R = D M-66-2
R = $CD_3$ M-66-3, R = Ph M-66-4
R = $R_a$ M-66-5, R = $R_b$ M-66-6
R = $R_c$ M-66-7, R = $R_d$ M-66-8
R = $R_e$ M-66-9, R = $R_f$ M-66-10

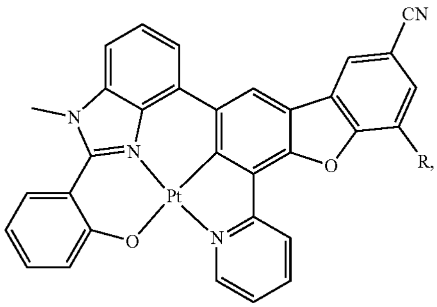

R = H M-67-1, R = D M-67-2
R = $CD_3$ M-67-3, R = Ph M-67-4
R = $R_a$ M-67-5, R = $R_b$ M-67-6
R = $R_c$ M-67-7, R = $R_d$ M-67-8
R = $R_e$ M-67-9, R = $R_f$ M-67-10

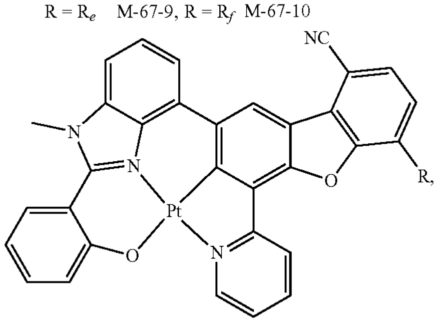

R = H M-68-1, R = D M-68-2
R = $CD_3$ M-68-3, R = Ph M-68-4
R = $R_a$ M-68-5, R = $R_b$ M-68-6
R = $R_c$ M-68-7, R = $R_d$ M-68-8
R = $R_e$ M-68-9, R = $R_f$ M-68-10

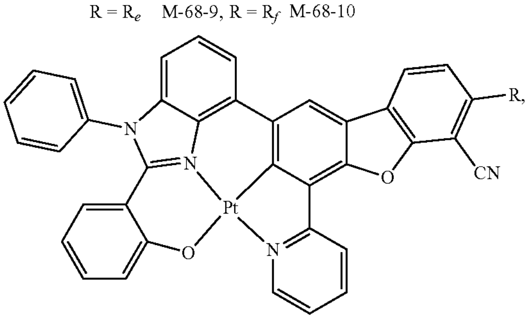

R = H M-69-1, R = D M-69-2
R = $CD_3$ M-69-3, R = Ph M-69-4
R = $R_a$ M-69-5, R = $R_b$ M-69-6
R = $R_c$ M-69-7, R = $R_d$ M-69-8
R = $R_e$ M-69-9, R = $R_f$ M-69-10

-continued

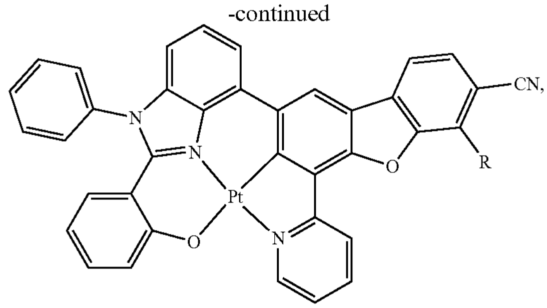

R = H M-70-1, R = D M-70-2
R = $CD_3$ M-70-3, R = Ph M-70-4
R = $R_a$ M-70-5, R = $R_b$ M-70-6
R = $R_c$ M-70-7, R = $R_d$ M-70-8
R = $R_e$ M-70-9, R = $R_f$ M-70-10

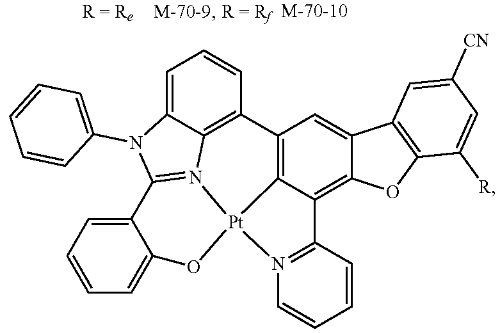

R = H M-71-1, R = D M-71-2
R = $CD_3$ M-71-3, R = Ph M-71-4
R = $R_a$ M-71-5, R = $R_b$ M-71-6
R = $R_c$ M-71-7, R = $R_d$ M-71-8
R = $R_e$ M-71-9, R = $R_f$ M-71-10

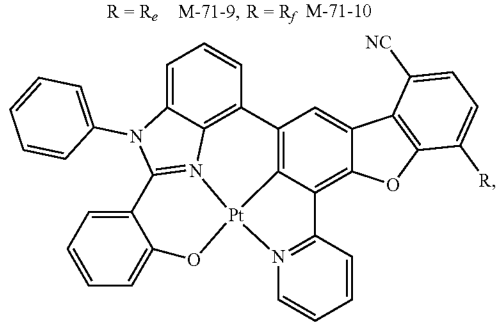

R = H M-72-1, R = D M-72-2
R = $CD_3$ M-72-3, R = Ph M-72-4
R = $R_a$ M-72-5, R = $R_b$ M-72-6
R = $R_c$ M-72-7, R = $R_d$ M-72-8
R = $R_e$ M-72-9, R = $R_f$ M-72-10

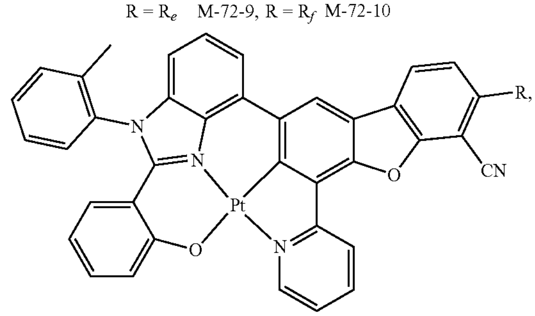

R = H M-73-1, R = D M-73-2
R = $CD_3$ M-73-3, R = Ph M-73-4
R = $R_a$ M-73-5, R = $R_b$ M-73-6
R = $R_c$ M-73-7, R = $R_d$ M-73-8
R = $R_e$ M-73-9, R = $R_f$ M-73-10

-continued

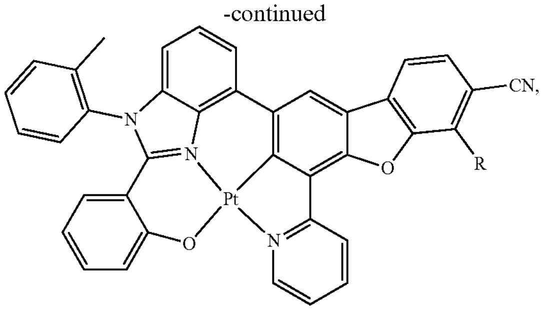

R = H M-74-1, R = D M-74-2
R = $CD_3$ M-74-3, R = Ph M-74-4
R = $R_a$ M-74-5, R = $R_b$ M-74-6
R = $R_c$ M-74-7, R = $R_d$ M-74-8
R = $R_e$ M-74-9, R = $R_f$ M-74-10

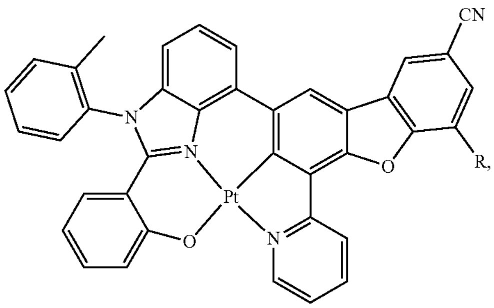

R = H M-75-1, R = D M-75-2
R = $CD_3$ M-75-3, R = Ph M-75-4
R = $R_a$ M-75-5, R = $R_b$ M-75-6
R = $R_c$ M-75-7, R = $R_d$ M-75-8
R = $R_e$ M-75-9, R = $R_f$ M-75-10

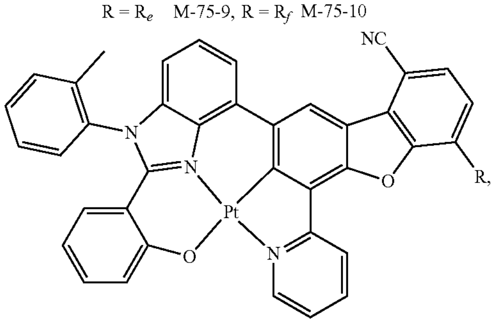

R = H M-76-1, R = D M-76-2
R = $CD_3$ M-76-3, R = Ph M-76-4
R = $R_a$ M-76-5, R = $R_b$ M-76-6
R = $R_c$ M-76-7, R = $R_d$ M-76-8
R = $R_e$ M-76-9, R = $R_f$ M-76-10

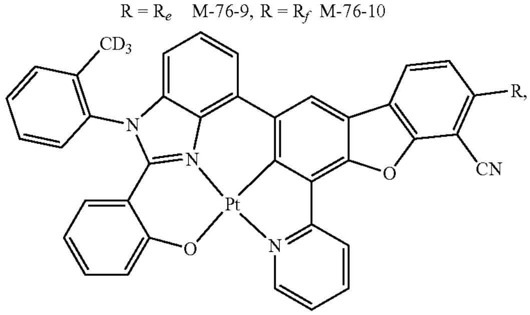

R = H M-77-1, R = D M-77-2
R = $CD_3$ M-77-3, R = Ph M-77-4
R = $R_a$ M-77-5, R = $R_b$ M-77-6
R = $R_c$ M-77-7, R = $R_d$ M-77-8
R = $R_e$ M-77-9, R = $R_f$ M-77-10

-continued

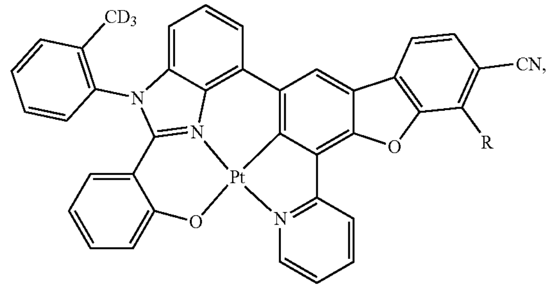

R = H M-78-1, R = D M-78-2
R = $CD_3$ M-78-3, R = Ph M-78-4
R = $R_a$ M-78-5, R = $R_b$ M-78-6
R = $R_c$ M-78-7, R = $R_d$ M-78-8
R = $R_e$ M-78-9, R = $R_f$ M-78-10

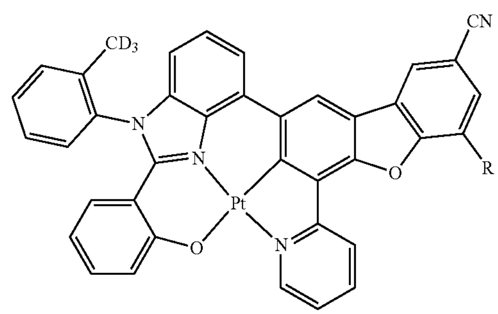

R = H M-79-1, R = D M-79-2
R = $CD_3$ M-79-3, R = Ph M-79-4
R = $R_a$ M-79-5, R = $R_b$ M-79-6
R = $R_c$ M-79-7, R = $R_d$ M-79-8
R = $R_e$ M-79-9, R = $R_f$ M-79-10

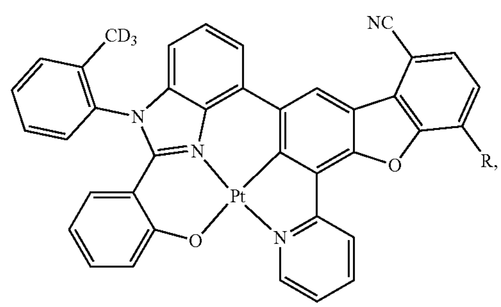

R = H M-80-1, R = D M-80-2
R = $CD_3$ M-80-3, R = Ph M-80-4
R = $R_a$ M-80-5, R = $R_b$ M-80-6
R = $R_c$ M-80-7, R = $R_d$ M-80-8
R = $R_e$ M-80-9, R = $R_f$ M-80-10

-continued

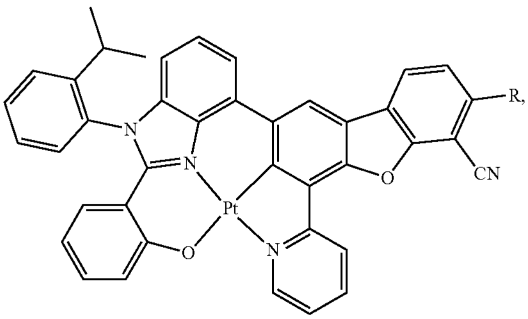

R = H M-81-1, R = D M-81-2
R = $CD_3$ M-81-3, R = Ph M-81-4
R = $R_a$ M-81-5, R = $R_b$ M-81-6
R = $R_c$ M-81-7, R = $R_d$ M-81-8
R = $R_e$ M-81-9, R = $R_f$ M-81-10

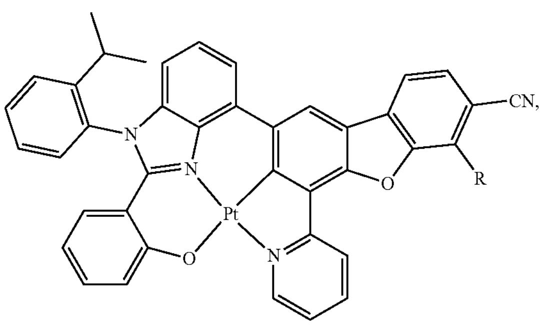

R = H M-82-1, R = D M-82-2
R = $CD_3$ M-82-3, R = Ph M-82-4
R = $R_a$ M-82-5, R = $R_b$ M-82-6
R = $R_c$ M-82-7, R = $R_d$ M-82-8
R = $R_e$ M-82-9, R = $R_f$ M-82-10

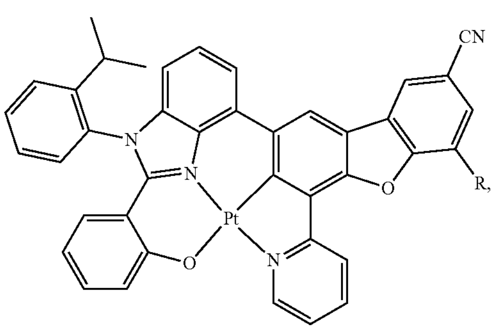

R = H M-83-1, R = D M-83-2
R = $CD_3$ M-83-3, R = Ph M-83-4
R = $R_a$ M-83-5, R = $R_b$ M-83-6
R = $R_c$ M-83-7, R = $R_d$ M-83-8
R = $R_e$ M-83-9, R = $R_f$ M-83-10

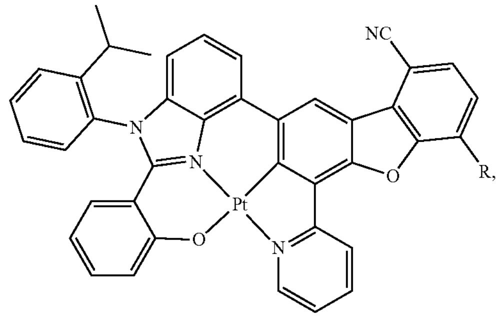

R = H M-84-1, R = D M-84-2
R = $CD_3$ M-84-3, R = Ph M-84-4
R = $R_a$ M-84-5, R = $R_b$ M-84-6
R = $R_c$ M-84-7, R = $R_d$ M-84-8
R = $R_e$ M-84-9, R = $R_f$ M-84-10

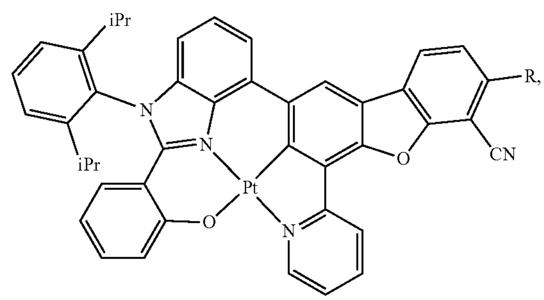

R = H M-85-1, R = D M-85-2
R = $CD_3$ M-85-3, R = Ph M-85-4
R = $R_a$ M-85-5, R = $R_b$ M-85-6
R = $R_c$ M-85-7, R = $R_d$ M-85-8
R = $R_e$ M-85-9, R = $R_f$ M-85-10

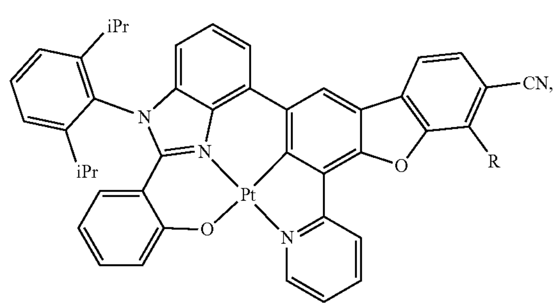

R = H M-86-1, R = D M-86-2
R = $CD_3$ M-86-3, R = Ph M-86-4
R = $R_a$ M-86-5, R = $R_b$ M-86-6
R = $R_c$ M-86-7, R = $R_d$ M-86-8
R = $R_e$ M-86-9, R = $R_f$ M-86-10

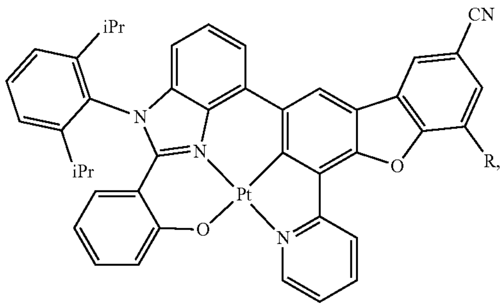

| | | | |
|---|---|---|---|
| R = H | M-87-1, | R = D | M-87-2 |
| R = $CD_3$ | M-87-3, | R = Ph | M-87-4 |
| R = $R_a$ | M-87-5, | R = $R_b$ | M-87-6 |
| R = $R_c$ | M-87-7, | R = $R_d$ | M-87-8 |
| R = $R_e$ | M-87-9, | R = $R_f$ | M-87-10 |

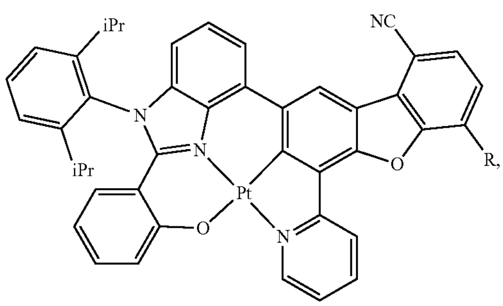

| | | | |
|---|---|---|---|
| R = H | M-88-1, | R = D | M-88-2 |
| R = $CD_3$ | M-88-3, | R = Ph | M-88-4 |
| R = $R_a$ | M-88-5, | R = $R_b$ | M-88-6 |
| R = $R_c$ | M-88-7, | R = $R_d$ | M-88-8 |
| R = $R_e$ | M-88-9, | R = $R_f$ | M-88-10 |

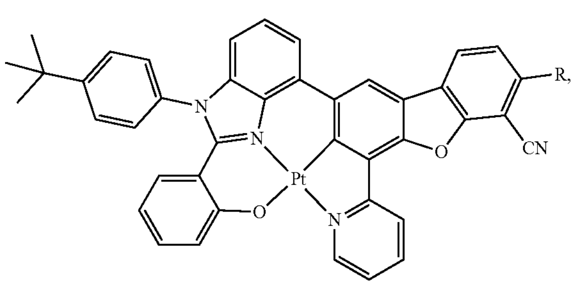

| | | | |
|---|---|---|---|
| R = H | M-89-1, | R = D | M-89-2 |
| R = $CD_3$ | M-89-3, | R = Ph | M-89-4 |
| R = $R_a$ | M-89-5, | R = $R_b$ | M-89-6 |
| R = $R_c$ | M-89-7, | R = $R_d$ | M-89-8 |
| R = $R_e$ | M-89-9, | R = $R_f$ | M-89-10 |

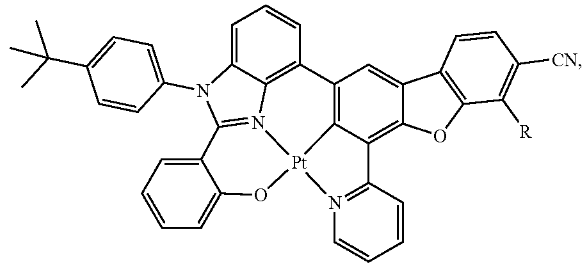

| | | | |
|---|---|---|---|
| R = H | M-90-1, | R = D | M-90-2 |
| R = $CD_3$ | M-90-3, | R = Ph | M-90-4 |
| R = $R_a$ | M-90-5, | R = $R_b$ | M-90-6 |
| R = $R_c$ | M-90-7, | R = $R_d$ | M-90-8 |
| R = $R_e$ | M-90-9, | R = $R_f$ | M-90-10 |

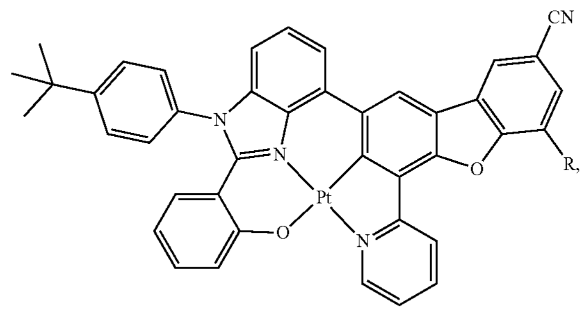

| | | | |
|---|---|---|---|
| R = H | M-91-1, | R = D | M-91-2 |
| R = $CD_3$ | M-91-3, | R = Ph | M-91-4 |
| R = $R_a$ | M-91-5, | R = $R_b$ | M-91-6 |
| R = $R_c$ | M-91-7, | R = $R_d$ | M-91-8 |
| R = $R_e$ | M-91-9, | R = $R_f$ | M-91-10 |

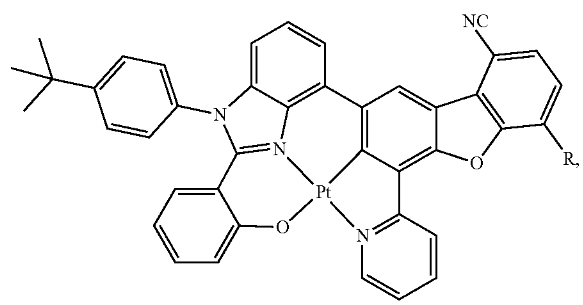

| | | | |
|---|---|---|---|
| R = H | M-92-1, | R = D | M-92-2 |
| R = $CD_3$ | M-92-3, | R = Ph | M-92-4 |
| R = $R_a$ | M-92-5, | R = $R_b$ | M-92-6 |
| R = $R_c$ | M-92-7, | R = $R_d$ | M-92-8 |
| R = $R_e$ | M-92-9, | R = $R_f$ | M-92-10 |

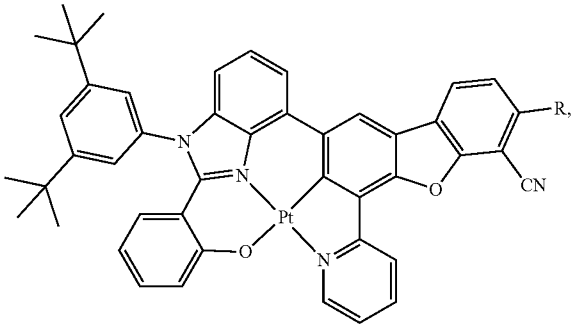

| | | | |
|---|---|---|---|
| R = H | M-93-1, | R = D | M-93-2 |
| R = $CD_3$ | M-93-3, | R = Ph | M-93-4 |
| R = $R_a$ | M-93-5, | R = $R_b$ | M-93-6 |
| R = $R_c$ | M-93-7, | R = $R_d$ | M-93-8 |
| R = $R_e$ | M-93-9, | R = $R_f$ | M-93-10 |

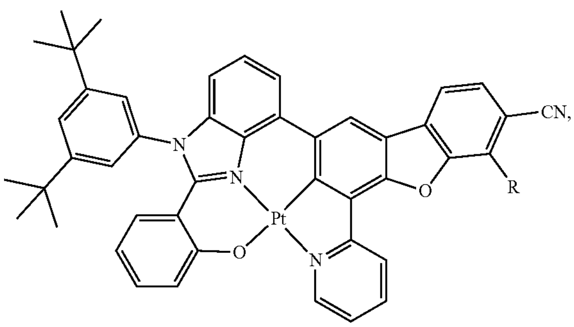

| | | | |
|---|---|---|---|
| R = H | M-94-1, | R = D | M-94-2 |
| R = $CD_3$ | M-94-3, | R = Ph | M-94-4 |
| R = $R_a$ | M-94-5, | R = $R_b$ | M-94-6 |
| R = $R_c$ | M-94-7, | R = $R_d$ | M-94-8 |
| R = $R_e$ | M-94-9, | R = $R_f$ | M-94-10 |

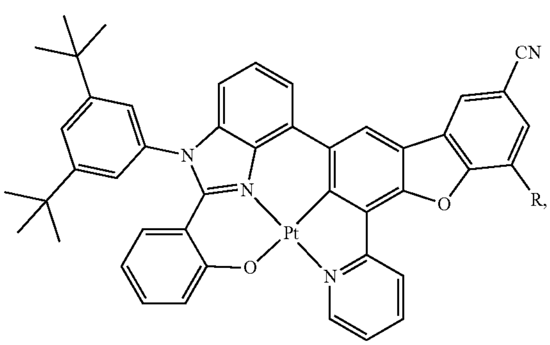

| | | | |
|---|---|---|---|
| R = H | M-95-1, | R = D | M-95-2 |
| R = $CD_3$ | M-95-3, | R = Ph | M-95-4 |
| R = $R_a$ | M-95-5, | R = $R_b$ | M-95-6 |
| R = $R_c$ | M-95-7, | R = $R_d$ | M-95-8 |
| R = $R_e$ | M-95-9, | R = $R_f$ | M-95-10 |

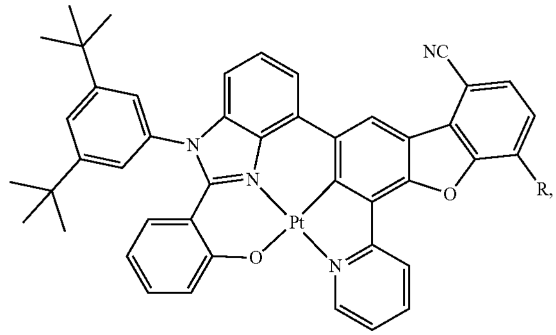

| | | | |
|---|---|---|---|
| R = H | M-96-1, | R = D | M-96-2 |
| R = $CD_3$ | M-96-3, | R = Ph | M-96-4 |
| R = $R_a$ | M-96-5, | R = $R_b$ | M-96-6 |
| R = $R_c$ | M-96-7, | R = $R_d$ | M-96-8 |
| R = $R_e$ | M-96-9, | R = $R_f$ | M-96-10 |

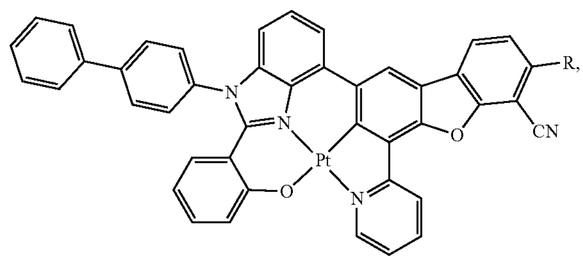

| | | | |
|---|---|---|---|
| R = H | M-97-1, | R = D | M-97-2 |
| R = $CD_3$ | M-97-3, | R = Ph | M-97-4 |
| R = $R_a$ | M-97-5, | R = $R_b$ | M-97-6 |
| R = $R_c$ | M-97-7, | R = $R_d$ | M-97-8 |
| R = $R_e$ | M-97-9, | R = $R_f$ | M-97-10 |

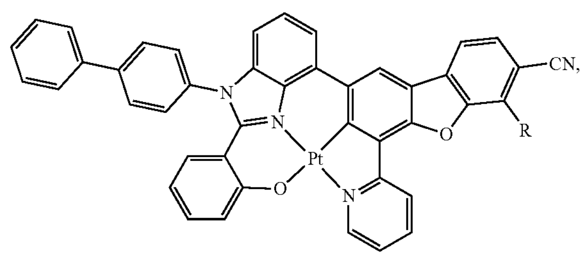

| | | | |
|---|---|---|---|
| R = H | M-98-1, | R = D | M-98-2 |
| R = $CD_3$ | M-98-3, | R = Ph | M-98-4 |
| R = $R_a$ | M-98-5, | R = $R_b$ | M-98-6 |
| R = $R_c$ | M-98-7, | R = $R_d$ | M-98-8 |
| R = $R_e$ | M-98-9, | R = $R_f$ | M-98-10 |

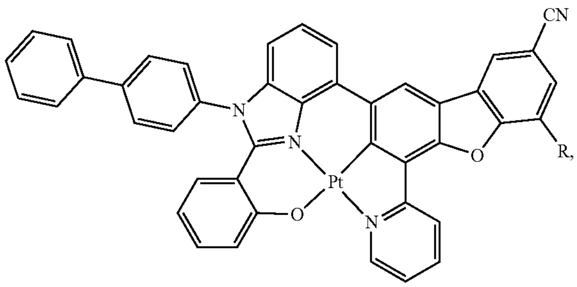

| | | | |
|---|---|---|---|
| R = H | M-99-1, | R = D | M-99-2 |
| R = $CD_3$ | M-99-3, | R = Ph | M-99-4 |
| R = $R_a$ | M-99-5, | R = $R_b$ | M-99-6 |
| R = $R_c$ | M-99-7, | R = $R_d$ | M-99-8 |
| R = $R_e$ | M-99-9, | R = $R_f$ | M-99-10 |

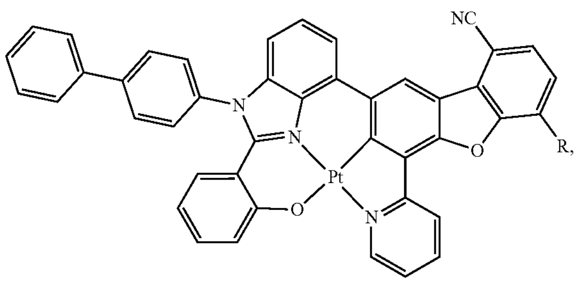

| | | | |
|---|---|---|---|
| R = H | M-100-1, | R = D | M-100-2 |
| R = $CD_3$ | M-100-3, | R = Ph | M-100-4 |
| R = $R_a$ | M-100-5, | R = $R_b$ | M-100-6 |
| R = $R_c$ | M-100-7, | R = $R_d$ | M-100-8 |
| R = $R_e$ | M-100-9, | R = $R_f$ | M-100-10 |

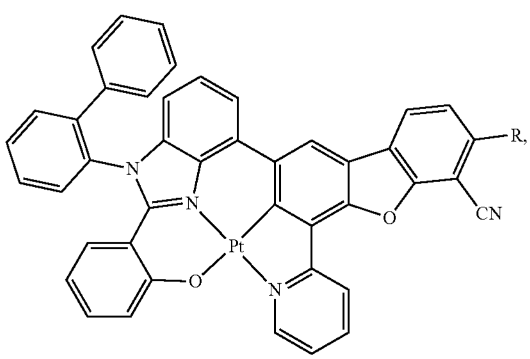

| | | | |
|---|---|---|---|
| R = H | M-101-1, | R = D | M-101-2 |
| R = $CD_3$ | M-101-3, | R = Ph | M-101-4 |
| R = $R_a$ | M-101-5, | R = $R_b$ | M-101-6 |
| R = $R_c$ | M-101-7, | R = $R_d$ | M-101-8 |
| R = $R_e$ | M-101-9, | R = $R_f$ | M-101-10 |

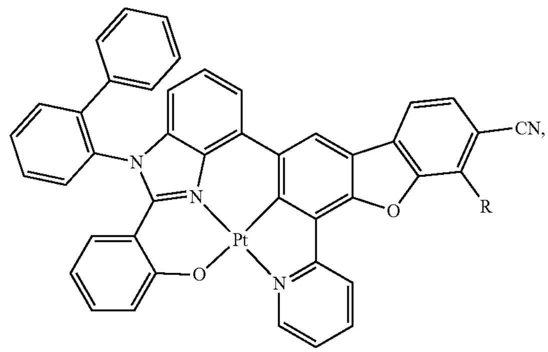

| | | | |
|---|---|---|---|
| R = H | M-102-1, | R = D | M-102-2 |
| R = $CD_3$ | M-102-3, | R = Ph | M-102-4 |
| R = $R_a$ | M-102-5, | R = $R_b$ | M-102-6 |
| R = $R_c$ | M-102-7, | R = $R_d$ | M-102-8 |
| R = $R_e$ | M-102-9, | R = $R_f$ | M-102-10 |

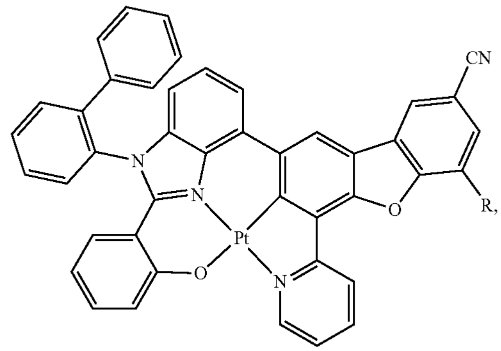

| | | | |
|---|---|---|---|
| R = H | M-103-1, | R = D | M-103-2 |
| R = $CD_3$ | M-103-3, | R = Ph | M-103-4 |
| R = $R_a$ | M-103-5, | R = $R_b$ | M-103-6 |
| R = $R_c$ | M-103-7, | R = $R_d$ | M-103-8 |
| R = $R_e$ | M-103-9, | R = $R_f$ | M-103-10 |

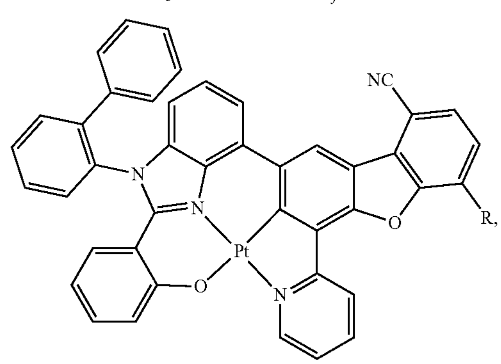

| | | | |
|---|---|---|---|
| R = H | M-104-1, | R = D | M-104-2 |
| R = $CD_3$ | M-104-3, | R = Ph | M-104-4 |
| R = $R_a$ | M-104-5, | R = $R_b$ | M-104-6 |
| R = $R_c$ | M-104-7, | R = $R_d$ | M-104-8 |
| R = $R_e$ | M-104-9, | R = $R_f$ | M-104-10 |

-continued

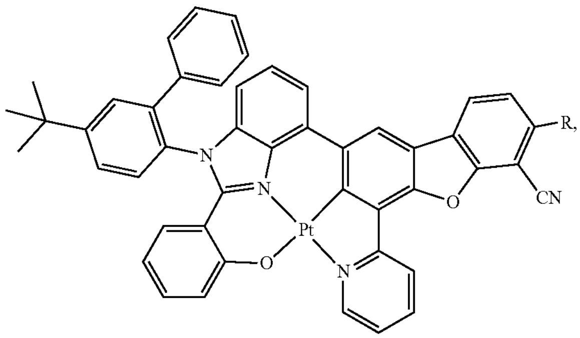

| | | | |
|---|---|---|---|
| R = H | M-105-1, | R = D | M-105-2 |
| R = $CD_3$ | M-105-3, | R = Ph | M-105-4 |
| R = $R_a$ | M-105-5, | R = $R_b$ | M-105-6 |
| R = $R_c$ | M-105-7, | R = $R_d$ | M-105-8 |
| R = $R_e$ | M-105-9, | R = $R_f$ | M-105-10 |

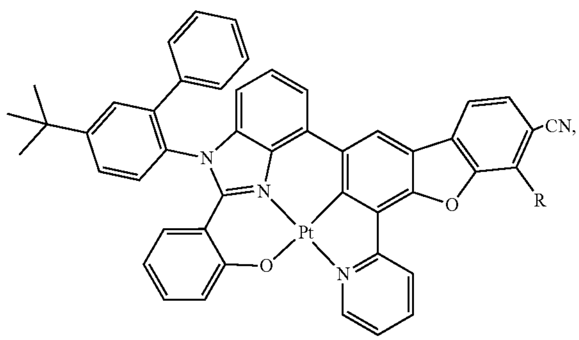

| | | | |
|---|---|---|---|
| R = H | M-106-1, | R = D | M-106-2 |
| R = $CD_3$ | M-106-3, | R = Ph | M-106-4 |
| R = $R_a$ | M-106-5, | R = $R_b$ | M-106-6 |
| R = $R_c$ | M-106-7, | R = $R_d$ | M-106-8 |
| R = $R_e$ | M-106-9, | R = $R_f$ | M-106-10 |

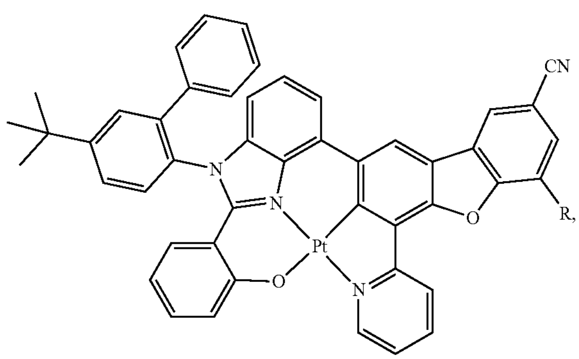

| | | | |
|---|---|---|---|
| R = H | M-107-1, | R = D | M-107-2 |
| R = $CD_3$ | M-107-3, | R = Ph | M-107-4 |
| R = $R_a$ | M-107-5, | R = $R_b$ | M-107-6 |
| R = $R_c$ | M-107-7, | R = $R_d$ | M-107-8 |
| R = $R_e$ | M-107-9, | R = $R_f$ | M-107-10 |

-continued

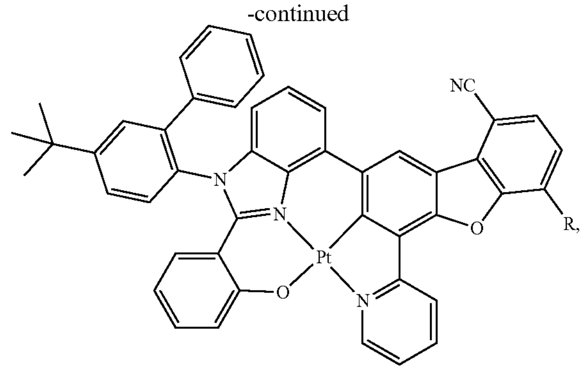

| | | | |
|---|---|---|---|
| R = H | M-108-1, | R = D | M-108-2 |
| R = $CD_3$ | M-108-3, | R = Ph | M-108-4 |
| R = $R_a$ | M-108-5, | R = $R_b$ | M-108-6 |
| R = $R_c$ | M-108-7, | R = $R_d$ | M-108-8 |
| R = $R_e$ | M-108-9, | R = $R_f$ | M-108-10 |

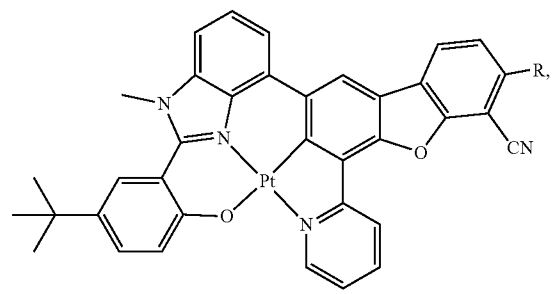

| | | | |
|---|---|---|---|
| R = H | M-109-1, | R = D | M-109-2 |
| R = $CD_3$ | M-109-3, | R = Ph | M-109-4 |
| R = $R_a$ | M-109-5, | R = $R_b$ | M-109-6 |
| R = $R_c$ | M-109-7, | R = $R_d$ | M-109-8 |
| R = $R_e$ | M-109-9, | R = $R_f$ | M-109-10 |

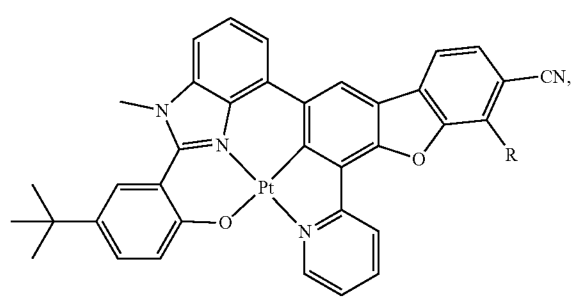

| | | | |
|---|---|---|---|
| R = H | M-110-1, | R = D | M-110-2 |
| R = $CD_3$ | M-110-3, | R = Ph | M-110-4 |
| R = $R_a$ | M-110-5, | R = $R_b$ | M-110-6 |
| R = $R_c$ | M-110-7, | R = $R_d$ | M-110-8 |
| R = $R_e$ | M-110-9, | R = $R_f$ | M-110-10 |

-continued

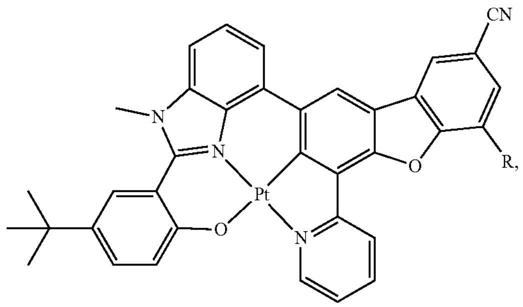

| | | | |
|---|---|---|---|
| R = H | M-111-1, | R = D | M-111-2 |
| R = $CD_3$ | M-111-3, | R = Ph | M-111-4 |
| R = $R_a$ | M-111-5, | R = $R_b$ | M-111-6 |
| R = $R_c$ | M-111-7, | R = $R_d$ | M-111-8 |
| R = $R_e$ | M-111-9, | R = $R_f$ | M-111-10 |

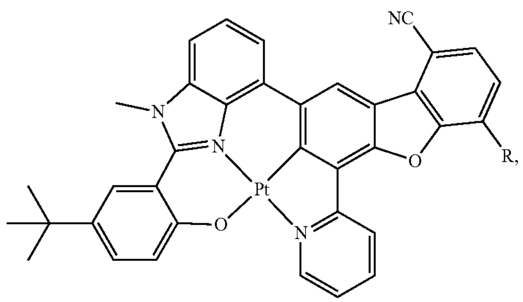

| | | | |
|---|---|---|---|
| R = H | M-112-1, | R = D | M-112-2 |
| R = $CD_3$ | M-112-3, | R = Ph | M-112-4 |
| R = $R_a$ | M-112-5, | R = $R_b$ | M-112-6 |
| R = $R_c$ | M-112-7, | R = $R_d$ | M-112-8 |
| R = $R_e$ | M-112-9, | R = $R_f$ | M-112-10 |

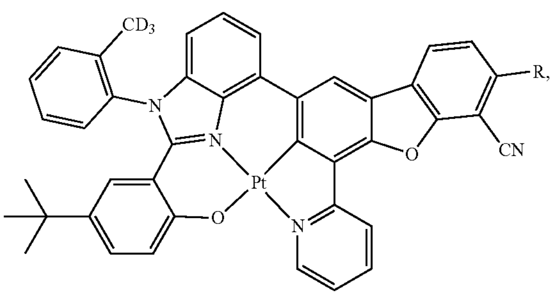

| | | | |
|---|---|---|---|
| R = H | M-113-1, | R = D | M-113-2 |
| R = $CD_3$ | M-113-3, | R = Ph | M-113-4 |
| R = $R_a$ | M-113-5, | R = $R_b$ | M-113-6 |
| R = $R_c$ | M-113-7, | R = $R_d$ | M-113-8 |
| R = $R_e$ | M-113-9, | R = $R_f$ | M-113-10 |

-continued

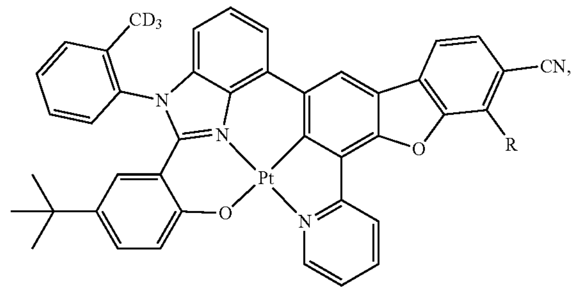

| | | | |
|---|---|---|---|
| R = H | M-114-1, | R = D | M-114-2 |
| R = $CD_3$ | M-114-3, | R = Ph | M-114-4 |
| R = $R_a$ | M-114-5, | R = $R_b$ | M-114-6 |
| R = $R_c$ | M-114-7, | R = $R_d$ | M-114-8 |
| R = $R_e$ | M-114-9, | R = $R_f$ | M-114-10 |

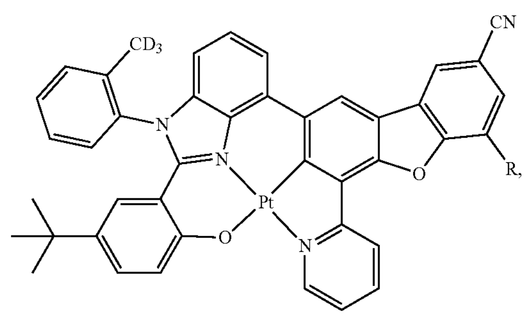

| | | | |
|---|---|---|---|
| R = H | M-115-1, | R = D | M-115-2 |
| R = $CD_3$ | M-115-3, | R = Ph | M-115-4 |
| R = $R_a$ | M-115-5, | R = $R_b$ | M-115-6 |
| R = $R_c$ | M-115-7, | R = $R_d$ | M-115-8 |
| R = $R_e$ | M-115-9, | R = $R_f$ | M-115-10 |

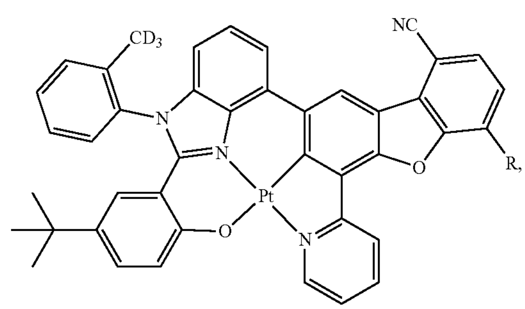

| | | | |
|---|---|---|---|
| R = H | M-116-1, | R = D | M-116-2 |
| R = $CD_3$ | M-116-3, | R = Ph | M-116-4 |
| R = $R_a$ | M-116-5, | R = $R_b$ | M-116-6 |
| R = $R_c$ | M-116-7, | R = $R_d$ | M-116-8 |
| R = $R_e$ | M-116-9, | R = $R_f$ | M-116-10 |

-continued

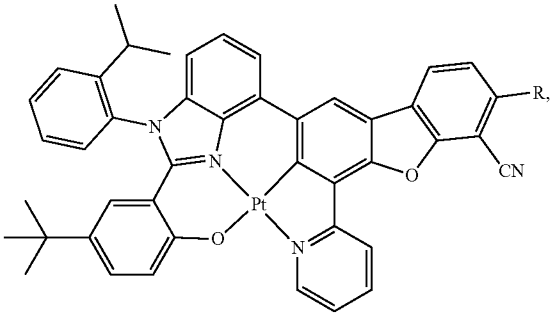

| | | | |
|---|---|---|---|
| R = H | M-117-1, | R = D | M-117-2 |
| R = $CD_3$ | M-117-3, | R = Ph | M-117-4 |
| R = $R_a$ | M-117-5, | R = $R_b$ | M-117-6 |
| R = $R_c$ | M-117-7, | R = $R_d$ | M-117-8 |
| R = $R_e$ | M-117-9, | R = $R_f$ | M-117-10 |

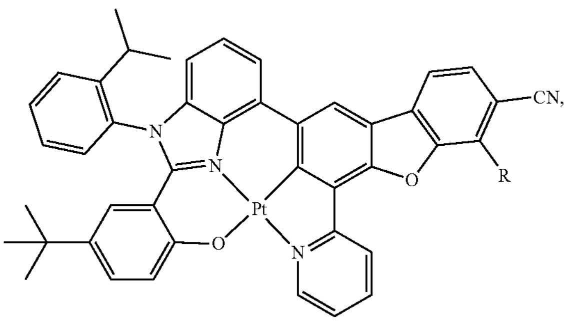

| | | | |
|---|---|---|---|
| R = H | M-118-1, | R = D | M-118-2 |
| R = $CD_3$ | M-118-3, | R = Ph | M-118-4 |
| R = $R_a$ | M-118-5, | R = $R_b$ | M-118-6 |
| R = $R_c$ | M-118-7, | R = $R_d$ | M-118-8 |
| R = $R_e$ | M-118-9, | R = $R_f$ | M-118-10 |

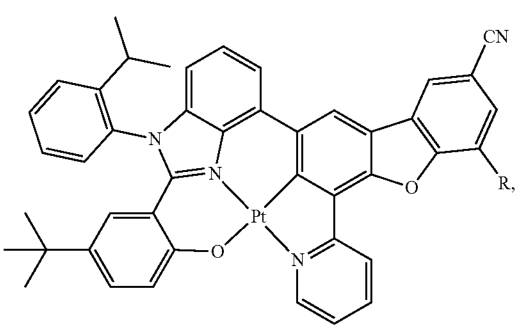

| | | | |
|---|---|---|---|
| R = H | M-119-1, | R = D | M-119-2 |
| R = $CD_3$ | M-119-3, | R = Ph | M-119-4 |
| R = $R_a$ | M-119-5, | R = $R_b$ | M-119-6 |
| R = $R_c$ | M-119-7, | R = $R_d$ | M-119-8 |
| R = $R_e$ | M-119-9, | R = $R_f$ | M-119-10 |

-continued

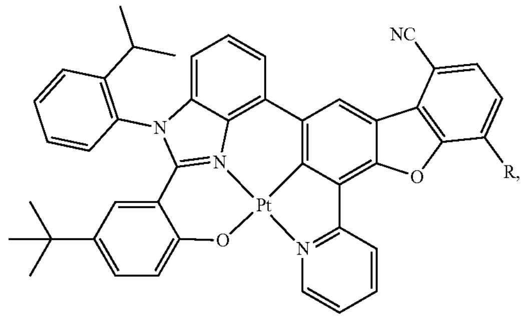

| | | | |
|---|---|---|---|
| R = H | M-120-1, | R = D | M-120-2 |
| R = $CD_3$ | M-120-3, | R = Ph | M-120-4 |
| R = $R_a$ | M-120-5, | R = $R_b$ | M-120-6 |
| R = $R_c$ | M-120-7, | R = $R_d$ | M-120-8 |
| R = $R_e$ | M-120-9, | R = $R_f$ | M-120-10 |

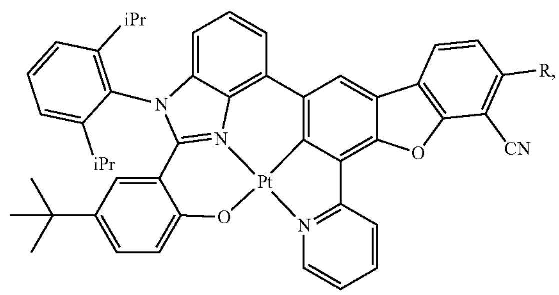

| | | | |
|---|---|---|---|
| R = H | M-121-1, | R = D | M-121-2 |
| R = $CD_3$ | M-121-3, | R = Ph | M-121-4 |
| R = $R_a$ | M-121-5, | R = $R_b$ | M-121-6 |
| R = $R_c$ | M-121-7, | R = $R_d$ | M-121-8 |
| R = $R_e$ | M-121-9, | R = $R_f$ | M-121-10 |

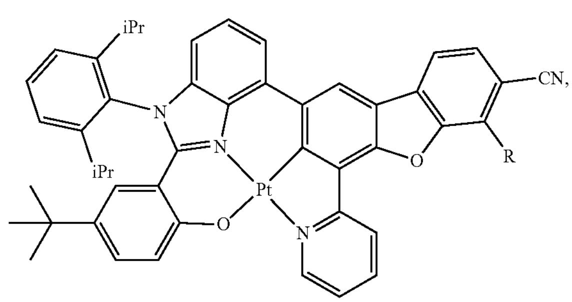

| | | | |
|---|---|---|---|
| R = H | M-122-1, | R = D | M-122-2 |
| R = $CD_3$ | M-122-3, | R = Ph | M-122-4 |
| R = $R_a$ | M-122-5, | R = $R_b$ | M-122-6 |
| R = $R_c$ | M-122-7, | R = $R_d$ | M-122-8 |
| R = $R_e$ | M-122-9, | R = $R_f$ | M-122-10 |

-continued

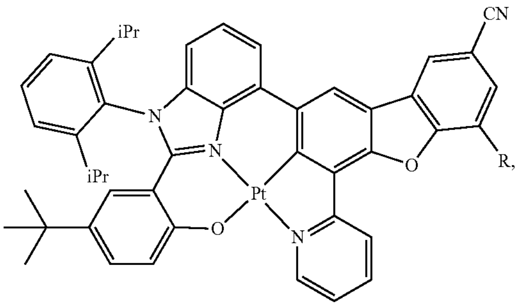

| | | | |
|---|---|---|---|
| R = H | M-123-1, | R = D | M-123-2 |
| R = $CD_3$ | M-123-3, | R = Ph | M-123-4 |
| R = $R_a$ | M-123-5, | R = $R_b$ | M-123-6 |
| R = $R_c$ | M-123-7, | R = $R_d$ | M-123-8 |
| R = $R_e$ | M-123-9, | R = $R_f$ | M-123-10 |

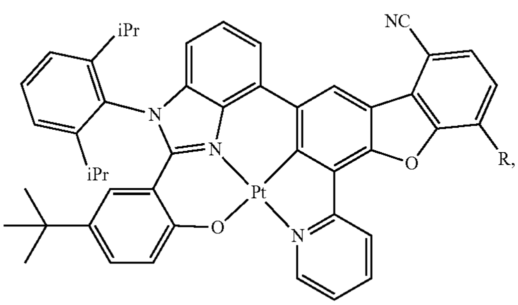

| | | | |
|---|---|---|---|
| R = H | M-124-1, | R = D | M-124-2 |
| R = $CD_3$ | M-124-3, | R = Ph | M-124-4 |
| R = $R_a$ | M-124-5, | R = $R_b$ | M-124-6 |
| R = $R_c$ | M-124-7, | R = $R_d$ | M-124-8 |
| R = $R_e$ | M-124-9, | R = $R_f$ | M-124-10 |

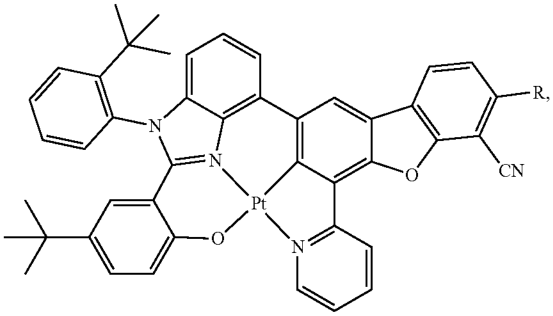

| | | | |
|---|---|---|---|
| R = H | M-125-1, | R = D | M-125-2 |
| R = $CD_3$ | M-125-3, | R = Ph | M-125-4 |
| R = $R_a$ | M-125-5, | R = $R_b$ | M-125-6 |
| R = $R_c$ | M-125-7, | R = $R_d$ | M-125-8 |
| R = $R_e$ | M-125-9, | R = $R_f$ | M-125-10 |

-continued

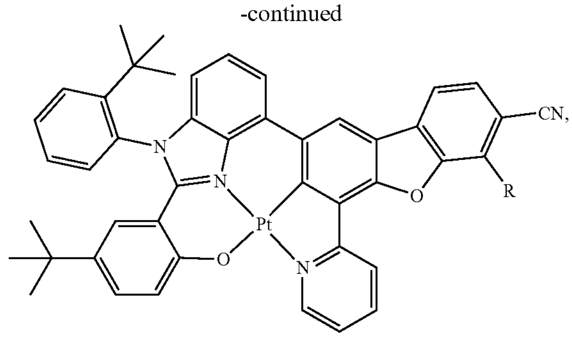

| | | | |
|---|---|---|---|
| R = H | M-126-1, | R = D | M-126-2 |
| R = $CD_3$ | M-126-3, | R = Ph | M-126-4 |
| R = $R_a$ | M-126-5, | R = $R_b$ | M-126-6 |
| R = $R_c$ | M-126-7, | R = $R_d$ | M-126-8 |
| R = $R_e$ | M-126-9, | R = $R_f$ | M-126-10 |

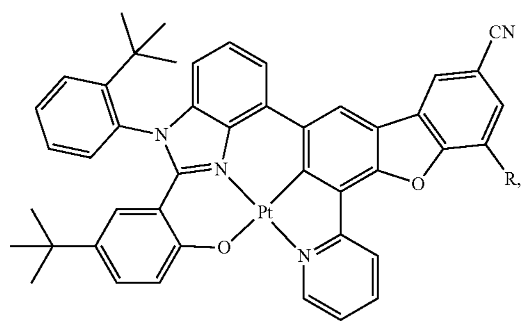

| | | | |
|---|---|---|---|
| R = H | M-127-1, | R = D | M-127-2 |
| R = $CD_3$ | M-127-3, | R = Ph | M-127-4 |
| R = $R_a$ | M-127-5, | R = $R_b$ | M-127-6 |
| R = $R_c$ | M-127-7, | R = $R_d$ | M-127-8 |
| R = $R_e$ | M-127-9, | R = $R_f$ | M-127-10 |

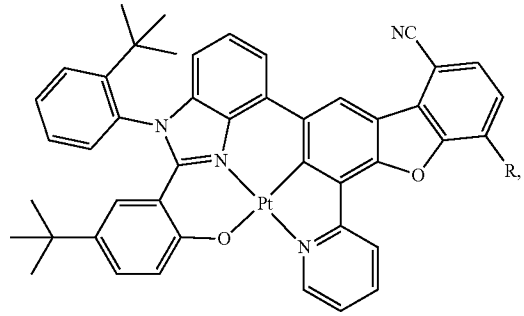

| | | | |
|---|---|---|---|
| R = H | M-128-1, | R = D | M-128-2 |
| R = $CD_3$ | M-128-3, | R = Ph | M-128-4 |
| R = $R_a$ | M-128-5, | R = $R_b$ | M-128-6 |
| R = $R_c$ | M-128-7, | R = $R_d$ | M-128-8 |
| R = $R_e$ | M-128-9, | R = $R_f$ | M-128-10 |

-continued

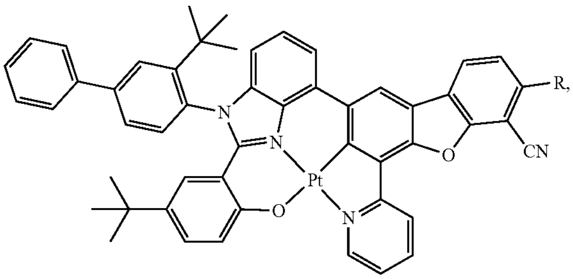

R = H M-129-1, R = D M-129-2
R = $CD_3$ M-129-3, R = Ph M-129-4
R = $R_a$ M-129-5, R = $R_b$ M-129-6
R = $R_c$ M-129-7, R = $R_d$ M-129-8
R = $R_e$ M-129-9, R = $R_f$ M-129-10

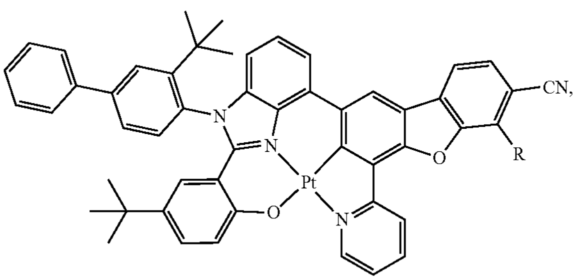

R = H M-130-1, R = D M-130-2
R = $CD_3$ M-130-3, R = Ph M-130-4
R = $R_a$ M-130-5, R = $R_b$ M-130-6
R = $R_c$ M-130-7, R = $R_d$ M-130-8
R = $R_e$ M-130-9, R = $R_f$ M-130-10

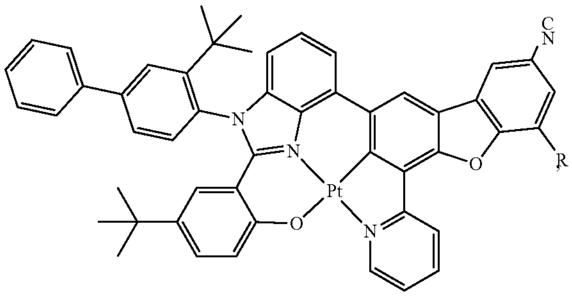

R = H M-131-1, R = D M-131-2
R = $CD_3$ M-131-3, R = Ph M-131-4
R = $R_a$ M-131-5, R = $R_b$ M-131-6
R = $R_c$ M-131-7, R = $R_d$ M-131-8
R = $R_e$ M-131-9, R = $R_f$ M-131-10

-continued

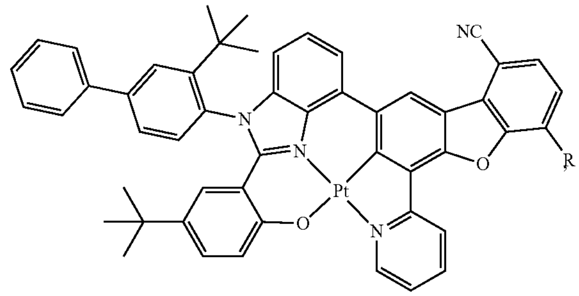

R = H M-132-1, R = D M-132-2
R = $CD_3$ M-132-3, R = Ph M-132-4
R = $R_a$ M-132-5, R = $R_b$ M-132-6
R = $R_c$ M-132-7, R = $R_d$ M-132-8
R = $R_e$ M-132-9, R = $R_f$ M-132-10

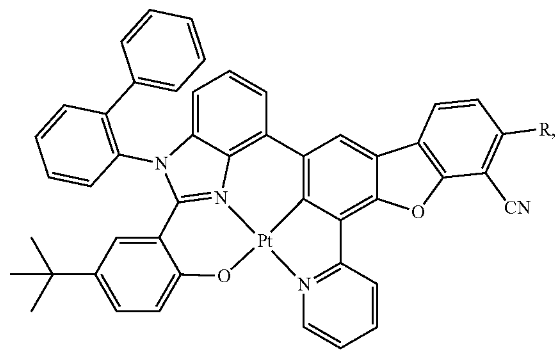

R = H M-133-1, R = D M-133-2
R = $CD_3$ M-133-3, R = Ph M-133-4
R = $R_a$ M-133-5, R = $R_b$ M-133-6
R = $R_c$ M-133-7, R = $R_d$ M-133-8
R = $R_e$ M-133-9, R = $R_f$ M-133-10

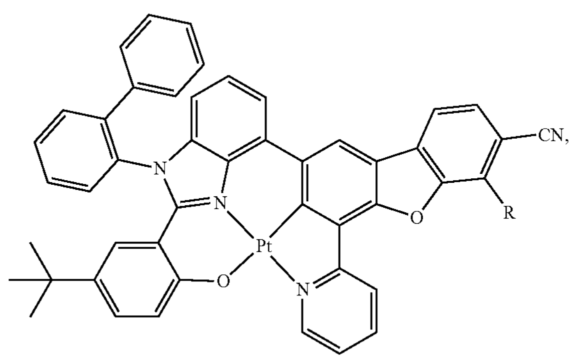

R = H M-134-1, R = D M-134-2
R = $CD_3$ M-134-3, R = Ph M-134-4
R = $R_a$ M-134-5, R = $R_b$ M-134-6
R = $R_c$ M-134-7, R = $R_d$ M-134-8
R = $R_e$ M-134-9, R = $R_f$ M-134-10

-continued

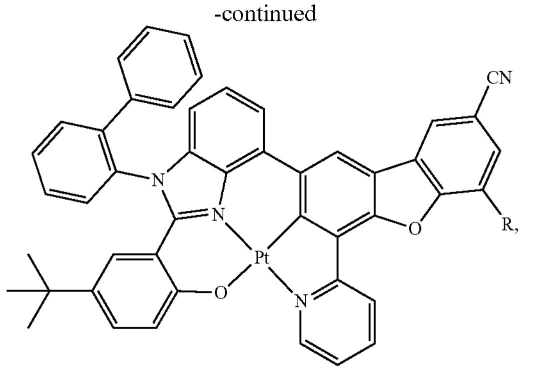

| | | | |
|---|---|---|---|
| R = H | M-135-1, | R = D | M-135-2 |
| R = $CD_3$ | M-135-3, | R = Ph | M-135-4 |
| R = $R_a$ | M-135-5, | R = $R_b$ | M-135-6 |
| R = $R_c$ | M-135-7, | R = $R_d$ | M-135-8 |
| R = $R_e$ | M-135-9, | R = $R_f$ | M-135-10 |

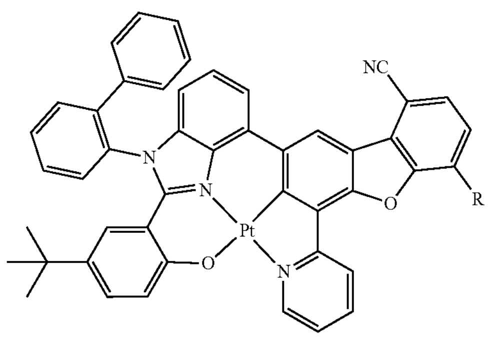

| | | | |
|---|---|---|---|
| R = H | M-136-1, | R = D | M-136-2 |
| R = $CD_3$ | M-136-3, | R = Ph | M-136-4 |
| R = $R_a$ | M-136-5, | R = $R_b$ | M-136-6 |
| R = $R_c$ | M-136-7, | R = $R_d$ | M-136-8 |
| R = $R_e$ | M-136-9, | R = $R_f$ | M-136-10 |

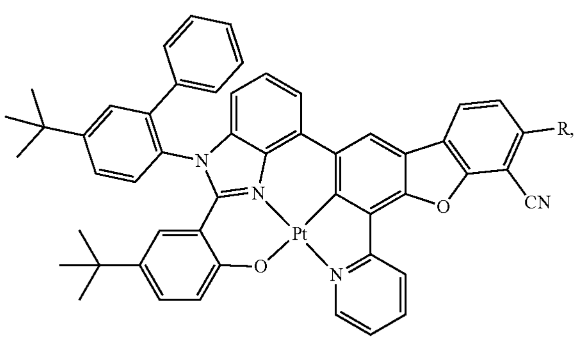

| | | | |
|---|---|---|---|
| R = H | M-137-1, | R = D | M-137-2 |
| R = $CD_3$ | M-137-3, | R = Ph | M-137-4 |
| R = $R_a$ | M-137-5, | R = $R_b$ | M-137-6 |
| R = $R_c$ | M-137-7, | R = $R_d$ | M-137-8 |
| R = $R_e$ | M-137-9, | R = $R_f$ | M-137-10 |

-continued

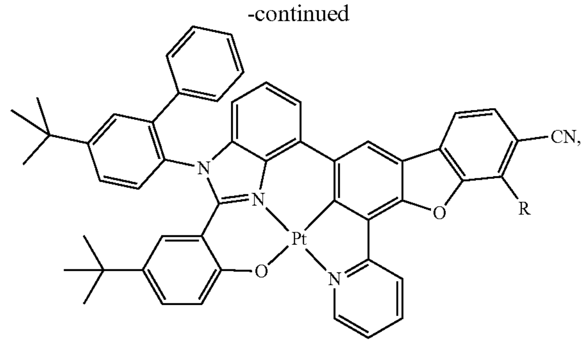

| | | | |
|---|---|---|---|
| R = H | M-138-1, | R = D | M-138-2 |
| R = $CD_3$ | M-138-3, | R = Ph | M-138-4 |
| R = $R_a$ | M-138-5, | R = $R_b$ | M-138-6 |
| R = $R_c$ | M-138-7, | R = $R_d$ | M-138-8 |
| R = $R_e$ | M-138-9, | R = $R_f$ | M-138-10 |

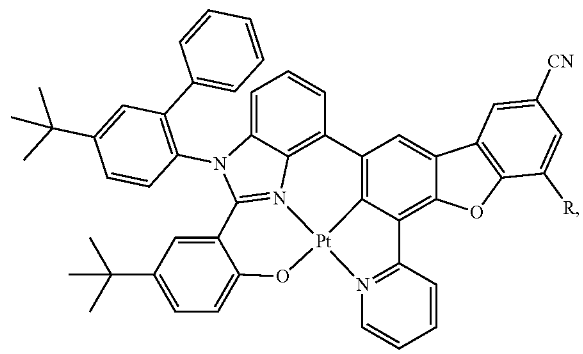

| | | | |
|---|---|---|---|
| R = H | M-139-1, | R = D | M-139-2 |
| R = $CD_3$ | M-139-3, | R = Ph | M-139-4 |
| R = $R_a$ | M-139-5, | R = $R_b$ | M-139-6 |
| R = $R_c$ | M-139-7, | R = $R_d$ | M-139-8 |
| R = $R_e$ | M-139-9, | R = $R_f$ | M-139-10 |

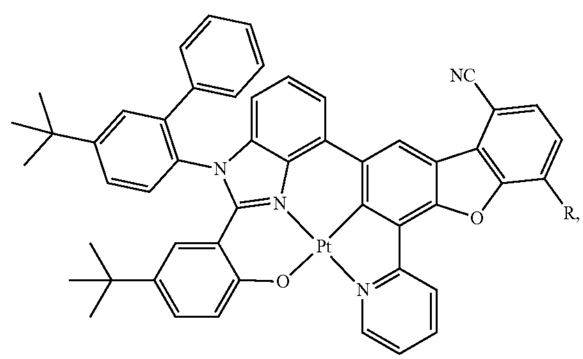

| | | | |
|---|---|---|---|
| R = H | M-140-1, | R = D | M-140-2 |
| R = $CD_3$ | M-140-3, | R = Ph | M-140-4 |
| R = $R_a$ | M-140-5, | R = $R_b$ | M-140-6 |
| R = $R_c$ | M-140-7, | R = $R_d$ | M-140-8 |
| R = $R_e$ | M-140-9, | R = $R_f$ | M-140-10 |

-continued

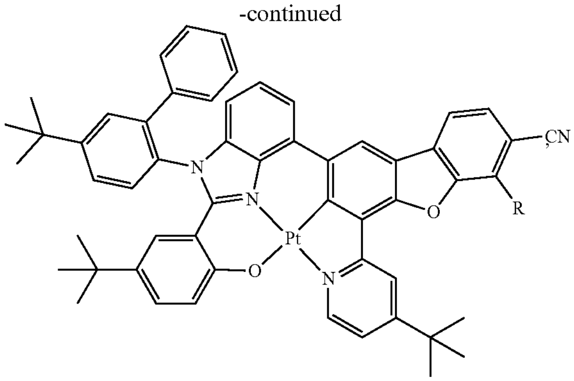

| | | | |
|---|---|---|---|
| R = H | M-141-1, | R = D | M-141-2 |
| R = $CD_3$ | M-141-3, | R = Ph | M-141-4 |
| R = $R_a$ | M-141-5, | R = $R_b$ | M-141-6 |
| R = $R_c$ | M-141-7, | R = $R_d$ | M-141-8 |
| R = $R_e$ | M-141-9, | R = $R_f$ | M-141-10 |

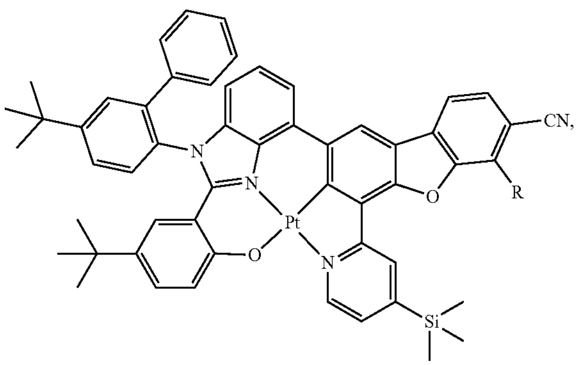

| | | | |
|---|---|---|---|
| R = H | M-142-1, | R = D | M-142-2 |
| R = $CD_3$ | M-142-3, | R = Ph | M-142-4 |
| R = $R_a$ | M-142-5, | R = $R_b$ | M-142-6 |
| R = $R_c$ | M-142-7, | R = $R_d$ | M-142-8 |
| R = $R_e$ | M-142-9, | R = $R_f$ | M-142-10 |

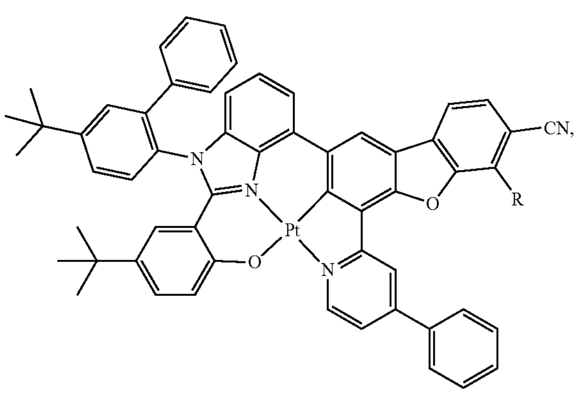

| | | | |
|---|---|---|---|
| R = H | M-143-1, | R = D | M-143-2 |
| R = $CD_3$ | M-143-3, | R = Ph | M-143-4 |
| R = $R_a$ | M-143-5, | R = $R_b$ | M-143-6 |
| R = $R_c$ | M-143-7, | R = $R_d$ | M-143-8 |
| R = $R_e$ | M-143-9, | R = $R_f$ | M-143-10 |

-continued

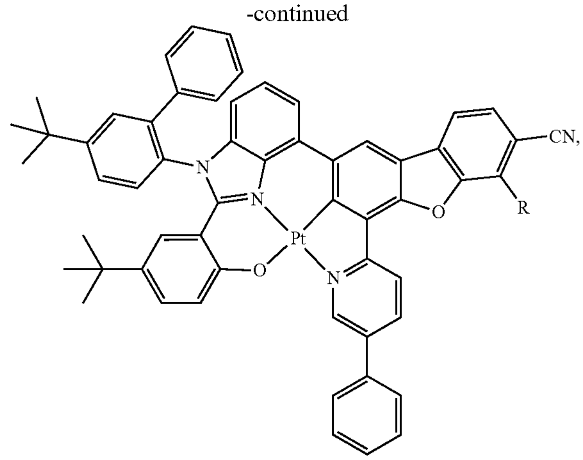

| | | | |
|---|---|---|---|
| R = H | M-144-1, | R = D | M-144-2 |
| R = $CD_3$ | M-144-3, | R = Ph | M-144-4 |
| R = $R_a$ | M-144-5, | R = $R_b$ | M-144-6 |
| R = $R_c$ | M-144-7, | R = $R_d$ | M-144-8 |
| R = $R_e$ | M-144-9, | R = $R_f$ | M-144-10 |

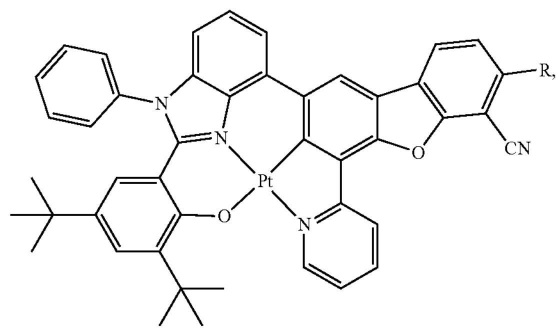

| | | | |
|---|---|---|---|
| R = H | M-145-1, | R = D | M-145-2 |
| R = $CD_3$ | M-145-3, | R = Ph | M-145-4 |
| R = $R_a$ | M-145-5, | R = $R_b$ | M-145-6 |
| R = $R_c$ | M-145-7, | R = $R_d$ | M-145-8 |
| R = $R_e$ | M-145-9, | R = $R_f$ | M-145-10 |

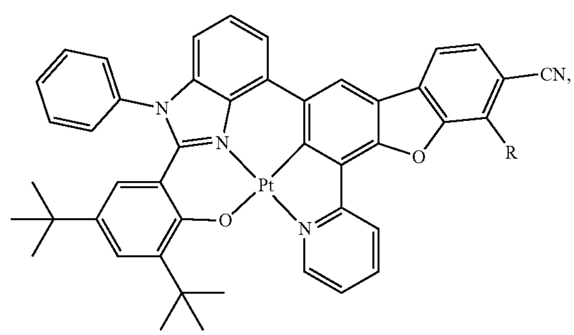

| | | | |
|---|---|---|---|
| R = H | M-146-1, | R = D | M-146-2 |
| R = $CD_3$ | M-146-3, | R = Ph | M-146-4 |
| R = $R_a$ | M-146-5, | R = $R_b$ | M-146-6 |
| R = $R_c$ | M-146-7, | R = $R_d$ | M-146-8 |
| R = $R_e$ | M-146-9, | R = $R_f$ | M-146-10 |

-continued

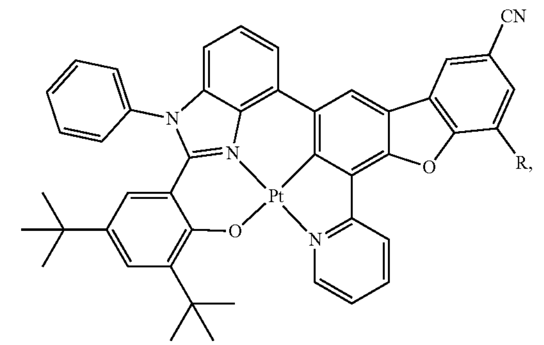

| | | | |
|---|---|---|---|
| R = H | M-147-1, | R = D | M-147-2 |
| R = $CD_3$ | M-147-3, | R = Ph | M-147-4 |
| R = $R_a$ | M-147-5, | R = $R_b$ | M-147-6 |
| R = $R_c$ | M-147-7, | R = $R_d$ | M-147-8 |
| R = $R_e$ | M-147-9, | R = $R_f$ | M-147-10 |

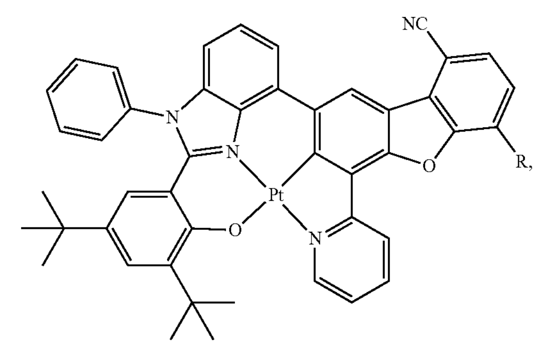

| | | | |
|---|---|---|---|
| R = H | M-148-1, | R = D | M-148-2 |
| R = $CD_3$ | M-148-3, | R = Ph | M-148-4 |
| R = $R_a$ | M-148-5, | R = $R_b$ | M-148-6 |
| R = $R_c$ | M-148-7, | R = $R_d$ | M-148-8 |
| R = $R_e$ | M-148-9, | R = $R_f$ | M-148-10 |

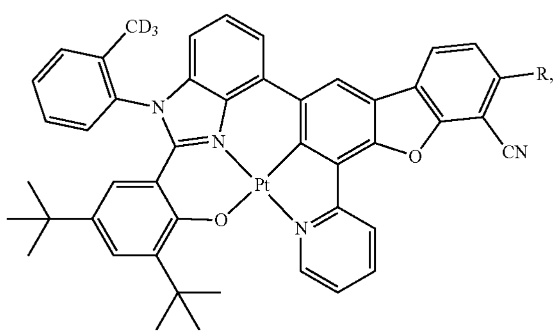

| | | | |
|---|---|---|---|
| R = H | M-149-1, | R = D | M-149-2 |
| R = $CD_3$ | M-149-3, | R = Ph | M-149-4 |
| R = $R_a$ | M-149-5, | R = $R_b$ | M-149-6 |
| R = $R_c$ | M-149-7, | R = $R_d$ | M-149-8 |
| R = $R_e$ | M-149-9, | R = $R_f$ | M-149-10 |

-continued

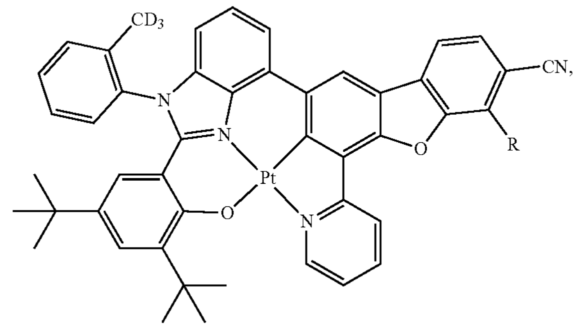

| | | | |
|---|---|---|---|
| R = H | M-150-1, | R = D | M-150-2 |
| R = $CD_3$ | M-150-3, | R = Ph | M-150-4 |
| R = $R_a$ | M-150-5, | R = $R_b$ | M-150-6 |
| R = $R_c$ | M-150-7, | R = $R_d$ | M-150-8 |
| R = $R_e$ | M-150-9, | R = $R_f$ | M-150-10 |

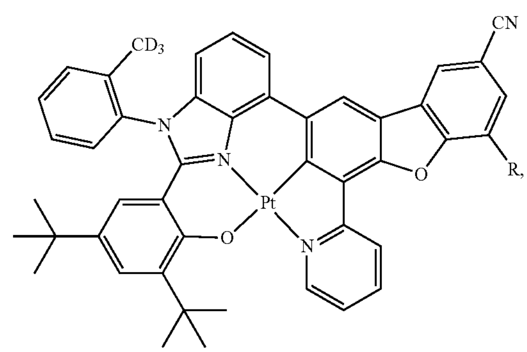

| | | | |
|---|---|---|---|
| R = H | M-151-1, | R = D | M-151-2 |
| R = $CD_3$ | M-151-3, | R = Ph | M-151-4 |
| R = $R_a$ | M-151-5, | R = $R_b$ | M-151-6 |
| R = $R_c$ | M-151-7, | R = $R_d$ | M-151-8 |
| R = $R_e$ | M-151-9, | R = $R_f$ | M-151-10 |

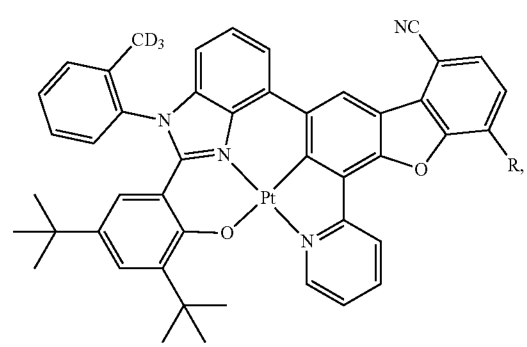

| | | | |
|---|---|---|---|
| R = H | M-152-1, | R = D | M-152-2 |
| R = $CD_3$ | M-152-3, | R = Ph | M-152-4 |
| R = $R_a$ | M-152-5, | R = $R_b$ | M-152-6 |
| R = $R_c$ | M-152-7, | R = $R_d$ | M-152-8 |
| R = $R_e$ | M-152-9, | R = $R_f$ | M-152-10 |

-continued

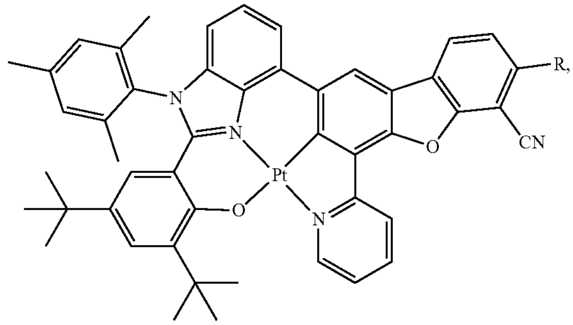

| | | | |
|---|---|---|---|
| R = H | M-153-1, | R = D | M-153-2 |
| R = $CD_3$ | M-153-3, | R = Ph | M-153-4 |
| R = $R_a$ | M-153-5, | R = $R_b$ | M-153-6 |
| R = $R_c$ | M-153-7, | R = $R_d$ | M-153-8 |
| R = $R_e$ | M-153-9, | R = $R_f$ | M-153-10 |

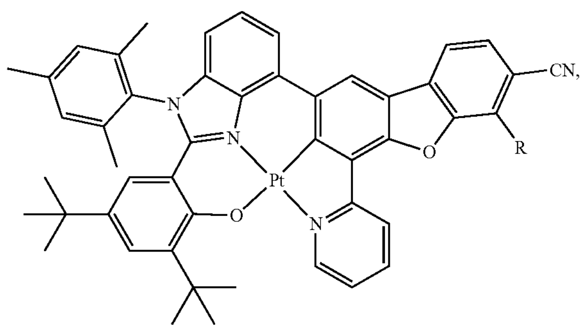

| | | | |
|---|---|---|---|
| R = H | M-154-1, | R = D | M-154-2 |
| R = $CD_3$ | M-154-3, | R = Ph | M-154-4 |
| R = $R_a$ | M-154-5, | R = $R_b$ | M-154-6 |
| R = $R_c$ | M-154-7, | R = $R_d$ | M-154-8 |
| R = $R_e$ | M-154-9, | R = $R_f$ | M-154-10 |

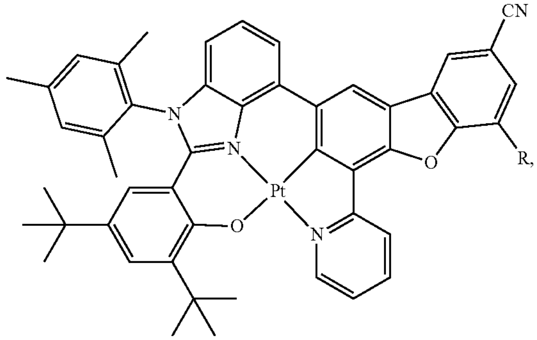

| | | | |
|---|---|---|---|
| R = H | M-155-1, | R = D | M-155-2 |
| R = $CD_3$ | M-155-3, | R = Ph | M-155-4 |
| R = $R_a$ | M-155-5, | R = $R_b$ | M-155-6 |
| R = $R_c$ | M-155-7, | R = $R_d$ | M-155-8 |
| R = $R_e$ | M-155-9, | R = $R_f$ | M-155-10 |

-continued

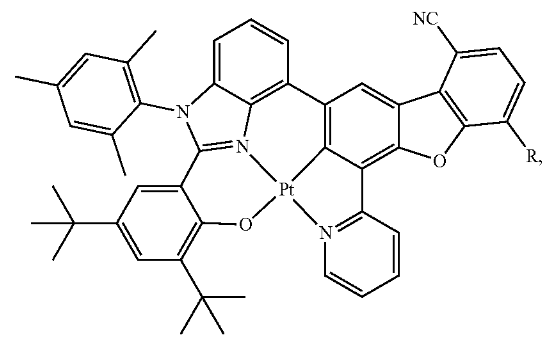

| | | | |
|---|---|---|---|
| R = H | M-156-1, | R = D | M-156-2 |
| R = $CD_3$ | M-156-3, | R = Ph | M-156-4 |
| R = $R_a$ | M-156-5, | R = $R_b$ | M-156-6 |
| R = $R_c$ | M-156-7, | R = $R_d$ | M-156-8 |
| R = $R_e$ | M-156-9, | R = $R_f$ | M-156-10 |

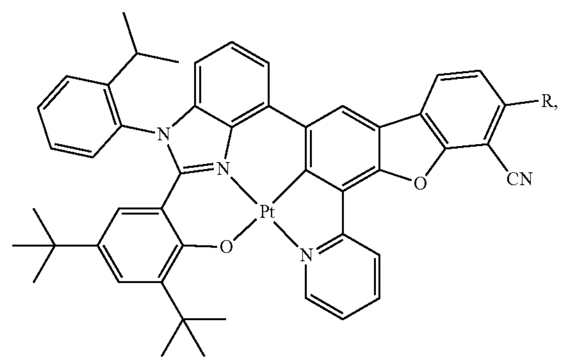

| | | | |
|---|---|---|---|
| R = H | M-157-1, | R = D | M-157-2 |
| R = $CD_3$ | M-157-3, | R = Ph | M-157-4 |
| R = $R_a$ | M-157-5, | R = $R_b$ | M-157-6 |
| R = $R_c$ | M-157-7, | R = $R_d$ | M-157-8 |
| R = $R_e$ | M-157-9, | R = $R_f$ | M-157-10 |

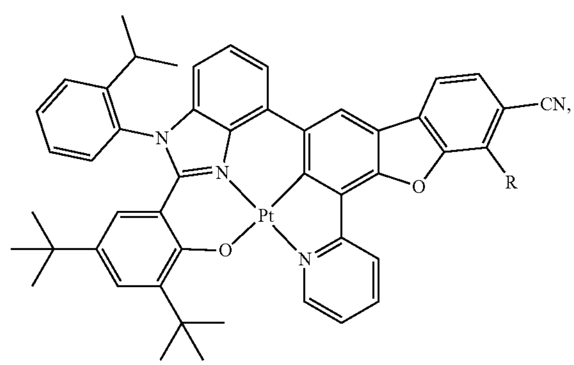

| | | | |
|---|---|---|---|
| R = H | M-158-1, | R = D | M-158-2 |
| R = $CD_3$ | M-158-3, | R = Ph | M-158-4 |
| R = $R_a$ | M-158-5, | R = $R_b$ | M-158-6 |
| R = $R_c$ | M-158-7, | R = $R_d$ | M-158-8 |
| R = $R_e$ | M-158-9, | R = $R_f$ | M-158-10 |

-continued

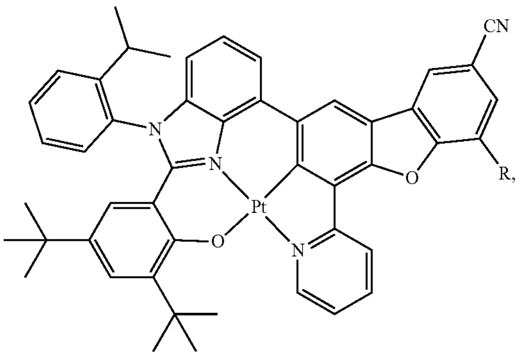

R = H M-159-1, R = D M-159-2
R = $CD_3$ M-159-3, R = Ph M-159-4
R = $R_a$ M-159-5, R = $R_b$ M-159-6
R = $R_c$ M-159-7, R = $R_d$ M-159-8
R = $R_e$ M-159-9, R = $R_f$ M-159-10

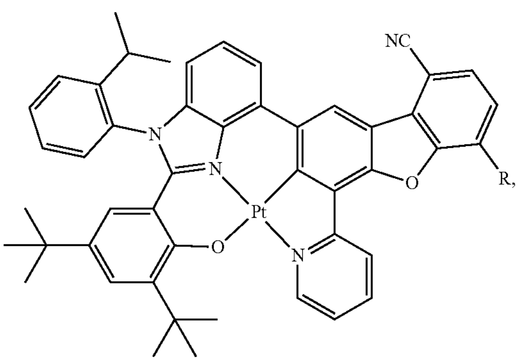

R = H M-160-1, R = D M-160-2
R = $CD_3$ M-160-3, R = Ph M-160-4
R = $R_a$ M-160-5, R = $R_b$ M-160-6
R = $R_c$ M-160-7, R = $R_d$ M-160-8
R = $R_e$ M-160-9, R = $R_f$ M-160-10

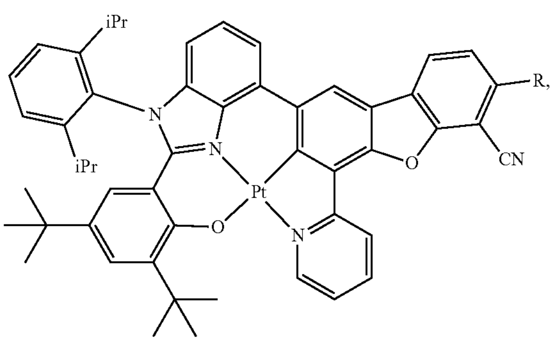

R = H M-161-1, R = D M-161-2
R = $CD_3$ M-161-3, R = Ph M-161-4
R = $R_a$ M-161-5, R = $R_b$ M-161-6
R = $R_c$ M-161-7, R = $R_d$ M-161-8
R = $R_e$ M-161-9, R = $R_f$ M-161-10

-continued

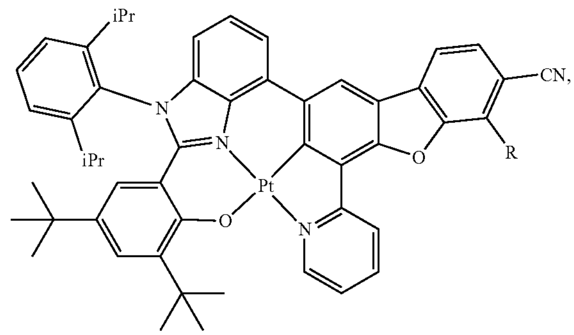

R = H M-162-1, R = D M-162-2
R = $CD_3$ M-162-3, R = Ph M-162-4
R = $R_a$ M-162-5, R = $R_b$ M-162-6
R = $R_c$ M-162-7, R = $R_d$ M-162-8
R = $R_e$ M-162-9, R = $R_f$ M-162-10

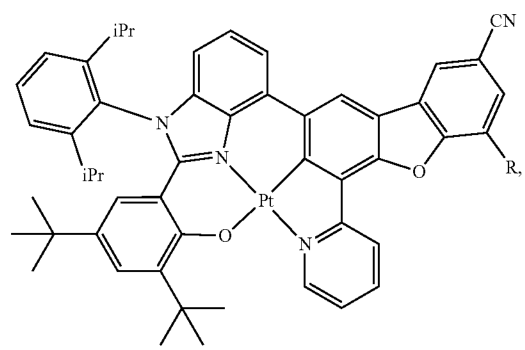

R = H M-163-1, R = D M-163-2
R = $CD_3$ M-163-3, R = Ph M-163-4
R = $R_a$ M-163-5, R = $R_b$ M-163-6
R = $R_c$ M-163-7, R = $R_d$ M-163-8
R = $R_e$ M-163-9, R = $R_f$ M-163-10

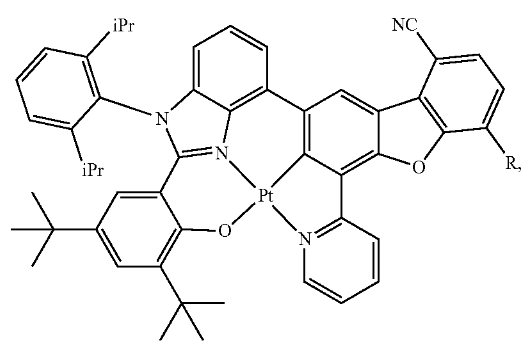

R = H M-164-1, R = D M-164-2
R = $CD_3$ M-164-3, R = Ph M-164-4
R = $R_a$ M-164-5, R = $R_b$ M-164-6
R = $R_c$ M-164-7, R = $R_d$ M-164-8
R = $R_e$ M-164-9, R = $R_f$ M-164-10

-continued

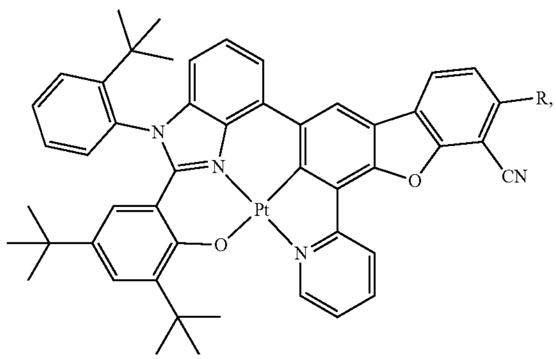

| | | | |
|---|---|---|---|
| R = H | M-165-1, | R = D | M-165-2 |
| R = $CD_3$ | M-165-3, | R = Ph | M-165-4 |
| R = $R_a$ | M-165-5, | R = $R_b$ | M-165-6 |
| R = $R_c$ | M-165-7, | R = $R_d$ | M-165-8 |
| R = $R_e$ | M-165-9, | R = $R_f$ | M-165-10 |

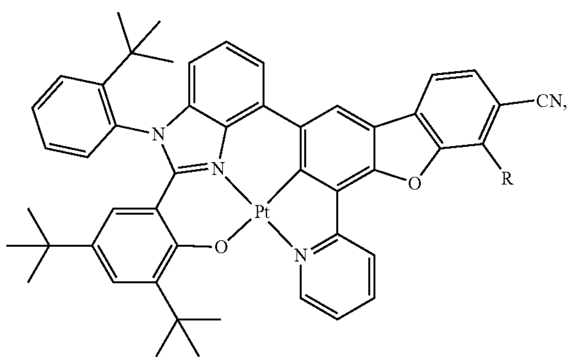

| | | | |
|---|---|---|---|
| R = H | M-166-1, | R = D | M-166-2 |
| R = $CD_3$ | M-166-3, | R = Ph | M-166-4 |
| R = $R_a$ | M-166-5, | R = $R_b$ | M-166-6 |
| R = $R_c$ | M-166-7, | R = $R_d$ | M-166-8 |
| R = $R_e$ | M-166-9, | R = $R_f$ | M-166-10 |

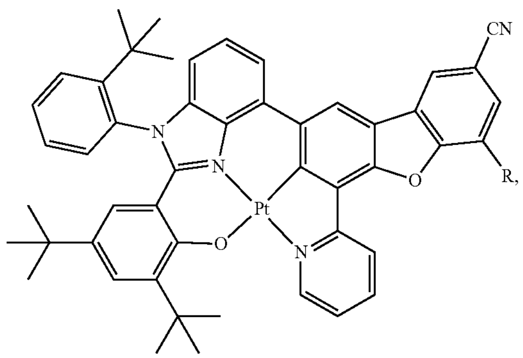

| | | | |
|---|---|---|---|
| R = H | M-167-1, | R = D | M-167-2 |
| R = $CD_3$ | M-167-3, | R = Ph | M-167-4 |
| R = $R_a$ | M-167-5, | R = $R_b$ | M-167-6 |
| R = $R_c$ | M-167-7, | R = $R_d$ | M-167-8 |
| R = $R_e$ | M-167-9, | R = $R_f$ | M-167-10 |

-continued

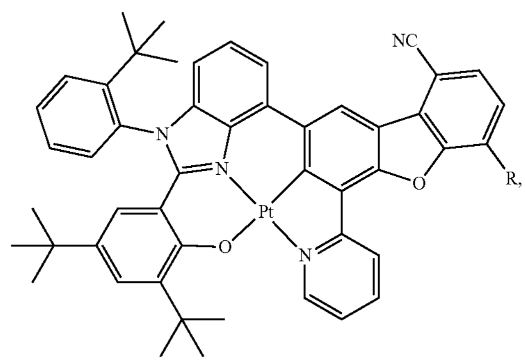

| | | | |
|---|---|---|---|
| R = H | M-168-1, | R = D | M-168-2 |
| R = $CD_3$ | M-168-3, | R = Ph | M-168-4 |
| R = $R_a$ | M-168-5, | R = $R_b$ | M-168-6 |
| R = $R_c$ | M-168-7, | R = $R_d$ | M-168-8 |
| R = $R_e$ | M-168-9, | R = $R_f$ | M-168-10 |

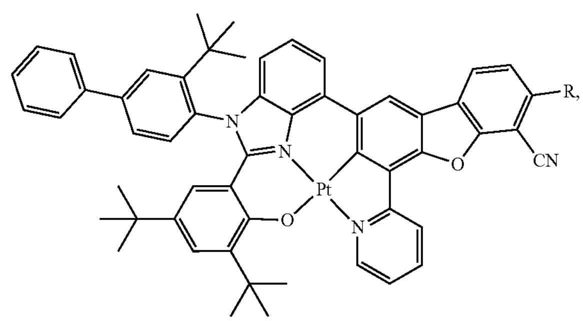

| | | | |
|---|---|---|---|
| R = H | M-169-1, | R = D | M-169-2 |
| R = $CD_3$ | M-169-3, | R = Ph | M-169-4 |
| R = $R_a$ | M-169-5, | R = $R_b$ | M-169-6 |
| R = $R_c$ | M-169-7, | R = $R_d$ | M-169-8 |
| R = $R_e$ | M-169-9, | R = $R_f$ | M-169-10 |

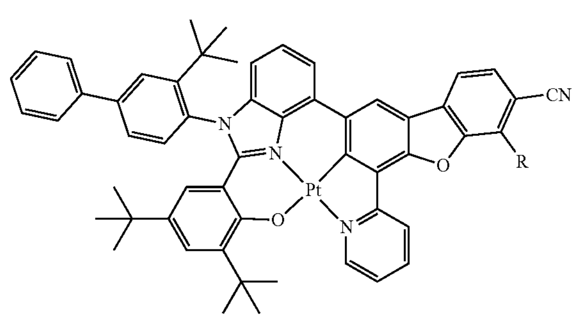

| | | | |
|---|---|---|---|
| R = H | M-170-1, | R = D | M-170-2 |
| R = $CD_3$ | M-170-3, | R = Ph | M-170-4 |
| R = $R_a$ | M-170-5, | R = $R_b$ | M-170-6 |
| R = $R_c$ | M-170-7, | R = $R_d$ | M-170-8 |
| R = $R_e$ | M-170-9, | R = $R_f$ | M-170-10 |

-continued

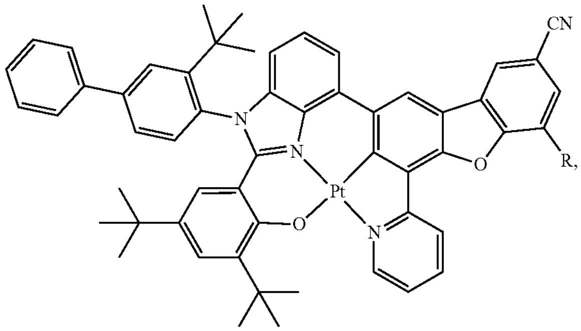

R = H M-171-1, R = D M-171-2
R = $CD_3$ M-171-3, R = Ph M-171-4
R = $R_a$ M-171-5, R = $R_b$ M-171-6
R = $R_c$ M-171-7, R = $R_d$ M-171-8
R = $R_e$ M-171-9, R = $R_f$ M-171-10

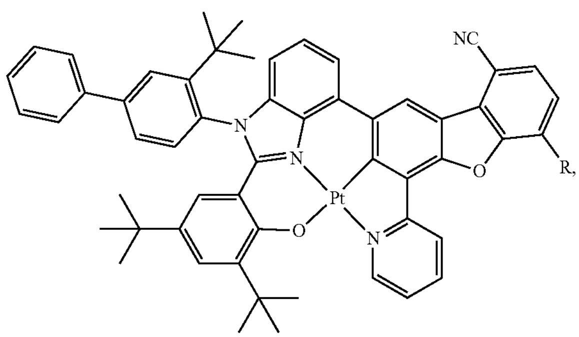

R = H M-172-1, R = D M-172-2
R = $CD_3$ M-172-3, R = Ph M-172-4
R = $R_a$ M-172-5, R = $R_b$ M-172-6
R = $R_c$ M-172-7, R = $R_d$ M-172-8
R = $R_e$ M-172-9, R = $R_f$ M-172-10

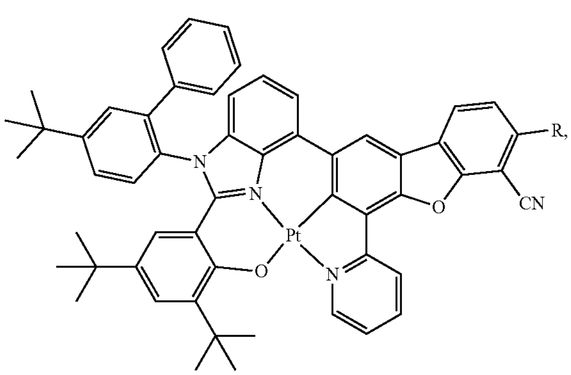

R=H M-173-1, R=D M-173-2
R=$CD_3$ M-173-3, R=H M-173-4
R=$R_a$ M-173-5, R=$R_b$ M-173-6
R=$R_c$ M-173-7, R=$R_d$ M-173-8
R=$R_e$ M-173-9, R=$R_f$ M-173-10

-continued

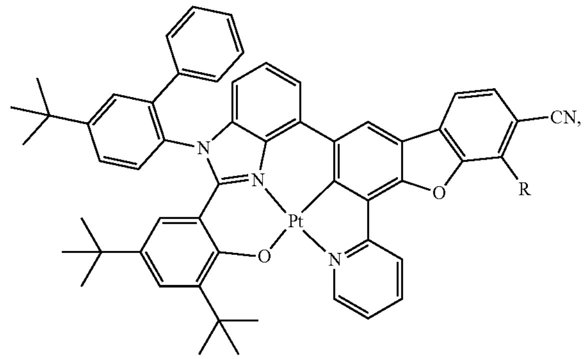

R=H M-174-1, R=D M-174-2
R=$CD_3$ M-174-3, R=H M-174-4
R=$R_a$ M-174-5, R=$R_b$ M-174-6
R=$R_c$ M-174-7, R=$R_d$ M-174-8
R=$R_e$ M-174-9, R=$R_f$ M-174-10

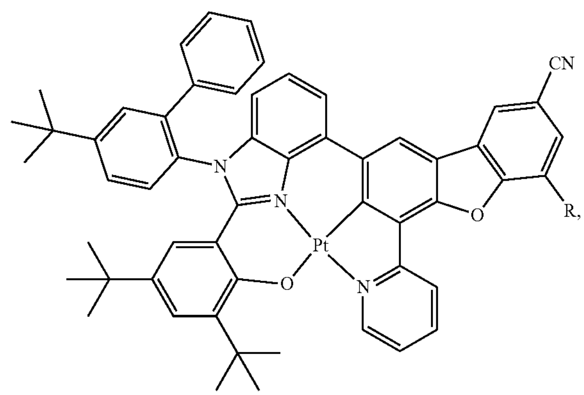

R=H M-175-1, R=D M-175-2
R=$CD_3$ M-175-3, R=H M-175-4
R=$R_a$ M-175-5, R=$R_b$ M-175-6
R=$R_c$ M-175-7, R=$R_d$ M-175-8
R=$R_e$ M-175-9, R=$R_f$ M-175-10

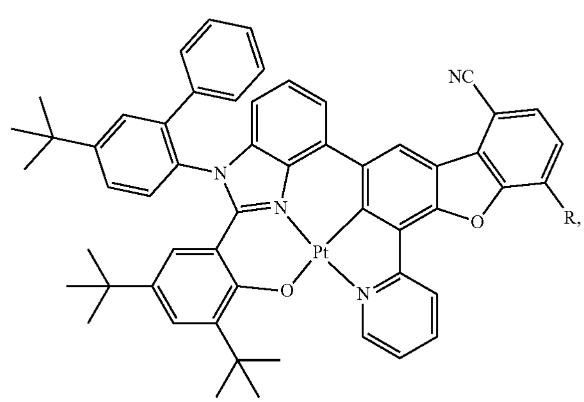

R=H M-176-1, R=D M-176-2
R=$CD_3$ M-176-3, R=H M-176-4
R=$R_a$ M-176-5, R=$R_b$ M-176-6
R=$R_c$ M-176-7, R=$R_d$ M-176-8
R=$R_e$ M-176-9, R=$R_f$ M-176-10

-continued

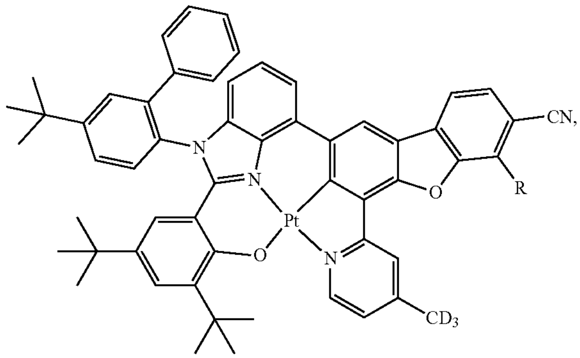

R=H M-177-1, R=D M-177-2
R=$CD_3$ M-177-3, R=H M-177-4
R=$R_a$ M-177-5, R=$R_b$ M-177-6
R=$R_c$ M-177-7, R=$R_d$ M-177-8
R=$R_e$ M-177-9, R=$R_f$ M-177-10

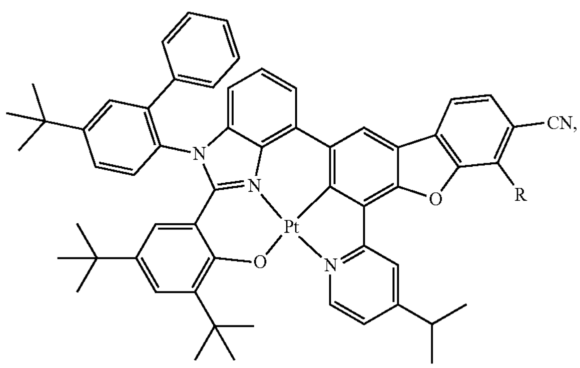

R=H M-178-1, R=D M-178-2
R=$CD_3$ M-178-3, R=H M-178-4
R=$R_a$ M-178-5, R=$R_b$ M-178-6
R=$R_c$ M-178-7, R=$R_d$ M-178-8
R=$R_e$ M-178-9, R=$R_f$ M-178-10

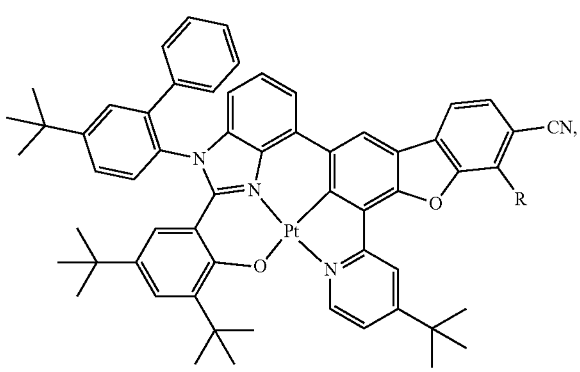

R=H M-179-1, R=D M-179-2
R=$CD_3$ M-179-3, R=H M-179-4
R=$R_a$ M-179-5, R=$R_b$ M-179-6
R=$R_c$ M-179-7, R=$R_d$ M-179-8
R=$R_e$ M-179-9, R=$R_f$ M-179-10

-continued

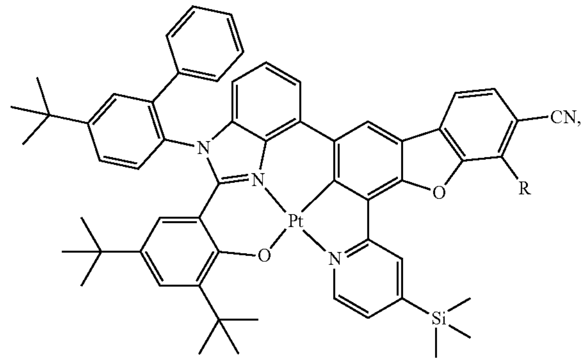

R=H M-180-1, R=D M-180-2
R=$CD_3$ M-180-3, R=H M-180-4
R=$R_a$ M-180-5, R=$R_b$ M-180-6
R=$R_c$ M-180-7, R=$R_d$ M-180-8
R=$R_e$ M-180-9, R=$R_f$ M-180-10

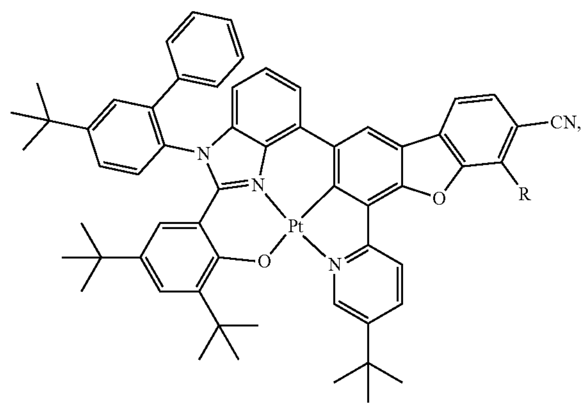

R=H M-181-1, R=D M-181-2
R=$CD_3$ M-181-3, R=H M-181-4
R=$R_a$ M-181-5, R=$R_b$ M-181-6
R=$R_c$ M-181-7, R=$R_d$ M-181-8
R=$R_e$ M-181-9, R=$R_f$ M-181-10

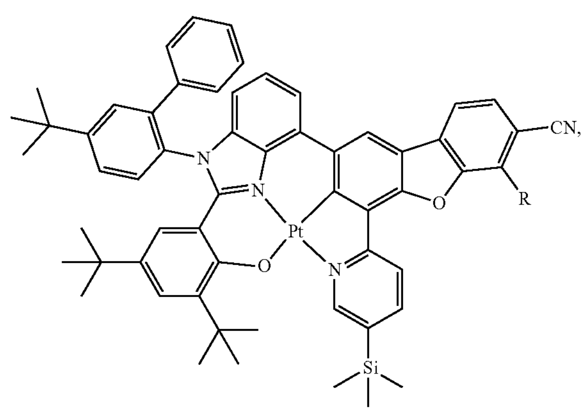

R=H M-182-1, R=D M-182-2
R=$CD_3$ M-182-3, R=H M-182-4
R=$R_a$ M-182-5, R=$R_b$ M-182-6
R=$R_c$ M-182-7, R=$R_d$ M-182-8
R=$R_e$ M-182-9, R=$R_f$ M-182-10

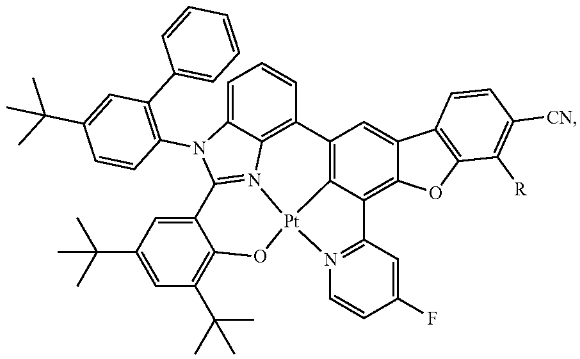

R=H M-183-1, R=D M-183-2
R=$CD_3$ M-183-3, R=H M-183-4
R=$R_a$ M-183-5, R=$R_b$ M-183-6
R=$R_c$ M-183-7, R=$R_d$ M-183-8
R=$R_e$ M-183-9, R=$R_f$ M-183-10

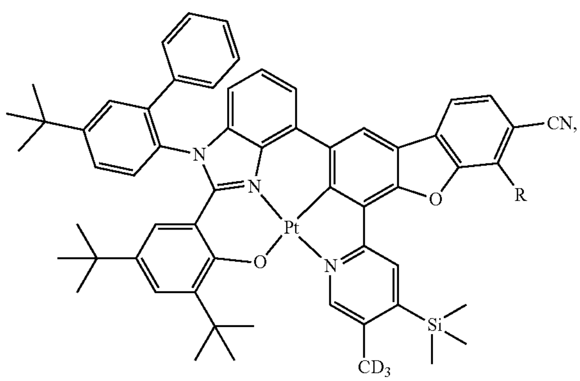

R=H M-184-1, R=D M-184-2
R=$CD_3$ M-184-3, R=H M-184-4
R=$R_a$ M-184-5, R=$R_b$ M-184-6
R=$R_c$ M-184-7, R=$R_d$ M-184-8
R=$R_e$ M-184-9, R=$R_f$ M-184-10

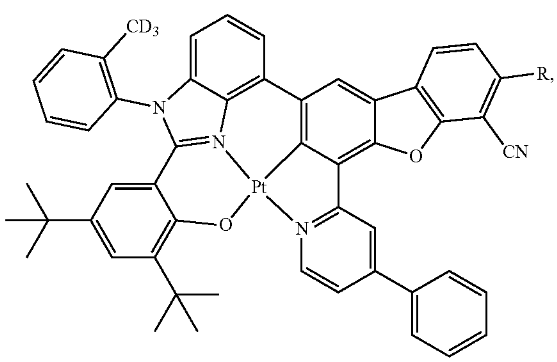

R=H M-185-1, R=D M-185-2
R=$CD_3$ M-185-3, R=H M-185-4
R=$R_a$ M-185-5, R=$R_b$ M-185-6
R=$R_c$ M-185-7, R=$R_d$ M-185-8
R=$R_e$ M-185-9, R=$R_f$ M-185-10

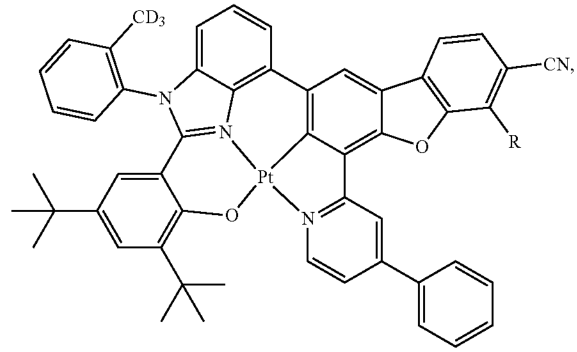

R=H M-186-1, R=D M-186-2
R=$CD_3$ M-186-3, R=H M-186-4
R=$R_a$ M-186-5, R=$R_b$ M-186-6
R=$R_c$ M-186-7, R=$R_d$ M-186-8
R=$R_e$ M-186-9, R=$R_f$ M-186-10

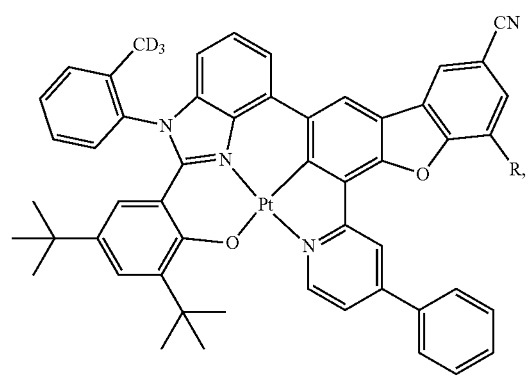

R=H M-187-1, R=D M-187-2
R=$CD_3$ M-187-3, R=H M-187-4
R=$R_a$ M-187-5, R=$R_b$ M-187-6
R=$R_c$ M-187-7, R=$R_d$ M-187-8
R=$R_e$ M-187-9, R=$R_f$ M-187-10

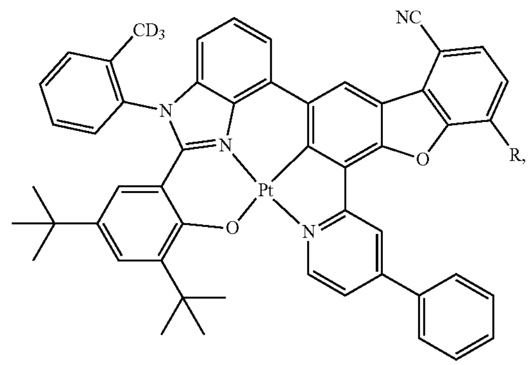

R=H M-188-1, R=D M-188-2
R=$CD_3$ M-188-3, R=H M-188-4
R=$R_a$ M-188-5, R=$R_b$ M-188-6
R=$R_c$ M-188-7, R=$R_d$ M-188-8
R=$R_e$ M-188-9, R=$R_f$ M-188-10

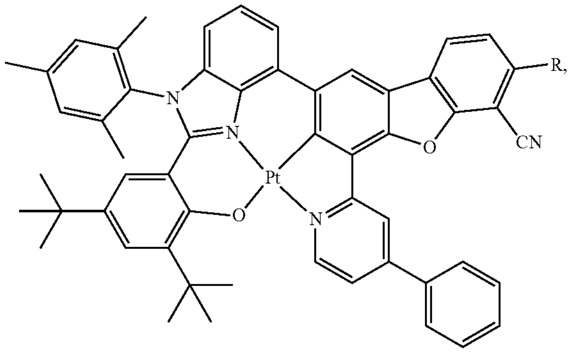

R=H M-189-1, R=D M-189-2
R=$CD_3$ M-189-3, R=H M-189-4
R=$R_a$ M-189-5, R=$R_b$ M-189-6
R=$R_c$ M-189-7, R=$R_d$ M-189-8
R=$R_e$ M-189-9, R=$R_f$ M-189-10

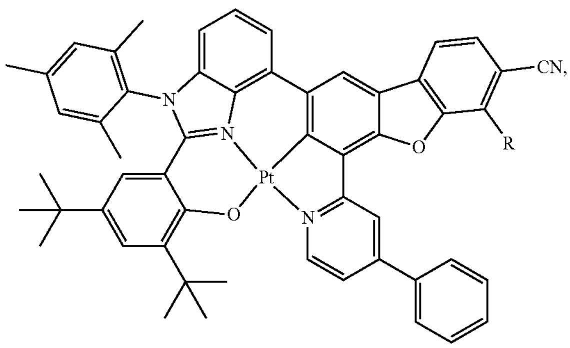

R=H M-190-1, R=D M-190-2
R=$CD_3$ M-190-3, R=H M-190-4
R=$R_a$ M-190-5, R=$R_b$ M-190-6
R=$R_c$ M-190-7, R=$R_d$ M-190-8
R=$R_e$ M-190-9, R=$R_f$ M-190-10

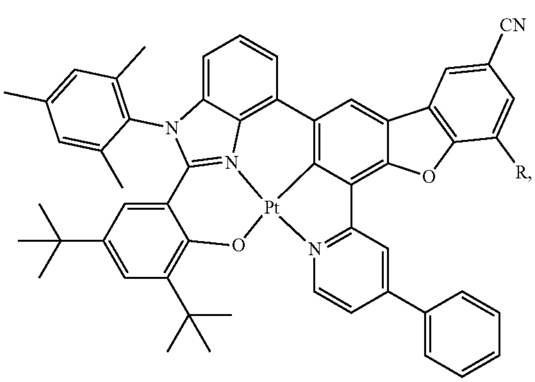

R=H M-191-1, R=D M-191-2
R=$CD_3$ M-191-3, R=H M-191-4
R=$R_a$ M-191-5, R=$R_b$ M-191-6
R=$R_c$ M-191-7, R=$R_d$ M-191-8
R=$R_e$ M-191-9, R=$R_f$ M-191-10

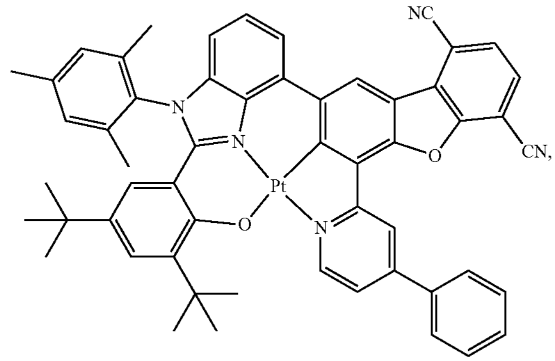

R=H M-192-1, R=D M-192-2
R=$CD_3$ M-192-3, R=H M-192-4
R=$R_a$ M-192-5, R=$R_b$ M-192-6
R=$R_c$ M-192-7, R=$R_d$ M-192-8
R=$R_e$ M-192-9, R=$R_f$ M-192-10

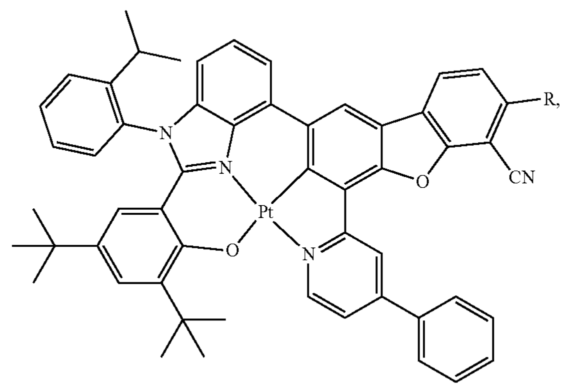

R=H M-193-1, R=D M-193-2
R=$CD_3$ M-193-3, R=H M-193-4
R=$R_a$ M-193-5, R=$R_b$ M-193-6
R=$R_c$ M-193-7, R=$R_d$ M-193-8
R=$R_e$ M-193-9, R=$R_f$ M-193-10

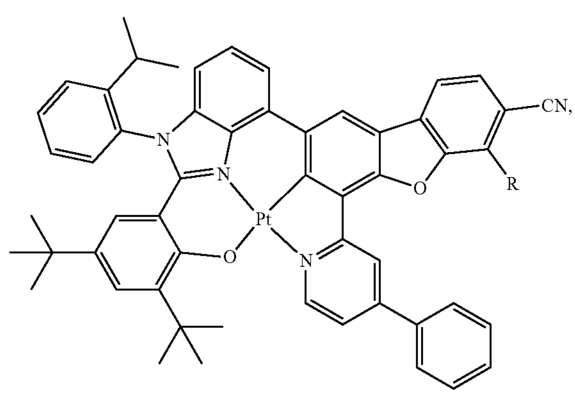

R=H M-194-1, R=D M-194-2
R=$CD_3$ M-194-3, R=H M-194-4
R=$R_a$ M-194-5, R=$R_b$ M-194-6
R=$R_c$ M-194-7, R=$R_d$ M-194-8
R=$R_e$ M-194-9, R=$R_f$ M-194-10

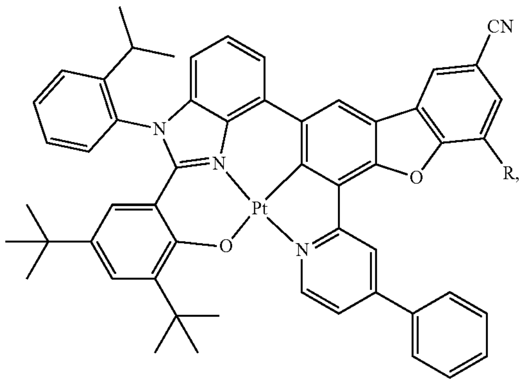

R=H M-195-1, R=D M-195-2
R=$CD_3$ M-195-3, R=H M-195-4
R=$R_a$ M-195-5, R=$R_b$ M-195-6
R=$R_c$ M-195-7, R=$R_d$ M-195-8
R=$R_e$ M-195-9, R=$R_f$ M-195-10

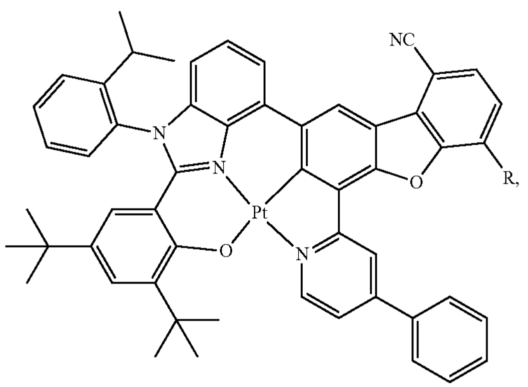

R=H M-196-1, R=D M-196-2
R=$CD_3$ M-196-3, R=H M-196-4
R=$R_a$ M-196-5, R=$R_b$ M-196-6
R=$R_c$ M-196-7, R=$R_d$ M-196-8
R=$R_e$ M-196-9, R=$R_f$ M-196-10

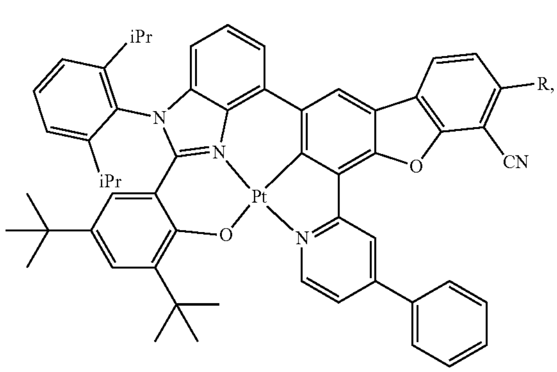

R=H M-197-1, R=D M-197-2
R=$CD_3$ M-197-3, R=H M-197-4
R=$R_a$ M-197-5, R=$R_b$ M-197-6
R=$R_c$ M-197-7, R=$R_d$ M-197-8
R=$R_e$ M-197-9, R=$R_f$ M-197-10

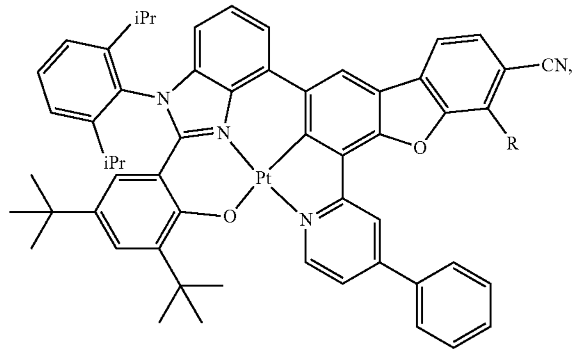

R=H M-198-1, R=D M-198-2
R=$CD_3$ M-198-3, R=H M-198-4
R=$R_a$ M-198-5, R=$R_b$ M-198-6
R=$R_c$ M-198-7, R=$R_d$ M-198-8
R=$R_e$ M-198-9, R=$R_f$ M-198-10

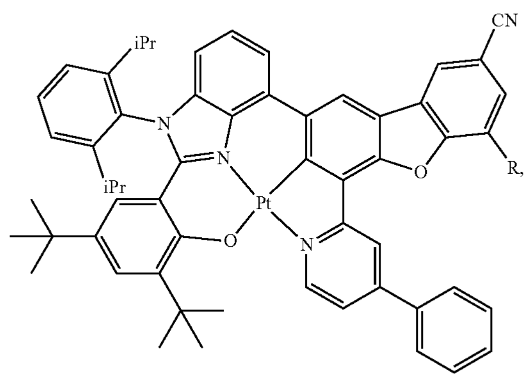

R=H M-199-1, R=D M-199-2
R=$CD_3$ M-199-3, R=H M-199-4
R=$R_a$ M-199-5, R=$R_b$ M-199-6
R=$R_c$ M-199-7, R=$R_d$ M-199-8
R=$R_e$ M-199-9, R=$R_f$ M-199-10

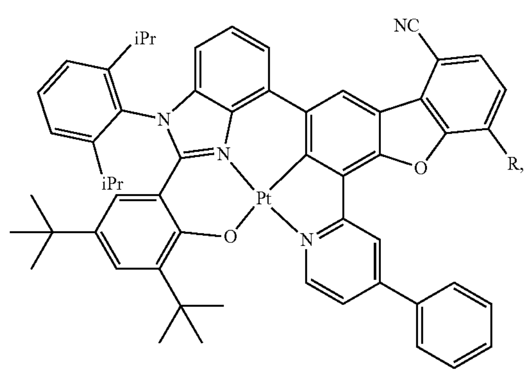

R=H M-200-1, R=D M-200-2
R=$CD_3$ M-200-3, R=H M-200-4
R=$R_a$ M-200-5, R=$R_b$ M-200-6
R=$R_c$ M-200-7, R=$R_d$ M-200-8
R=$R_e$ M-200-9, R=$R_f$ M-200-10

-continued

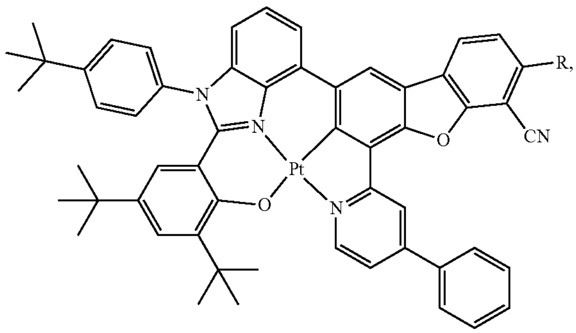

R=H M-201-1, R=D M-201-2
R=$CD_3$ M-201-3, R=H M-201-4
R=$R_a$ M-201-5, R=$R_b$ M-201-6
R=$R_c$ M-201-7, R=$R_d$ M-201-8
R=$R_e$ M-201-9, R=$R_f$ M-201-10

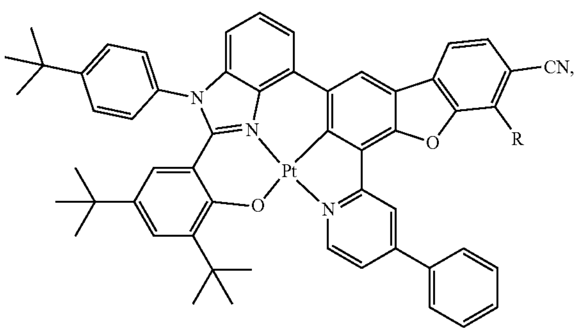

R=H M-202-1, R=D M-202-2
R=$CD_3$ M-202-3, R=H M-202-4
R=$R_a$ M-202-5, R=$R_b$ M-202-6
R=$R_c$ M-202-7, R=$R_d$ M-202-8
R=$R_e$ M-202-9, R=$R_f$ M-202-10

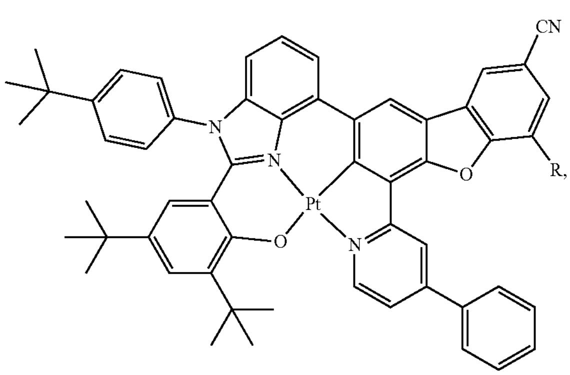

R=H M-203-1, R=D M-203-2
R=$CD_3$ M-203-3, R=H M-203-4
R=$R_a$ M-203-5, R=$R_b$ M-203-6
R=$R_c$ M-203-7, R=$R_d$ M-203-8
R=$R_e$ M-203-9, R=$R_f$ M-203-10

-continued

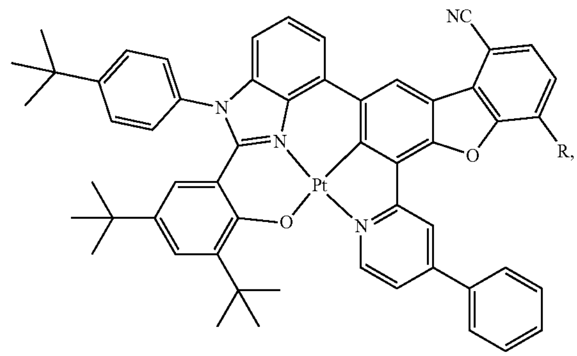

R=H M-204-1, R=D M-204-2
R=$CD_3$ M-204-3, R=H M-204-4
R=$R_a$ M-204-5, R=$R_b$ M-204-6
R=$R_c$ M-204-7, R=$R_d$ M-204-8
R=$R_e$ M-204-9, R=$R_f$ M-204-10

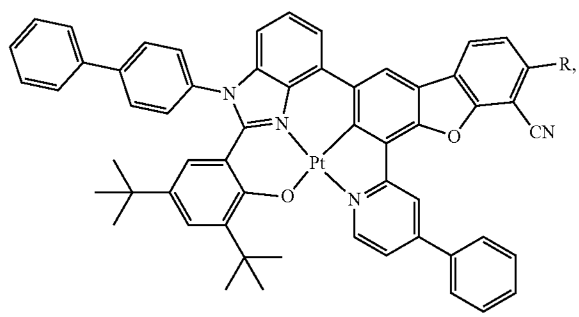

R=H M-205-1, R=D M-205-2
R=$CD_3$ M-205-3, R=H M-205-4
R=$R_a$ M-205-5, R=$R_b$ M-205-6
R=$R_c$ M-205-7, R=$R_d$ M-205-8
R=$R_e$ M-205-9, R=$R_f$ M-205-10

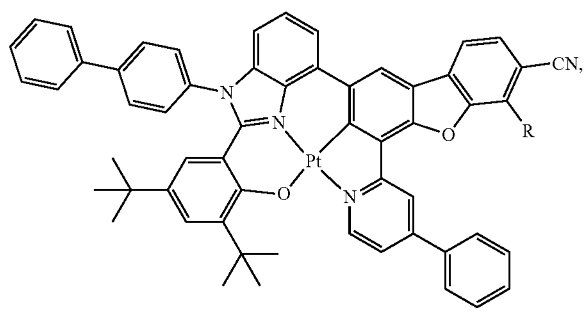

R=H M-206-1, R=D M-206-2
R=$CD_3$ M-206-3, R=H M-206-4
R=$R_a$ M-206-5, R=$R_b$ M-206-6
R=$R_c$ M-206-7, R=$R_d$ M-206-8
R=$R_e$ M-206-9, R=$R_f$ M-206-10

-continued

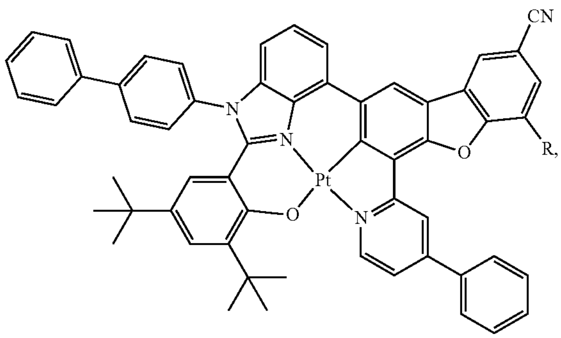

R=H M-207-1, R=D M-207-2
R=$CD_3$ M-207-3, R=H M-207-4
R=$R_a$ M-207-5, R=$R_b$ M-207-6
R=$R_c$ M-207-7, R=$R_d$ M-207-8
R=$R_e$ M-207-9, R=$R_f$ M-207-10

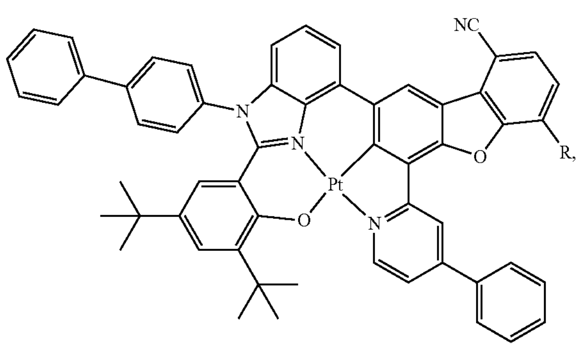

R=H M-208-1, R=D M-208-2
R=$CD_3$ M-208-3, R=H M-208-4
R=$R_a$ M-208-5, R=$R_b$ M-208-6
R=$R_c$ M-208-7, R=$R_d$ M-208-8
R=$R_e$ M-208-9, R=$R_f$ M-208-10

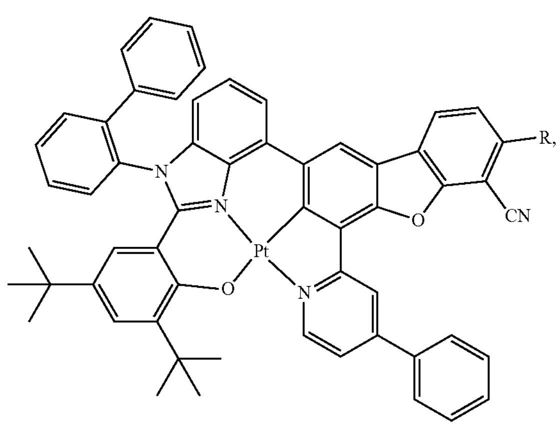

R=H M-209-1, R=D M-209-2
R=$CD_3$ M-209-3, R=H M-209-4
R=$R_a$ M-209-5, R=$R_b$ M-209-6
R=$R_c$ M-209-7, R=$R_d$ M-209-8
R=$R_e$ M-209-9, R=$R_f$ M-209-10

-continued

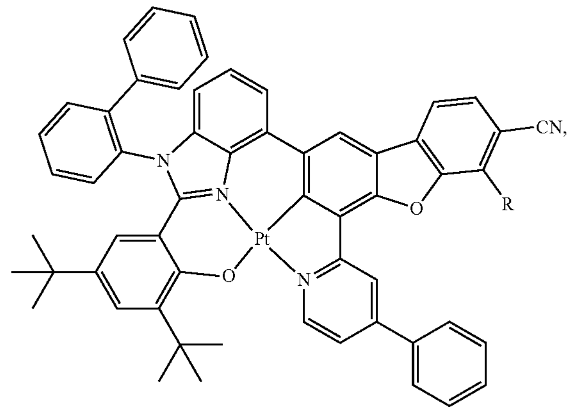

R=H M-210-1, R=D M-210-2
R=$CD_3$ M-210-3, R=H M-210-4
R=$R_a$ M-210-5, R=$R_b$ M-210-6
R=$R_c$ M-210-7, R=$R_d$ M-210-8
R=$R_e$ M-210-9, R=$R_f$ M-210-10

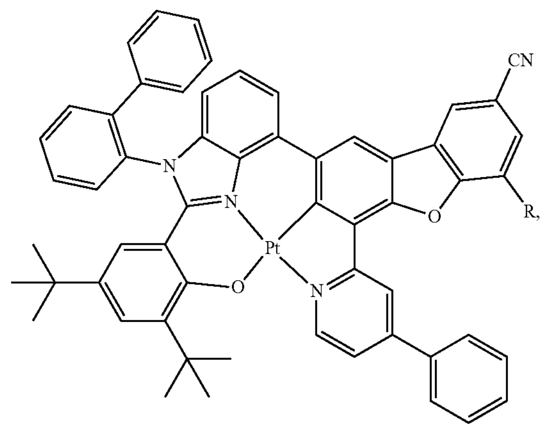

R=H M-211-1, R=D M-211-2
R=$CD_3$ M-211-3, R=H M-211-4
R=$R_a$ M-211-5, R=$R_b$ M-211-6
R=$R_c$ M-211-7, R=$R_d$ M-211-8
R=$R_e$ M-211-9, R=$R_f$ M-211-10

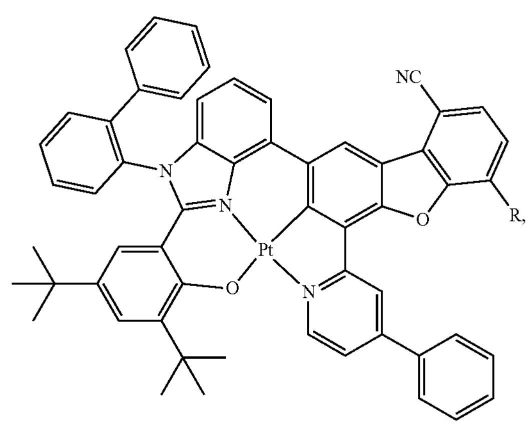

R=H M-212-1, R=D M-212-2
R=$CD_3$ M-212-3, R=H M-212-4
R=$R_a$ M-212-5, R=$R_b$ M-212-6
R=$R_c$ M-212-7, R=$R_d$ M-212-8
R=$R_e$ M-212-9, R=$R_f$ M-212-10

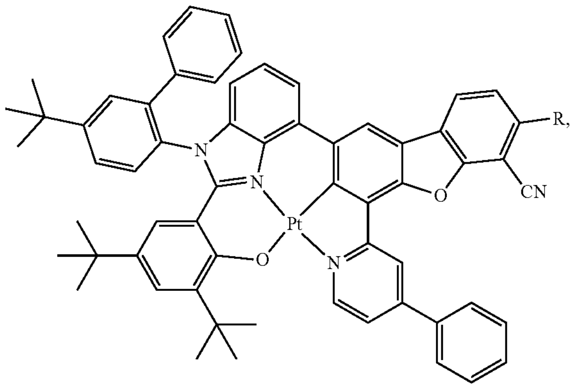

R=H M-213-1, R=D M-213-2
R=$CD_3$ M-213-3, R=H M-213-4
R=$R_a$ M-213-5, R=$R_b$ M-213-6
R=$R_c$ M-213-7, R=$R_d$ M-213-8
R=$R_e$ M-213-9, R=$R_f$ M-213-10

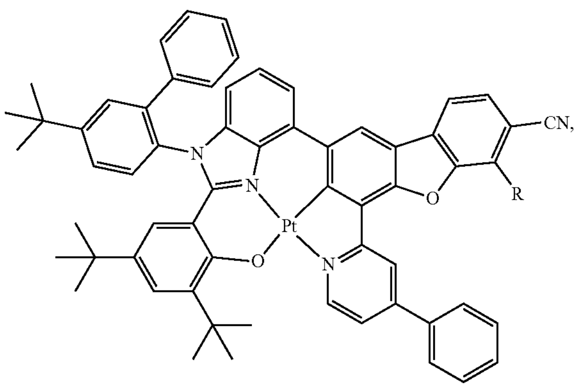

R=H M-214-1, R=D M-214-2
R=$CD_3$ M-214-3, R=H M-214-4
R=$R_a$ M-214-5, R=$R_b$ M-214-6
R=$R_c$ M-214-7, R=$R_d$ M-214-8
R=$R_e$ M-214-9, R=$R_f$ M-214-10

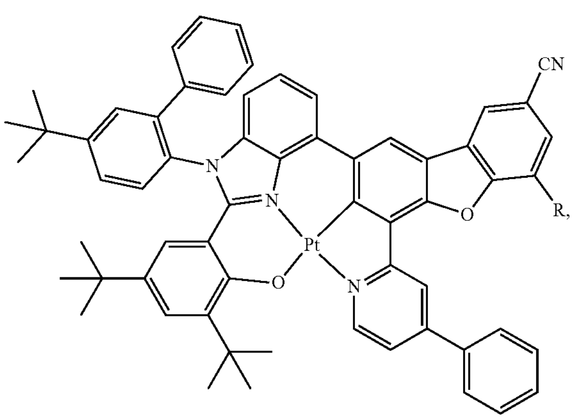

R=H M-215-1, R=D M-215-2
R=$CD_3$ M-215-3, R=H M-215-4
R=$R_a$ M-215-5, R=$R_b$ M-215-6
R=$R_c$ M-215-7, R=$R_d$ M-215-8
R=$R_e$ M-215-9, R=$R_f$ M-215-10

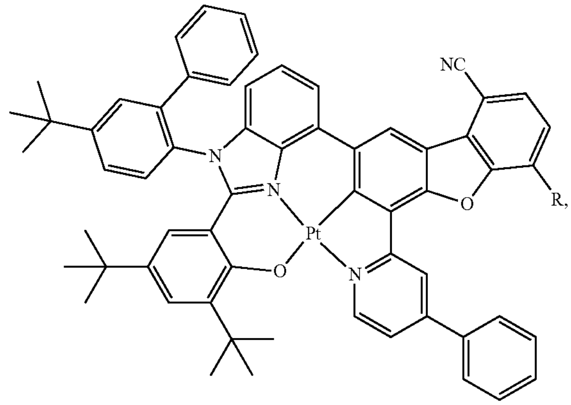

R=H M-216-1, R=D M-216-2
R=$CD_3$ M-216-3, R=H M-216-4
R=$R_a$ M-216-5, R=$R_b$ M-216-6
R=$R_c$ M-216-7, R=$R_d$ M-216-8
R=$R_e$ M-216-9, R=$R_f$ M-216-10

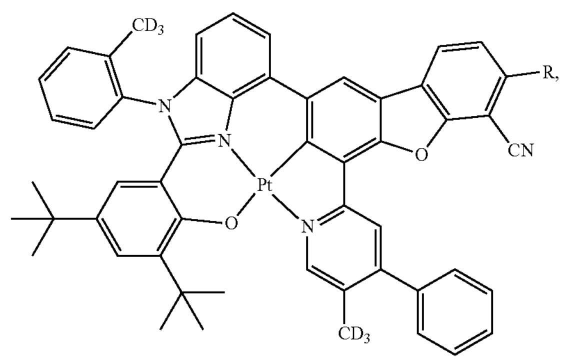

R=H M-217-1, R=D M-217-2
R=$CD_3$ M-217-3, R=H M-217-4
R=$R_a$ M-217-5, R=$R_b$ M-217-6
R=$R_c$ M-217-7, R=$R_d$ M-217-8
R=$R_e$ M-217-9, R=$R_f$ M-217-10

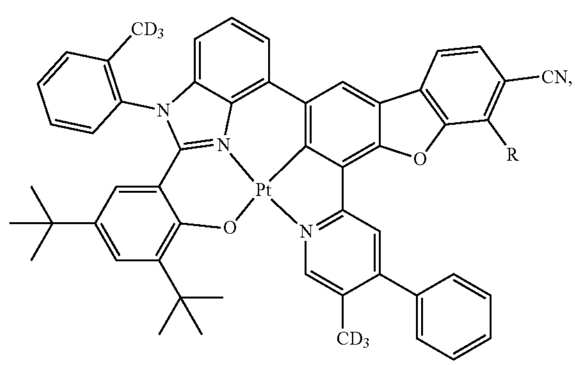

R=H M-218-1, R=D M-218-2
R=$CD_3$ M-218-3, R=H M-218-4
R=$R_a$ M-218-5, R=$R_b$ M-218-6
R=$R_c$ M-218-7, R=$R_d$ M-218-8
R=$R_e$ M-218-9, R=$R_f$ M-218-10

-continued

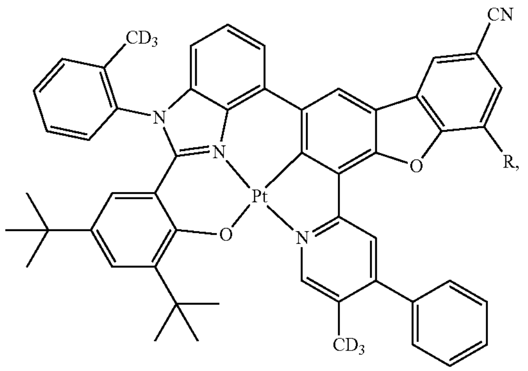

R=H M-219-1, R=D M-219-2
R=$CD_3$ M-219-3, R=H M-219-4
R=$R_a$ M-219-5, R=$R_b$ M-219-6
R=$R_c$ M-219-7, R=$R_d$ M-219-8
R=$R_e$ M-219-9, R=$R_f$ M-219-10

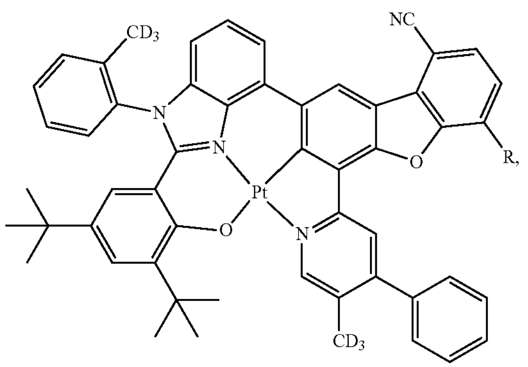

R=H M-220-1, R=D M-220-2
R=$CD_3$ M-220-3, R=H M-220-4
R=$R_a$ M-220-5, R=$R_b$ M-220-6
R=$R_c$ M-220-7, R=$R_d$ M-220-8
R=$R_e$ M-220-9, R=$R_f$ M-220-10

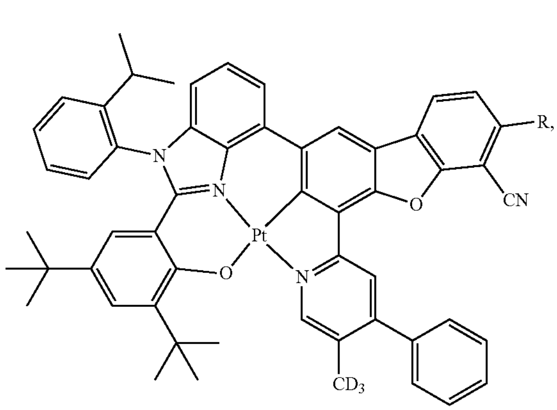

R=H M-221-1, R=D M-221-2
R=$CD_3$ M-221-3, R=H M-221-4
R=$R_a$ M-221-5, R=$R_b$ M-221-6
R=$R_c$ M-221-7, R=$R_d$ M-221-8
R=$R_e$ M-221-9, R=$R_f$ M-221-10

-continued

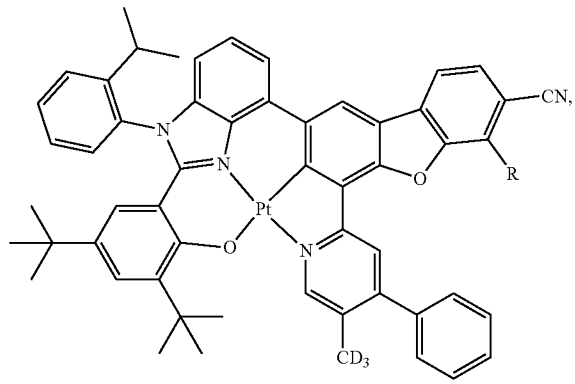

R=H M-222-1, R=D M-222-2
R=$CD_3$ M-222-3, R=H M-222-4
R=$R_a$ M-222-5, R=$R_b$ M-222-6
R=$R_c$ M-222-7, R=$R_d$ M-222-8
R=$R_e$ M-222-9, R=$R_f$ M-222-10

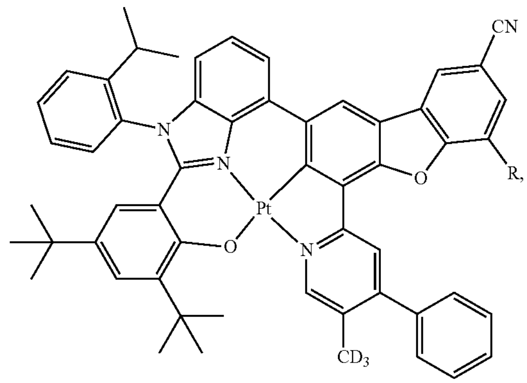

R=H M-223-1, R=D M-223-2
R=$CD_3$ M-223-3, R=H M-223-4
R=$R_a$ M-223-5, R=$R_b$ M-223-6
R=$R_c$ M-223-7, R=$R_d$ M-223-8
R=$R_e$ M-223-9, R=$R_f$ M-223-10

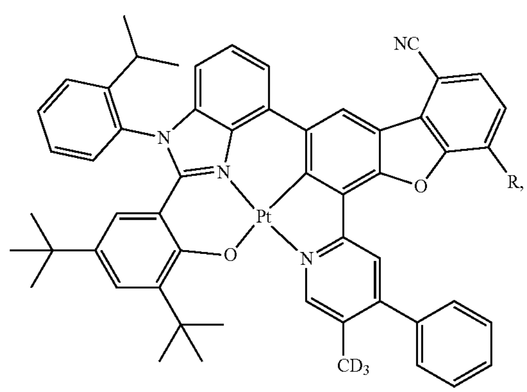

R=H M-224-1, R=D M-224-2
R=$CD_3$ M-224-3, R=H M-224-4
R=$R_a$ M-224-5, R=$R_b$ M-224-6
R=$R_c$ M-224-7, R=$R_d$ M-224-8
R=$R_e$ M-224-9, R=$R_f$ M-224-10

-continued

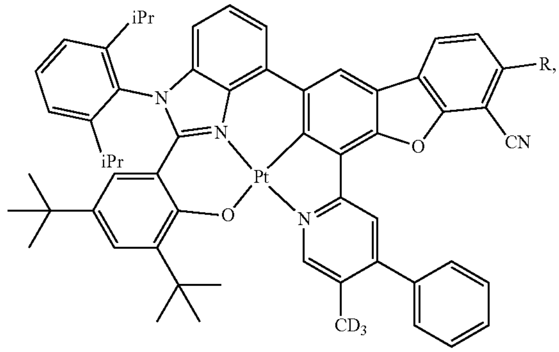

R=H M-225-1, R=D M-225-2
$R=CD_3$ M-225-3, R=H M-225-4
$R=R_a$ M-225-5, $R=R_b$ M-225-6
$R=R_c$ M-225-7, $R=R_d$ M-225-8
$R=R_e$ M-225-9, $R=R_f$ M-225-10

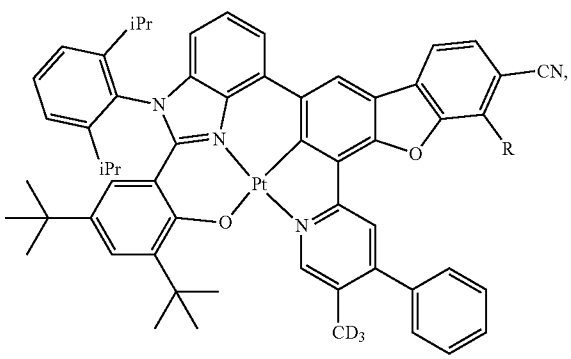

R=H M-226-1, R=D M-226-2
$R=CD_3$ M-226-3, R=H M-226-4
$R=R_a$ M-226-5, $R=R_b$ M-226-6
$R=R_c$ M-226-7, $R=R_d$ M-226-8
$R=R_e$ M-226-9, $R=R_f$ M-226-10

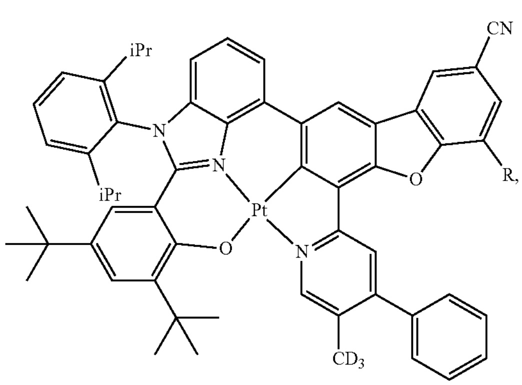

R=H M-227-1, R=D M-227-2
$R=CD_3$ M-227-3, R=H M-227-4
$R=R_a$ M-227-5, $R=R_b$ M-227-6
$R=R_c$ M-227-7, $R=R_d$ M-227-8
$R=R_e$ M-227-9, $R=R_f$ M-227-10

-continued

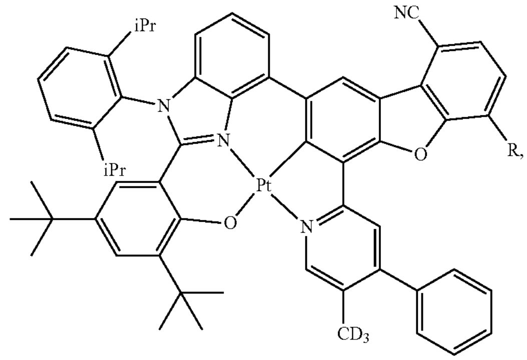

R=H M-228-1, R=D M-228-2
$R=CD_3$ M-228-3, R=H M-228-4
$R=R_a$ M-228-5, $R=R_b$ M-228-6
$R=R_c$ M-228-7, $R=R_d$ M-228-8
$R=R_e$ M-228-9, $R=R_f$ M-228-10

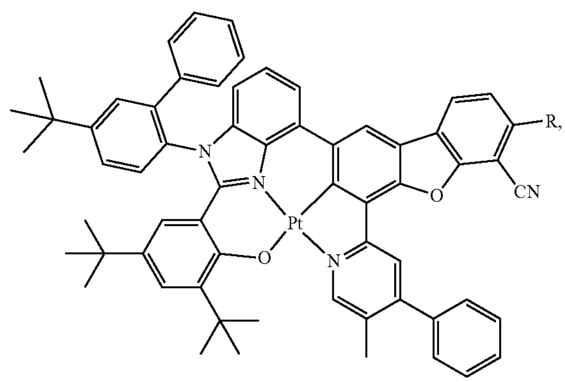

R=H M-229-1, R=D M-229-2
$R=CD_3$ M-229-3, R=H M-229-4
$R=R_a$ M-229-5, $R=R_b$ M-229-6
$R=R_c$ M-229-7, $R=R_d$ M-229-8
$R=R_e$ M-229-9, $R=R_f$ M-229-10

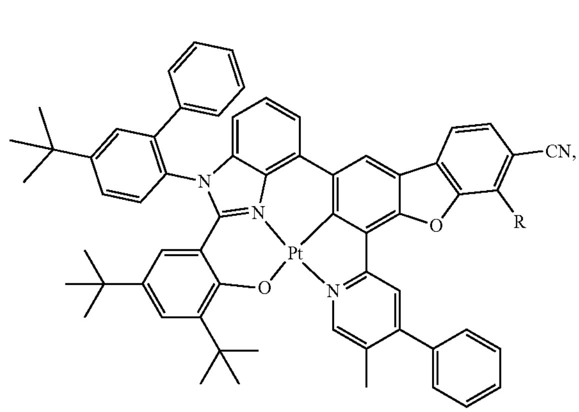

R=H M-230-1, R=D M-230-2
$R=CD_3$ M-230-3, R=H M-230-4
$R=R_a$ M-230-5, $R=R_b$ M-230-6
$R=R_c$ M-230-7, $R=R_d$ M-230-8
$R=R_e$ M-230-9, $R=R_f$ M-230-10

-continued

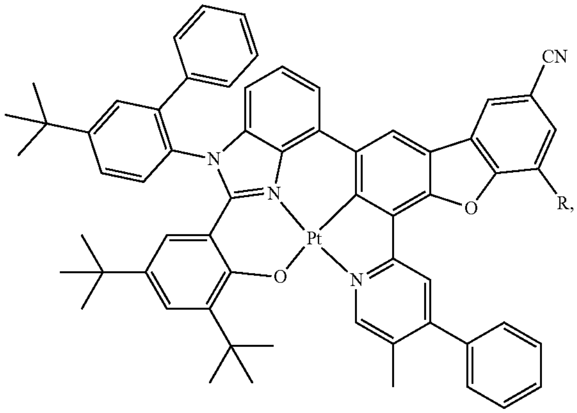

R=H M-231-1, R=D M-231-2
R=$CD_3$ M-231-3, R=H M-231-4
R=$R_a$ M-231-5, R=$R_b$ M-231-6
R=$R_c$ M-231-7, R=$R_d$ M-231-8
R=$R_e$ M-231-9, R=$R_f$ M-231-10

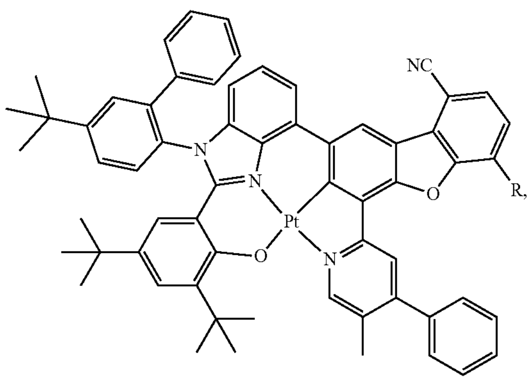

R=H M-232-1, R=D M-232-2
R=$CD_3$ M-232-3, R=H M-232-4
R=$R_a$ M-232-5, R=$R_b$ M-232-6
R=$R_c$ M-232-7, R=$R_d$ M-232-8
R=$R_e$ M-232-9, R=$R_f$ M-232-10

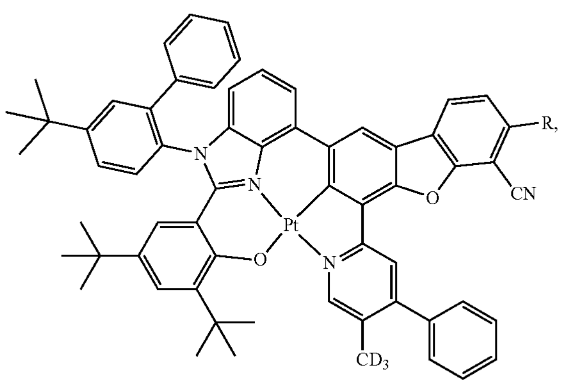

R=H M-233-1, R=D M-233-2
R=$CD_3$ M-233-3, R=H M-233-4
R=$R_a$ M-233-5, R=$R_b$ M-233-6
R=$R_c$ M-233-7, R=$R_d$ M-233-8
R=$R_e$ M-233-9, R=$R_f$ M-233-10

-continued

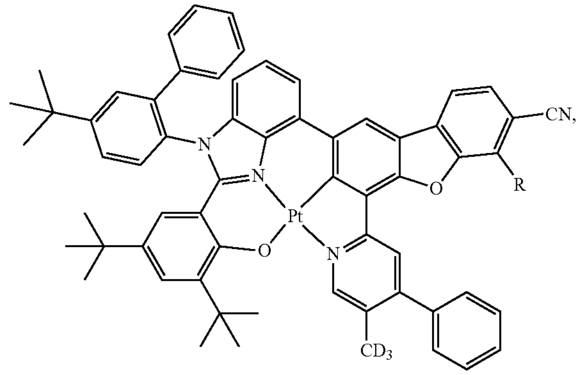

R=H M-234-1, R=D M-234-2
R=$CD_3$ M-234-3, R=H M-234-4
R=$R_a$ M-234-5, R=$R_b$ M-234-6
R=$R_c$ M-234-7, R=$R_d$ M-234-8
R=$R_e$ M-234-9, R=$R_f$ M-234-10

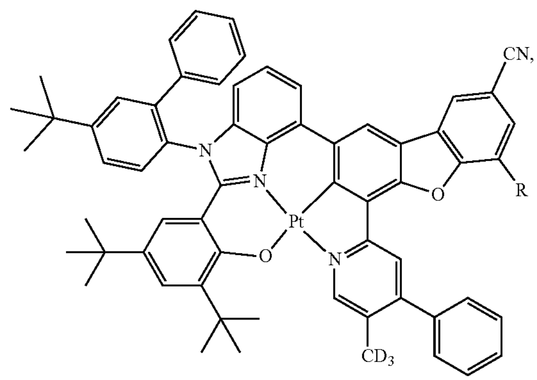

R=H M-235-1, R=D M-235-2
R=$CD_3$ M-235-3, R=H M-235-4
R=$R_a$ M-235-5, R=$R_b$ M-235-6
R=$R_c$ M-235-7, R=$R_d$ M-235-8
R=$R_e$ M-235-9, R=$R_f$ M-235-10

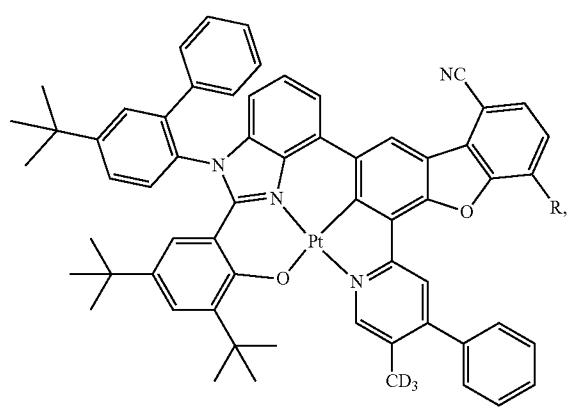

R=H M-236-1, R=D M-236-2
R=$CD_3$ M-236-3, R=H M-236-4
R=$R_a$ M-236-5, R=$R_b$ M-236-6
R=$R_c$ M-236-7, R=$R_d$ M-236-8
R=$R_e$ M-236-9, R=$R_f$ M-236-10

-continued

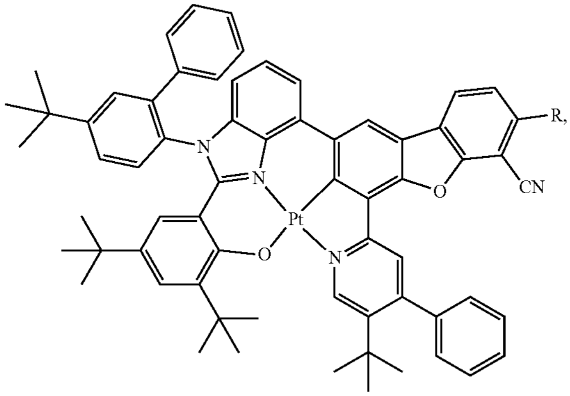

R=H M-237-1, R=D M-237-2
R=$CD_3$ M-237-3, R=H M-237-4
R=$R_a$ M-237-5, R=$R_b$ M-237-6
R=$R_c$ M-237-7, R=$R_d$ M-237-8
R=$R_e$ M-237-9, R=$R_f$ M-237-10

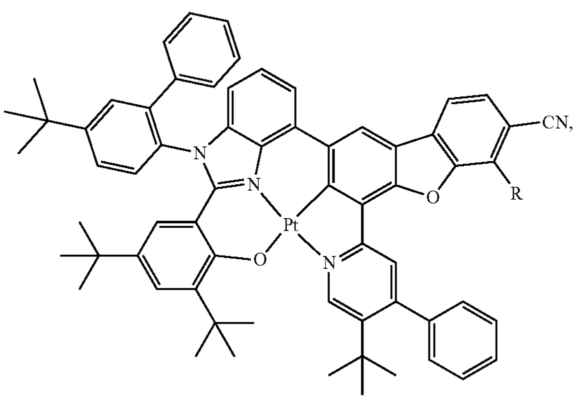

R=H M-238-1, R=D M-238-2
R=$CD_3$ M-238-3, R=H M-238-4
R=$R_a$ M-238-5, R=$R_b$ M-238-6
R=$R_c$ M-238-7, R=$R_d$ M-238-8
R=$R_e$ M-238-9, R=$R_f$ M-238-10

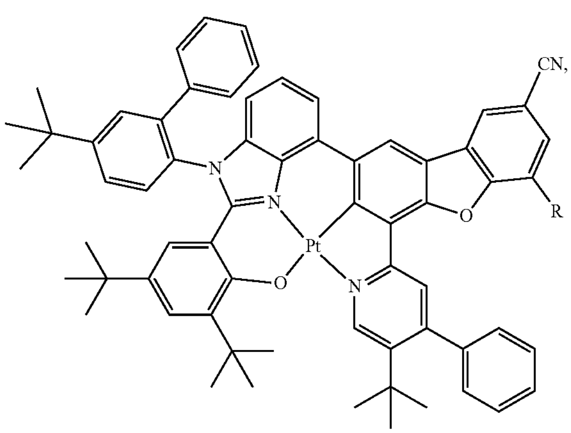

R=H M-239-1, R=D M-239-2
R=$CD_3$ M-239-3, R=H M-239-4
R=$R_a$ M-239-5, R=$R_b$ M-239-6
R=$R_c$ M-239-7, R=$R_d$ M-239-8
R=$R_e$ M-239-9, R=$R_f$ M-239-10

-continued

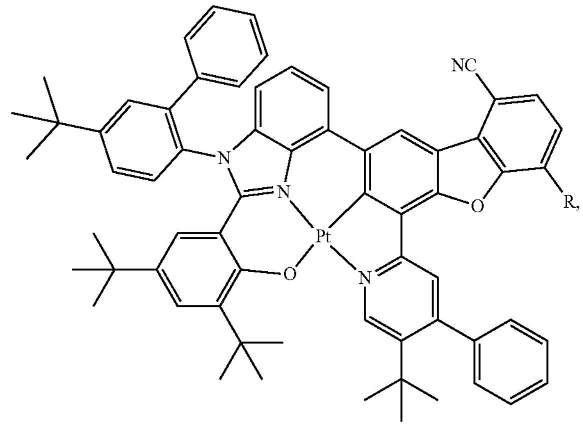

R=H M-240-1, R=D M-240-2
R=$CD_3$ M-240-3, R=H M-240-4
R=$R_a$ M-240-5, R=$R_b$ M-240-6
R=$R_c$ M-240-7, R=$R_d$ M-240-8
R=$R_e$ M-240-9, R=$R_f$ M-240-10

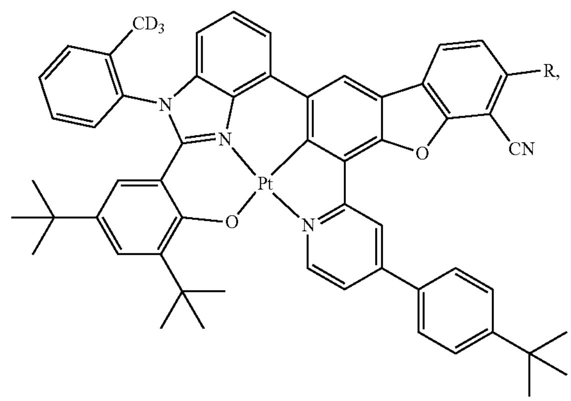

R=H M-241-1, R=D M-241-2
R=$CD_3$ M-241-3, R=H M-241-4
R=$R_a$ M-241-5, R=$R_b$ M-241-6
R=$R_c$ M-241-7, R=$R_d$ M-241-8
R=$R_e$ M-241-9, R=$R_f$ M-241-10

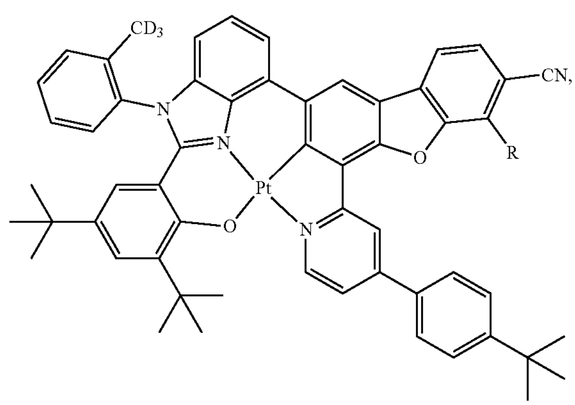

R=H M-242-1, R=D M-242-2
R=$CD_3$ M-242-3, R=H M-242-4
R=$R_a$ M-242-5, R=$R_b$ M-242-6
R=$R_c$ M-242-7, R=$R_d$ M-242-8
R=$R_e$ M-242-9, R=$R_f$ M-242-10

-continued

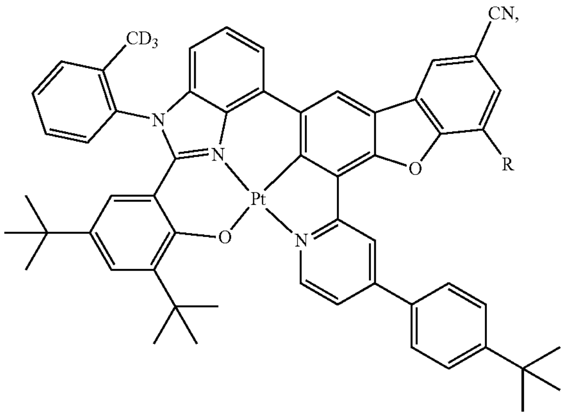

R=H M-243-1, R=D M-243-2
R=$CD_3$ M-243-3, R=H M-243-4
R=$R_a$ M-243-5, R=$R_b$ M-243-6
R=$R_c$ M-243-7, R=$R_d$ M-243-8
R=$R_e$ M-243-9, R=$R_f$ M-243-10

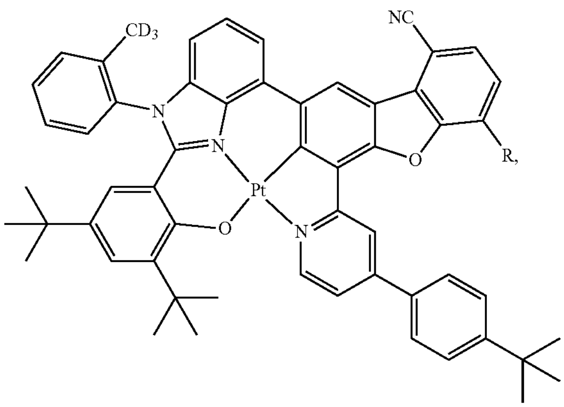

R=H M-244-1, R=D M-244-2
R=$CD_3$ M-244-3, R=H M-244-4
R=$R_a$ M-244-5, R=$R_b$ M-244-6
R=$R_c$ M-244-7, R=$R_d$ M-244-8
R=$R_e$ M-244-9, R=$R_f$ M-244-10

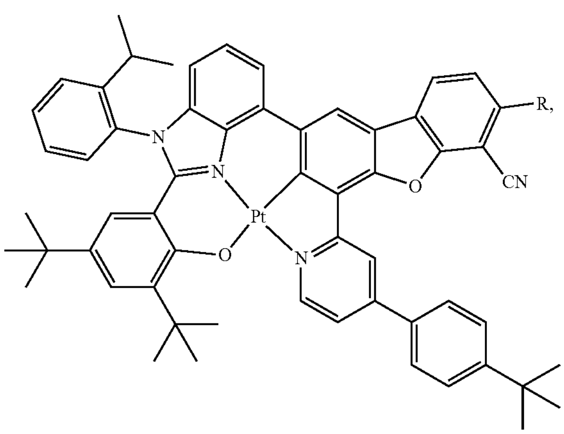

R=H M-245-1, R=D M-245-2
R=$CD_3$ M-245-3, R=H M-245-4
R=$R_a$ M-245-5, R=$R_b$ M-245-6
R=$R_c$ M-245-7, R=$R_d$ M-245-8
R=$R_e$ M-245-9, R=$R_f$ M-245-10

-continued

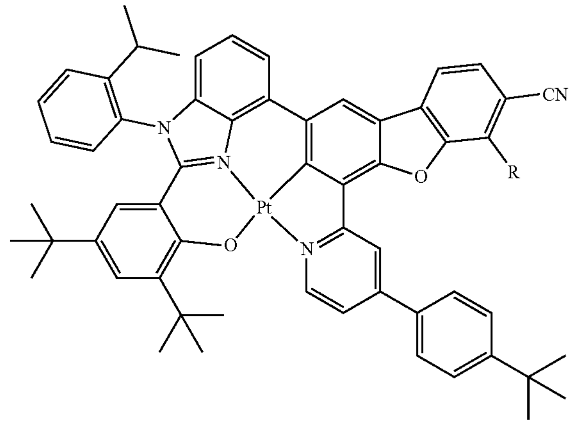

R=H M-246-1, R=D M-246-2
R=$CD_3$ M-246-3, R=H M-246-4
R=$R_a$ M-246-5, R=$R_b$ M-246-6
R=$R_c$ M-246-7, R=$R_d$ M-246-8
R=$R_e$ M-246-9, R=$R_f$ M-246-10

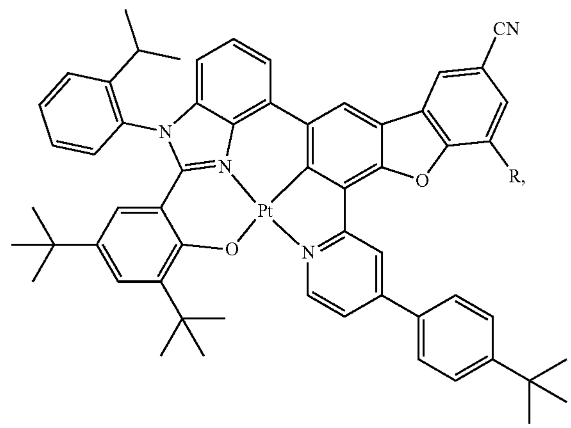

R=H M-247-1, R=D M-247-2
R=$CD_3$ M-247-3, R=H M-247-4
R=$R_a$ M-247-5, R=$R_b$ M-247-6
R=$R_c$ M-247-7, R=$R_d$ M-247-8
R=$R_e$ M-247-9, R=$R_f$ M-247-10

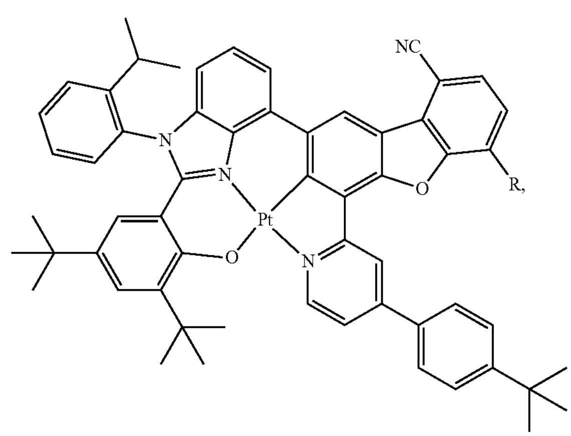

R=H M-248-1, R=D M-248-2
R=$CD_3$ M-248-3, R=H M-248-4
R=$R_a$ M-248-5, R=$R_b$ M-248-6
R=$R_c$ M-248-7, R=$R_d$ M-248-8
R=$R_e$ M-248-9, R=$R_f$ M-248-10

-continued

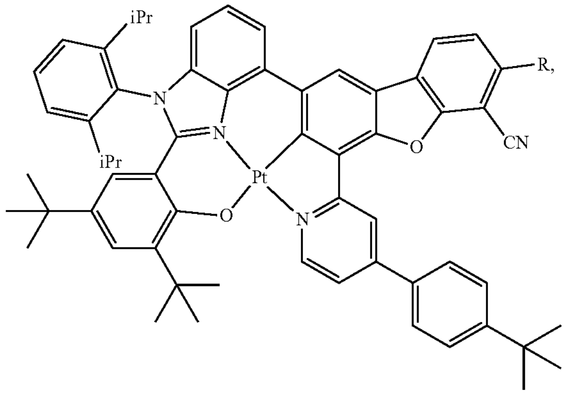

R=H M-249-1, R=D M-249-2
R=$CD_3$ M-249-3, R=H M-249-4
R=$R_a$ M-249-5, R=$R_b$ M-249-6
R=$R_c$ M-249-7, R=$R_d$ M-249-8
R=$R_e$ M-249-9, R=$R_f$ M-249-10

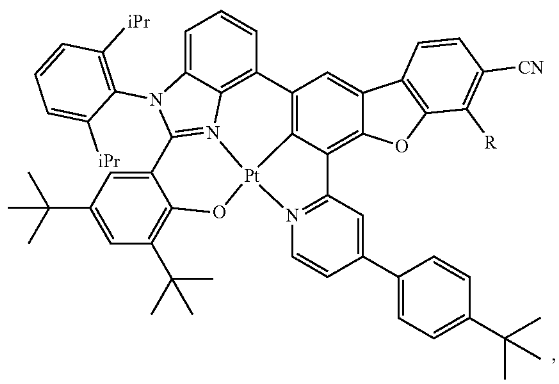

R=H M-250-1, R=D M-250-2
R=$CD_3$ M-250-3, R=H M-250-4
R=$R_a$ M-250-5, R=$R_b$ M-250-6
R=$R_c$ M-250-7, R=$R_d$ M-250-8
R=$R_e$ M-250-9, R=$R_f$ M-250-10

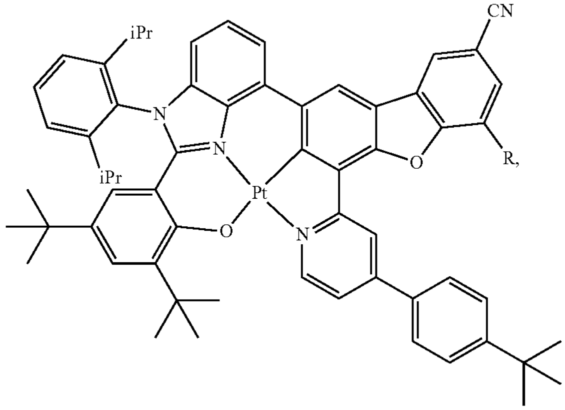

R=H M-251-1, R=D M-251-2
R=$CD_3$ M-251-3, R=H M-251-4
R=$R_a$ M-251-5, R=$R_b$ M-251-6
R=$R_c$ M-251-7, R=$R_d$ M-251-8
R=$R_e$ M-251-9, R=$R_f$ M-251-10

-continued

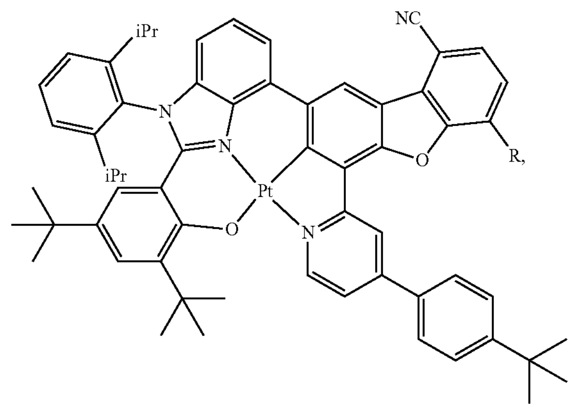

R=H M-252-1, R=D M-252-2
R=$CD_3$ M-252-3, R=H M-252-4
R=$R_a$ M-252-5, R=$R_b$ M-252-6
R=$R_c$ M-252-7, R=$R_d$ M-252-8
R=$R_e$ M-252-9, R=$R_f$ M-252-10

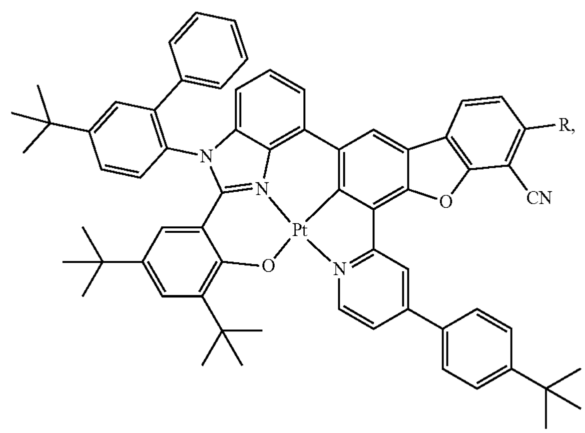

R=H M-253-1, R=D M-253-2
R=$CD_3$ M-253-3, R=H M-253-4
R=$R_a$ M-253-5, R=$R_b$ M-253-6
R=$R_c$ M-253-7, R=$R_d$ M-253-8
R=$R_e$ M-253-9, R=$R_f$ M-253-10

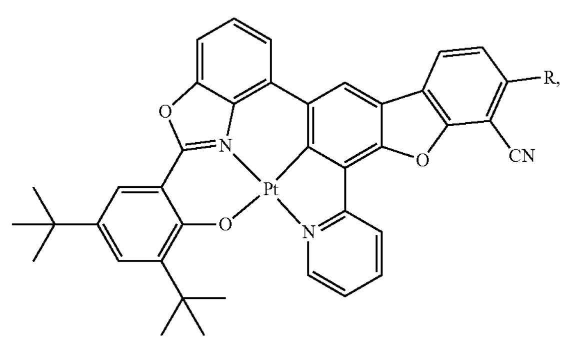

R = H M-437-1, R = D M-437-2
R = $CD_3$ M-437-3, R = Ph M-437-4
R = $R_a$ M-437-5, R = $R_b$ M-437-6
R = $R_c$ M-437-7, R = $R_d$ M-437-8
R = $R_e$ M-437-9, R = $R_f$ M-437-10

-continued

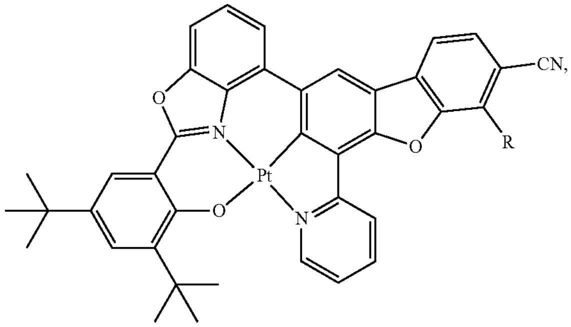

R = H M-438-1, R = D M-438-2
R = $CD_3$ M-438-3, R = Ph M-438-4
R = $R_a$ M-438-5, R = $R_b$ M-438-6
R = $R_c$ M-438-7, R = $R_d$ M-438-8
R = $R_e$ M-438-9, R = $R_f$ M-438-10

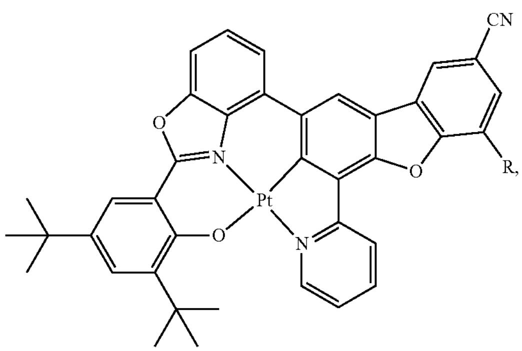

R = H M-439-1, R = D M-439-2
R = $CD_3$ M-439-3, R = Ph M-439-4
R = $R_a$ M-439-5, R = $R_b$ M-439-6
R = $R_c$ M-439-7, R = $R_d$ M-439-8
R = $R_e$ M-439-9, R = $R_f$ M-439-10

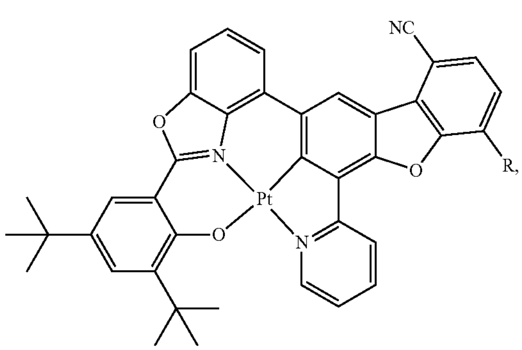

R = H M-440-1, R = D M-440-2
R = $CD_3$ M-440-3, R = Ph M-440-4
R = $R_a$ M-440-5, R = $R_b$ M-440-6
R = $R_c$ M-440-7, R = $R_d$ M-440-8
R = $R_e$ M-440-9, R = $R_f$ M-440-10

-continued

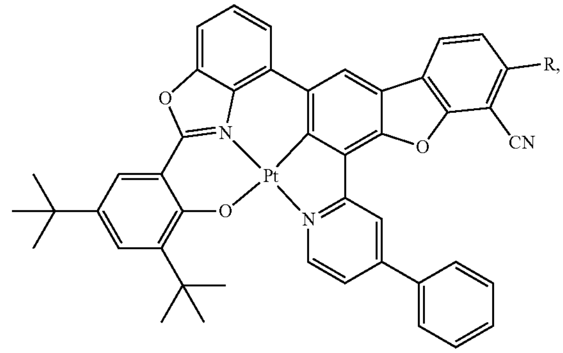

R = H M-441-1, R = D M-441-2
R = $CD_3$ M-441-3, R = Ph M-441-4
R = $R_a$ M-441-5, R = $R_b$ M-441-6
R = $R_c$ M-441-7, R = $R_d$ M-441-8
R = $R_e$ M-441-9, R = $R_f$ M-441-10

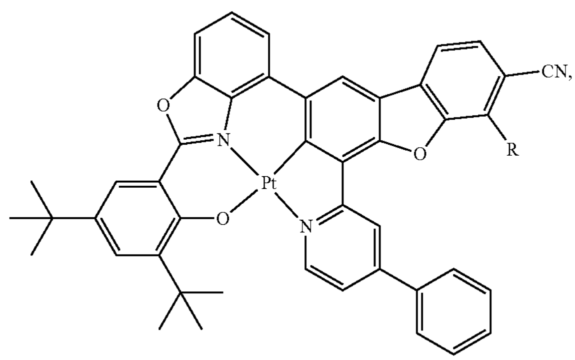

R = H M-442-1, R = D M-442-2
R = $CD_3$ M-442-3, R = Ph M-442-4
R = $R_a$ M-442-5, R = $R_b$ M-442-6
R = $R_c$ M-442-7, R = $R_d$ M-442-8
R = $R_e$ M-442-9, R = $R_f$ M-442-10

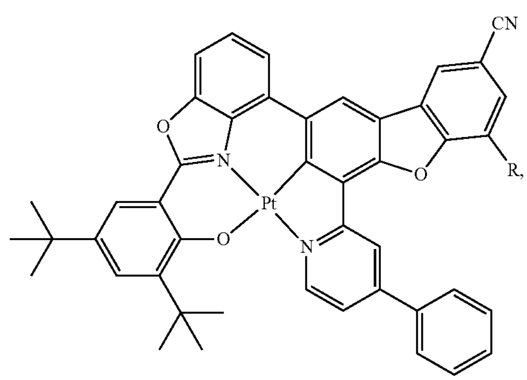

R = H M-443-1, R = D M-443-2
R = $CD_3$ M-443-3, R = Ph M-443-4
R = $R_a$ M-443-5, R = $R_b$ M-443-6
R = $R_c$ M-443-7, R = $R_d$ M-443-8
R = $R_e$ M-443-9, R = $R_f$ M-443-10

-continued

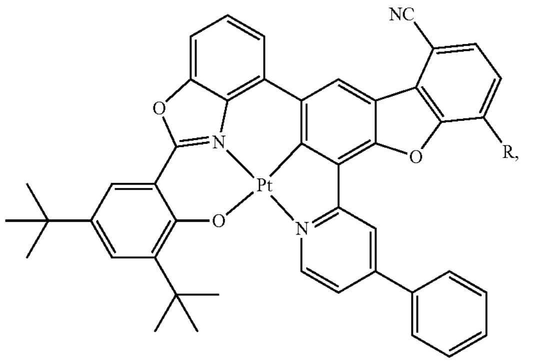

R = H M-444-1, R = D M-444-2
R = $CD_3$ M-444-3, R = Ph M-444-4
R = $R_a$ M-444-5, R = $R_b$ M-444-6
R = $R_c$ M-444-7, R = $R_d$ M-444-8
R = $R_e$ M-444-9, R = $R_f$ M-444-10

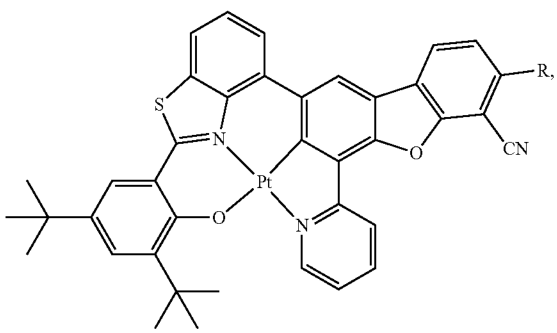

R = H M-445-1, R = D M-445-2
R = $CD_3$ M-445-3, R = Ph M-445-4
R = $R_a$ M-445-5, R = $R_b$ M-445-6
R = $R_c$ M-445-7, R = $R_d$ M-445-8
R = $R_e$ M-445-9, R = $R_f$ M-445-10

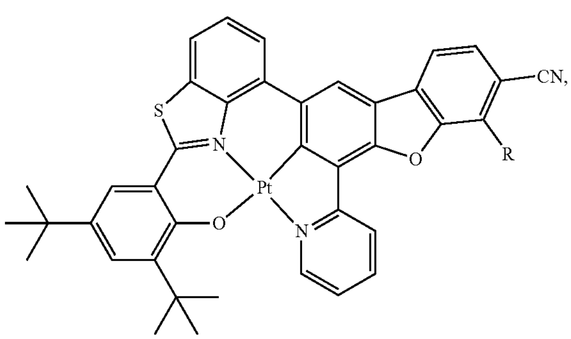

R = H M-446-1, R = D M-446-2
R = $CD_3$ M-446-3, R = Ph M-446-4
R = $R_a$ M-446-5, R = $R_b$ M-446-6
R = $R_c$ M-446-7, R = $R_d$ M-446-8
R = $R_e$ M-446-9, R = $R_f$ M-446-10

-continued

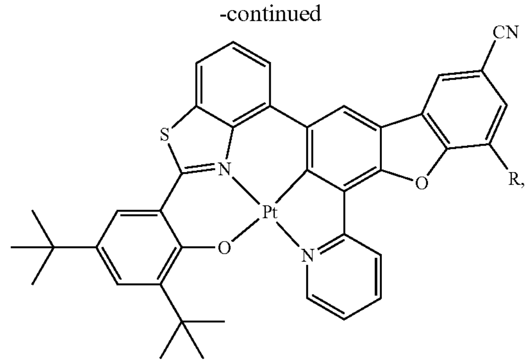

R = H M-447-1, R = D M-447-2
R = $CD_3$ M-447-3, R = Ph M-447-4
R = $R_a$ M-447-5, R = $R_b$ M-447-6
R = $R_c$ M-447-7, R = $R_d$ M-447-8
R = $R_e$ M-447-9, R = $R_f$ M-447-10

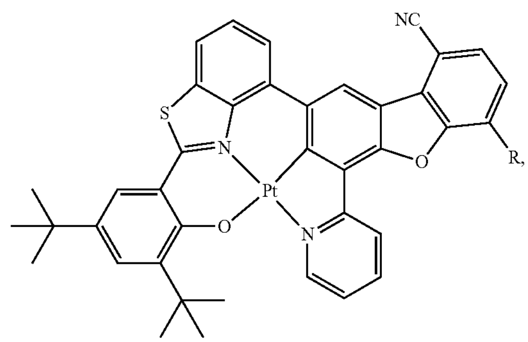

R = H M-448-1, R = D M-448-2
R = $CD_3$ M-448-3, R = Ph M-448-4
R = $R_a$ M-448-5, R = $R_b$ M-448-6
R = $R_c$ M-448-7, R = $R_d$ M-448-8
R = $R_e$ M-448-9, R = $R_f$ M-448-10

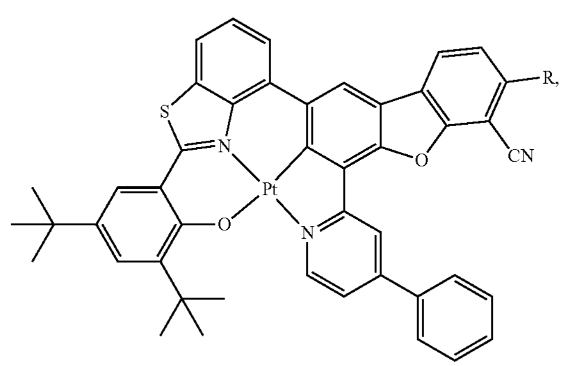

R = H M-449-1, R = D M-449-2
R = $CD_3$ M-449-3, R = Ph M-449-4
R = $R_a$ M-449-5, R = $R_b$ M-449-6
R = $R_c$ M-449-7, R = $R_d$ M-449-8
R = $R_e$ M-449-9, R = $R_f$ M-449-10

-continued
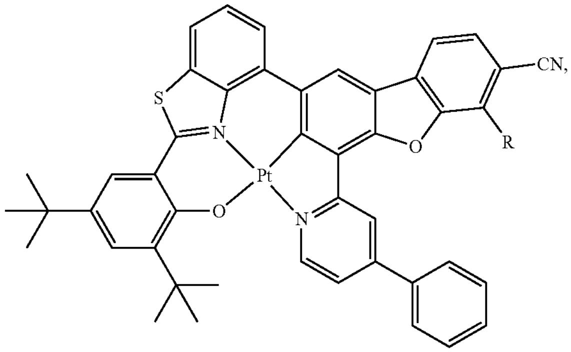
R = H M-450-1, R = D M-450-2
R = $CD_3$ M-450-3, R = Ph M-450-4
R = $R_a$ M-450-5, R = $R_b$ M-450-6
R = $R_c$ M-450-7, R = $R_d$ M-450-8
R = $R_e$ M-450-9, R = $R_f$ M-450-10
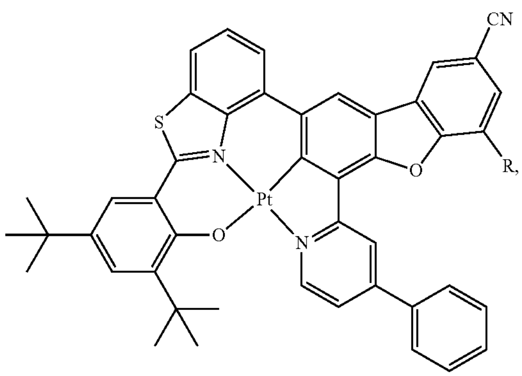
R = H M-451-1, R = D M-451-2
R = $CD_3$ M-451-3, R = Ph M-451-4
R = $R_a$ M-451-5, R = $R_b$ M-451-6
R = $R_c$ M-451-7, R = $R_d$ M-451-8
R = $R_e$ M-451-9, R = $R_f$ M-451-10
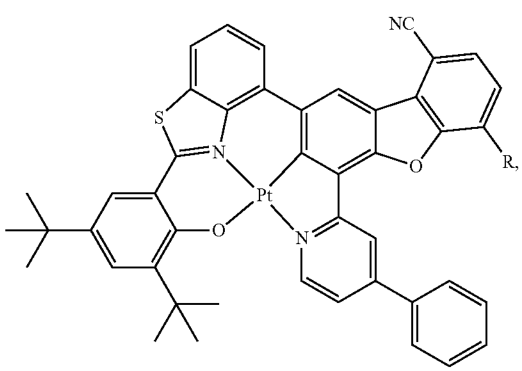
R = H M-452-1, R = D M-452-2
R = $CD_3$ M-452-3, R = Ph M-452-4
R = $R_a$ M-452-5, R = $R_b$ M-452-6
R = $R_c$ M-452-7, R = $R_d$ M-452-8
R = $R_e$ M-452-9, R = $R_f$ M-452-10
-continued
M-453
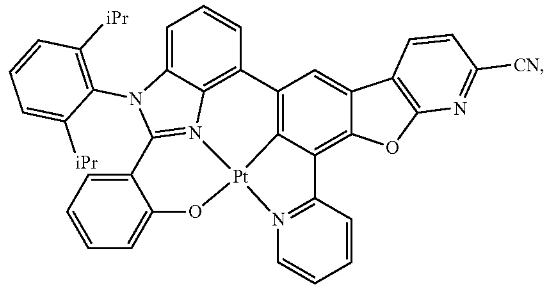
M-454
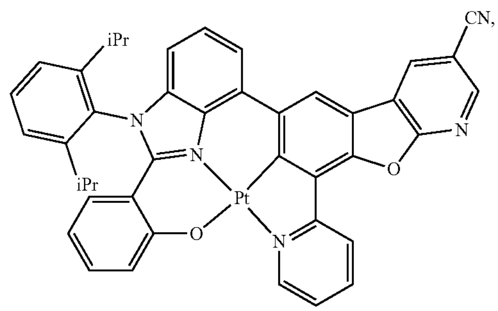
M-455
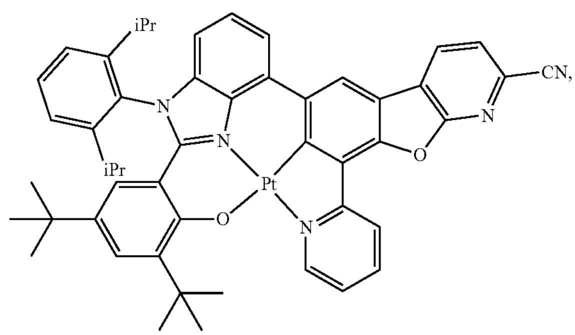
M-456
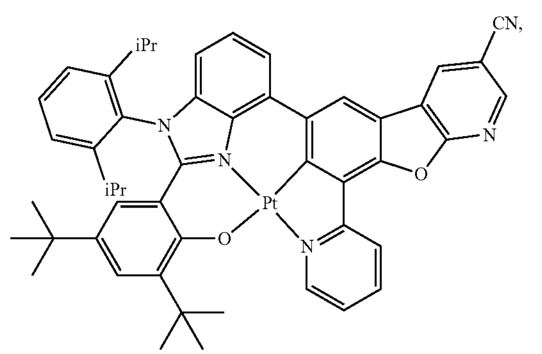

-continued
M-457
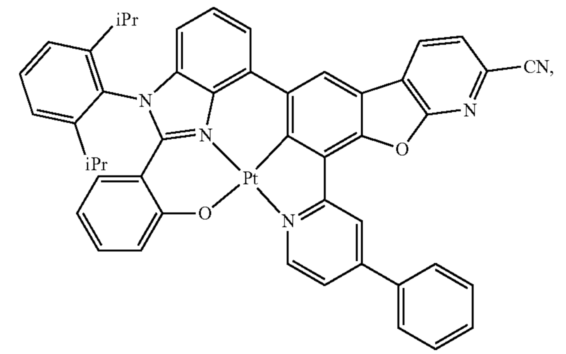
M-458
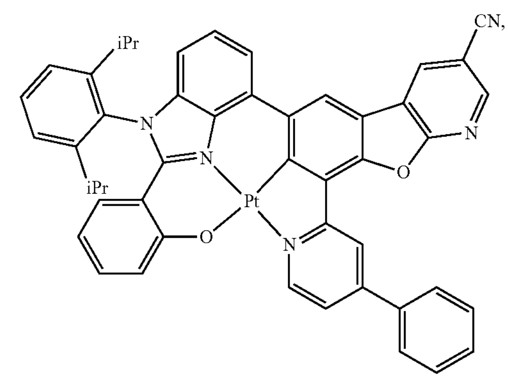
M-459
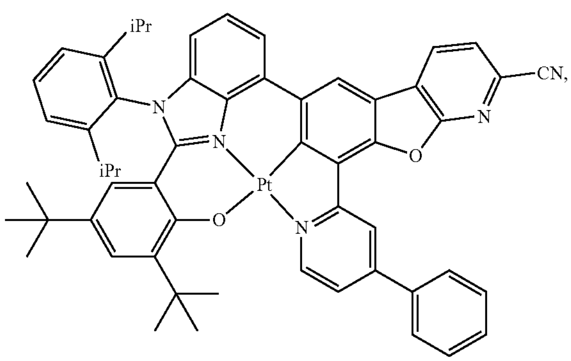
M-460
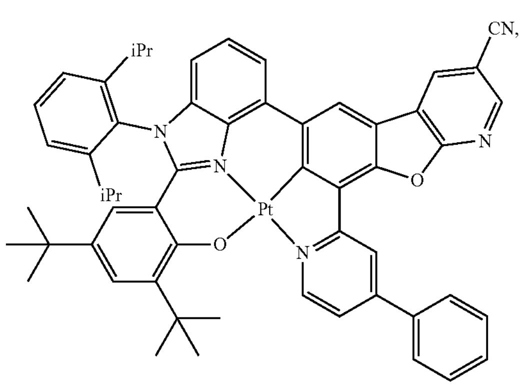
-continued
M-461
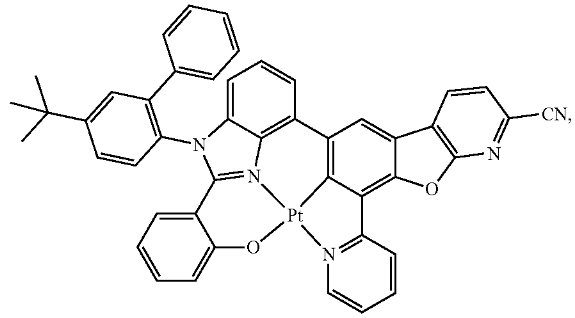
M-462
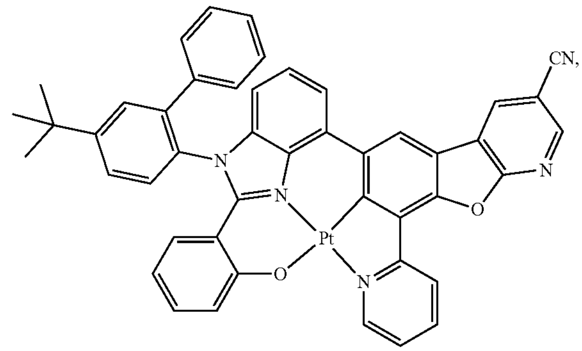
M-463
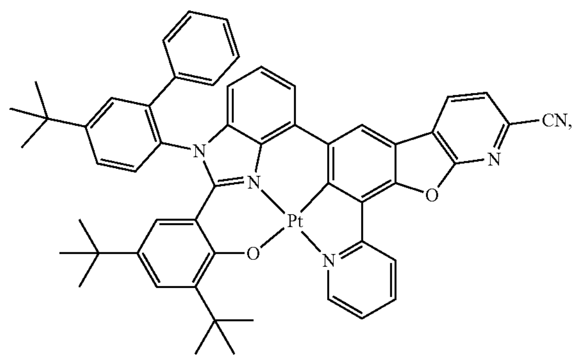
M-464
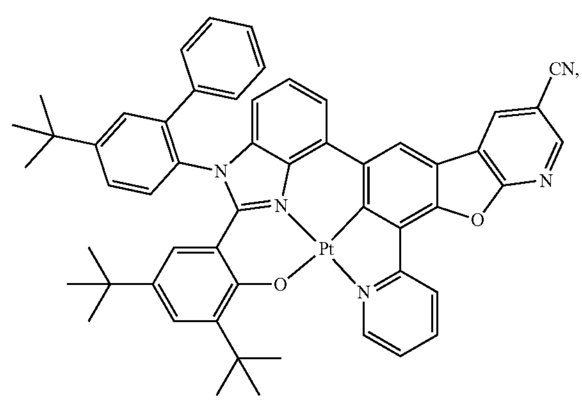

-continued
M-465
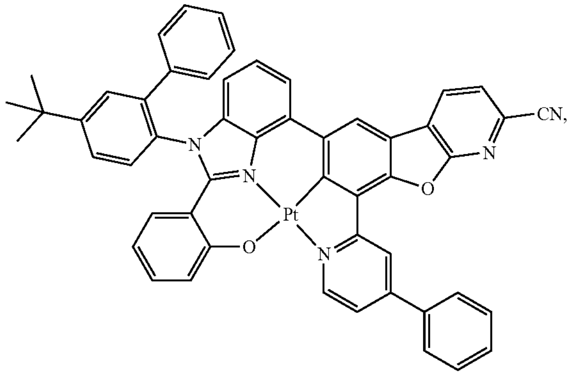
M-466
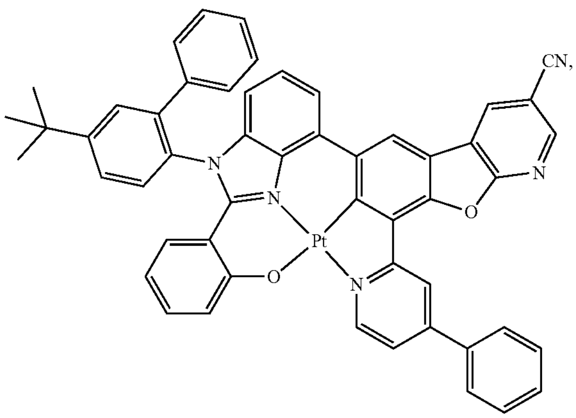
M-467
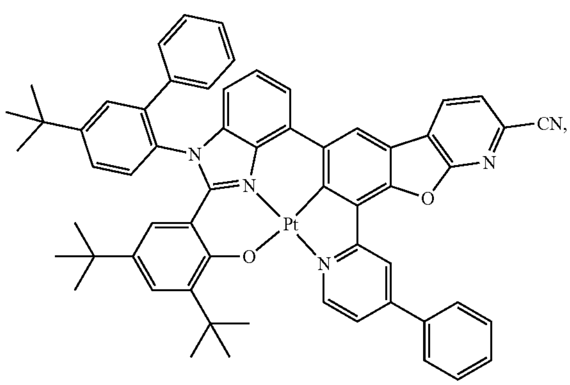
-continued
M-468
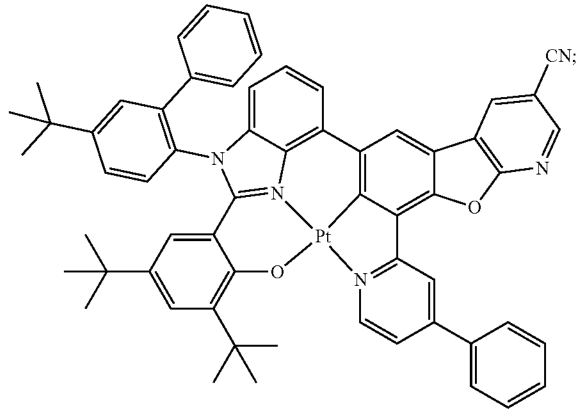
$R_a$
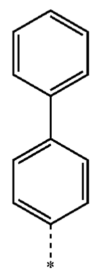
$R_b$
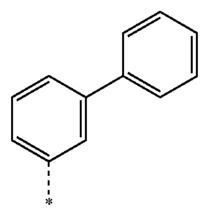
$R_c$
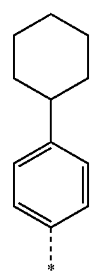
$R_d$
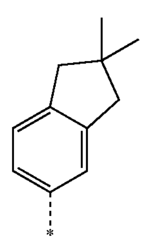

-continued $R_e$

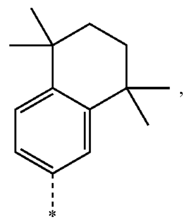

$R_f$

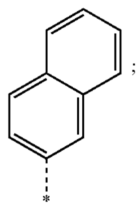

wherein, "*" represents the connection position of R;

wherein, optionally, the hydrogen in all the above metal complexes can be partially or completely replaced by deuterium.

14. An electroluminescent device, comprising an anode, a cathode, and an organic layer disposed between the anode and the cathode, wherein the organic layer comprises the metal complex of claim 1.

15. The electroluminescent device according to claim 14, wherein the organic layer comprises the metal complex is a light-emitting layer.

16. The electroluminescent device according to claim 14, wherein the electroluminescent device emits green light or white light or yellow light or blue light.

17. The electroluminescent device according to claim 15, wherein the light-emitting layer comprises a first host compound;

the light-emitting layer further comprises a second host compound;

the first host compound and/or the second host material compound comprise at least one chemical group selected from the group consisting of: benzene, pyridine, pyrimidine, triazine, carbazole, azacarbazole, indole carbazole, dibenzothiophene, azadibenzothiophene, dibenzofuran, azadibenzofuran, dibenzoselenium phenene, triphenylene, azatriphenylene, fluorene, silicofluorene, naphthalene, quinoline, isoquinoline, quinazoline, quinoxaline, phenanthrene, azaphenanthrene, and combinations thereof.

18. The electroluminescent device according to claim 17, wherein the first host compound has a structure represented by Formula 5:

Formula 5

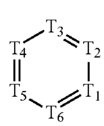

wherein, $T_1$ to $T_6$ are, at each occurrence identically or differently, selected from C, $CR_t$, or N, and at least two of $T_1$ to $T_6$ are N, at least one of $T_1$ to $T_6$ is C and connected with at least one of Formula A, Formula B, Formula C or Formula D;

Formula A

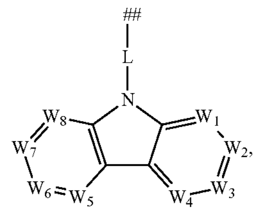

Formula B

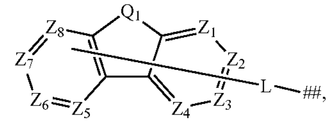

Formula C

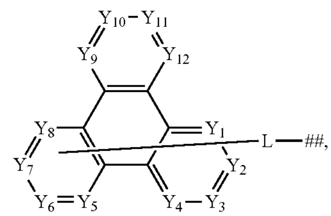

Formula D

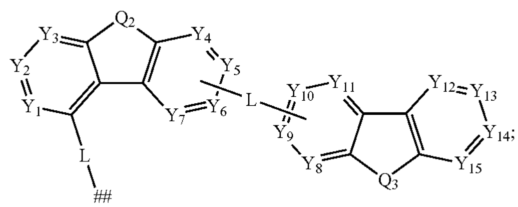

wherein, in Formula A, Formula B, Formula C and Formula D;

$Q_1$, $Q_2$ and $Q_3$ are, at each occurrence identically or differently, selected from the group consisting of: O, S, Se, $NR_q$, $CR_qR_q$, and Si $R_qR_q$; when two $R_q$, exist at the same time, the two $R_q$ are the same or different;

L is, at each occurrence identically or differently, selected from single bond, substituted or unsubstituted alkylene having 1 to 20 carbon atoms, substituted or unsubstituted cycloalkylene, having 3 to 20 carbon atoms, substituted or unsubstituted arylene having 6 to 20 carbon atoms, substituted or unsubstituted heteroarylene having 3 to 20 carbon atoms, or a combination thereof;

$W_1$ to $W_8$ are, at each occurrence identically or differently, selected from $CR_w$ or N;

$Z_1$ to Zs are, at each occurrence identically or differently, selected from C, $CR_z$ or N, and at least one of $Z_1$ to $Z_8$ is C and connected with L;

$Y_1$ to $Y_{15}$ are, at each occurrence identically or differently, selected from C, $CR_y$, or N, and in Formula C at least one, of $Y_1$ to $Y_8$ is C and connected with L; in Formula D at least one, of $Y_1$ to $Y_7$, is C, $Y_8$ to $Y_{11}$ is C and connected with L;

$R_4$, $R_q$, $R_w$, $R_y$, and $R_z$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sufinyl group, a sulfonyl group, a phosphino group, and combinations thereof;

"##" represents the position where Formula A, Formula B, Formula C and Formula D is connected to Formula 5;

adjacent substituents $R_r$, $R_q$, $R_w$, $R_y$ and $R_z$ can be optionally joined to form a ring.

19. The electroluminescent device according to claim 18, wherein the first host compound has a structure represented by one of Formula 5a to Formula 5e:

Formula 5a

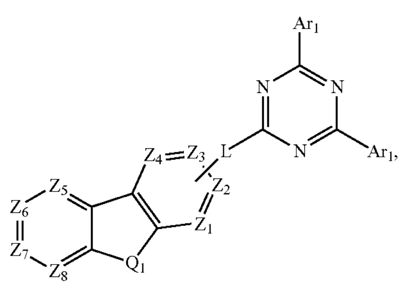

Formula 5b

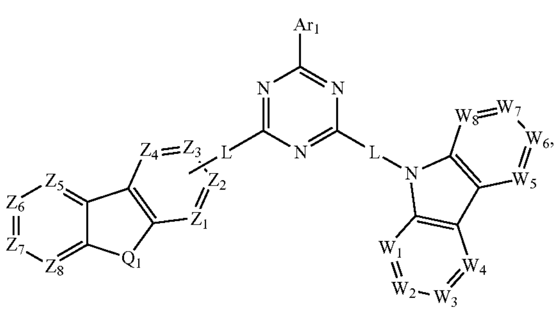

Formula 5c

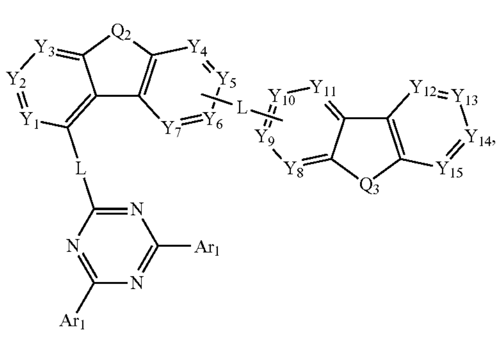

-continued

Formula 5d

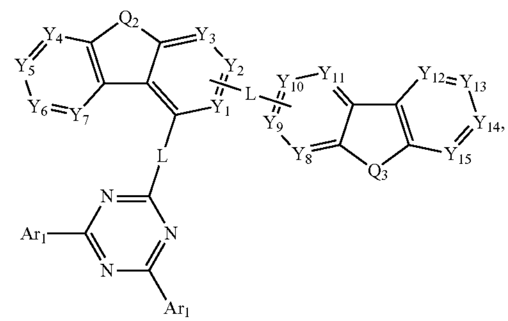

Formula 5e

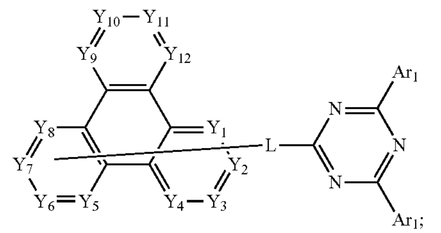

wherein in Formula 5a to Formula 5e;

$Ar_1$ is, at each occurrence identically or differently, selected from substituted or unsubstituted aryl group having 6 to 30 carbon atoms, substituted or unsubstituted heteroaryl having 3 to 30 carbon atoms, or a combination thereof, and in Formula 5a or Formula 5b, at least one of $Z_1$ to $Z_8$ is $CR_z$, and the $R_z$ is selected from substituted or unsubstituted aryl having 6 to 30 carbon atoms, substituted or unsubstituted heteroaryl having 3 to 30 carbon atoms, or a combination thereof.

20. The electroluminescent device according to claim 17, wherein the second host compound has a structure represented by Formula X:

Formula X

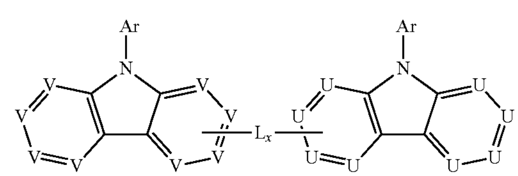

wherein, $L_x$ is, at each occurrence identically or differently, selected from single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms, or a combination thereof;

V is, at each occurrence identically or differently, selected from C, $CR_v$ or N; and at least one of V is C and connected with $L_x$;

U is, at each occurrence identically or differently, selected from C, $CR_u$ or N; and at least one of U is C and connected with $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof;

Ar is, at each occurrence identically or differently, selected from substituted or unsubstituted aryl having 6 to 30 carbon atoms, substituted or unsubstituted heteroaryl having 3 to 30 carbon atoms, or combinations thereof;

adjacent substituents $R_v$, $R_u$ can be optionally joined to form a ring.

21. The electroluminescent device according to claim 17, wherein the metal complex is doped in the first host compound and the second host compound, and the weight of the metal complex accounts for 3% to 13% of the total weight of the light-emitting layer.

22. A compound composition comprises the metal complex of claim 1.

23. The metal complex according to claim 1, wherein $R_1$, $R_2$ and $R_3$ are, at each occurrence identically or differently, selected from the group consisting of: hydrogen, deuterium, fluorine, methyl, ethyl, propyl, isopropyl, n-butyl, isobutyl, tert-butyl, cyclopentyl, cyclohexyl, deuterated methyl, deuterated ethyl, deuterated Propyl, deuterated isopropyl, deuterated n-butyl, deuterated isobutyl, deuterated tert-butyl, deuterated cyclopentyl, deuterated cyclohexyl, phenyl, pyridyl, trimethylsilyl, and combinations thereof.

24. The metal complex according to claim 2, wherein $X_7$ and/or $X_8$ is $CR_x$, and the $R_x$ is a cyano group.

25. The metal complex according to claim 1, wherein at least two of $X_5$ to $X_8$ are $CR_x$, and one of the $R_x$ is a cyano group; at least one of the remaining $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, a cyano group, a hydroxyl group, a sulfanyl group, and combinations thereof.

26. The metal complex according to claim 1, wherein at least two of $X_5$ to $X_8$ are $CR_x$, and one of the Rx is a cyano group; at least one of the remaining $R_x$ is selected from the group consisting of: deuterium, halogen, substituted or unsubstituted alkyl having 1 to 10 carbon atoms, substituted or unsubstituted cycloalkyl having 3 to 10 ring carbon atoms, substituted or unsubstituted aryl having 6 to 15 carbon atoms, substituted or unsubstituted heteroaryl having 3 to 15 carbon atoms, and combinations thereof.

27. The metal complex according to claim 2, wherein $X_7$ is selected from $CR_x$, and the $R_x$ is a cyano group; $X_8$ is selected from $CR_x$, and the $R_x$ is selected from substituted or unsubstituted aryl having 6 to 30 carbon atoms, substituted or unsubstituted heteroaryl having 3 to 30 carbon atoms, or combinations thereof.

28. The metal complex according to claim 2, wherein $X_7$ and $X_8$ are selected from $CR_x$, and one of the $R_x$ is a cyano group; the other one of $R_x$ is selected from the substituted or unsubstituted group consisting of: benzene, pyridine, pyrimidine, triazine, naphthalene, phenanthrene, anthracene, fluorene, silicon fluorene, quinoline, isoquinoline, dithiophene, difiuran, benzofuran, benzothiophene, dibenzofuran, dibenzothiophene, triphenylene, carbazole, azacarbazole, azafluorene, azasilfluorene, azadibenzofuran, azadibenzothiophene, and combinations thereof.

29. The metal complex according to claim 2, wherein $X_7$ is selected from $CR_x$, and the $R_x$ is selected from a cyano group; $X_8$ is selected from $CR_x$, and the $R_x$ is selected from the substituted or unsubstituted group consisting of: benzene, pyridine, pyrimidine, triazine, naphthalene, phenanthrene, anthracene, fluorene, silicon fluorene, quinoline, isoquinoline, dithiophene, difuran, benzofuran, benzothiophene, dibenzofuran, diphenyl azathiophene, triphenylene, carbazole, azacarbazole, azafluorene, azasilfluorene, azadibenzofuran, azadibenzothiophene, and combinations thereof.

30. The electroluminescent device according to claim 17, wherein the first host compound is selected from the group consisting of the following structure:

2a-1

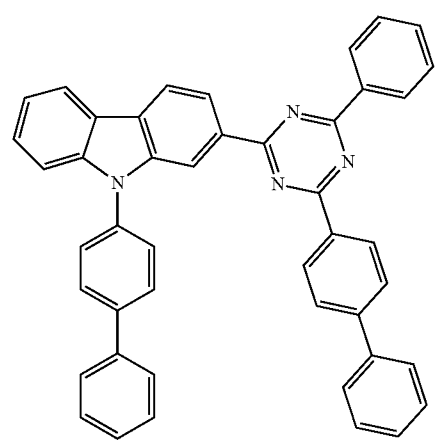

,

-continued
2a-2
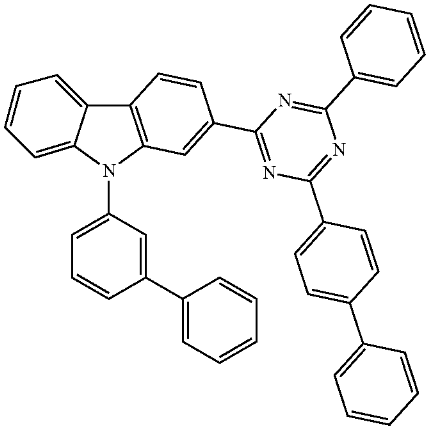
,
2a-3
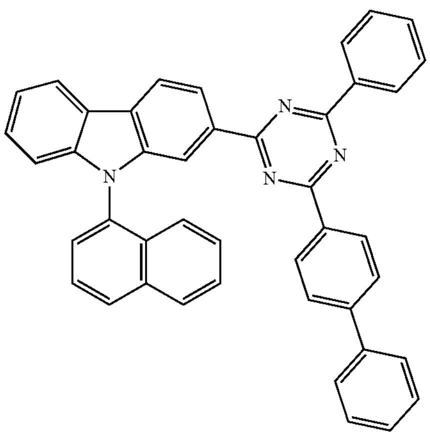
,
2a-4
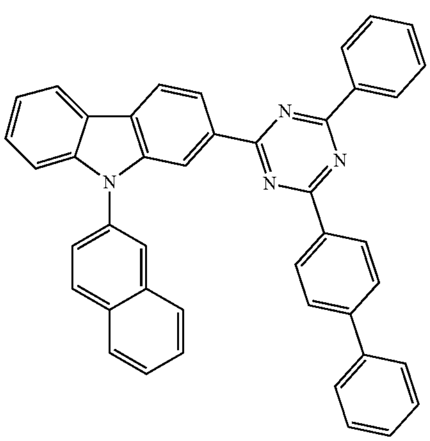
,
-continued
2a-5
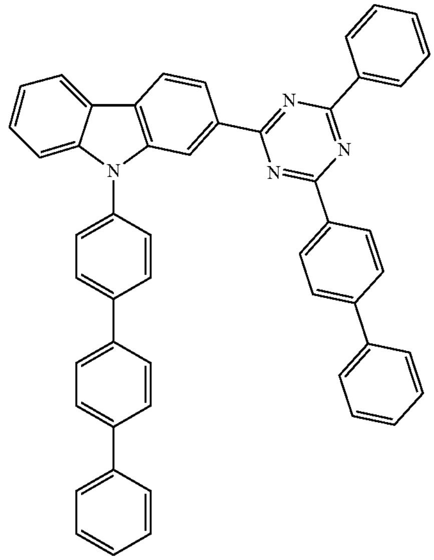
,
2a-6
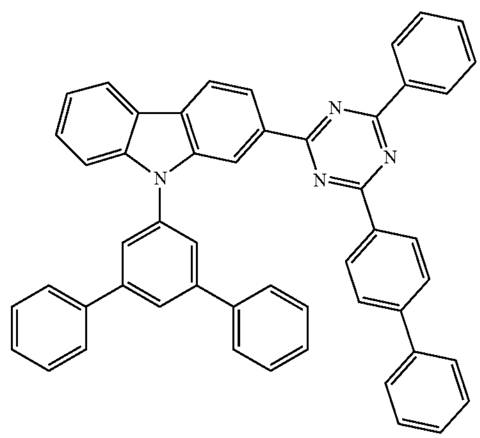
,
2a-7
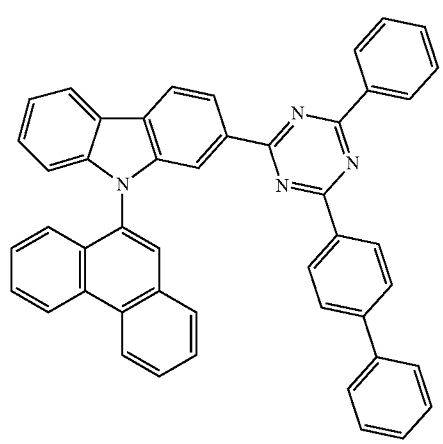
, -continued
2a-8
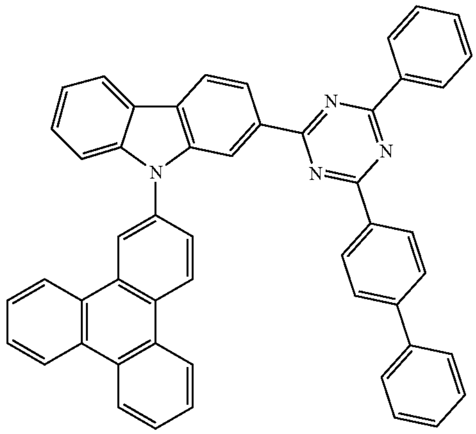
,
2a-9
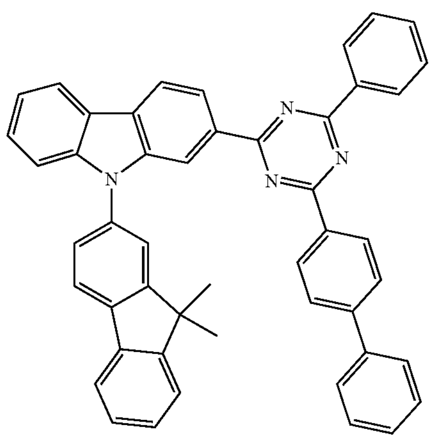
,
2a-10
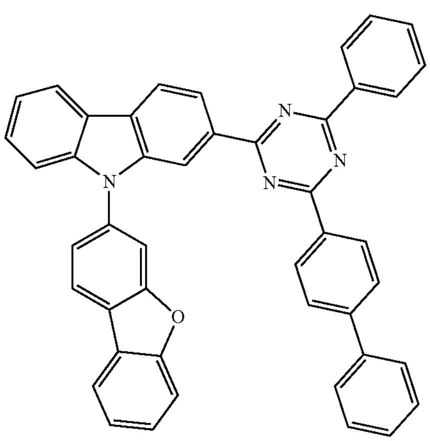
,
-continued
2a-11
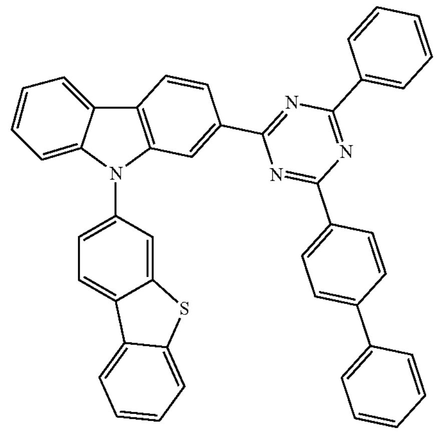
,
2a-12
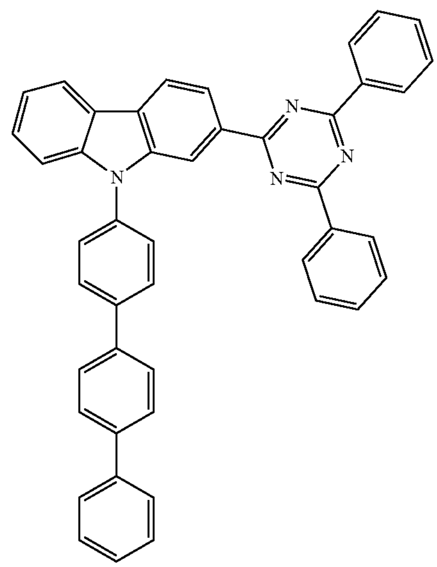
,
2a-13
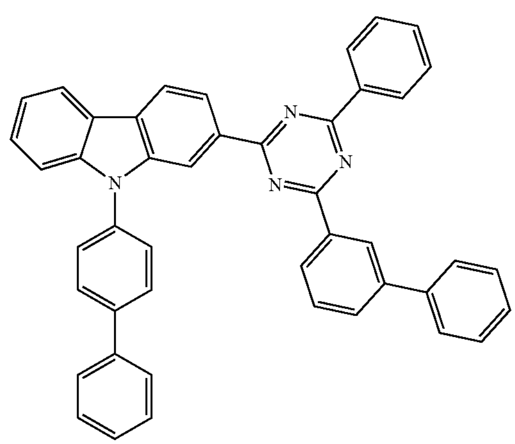
, -continued
2a-14
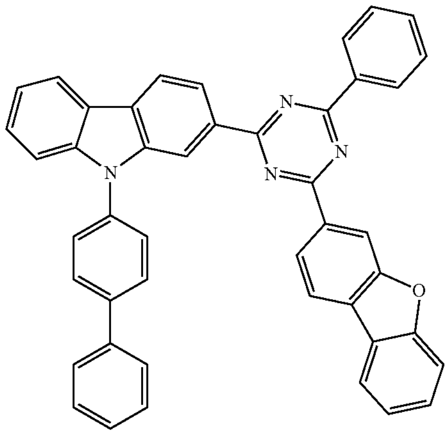
,
2a-15
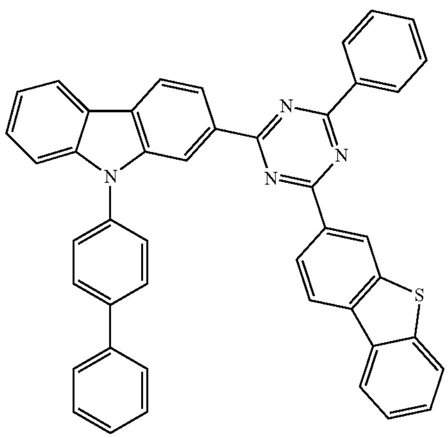
,
2a-16
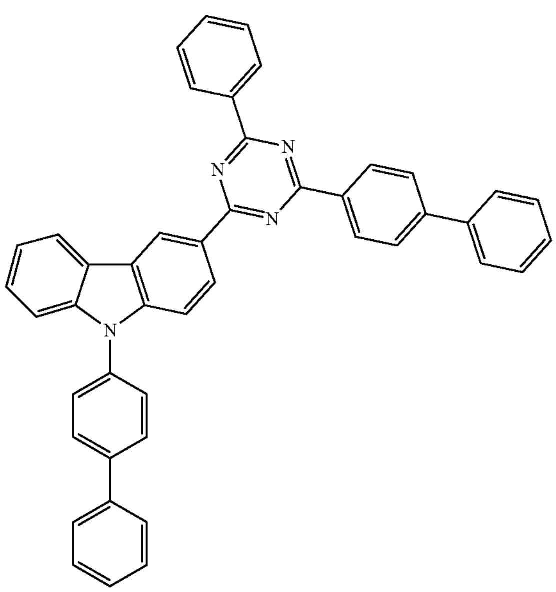
,
-continued
2a-17
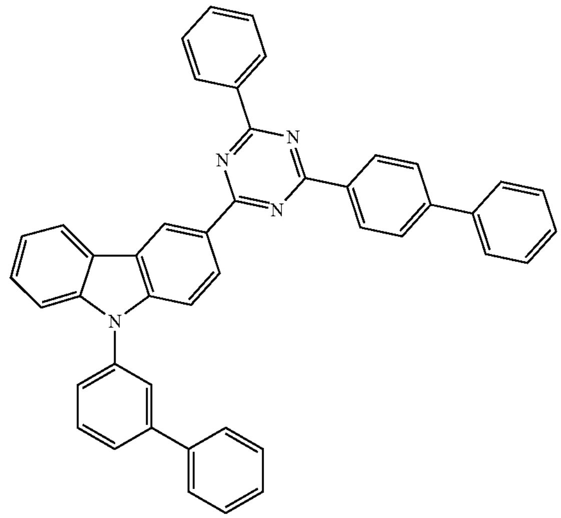
,
2a-18
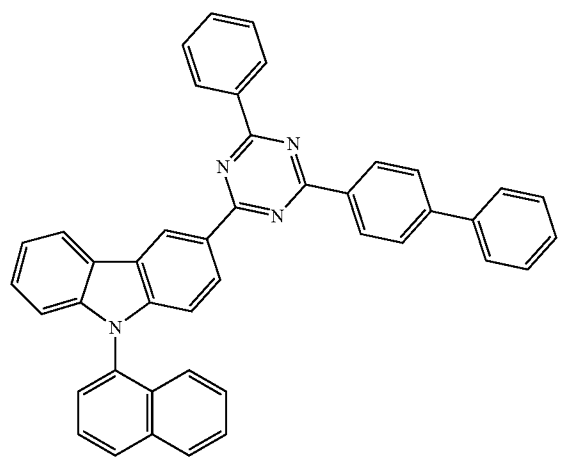
,
2a-19
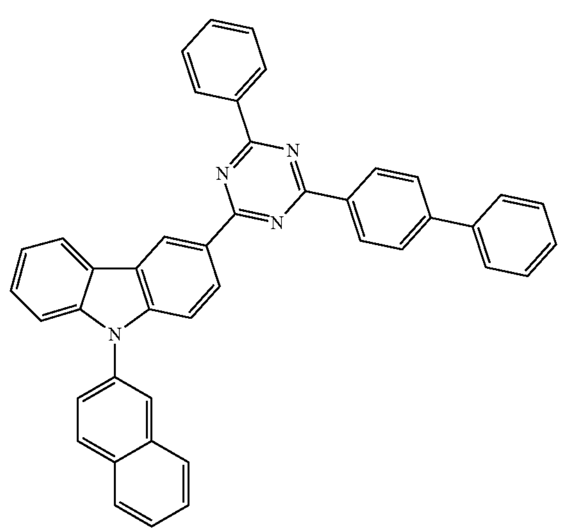
, -continued
2a-20
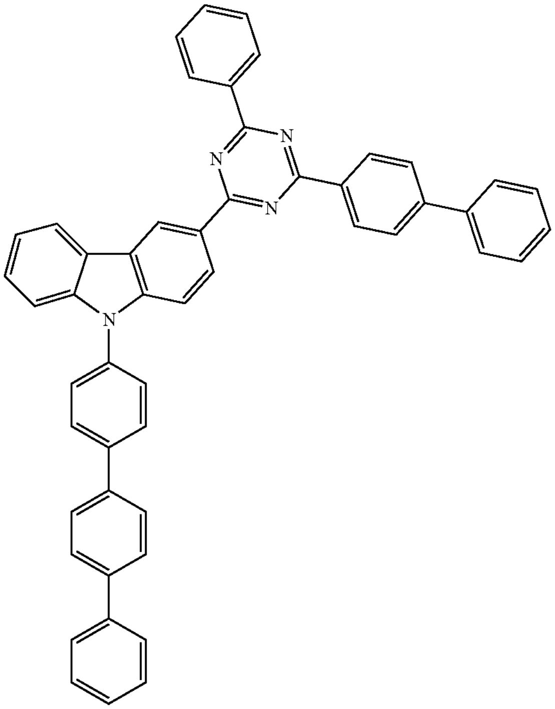
,
2a-21
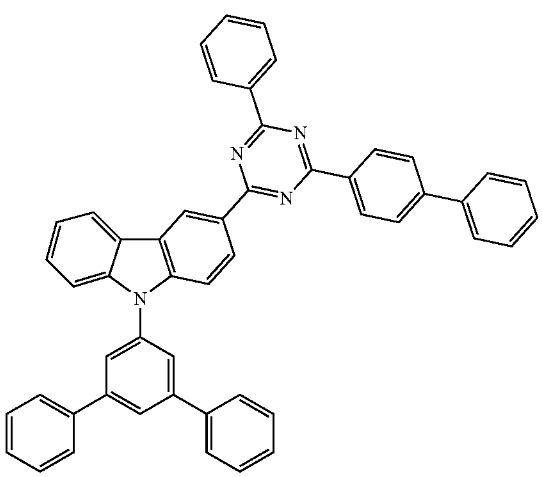
,
-continued
2a-22
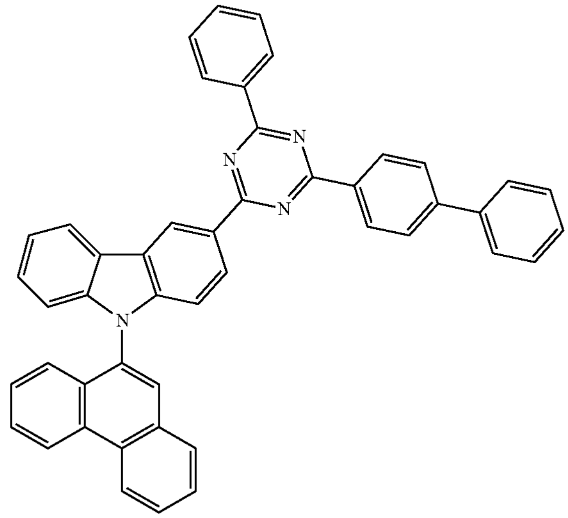
,
2a-23
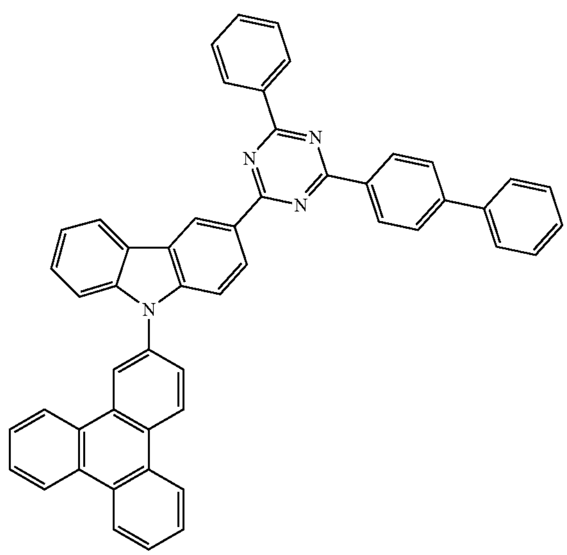
, -continued
2a-24
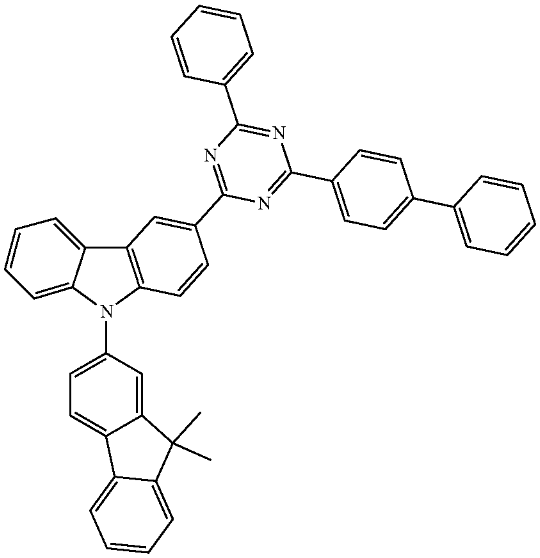
,
2a-25
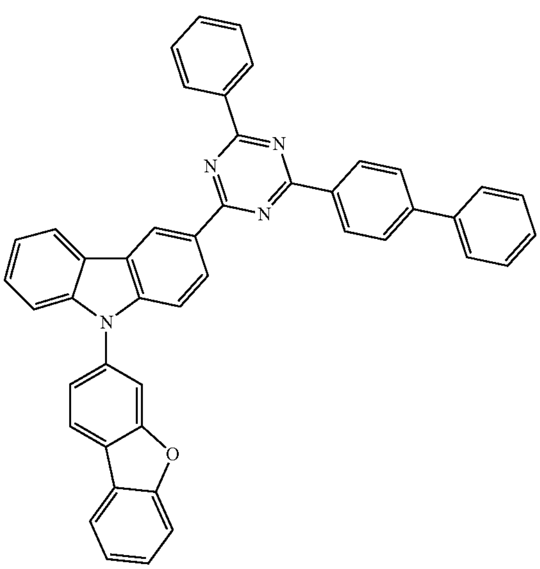
,
-continued
2a-26
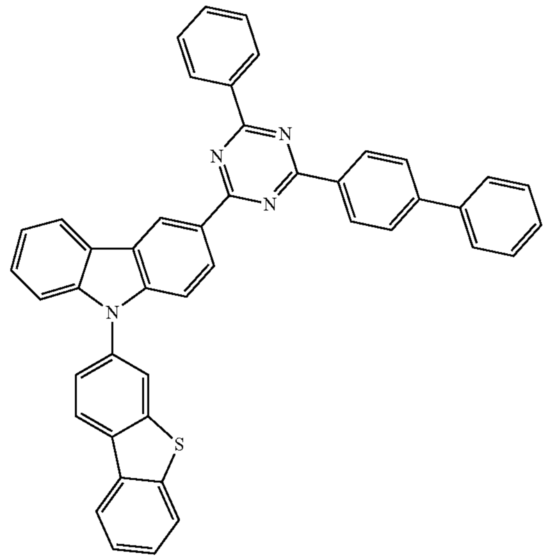
,
2a-27
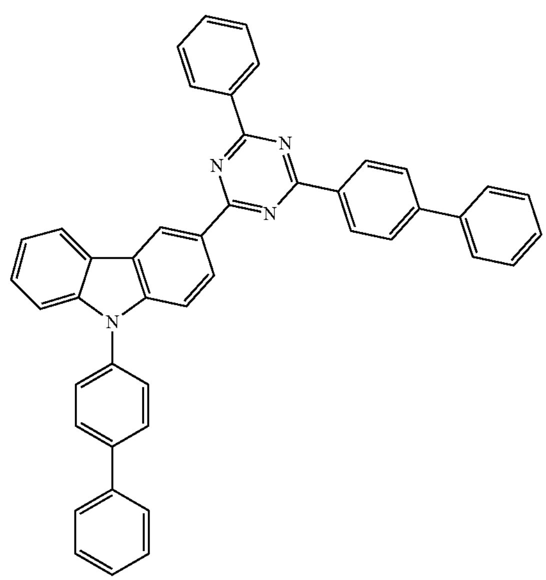
, -continued
2a-28
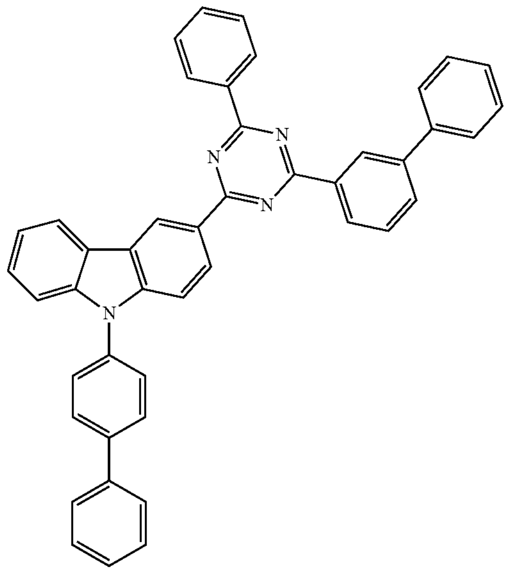
,
2a-29
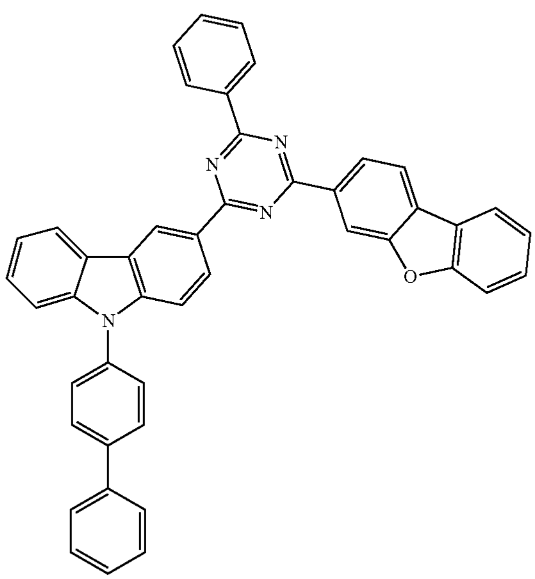
,
-continued
2a-30
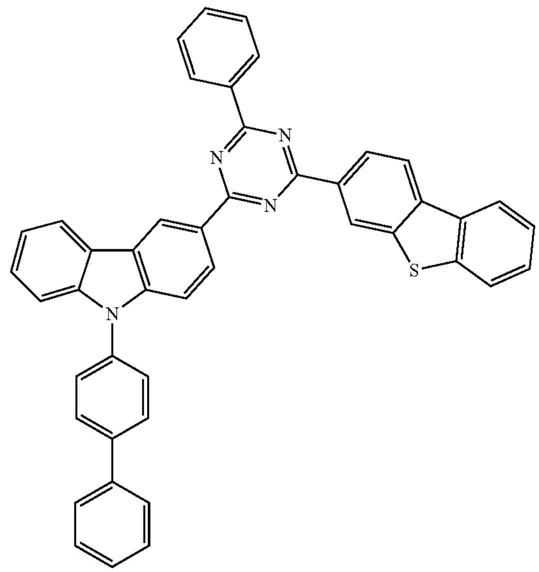
,
2a-31
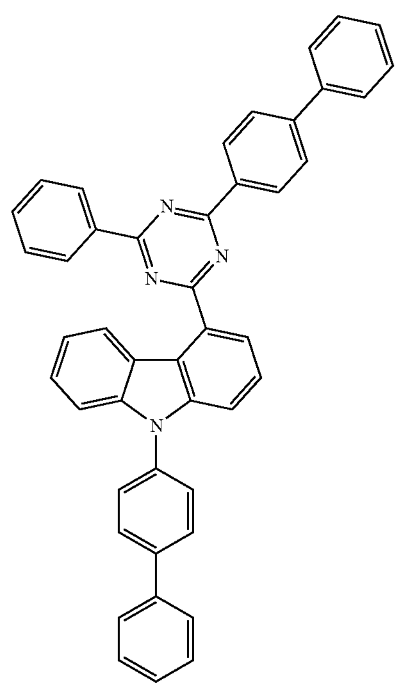
, -continued
2a-32
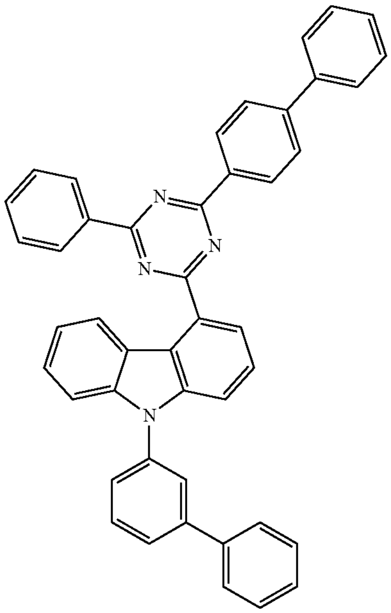
,
2a-33
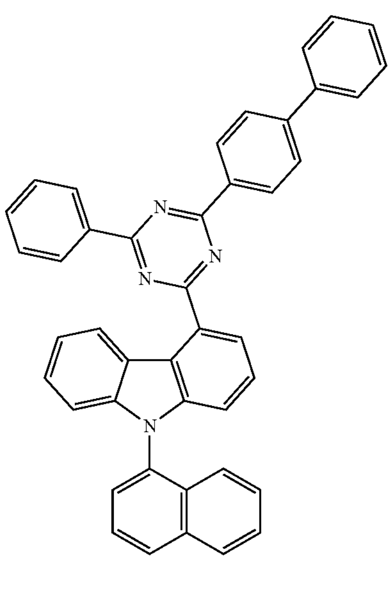
,
-continued
2a-34
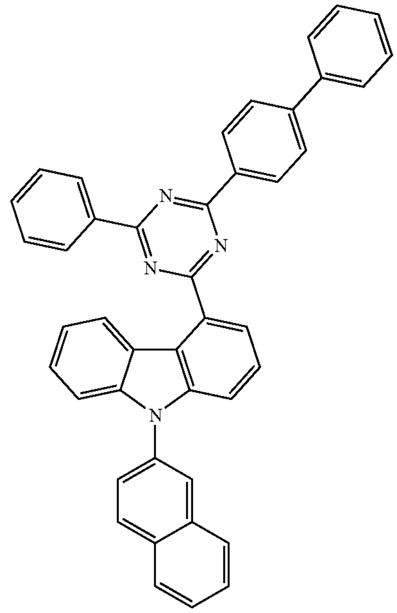
,
2a-35
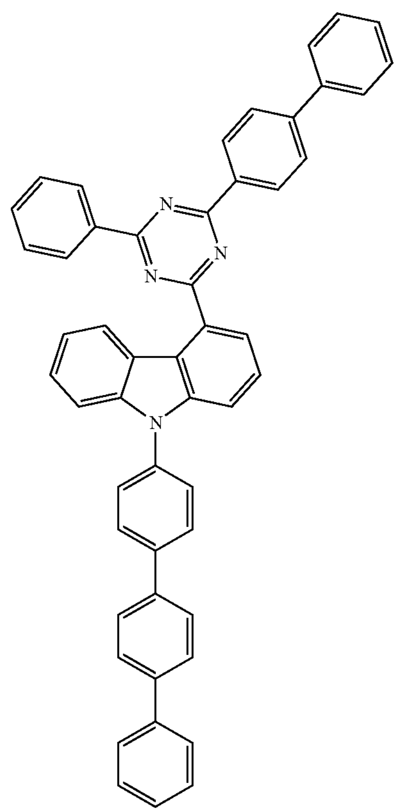
, 2a-36
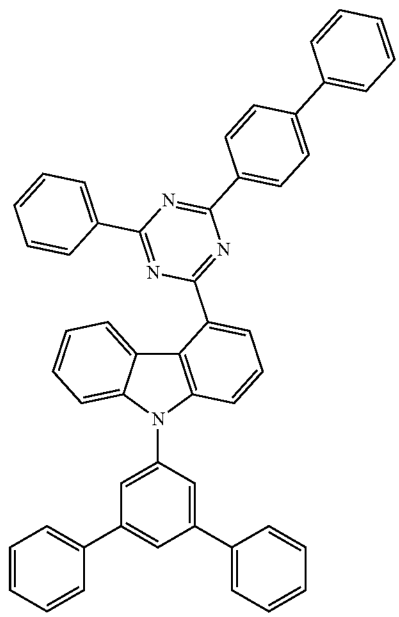
,
2a-37
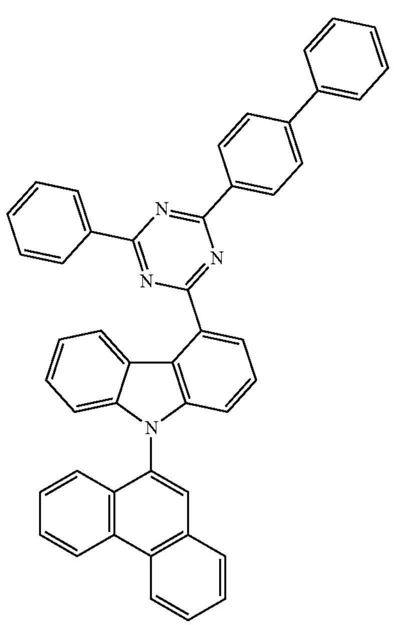
,
2a-38
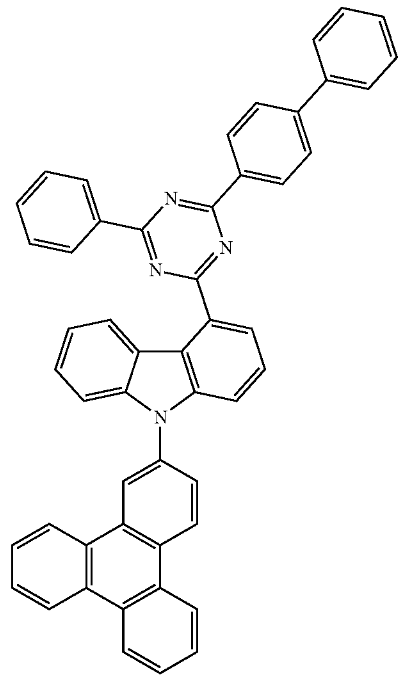
,
2a-39
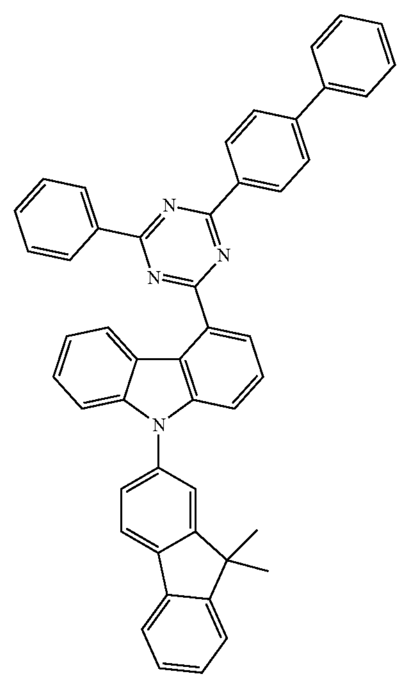
, -continued
2a-40
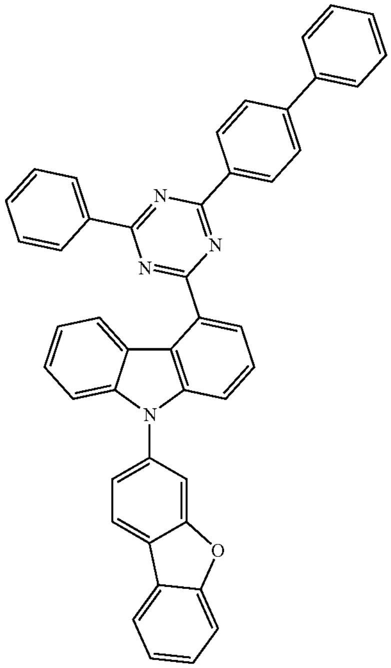
,
2a-41
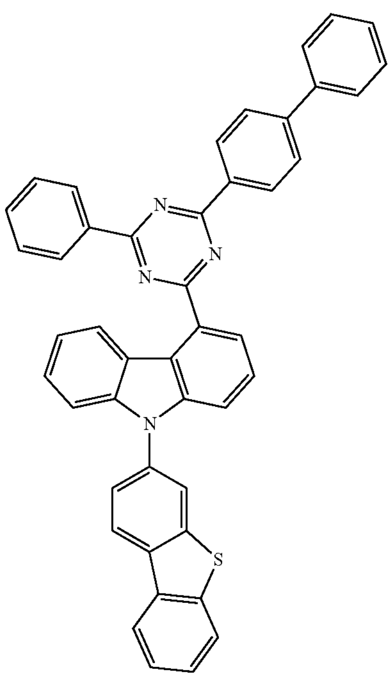
,
-continued
2a-42
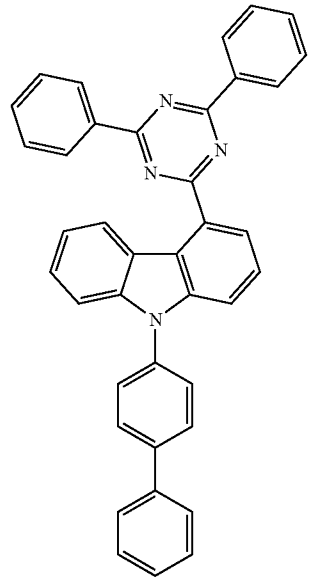
,
2a-43
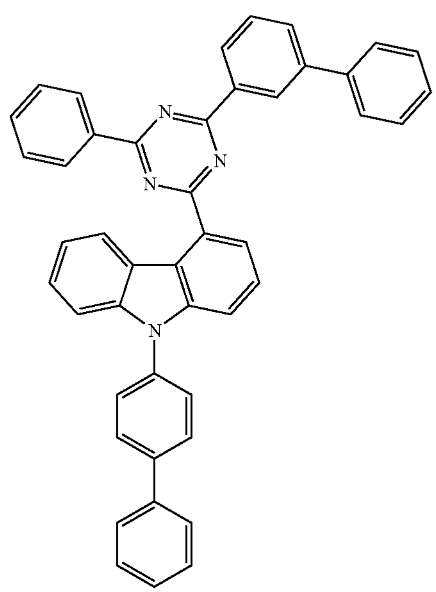
, -continued
2a-44
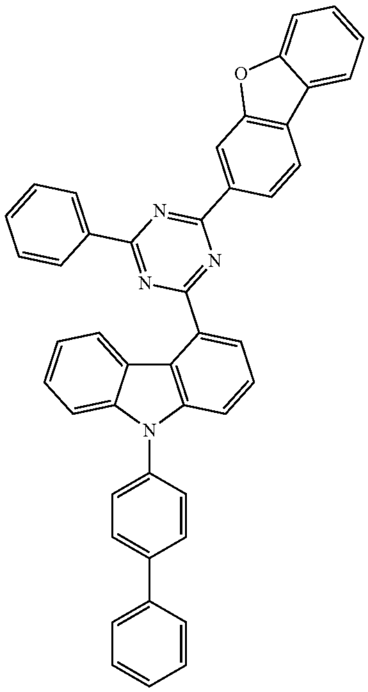
,
2a-45
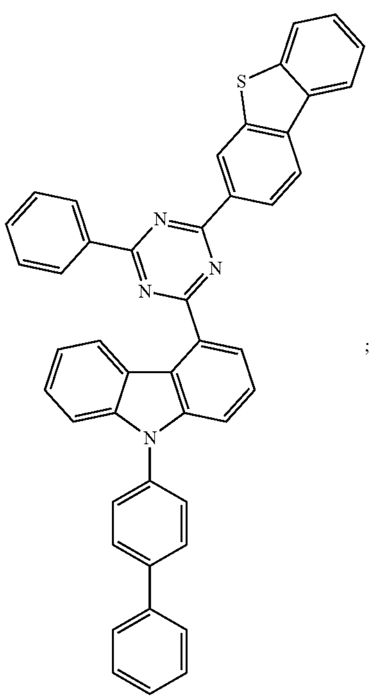
;
-continued
2b-1
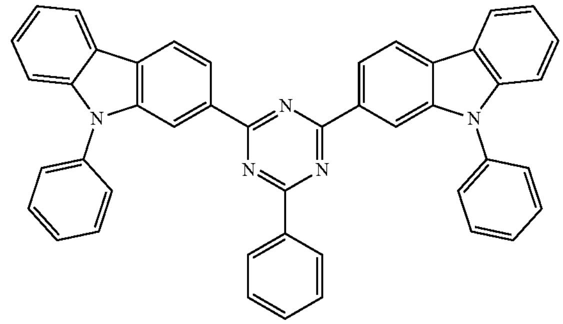
,
2b-2
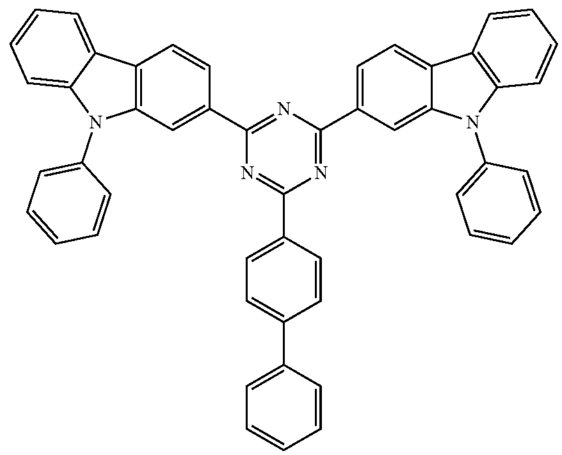
,
2b-3
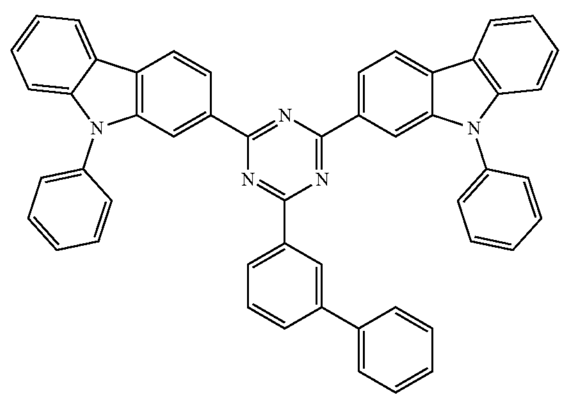
,
2b-4
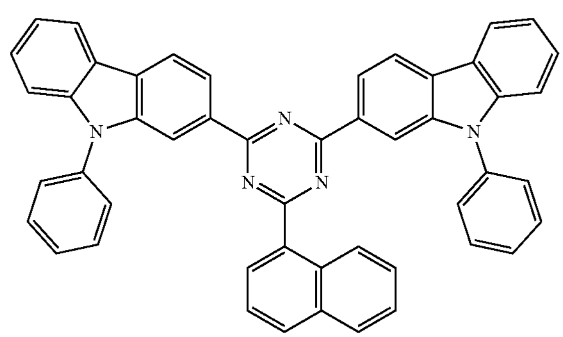
, 2b-5
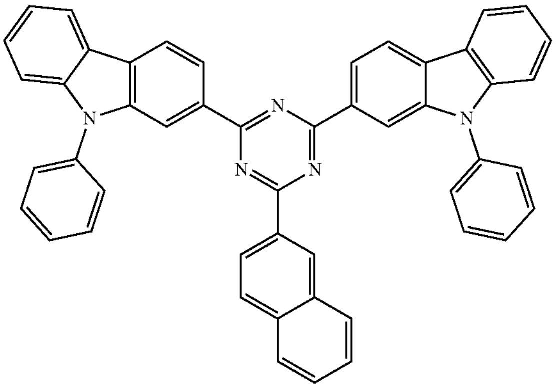
,
2b-6
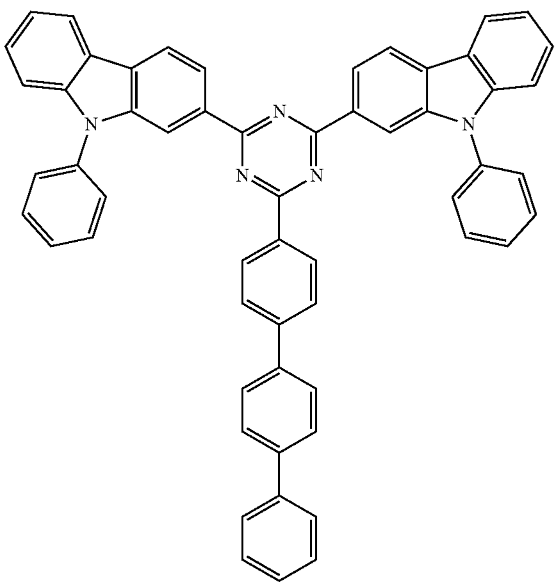
,
2b-7
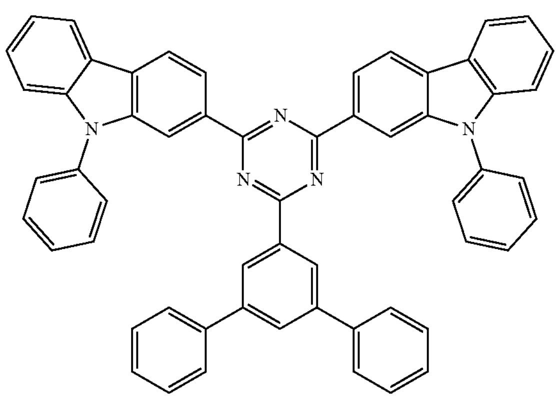
,
2b-8
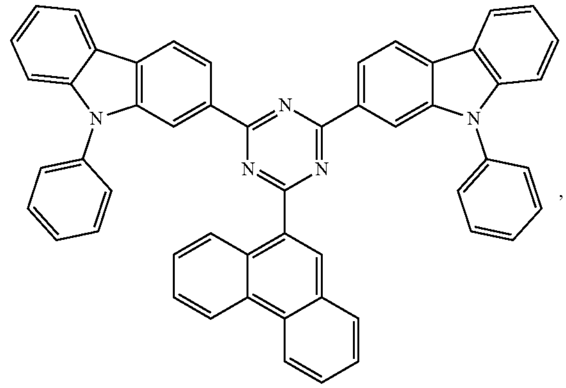
,
2b-9
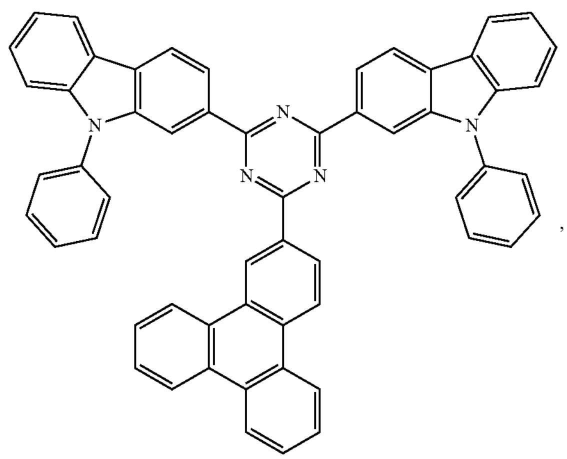
,
2b-10
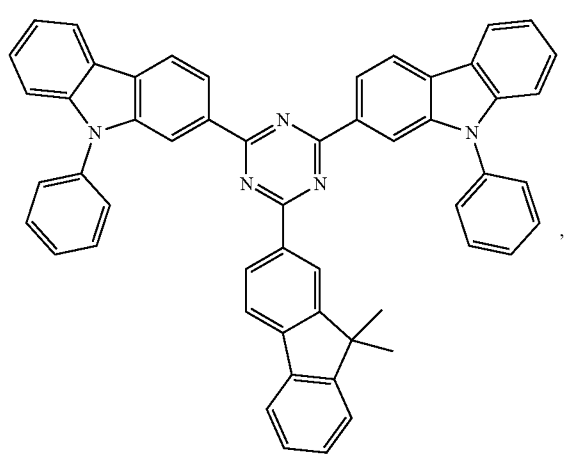
, -continued
2b-11
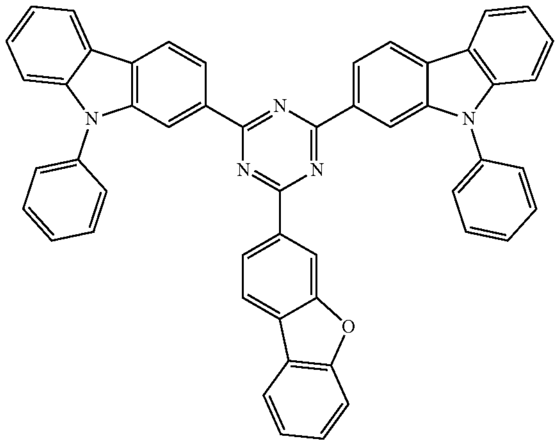
,
2b-12
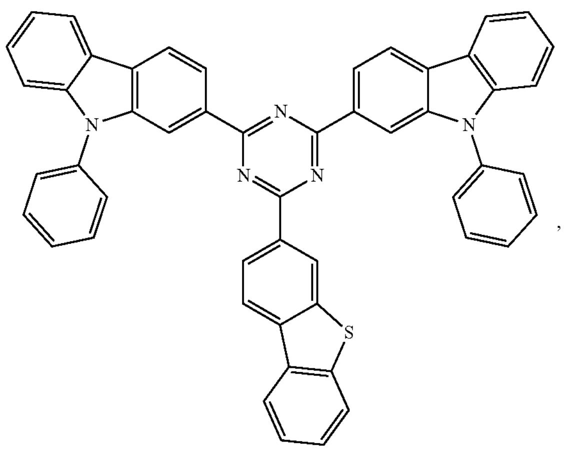
,
2b-13
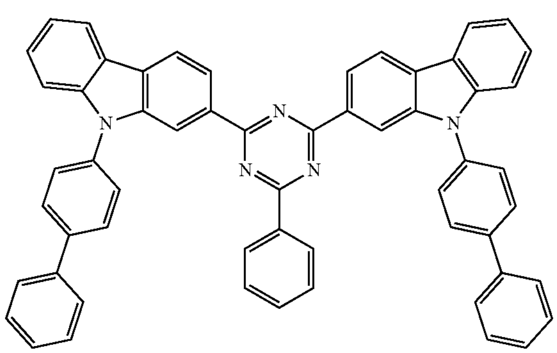
,
-continued
2b-14
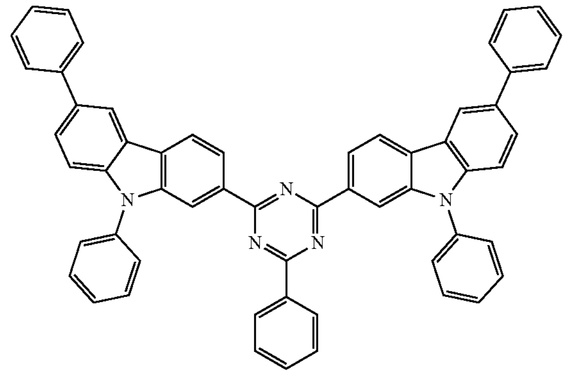
,
2b-15
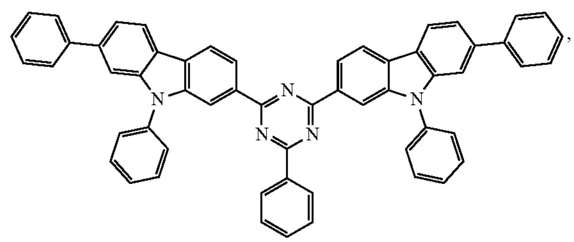
,
2b-16
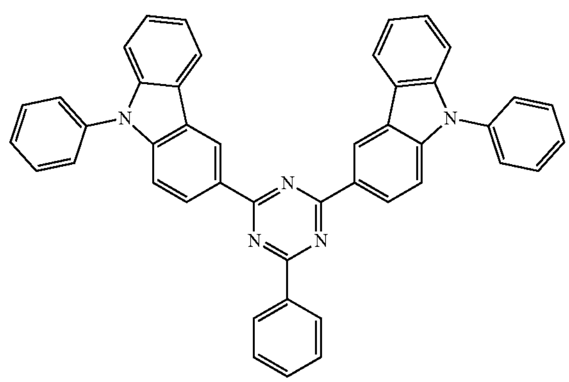
,
2b-17
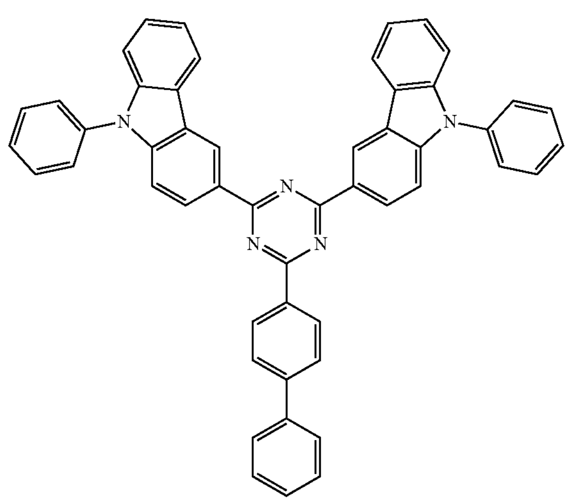
, -continued
2b-18
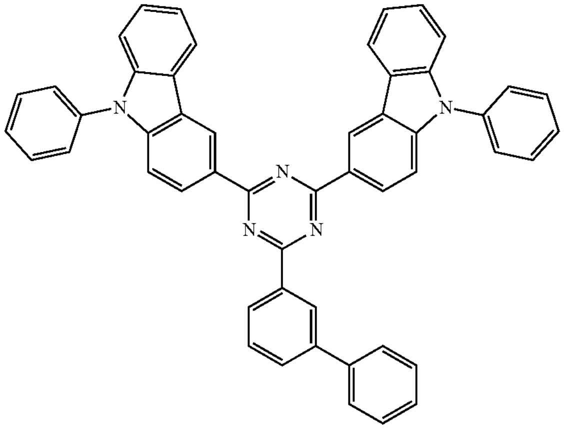
,
2b-19
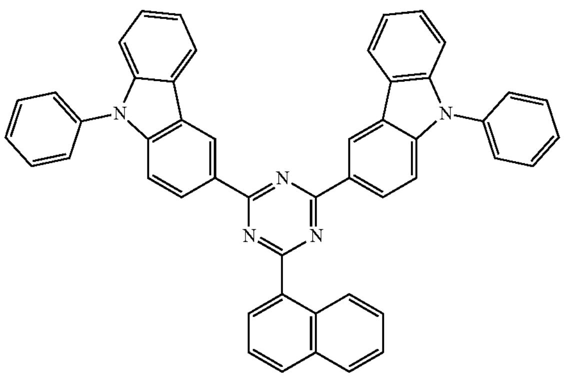
,
2b-20
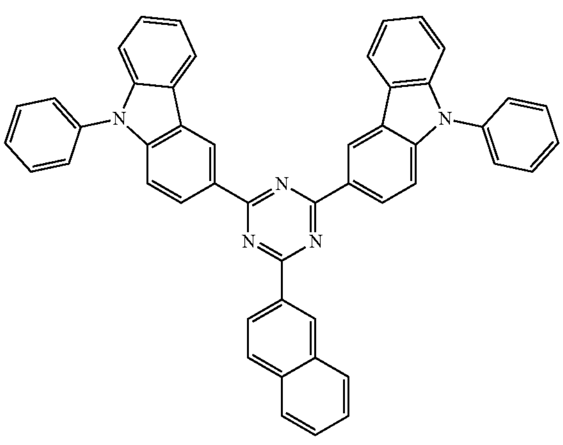
,
-continued
2b-21
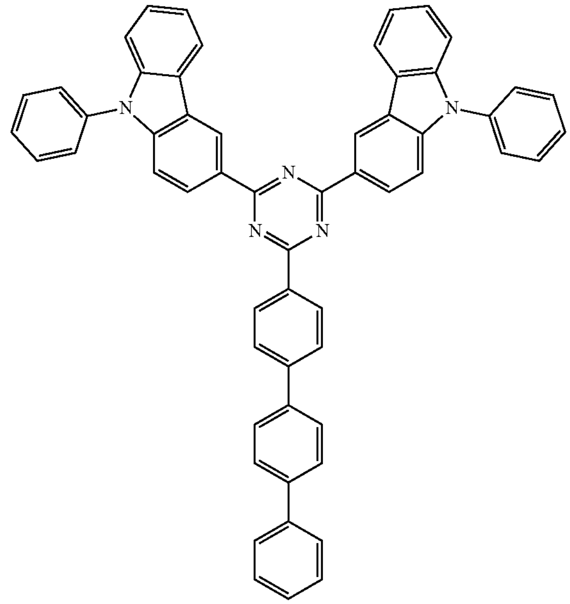
,
2b-22
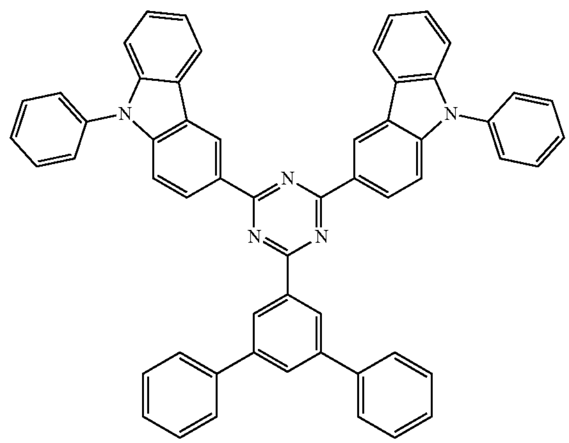
,
2b-23
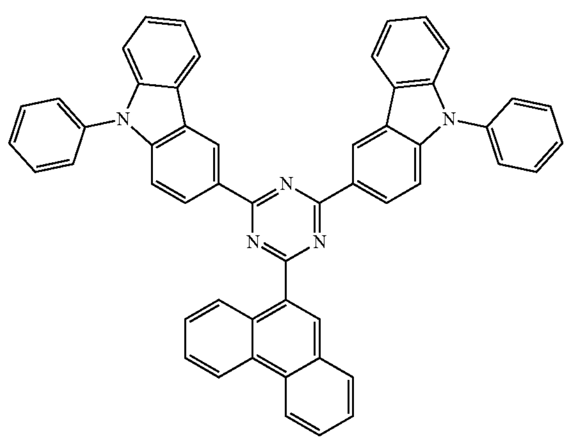
, -continued
2b-24
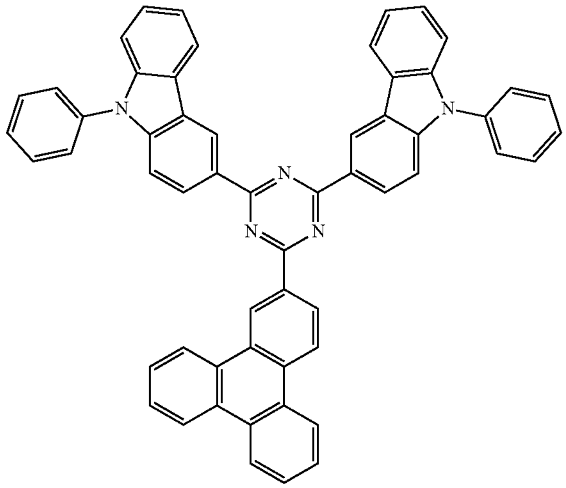
,
2b-25
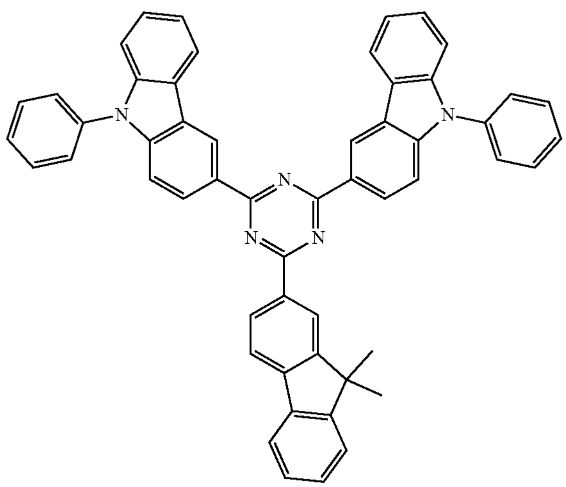
,
2b-26
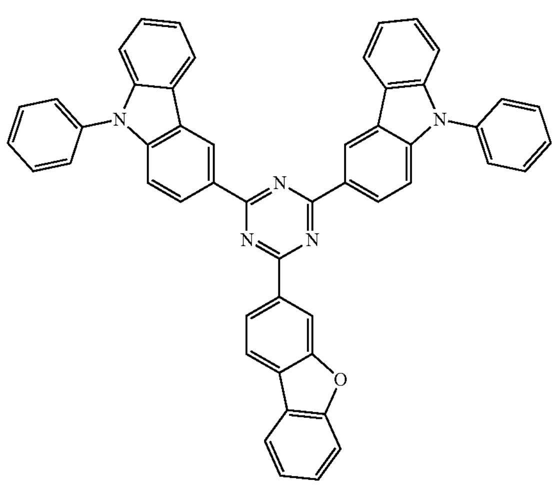
,
-continued
2b-27
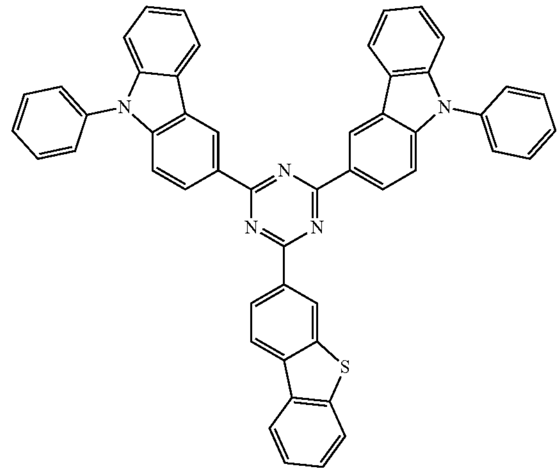
,
2b-28
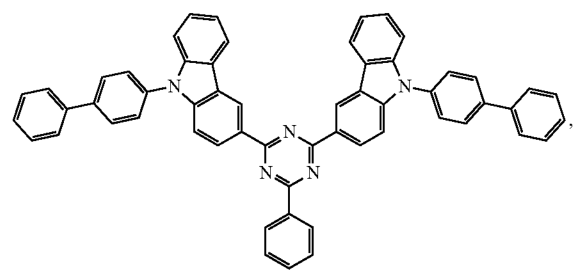
,
2b-29
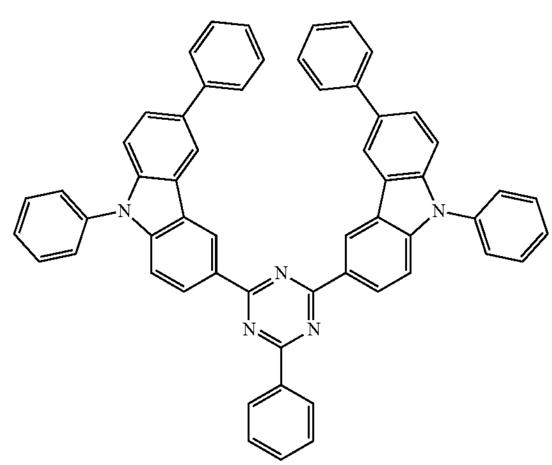
, -continued
2b-30
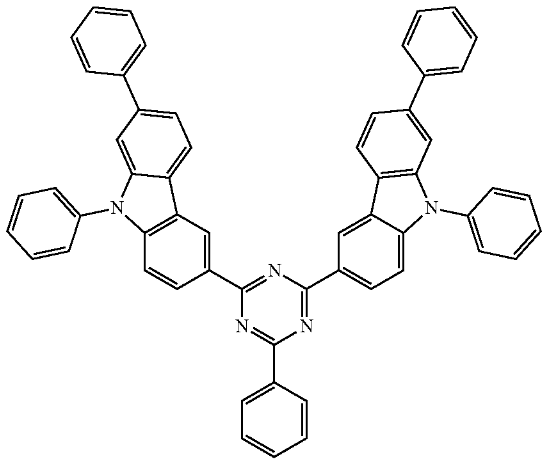
,
2b-31
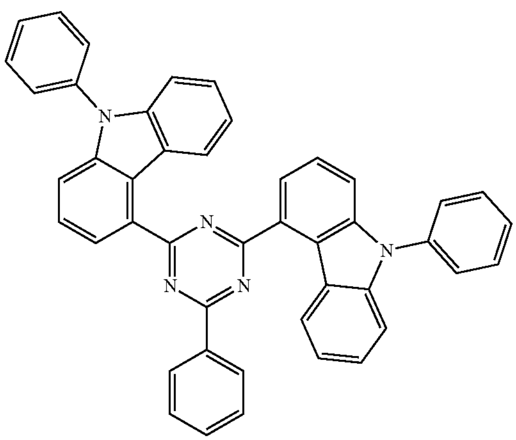
,
2b-32
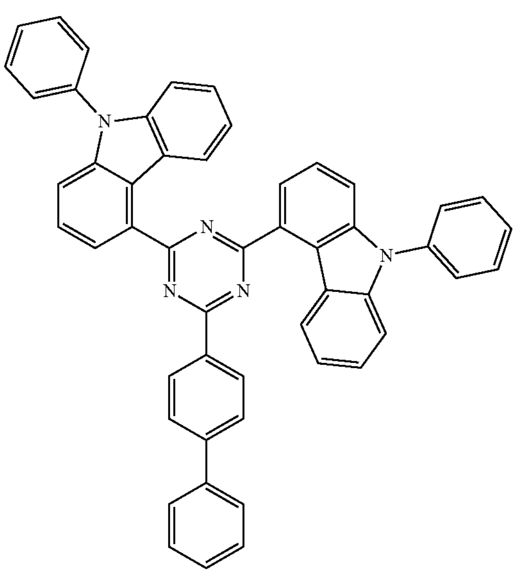
,
-continued
2b-33
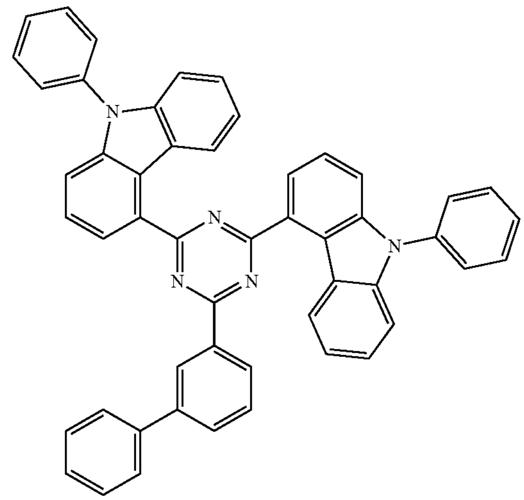
,
2b-34
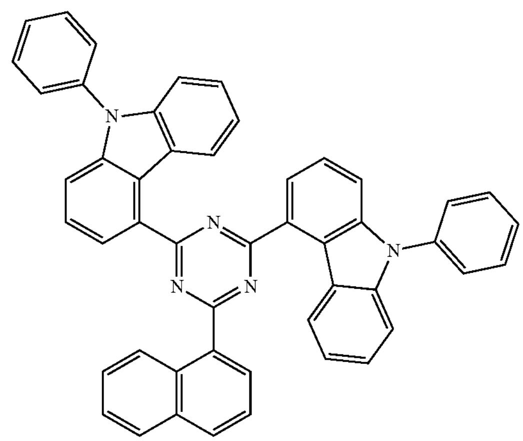
,
2b-35
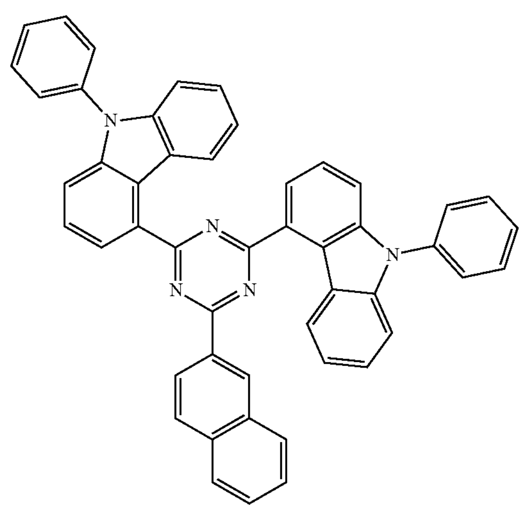
, -continued
2b-36
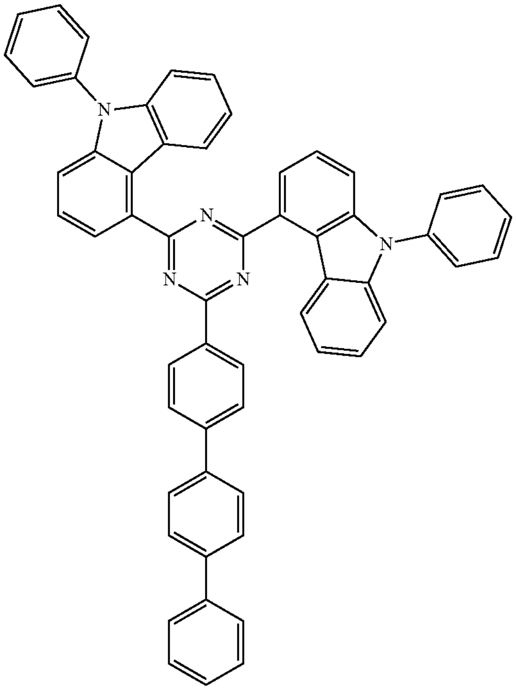
,
2b-37
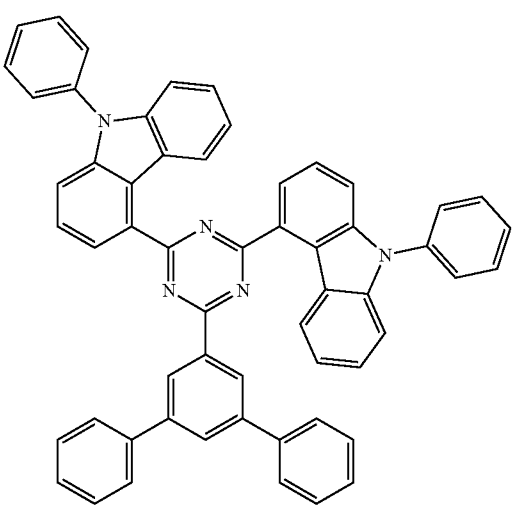
,
-continued
2b-38
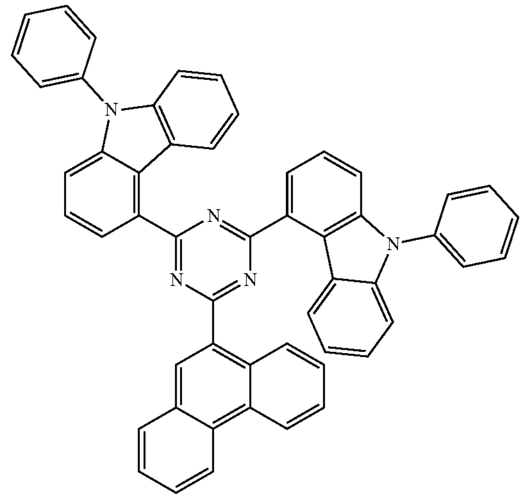
,
2b-39
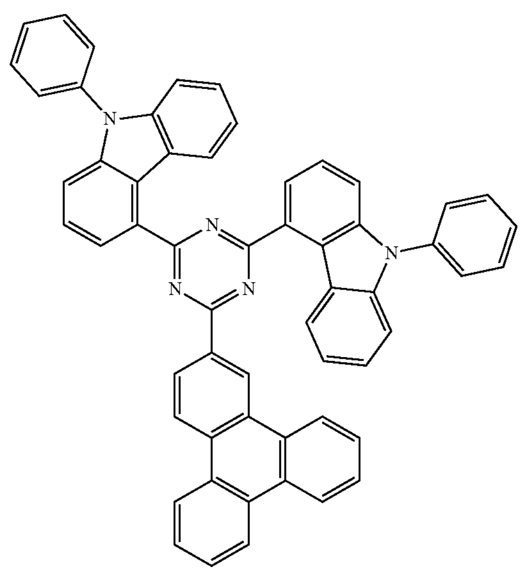
, -continued
2b-40
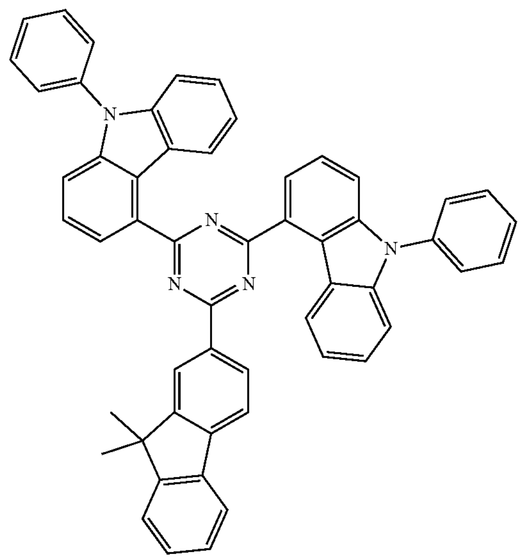
,
2b-41
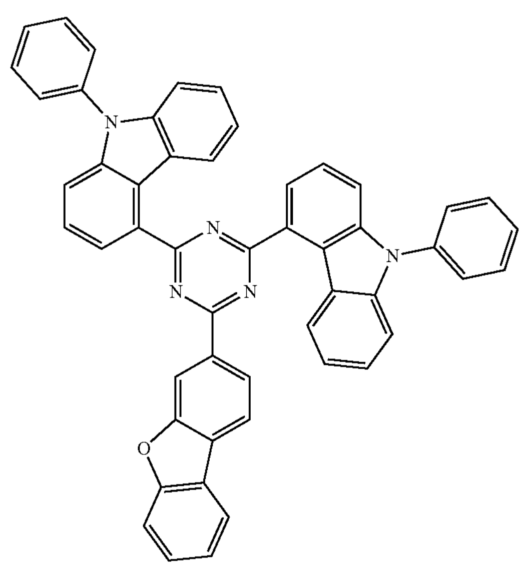
,
-continued
2b-42
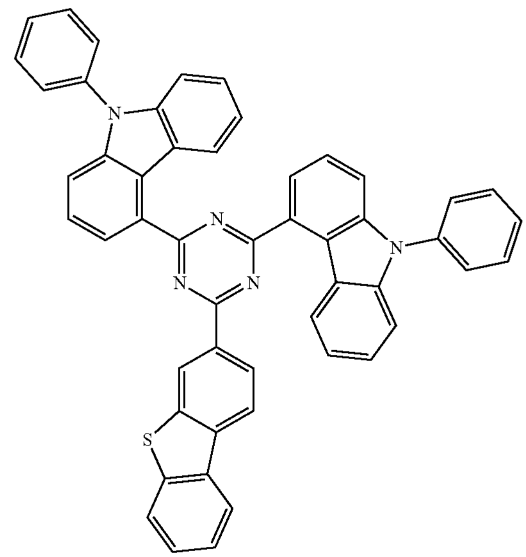
,
2b-43
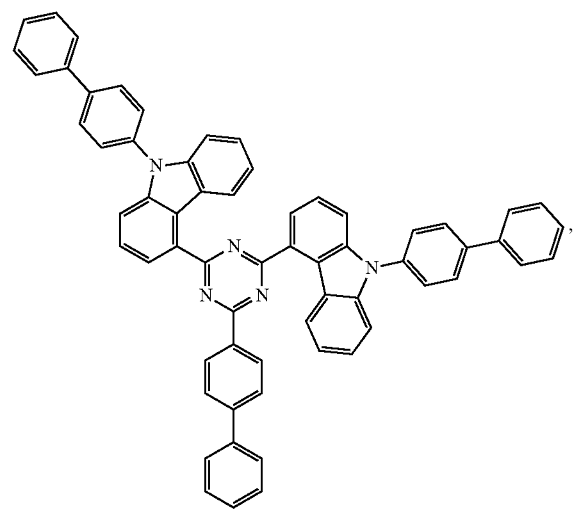
,
2b-44
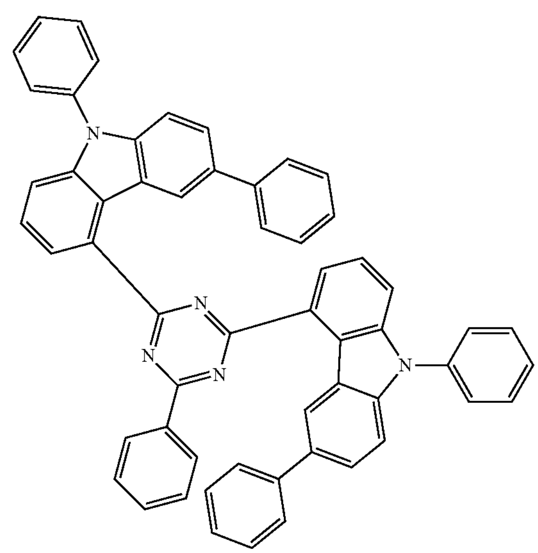
, -continued
2b-45
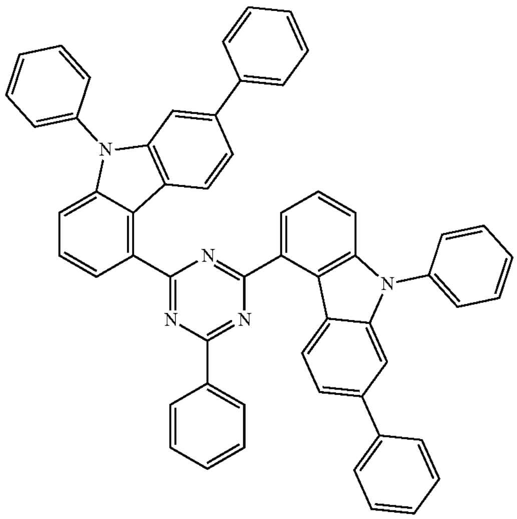
,
2b-46
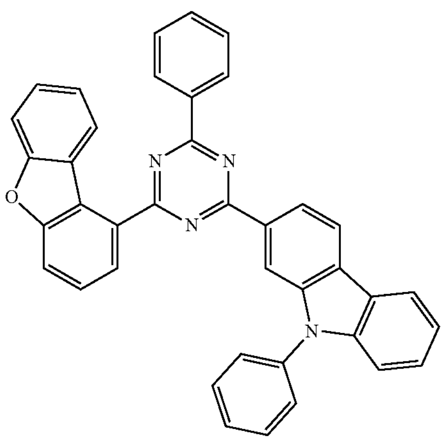
,
2b-47
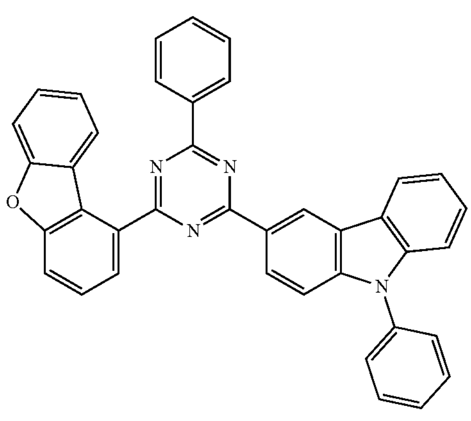
,
-continued
2b-48
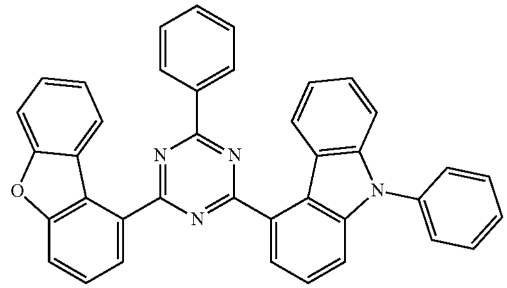
,
2b-49
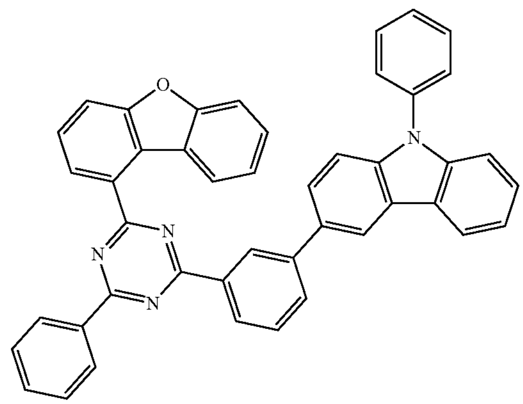
,
2b-50
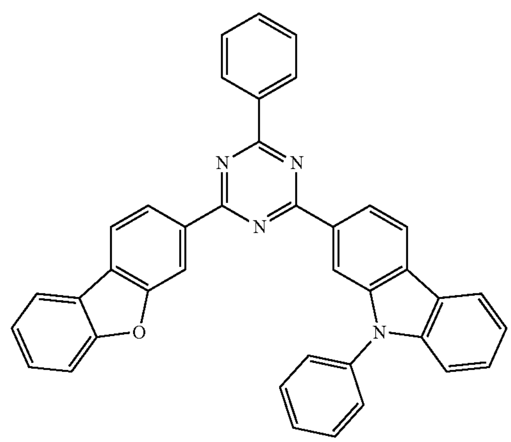
,
2b-51
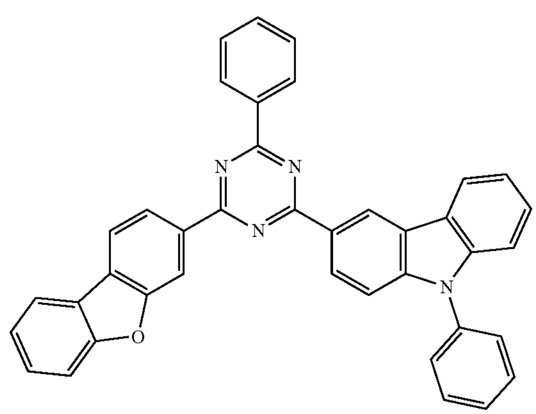
, 2b-52
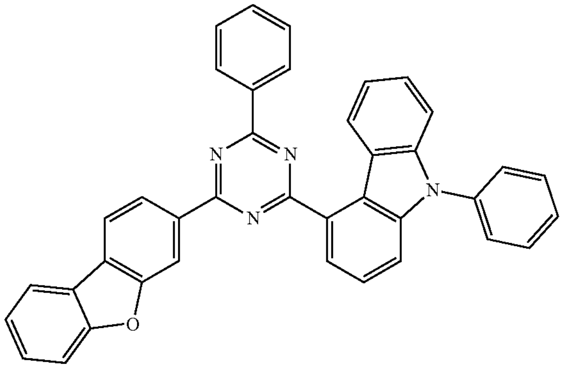
2b-53
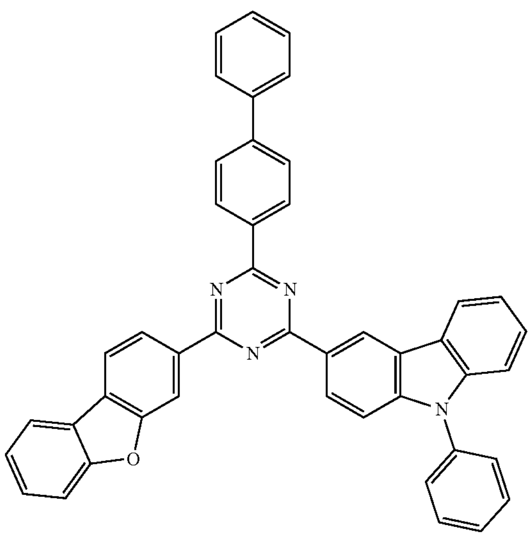
2b-54
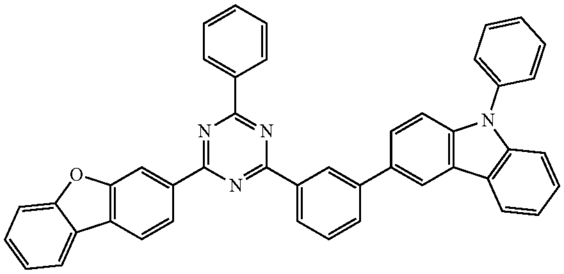
2b-55
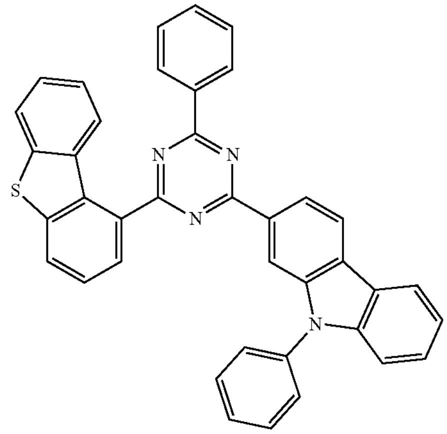
2b-56
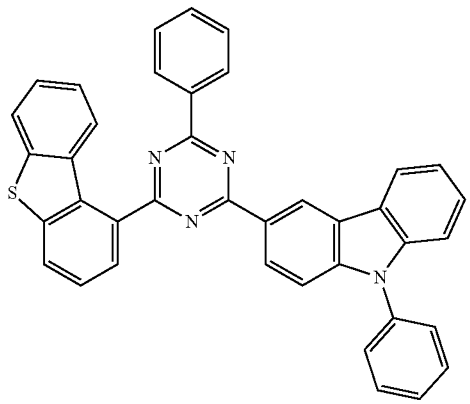
2b-57
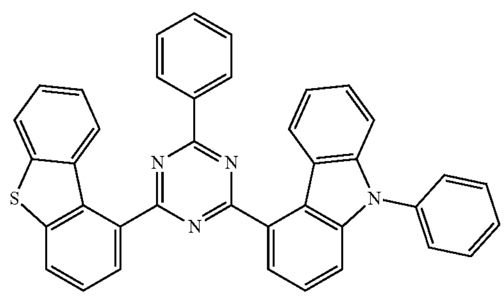
2b-58
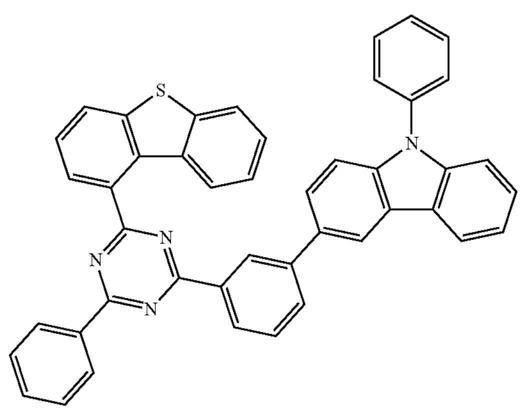

2b-59
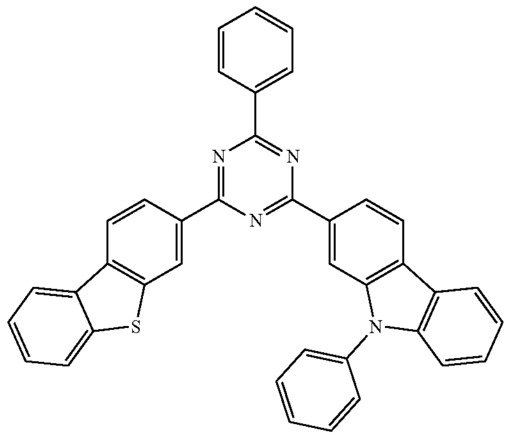
,
2b-60
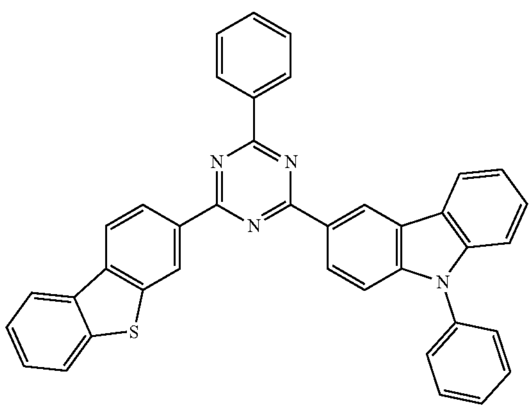
,
2b-61
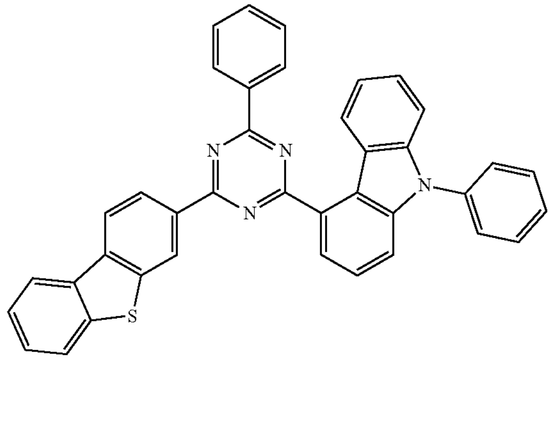
,
2b-62
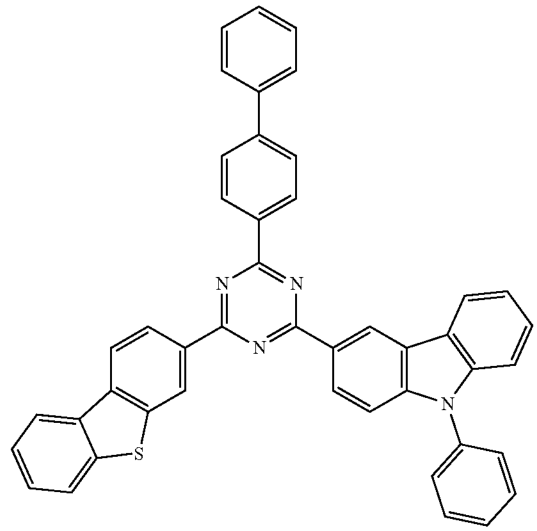
,
2b-63
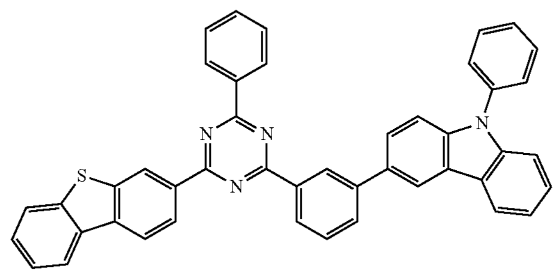
;
2c-1
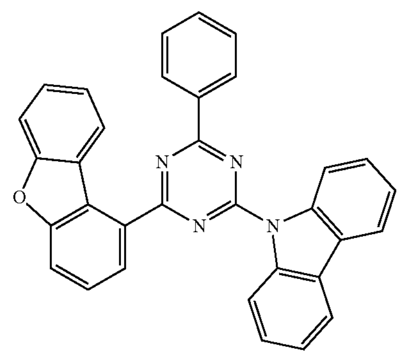
,
2c-2
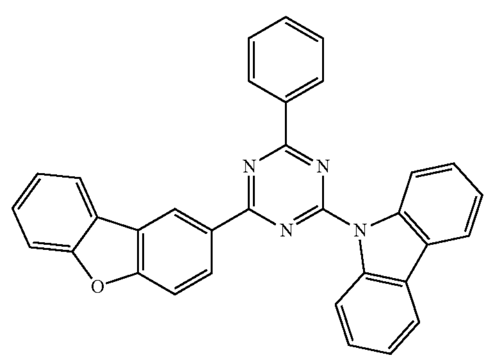
, -continued
2c-3
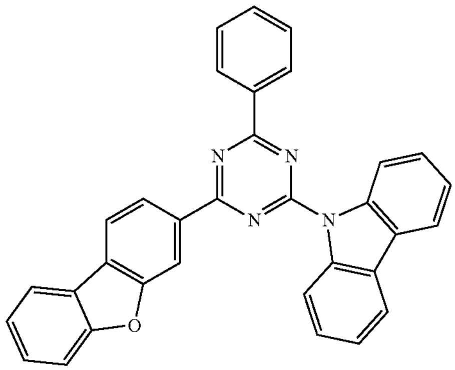
,
2c-4
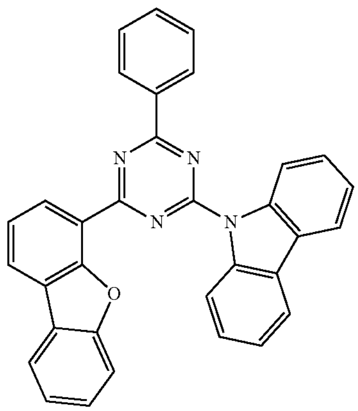
,
2c-5
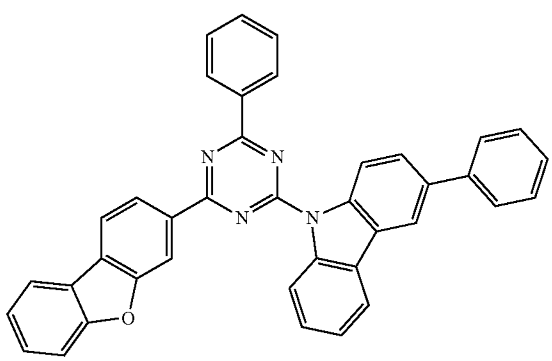
,
2c-6
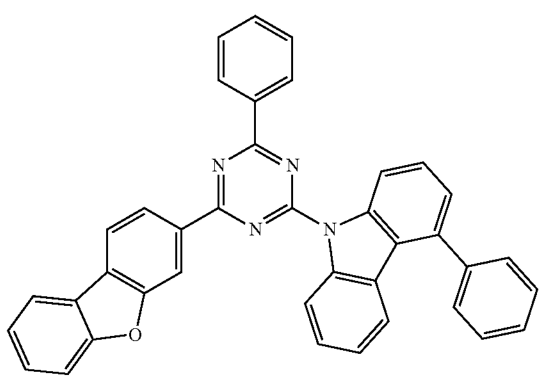
,
-continued
2c-7
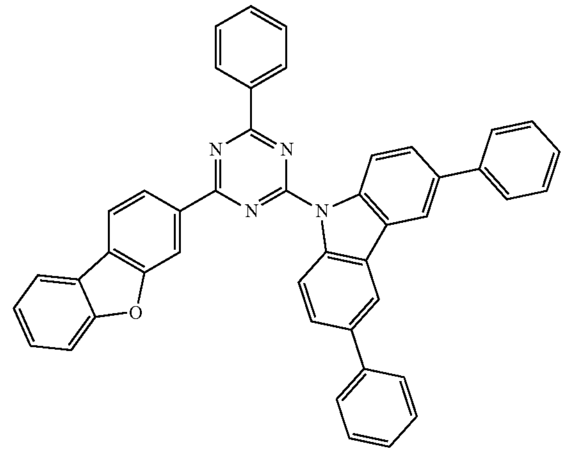
,
2c-8
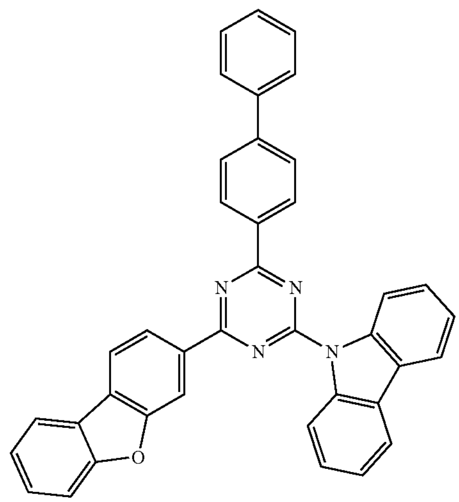
,
2c-9
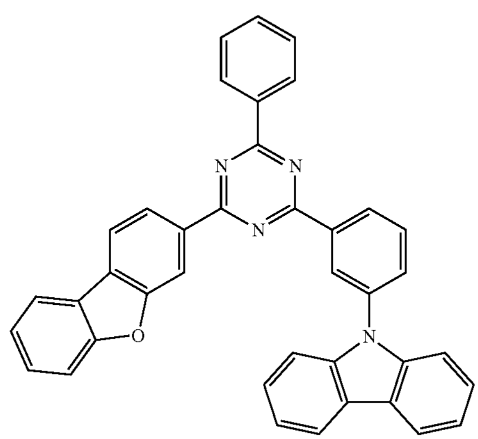
, -continued
2c-10
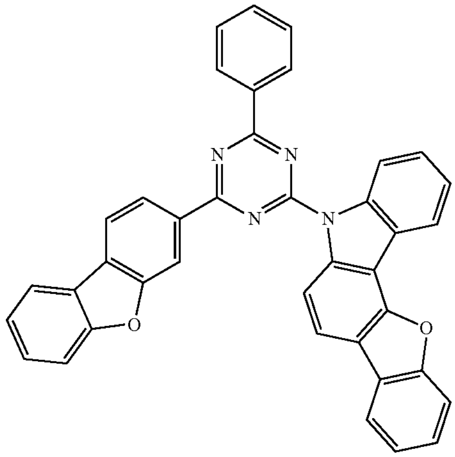
,
2c-11
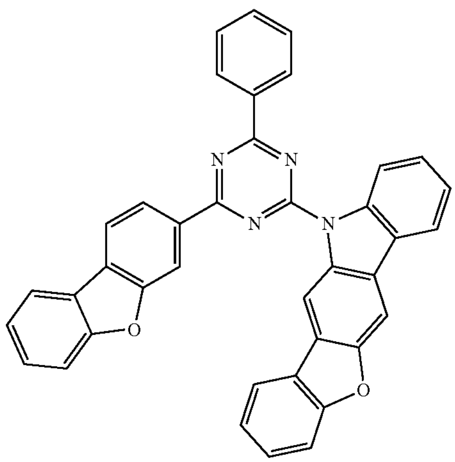
,
2c-12
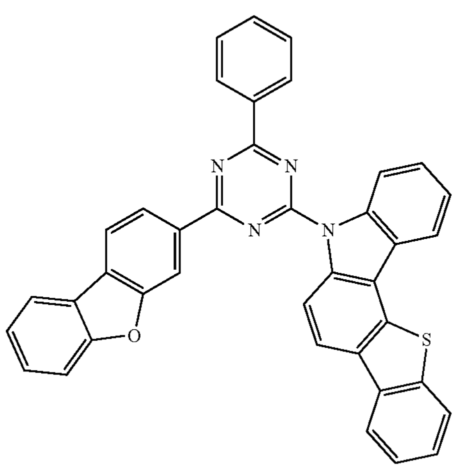
,
-continued
2c-13
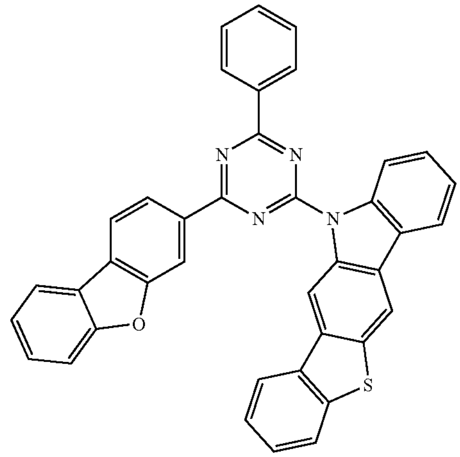
,
2c-14
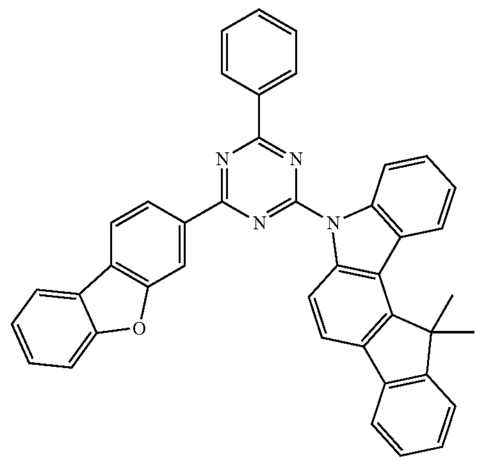
,
2c-15
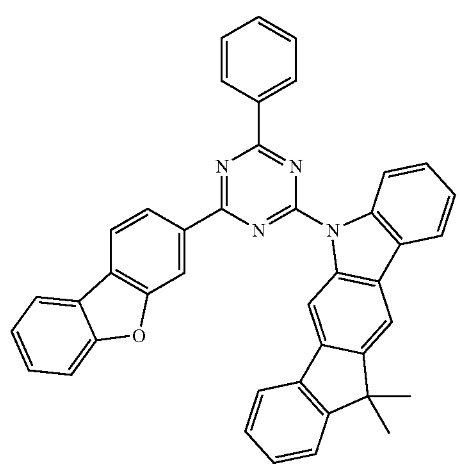
, -continued
2c-16
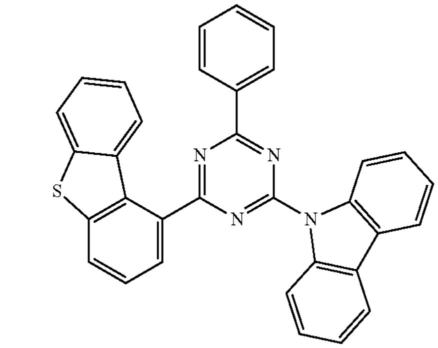
,
2c-17
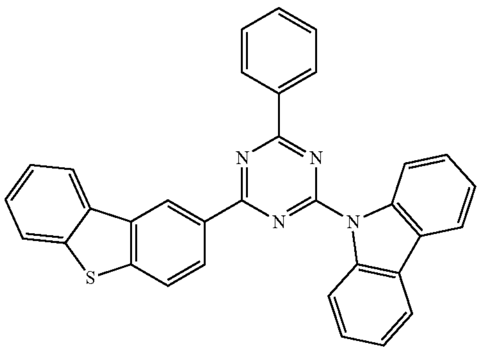
,
2c-18
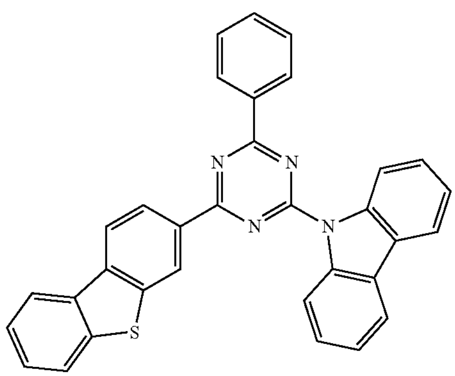
,
2c-19
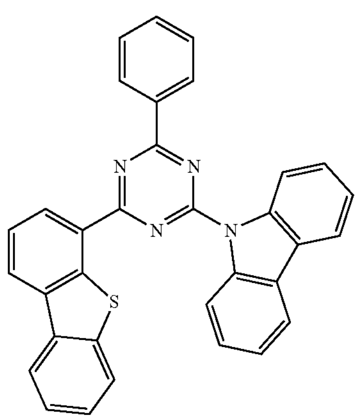
,
-continued
2c-20
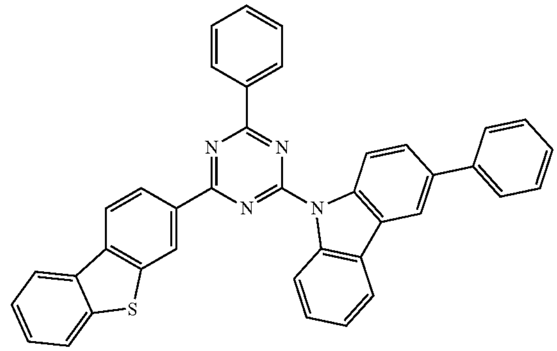
,
2c-21
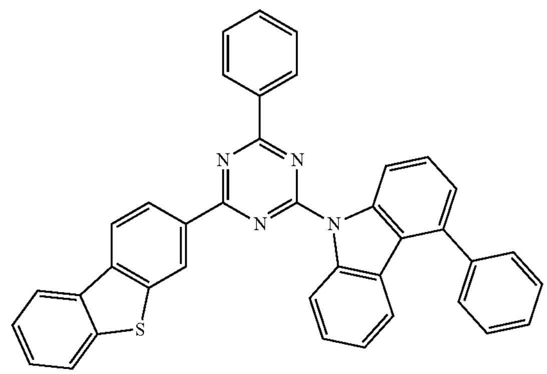
,
2c-22
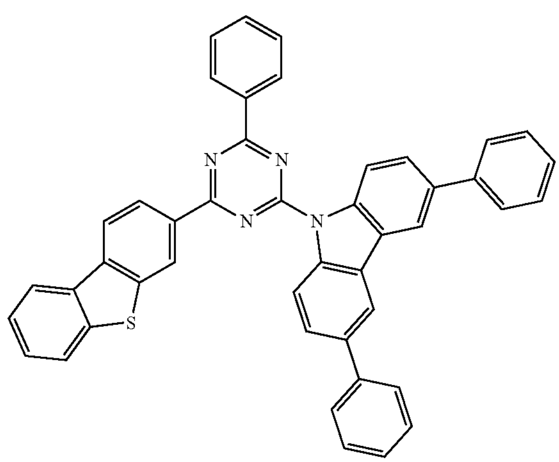
, -continued
2c-23
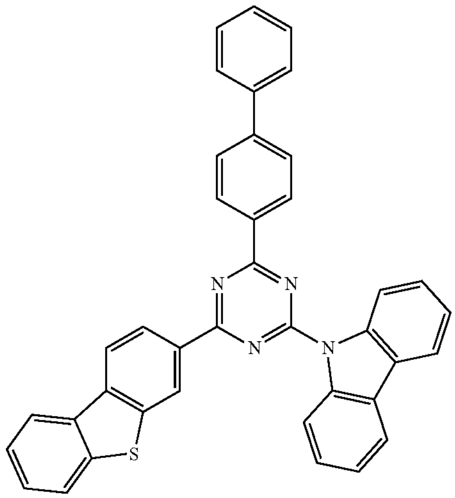
,
2c-24
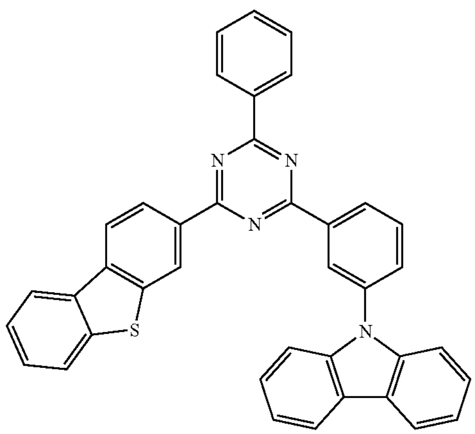
,
2c-25
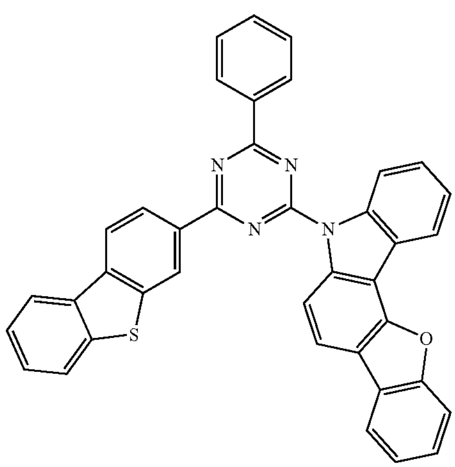
,
-continued
2c-26
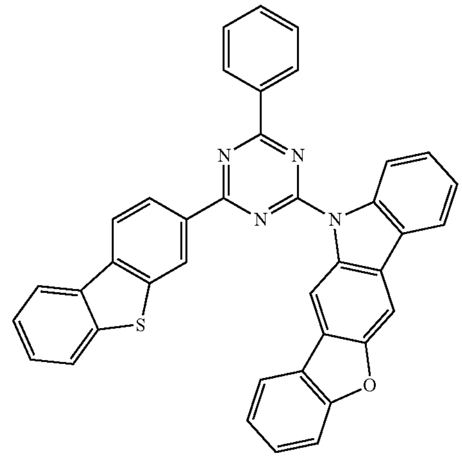
,
2c-27
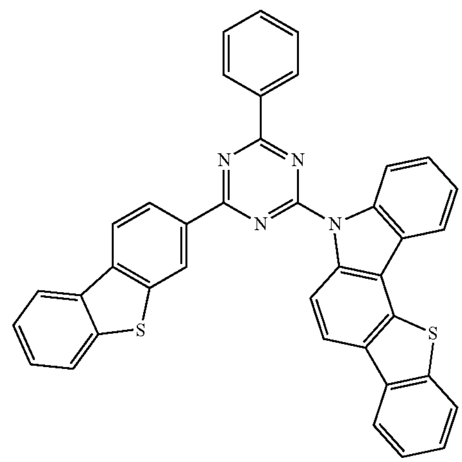
,
2c-28
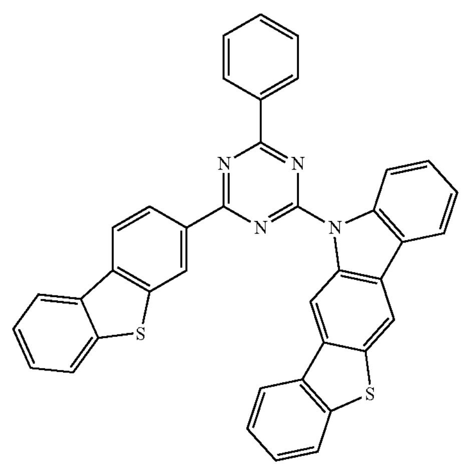
, -continued
2c-29
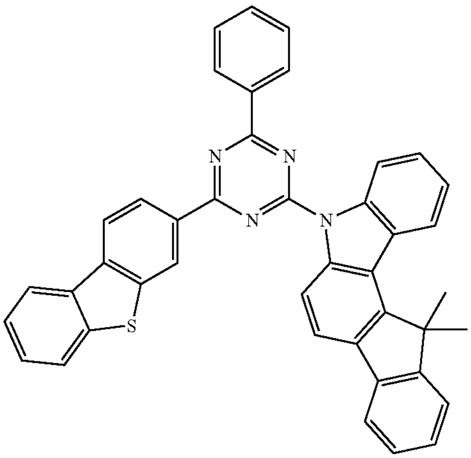
,
2c-30
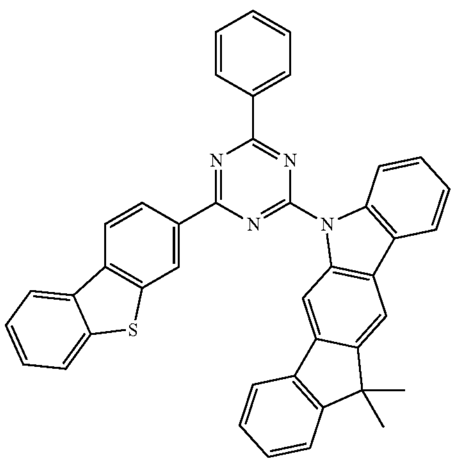
,
2c-31
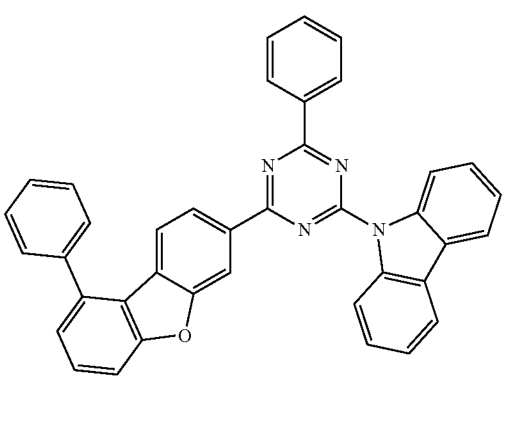
,
-continued
2c-32
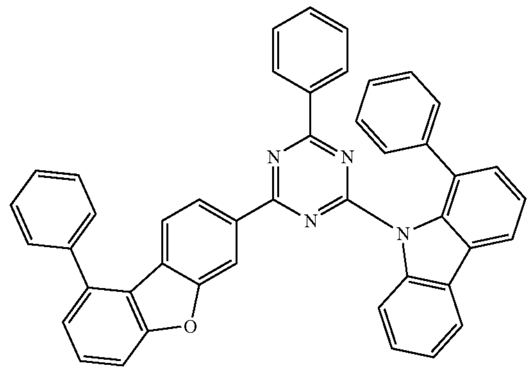
,
2c-33
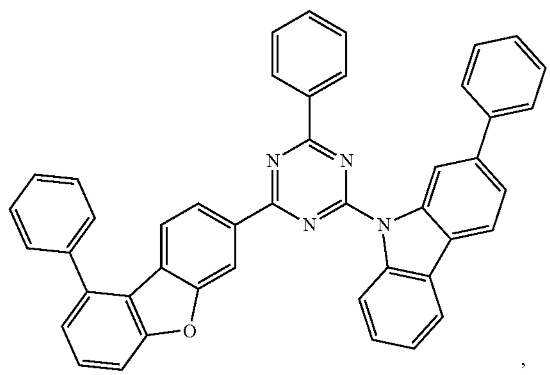
,
2c-34
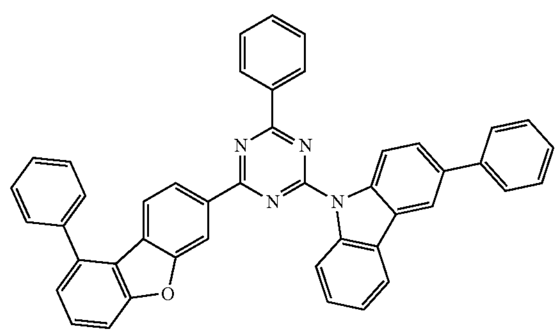
,
2c-35
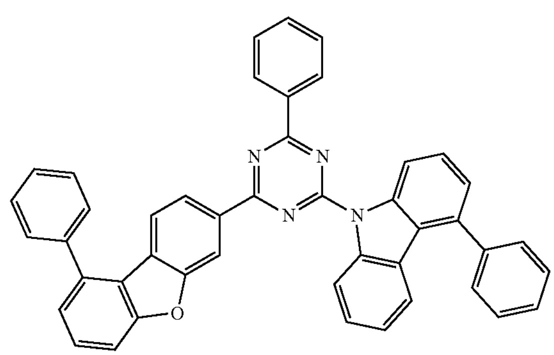
, -continued
2c-36
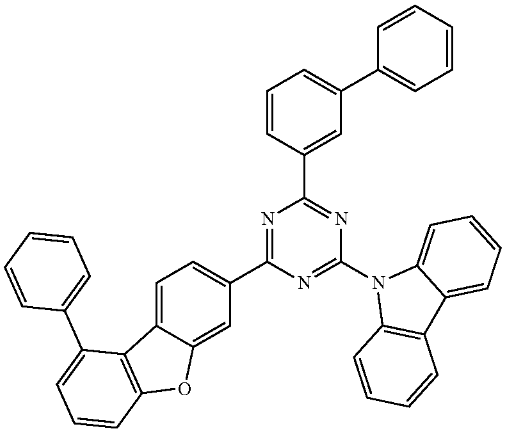
,
2c-37
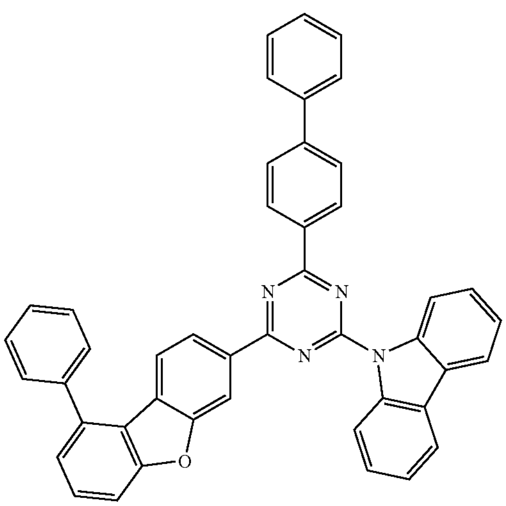
,
2c-38
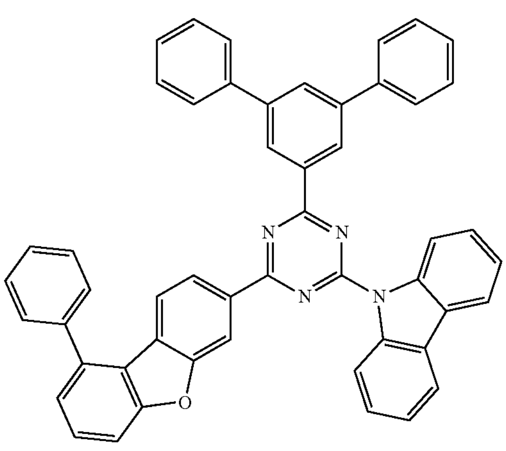
,
-continued
2c-39
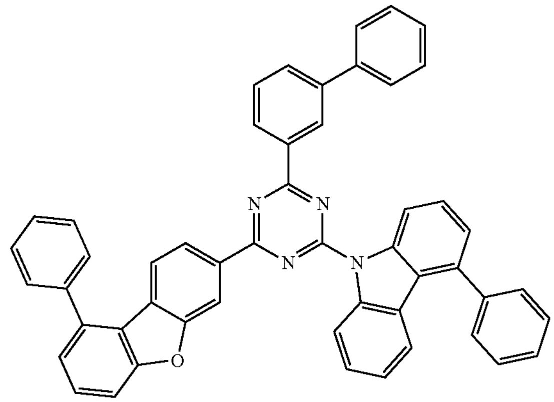
,
2c-40
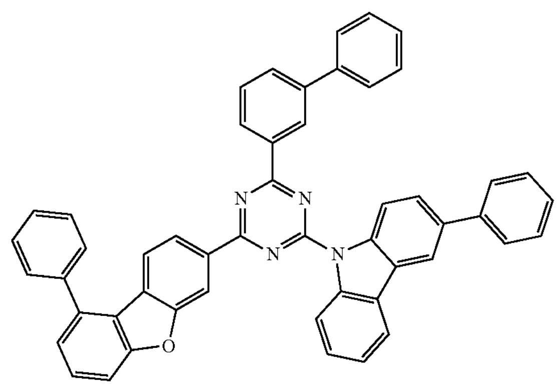
,
2c-41
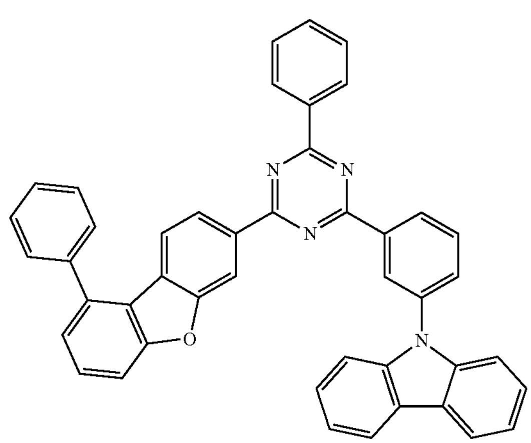
, -continued
2c-42
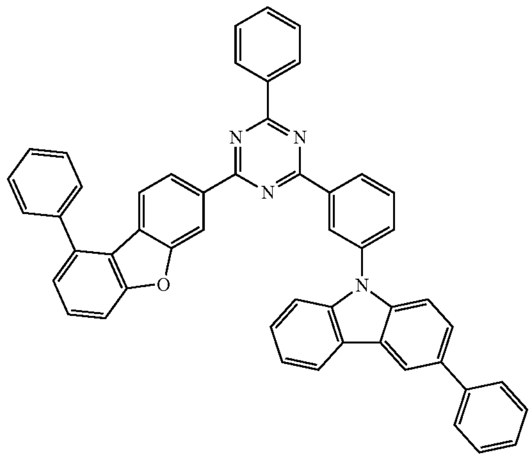
,
2c-43
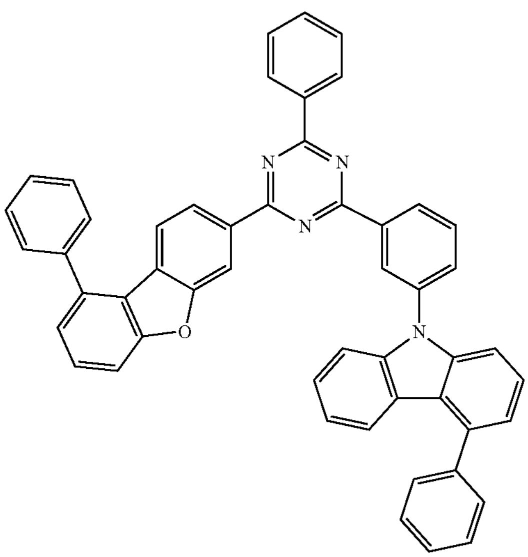
,
2c-44
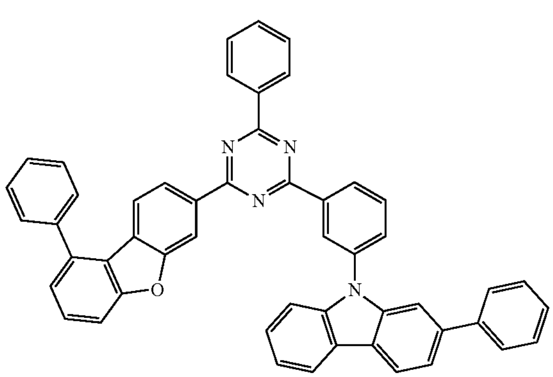
,
-continued
2c-45
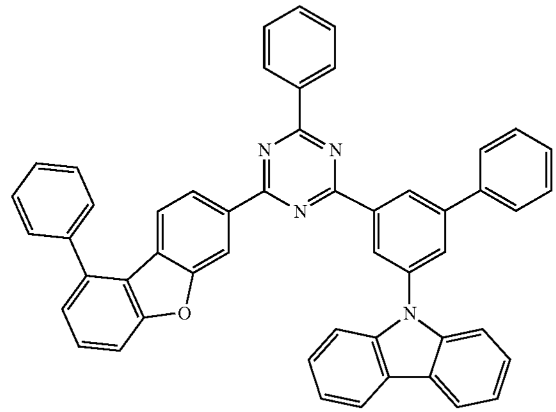
,
2c-46
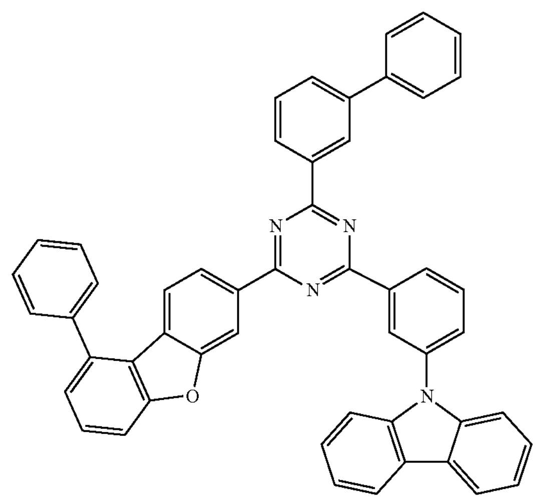
2c-47
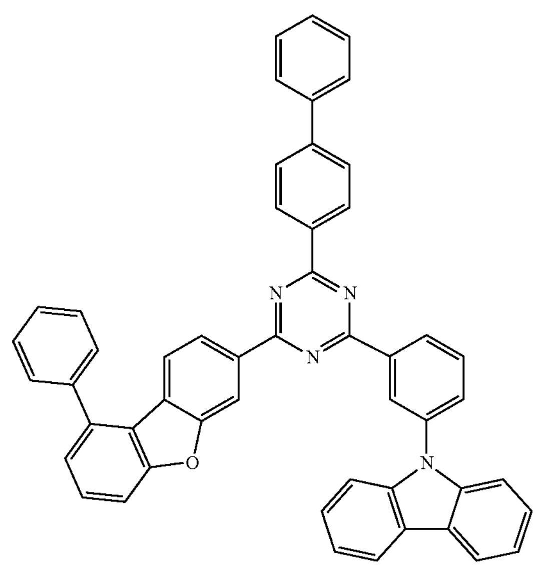
, -continued
2c-48
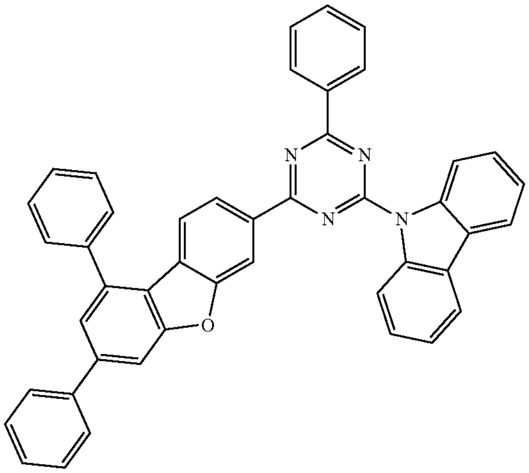
,
2c-49
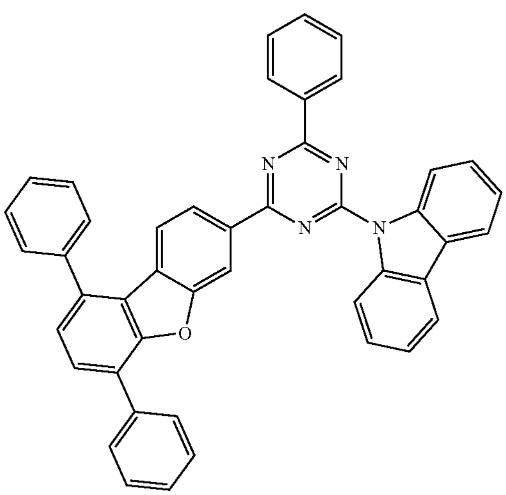
,
2c-50
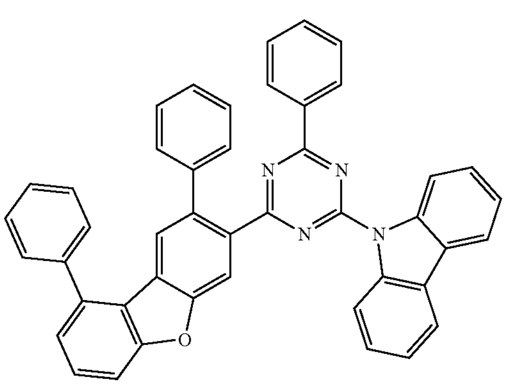
,
-continued
2c-51
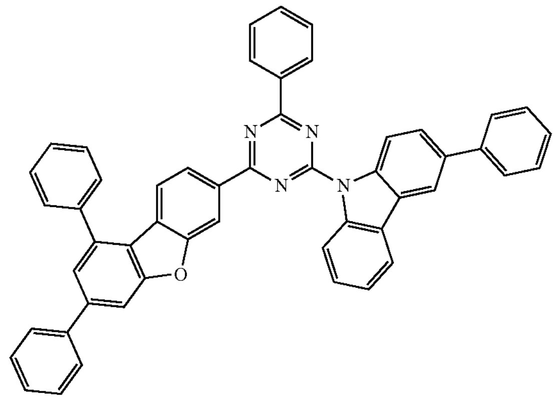
,
2c-52
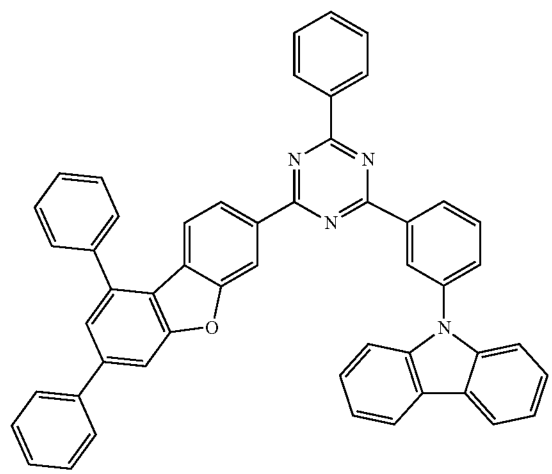
,
2c-53
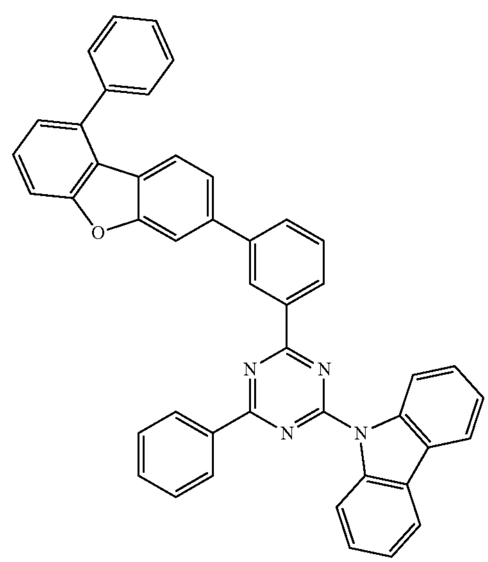
, -continued
2c-54
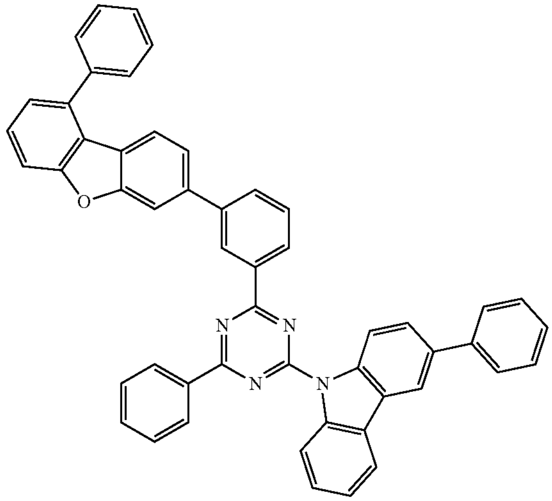
,
2c-55
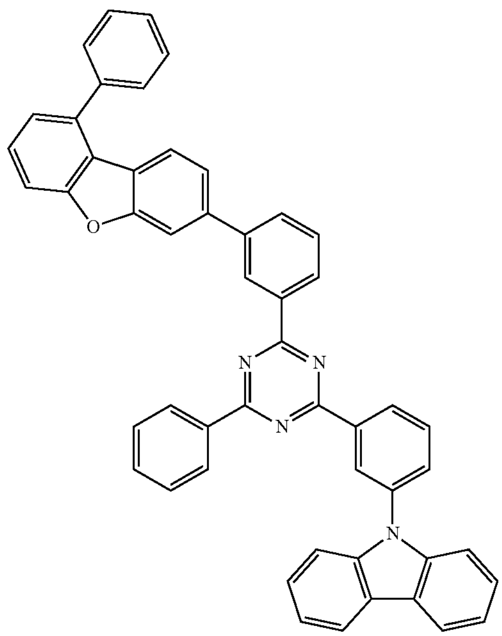
,
2c-56
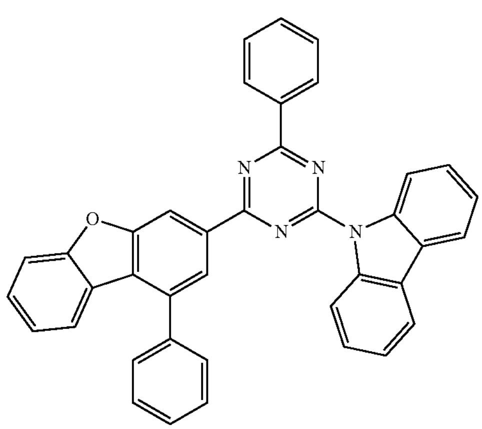
,
-continued
2c-57
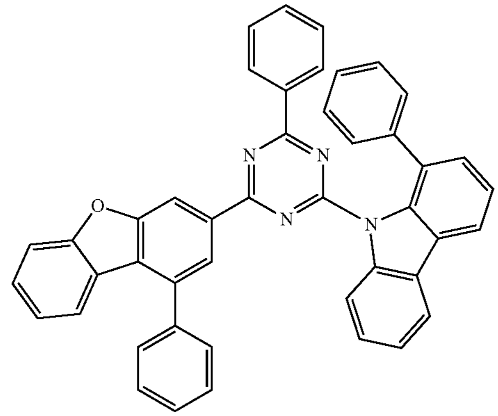
,
2c-58
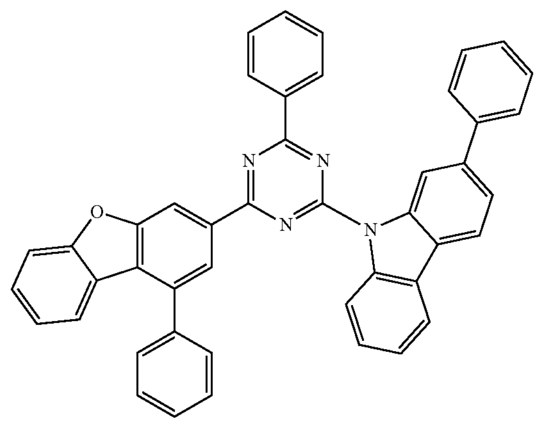
,
2c-59
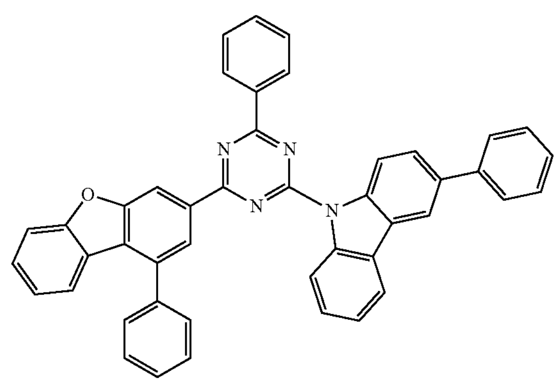
, -continued
2c-60
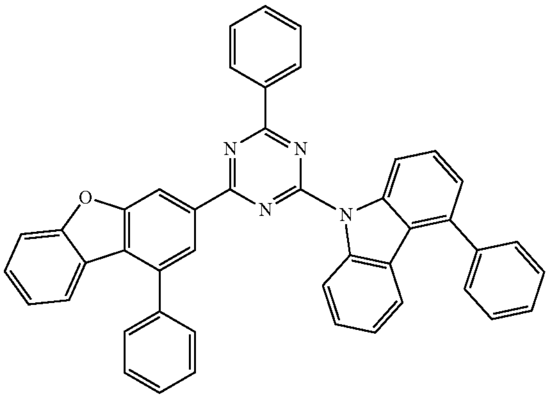
,
2c-61
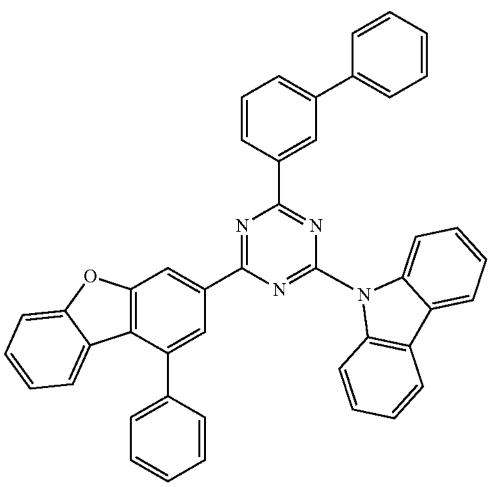
,
2c-62
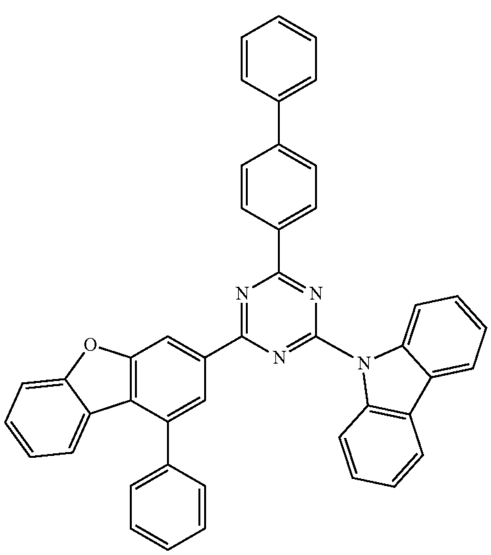
,
-continued
2c-63
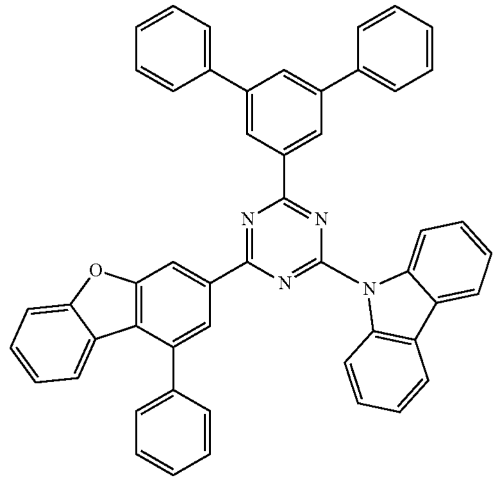
,
2c-64
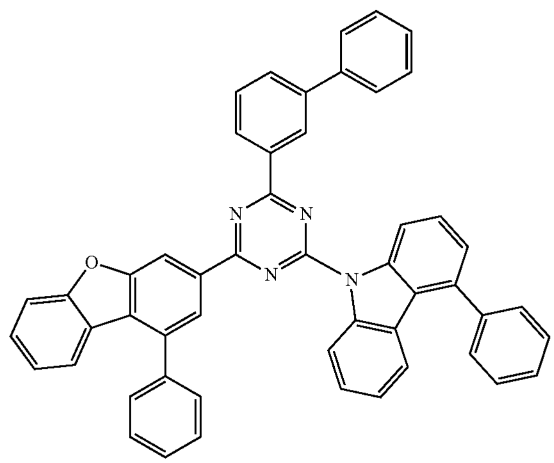
,
2c-65
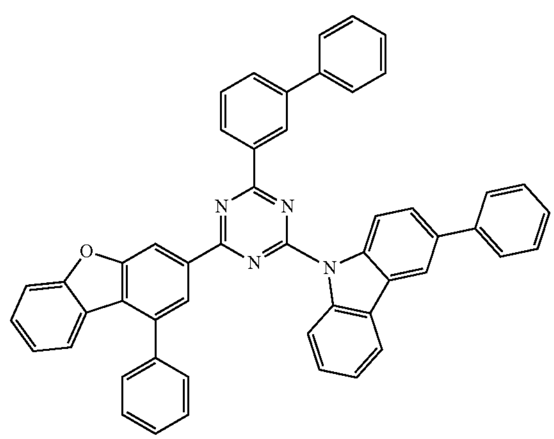
, -continued
2c-66
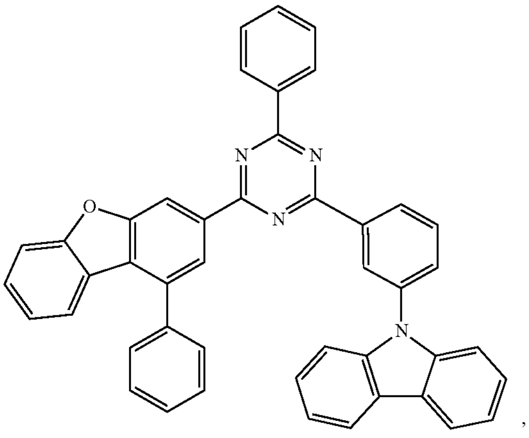
2c-67
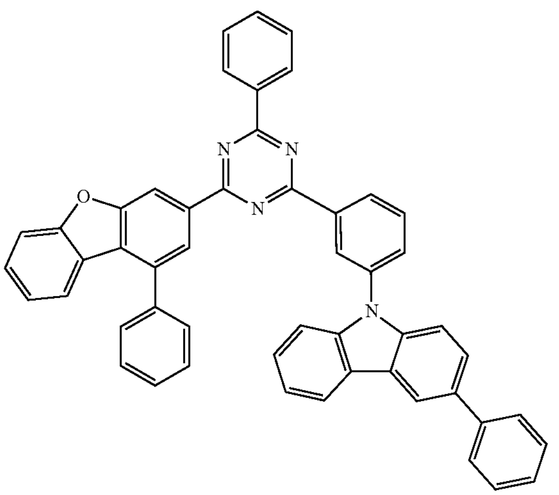
2c-68
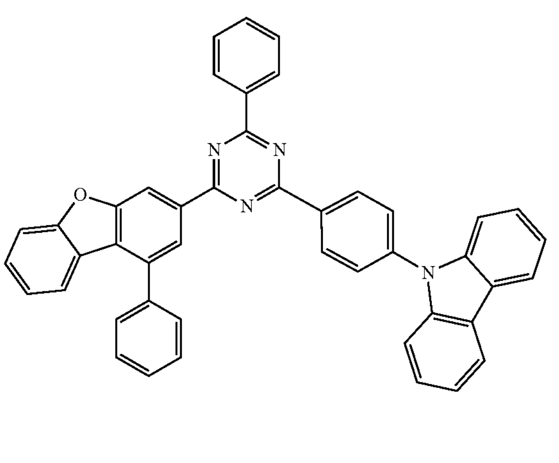
-continued
2c-69
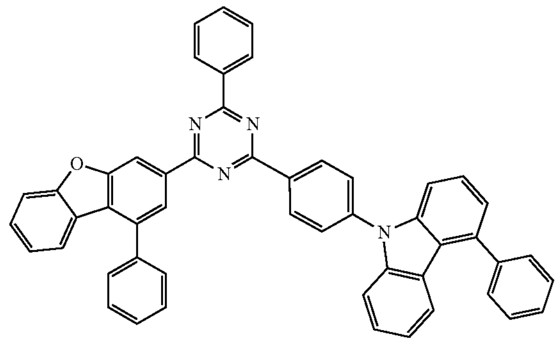
2c-70
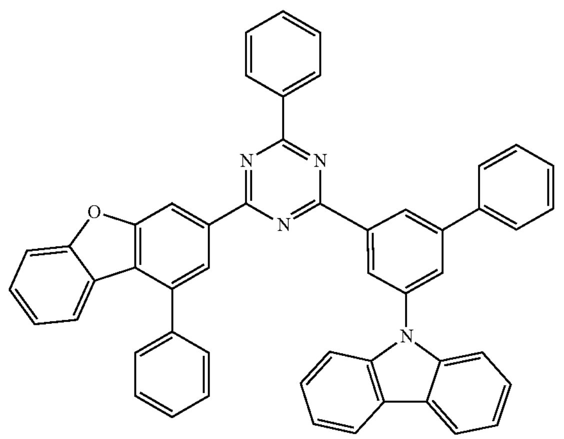
2c-71
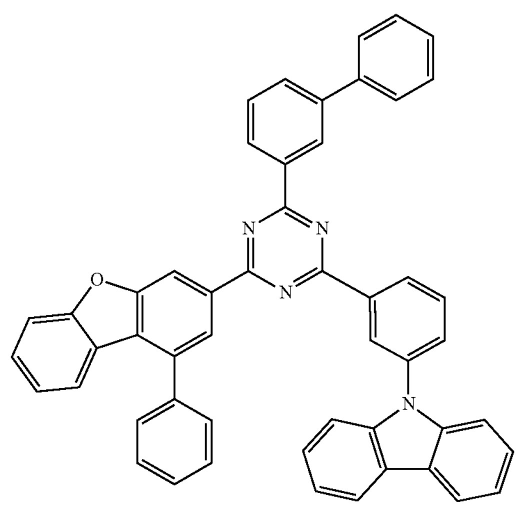

-continued
2c-72
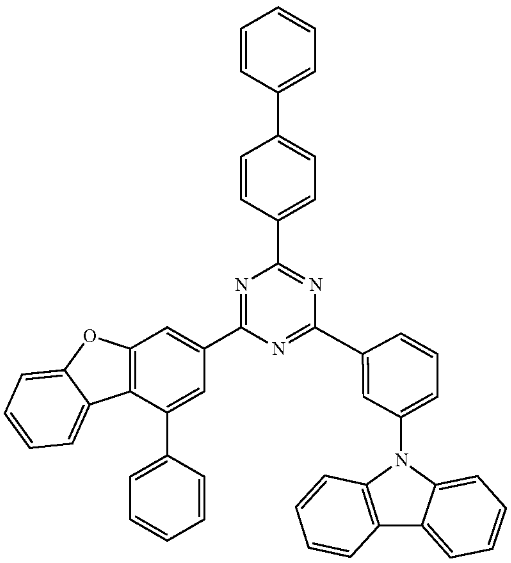
,
2c-73
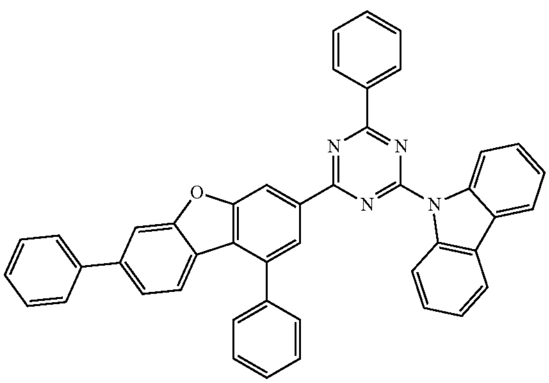
,
2c-74
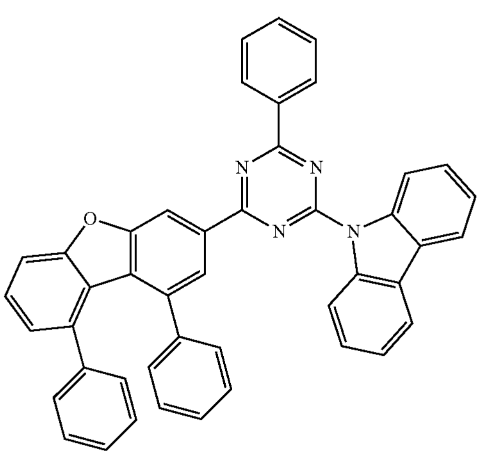
,
-continued
2c-75
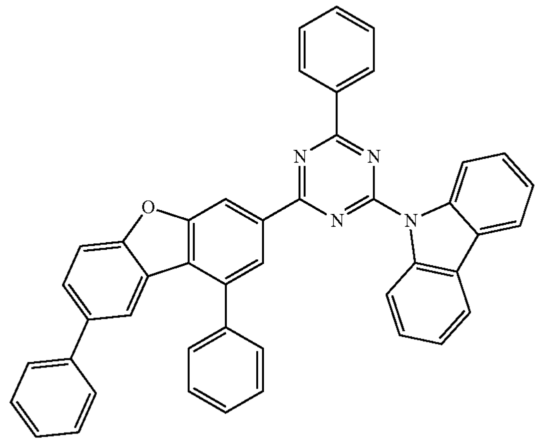
,
2c-76
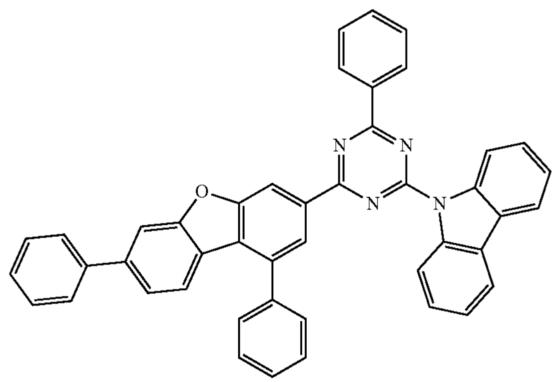
,
2c-77
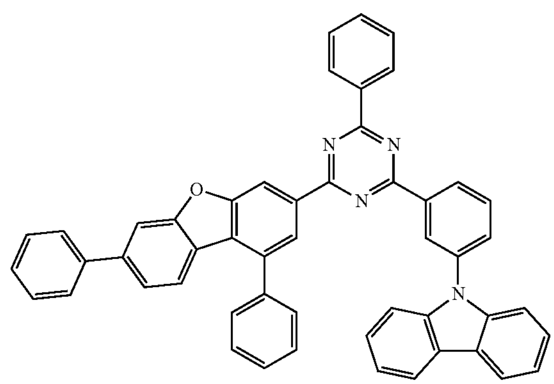
,
2c-78
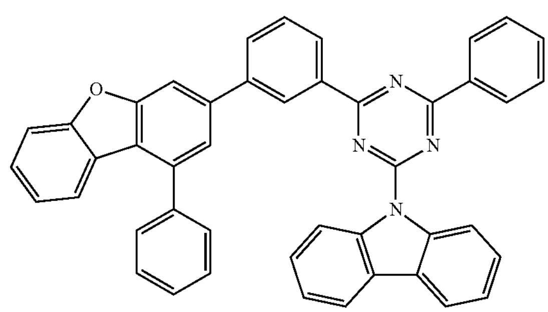
, -continued
2c-79
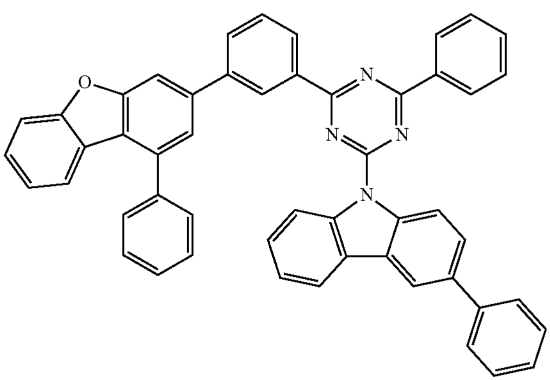
,
2c-80
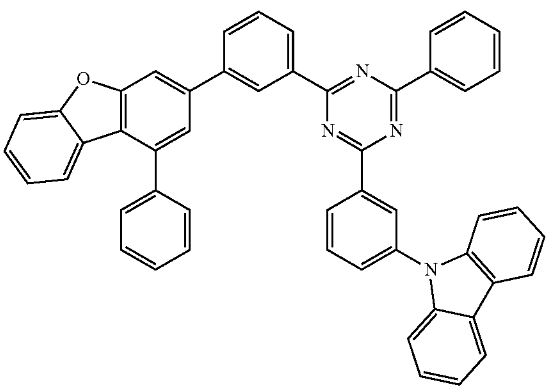
,
2d-1
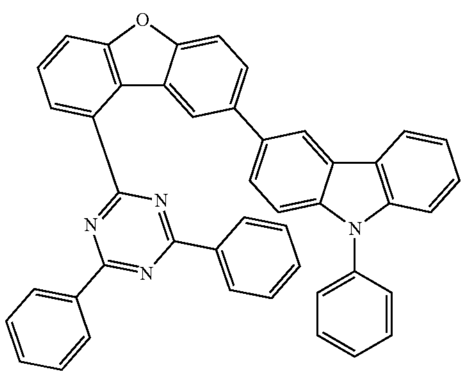
,
2d-2
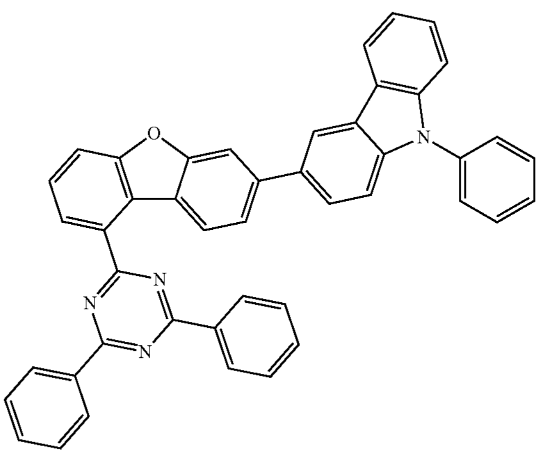
,
-continued
2d-3
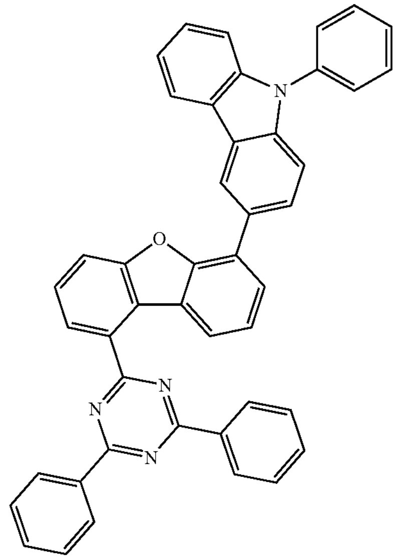
,
2d-4
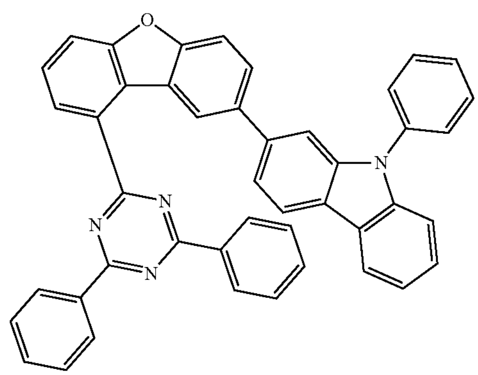
,
2d-5
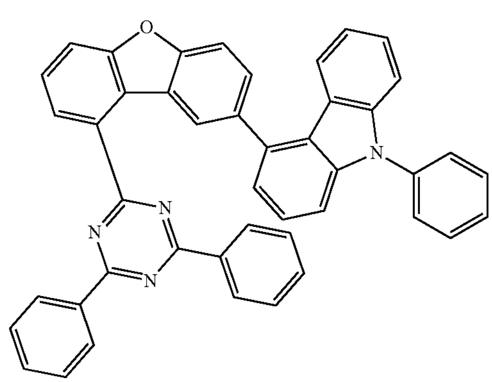
, 2d-6
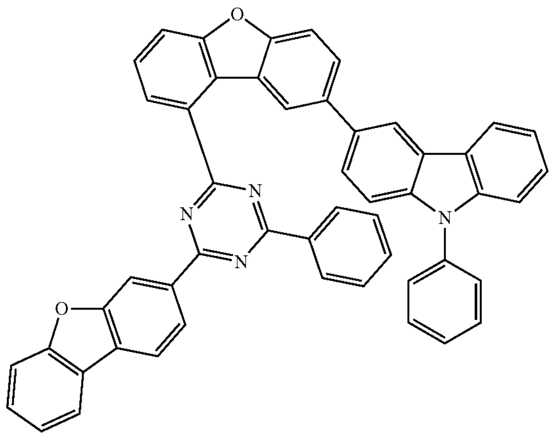
,
2d-7
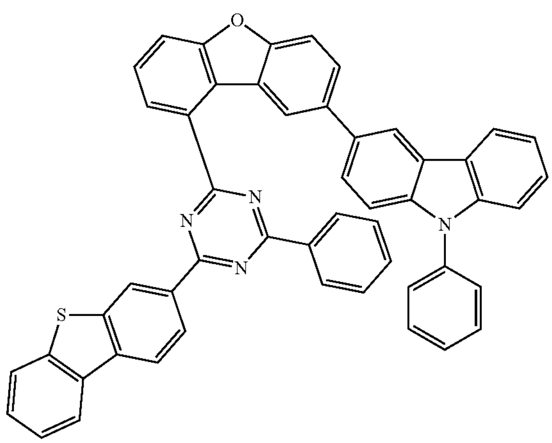
,
2d-8
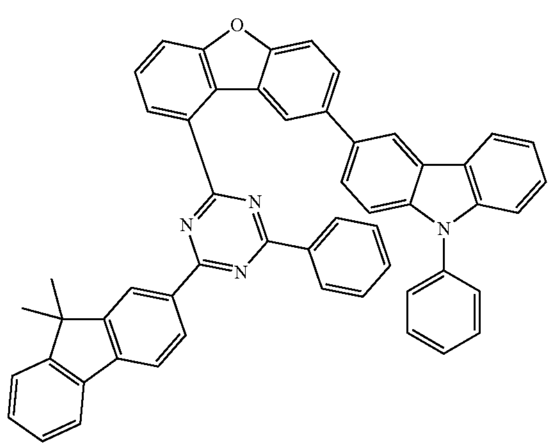
,
2d-9
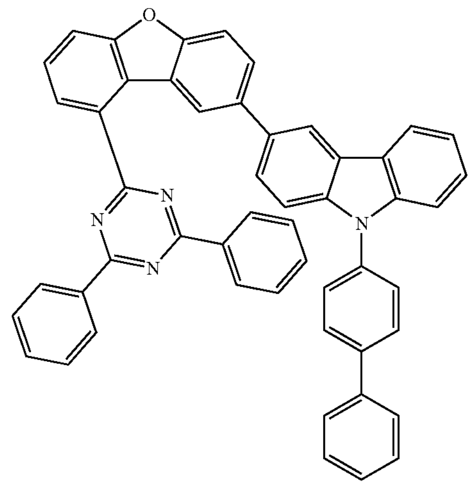
,
2d-10
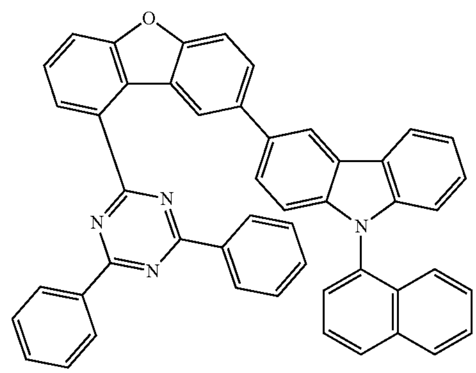
,
2d-11
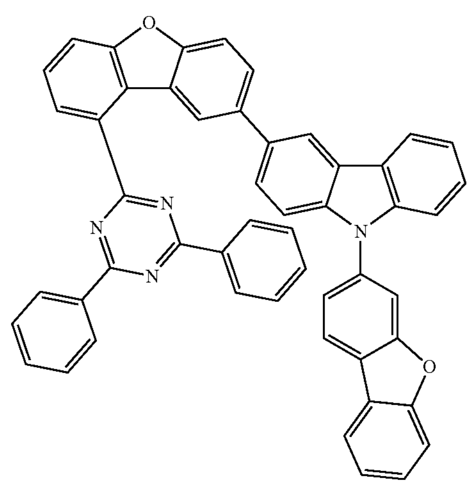
, -continued
2d-12
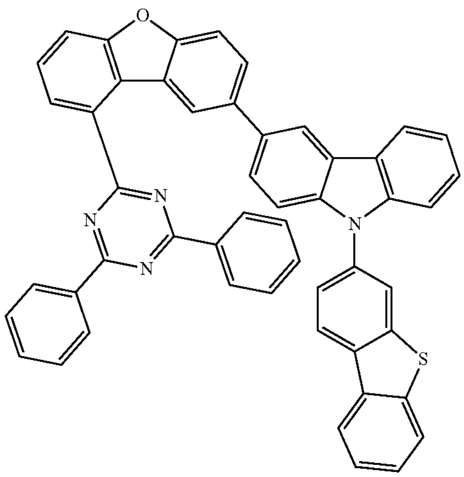
,
2d-13
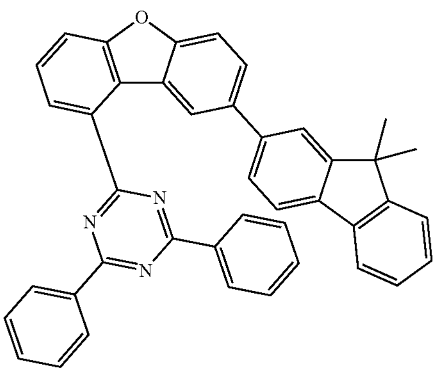
,
2d-14
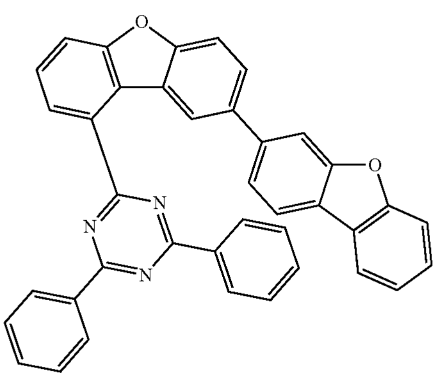
,
2d-15
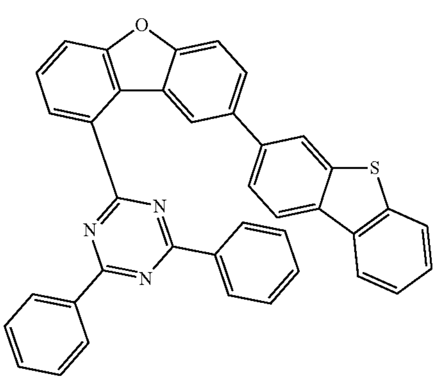
,
-continued
2d-16
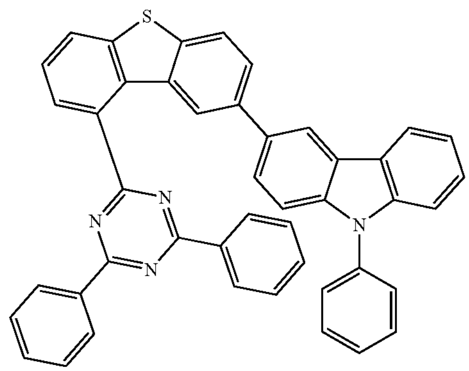
,
2d-17
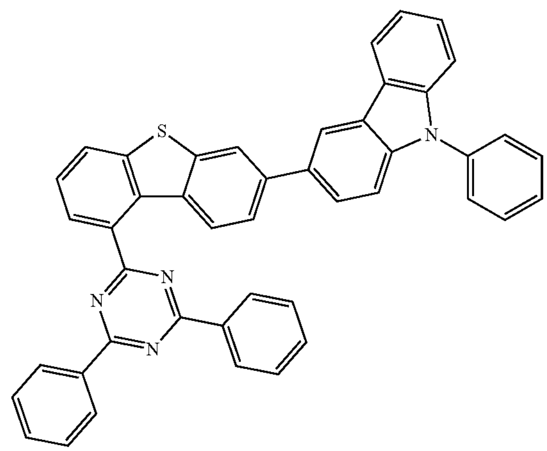
,
2d-18
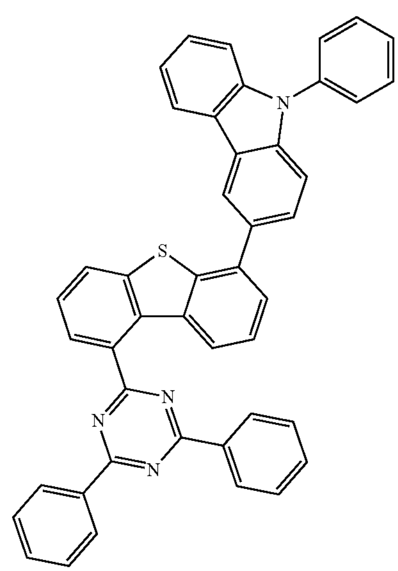
, -continued
2d-19
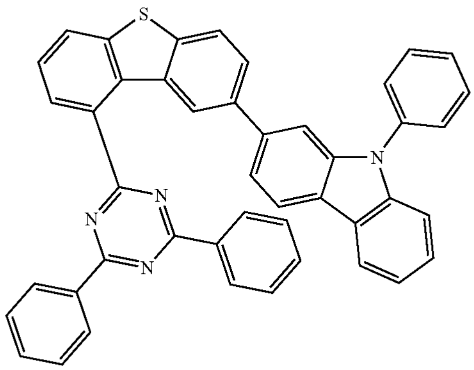
,
2d-20
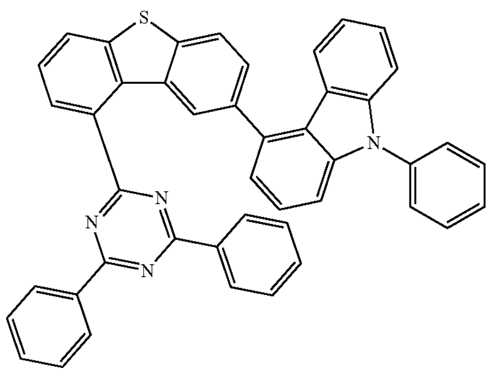
,
2d-21
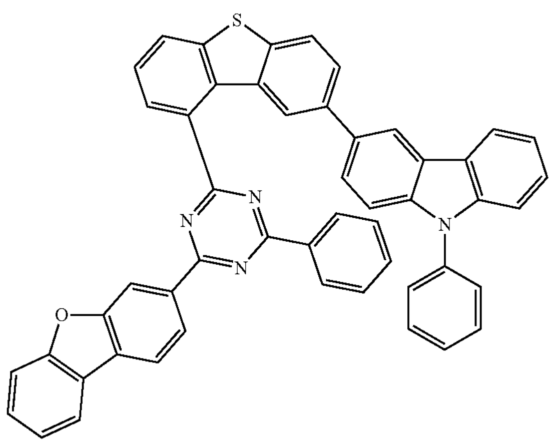
,
2d-22
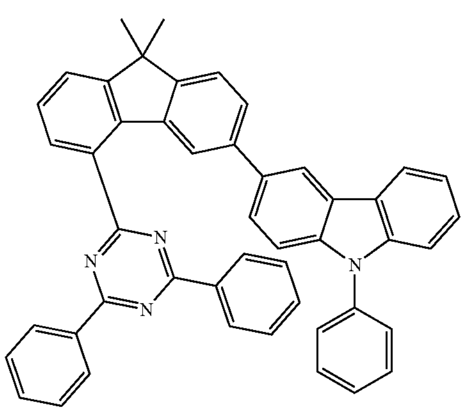
,
-continued
2d-23
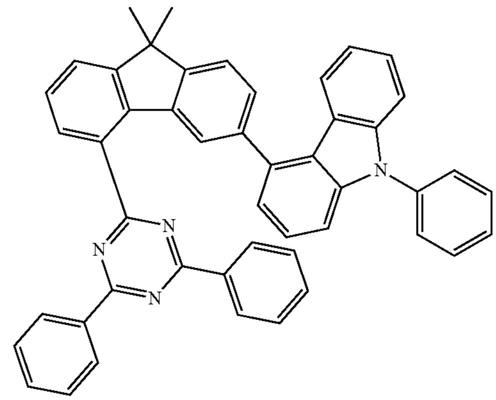
,
2d-24
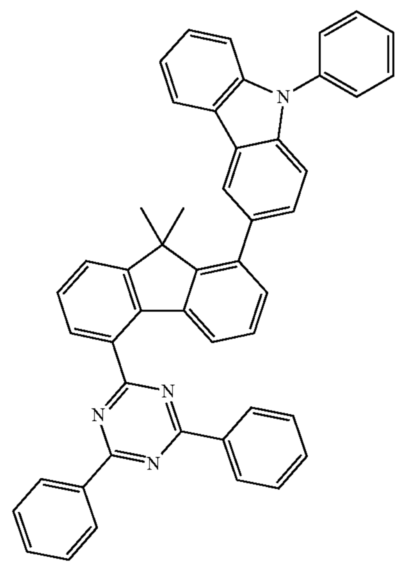
,
2d-25
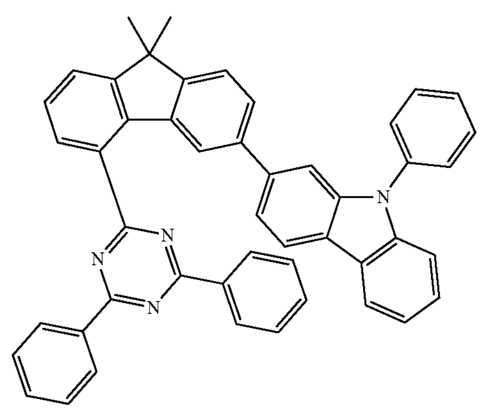
, -continued
2d-26
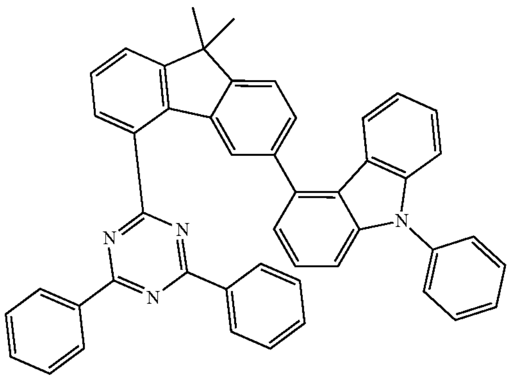
,
2d-27
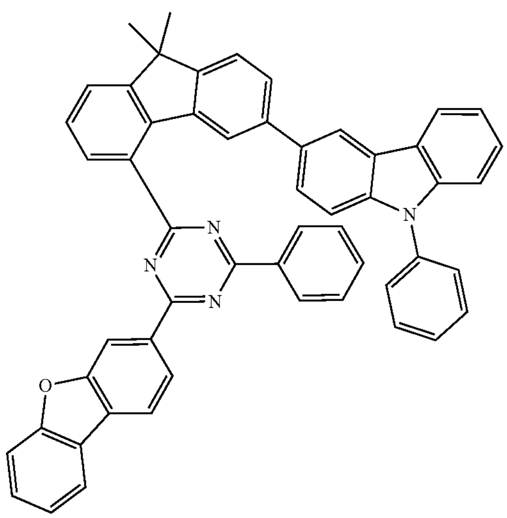
;
2e-1
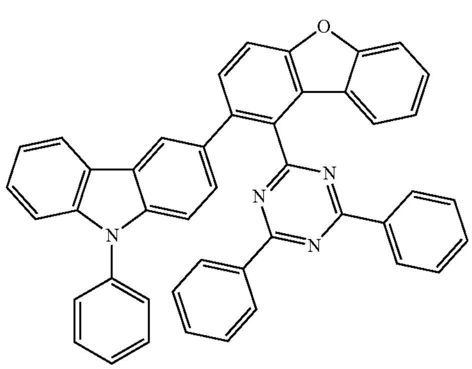
,
-continued
2e-2
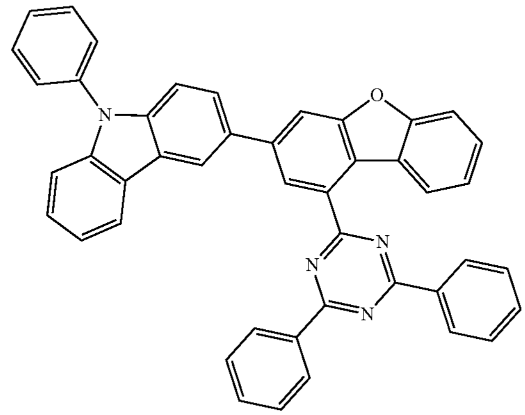
,
2e-3
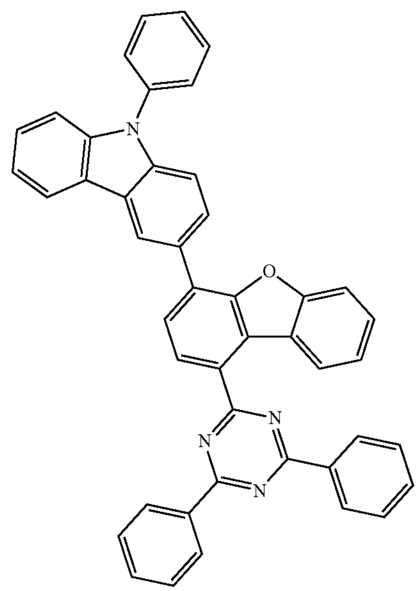
,
2e-4
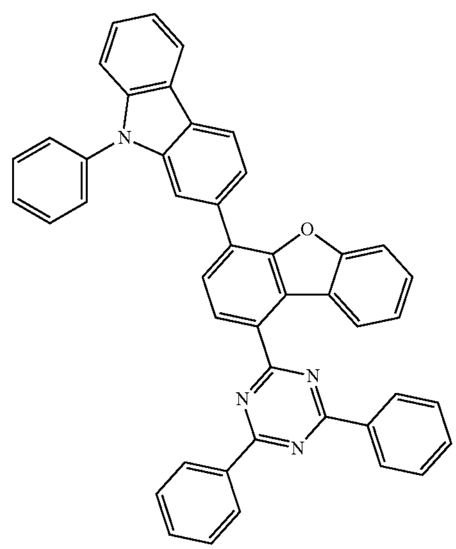
, -continued
2e-5
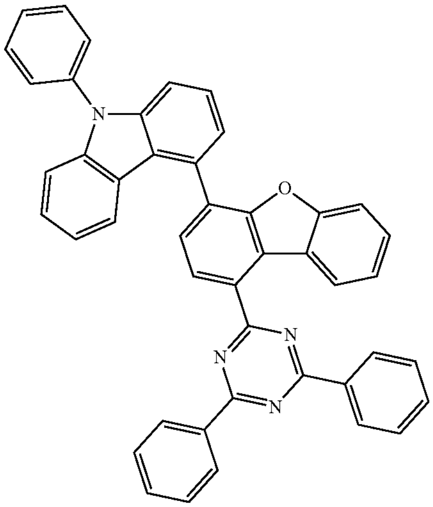
,
2e-6
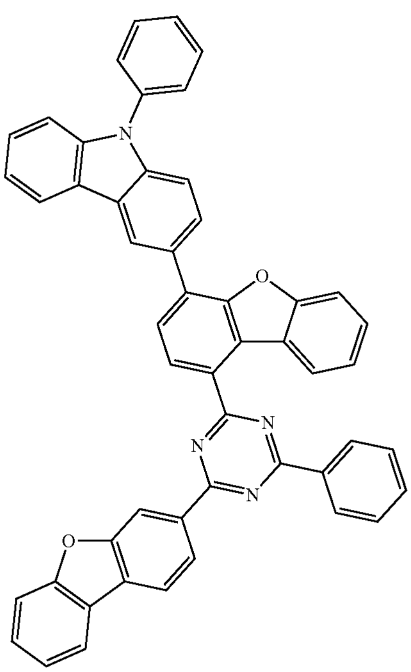
,
-continued
2e-7
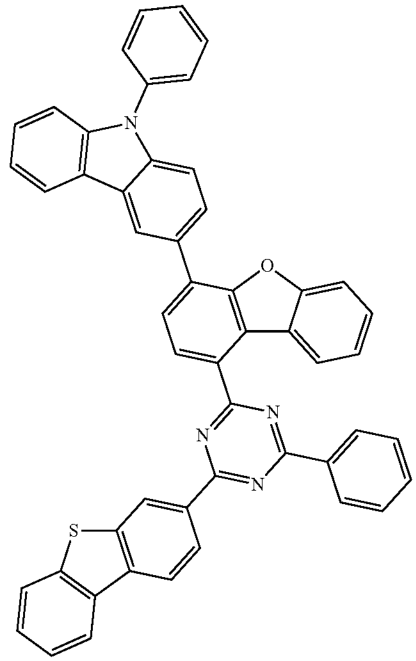
,
2e-8
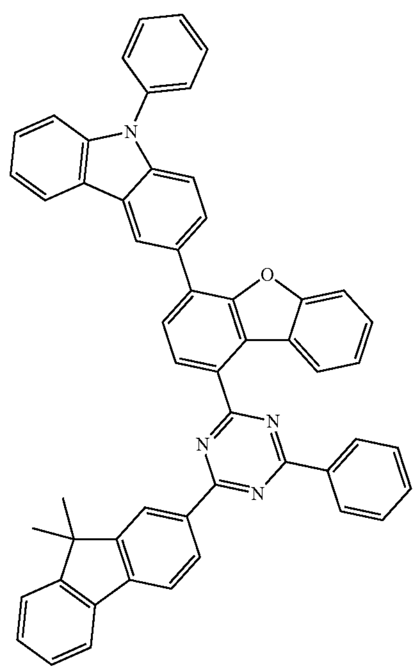
, -continued
2e-9
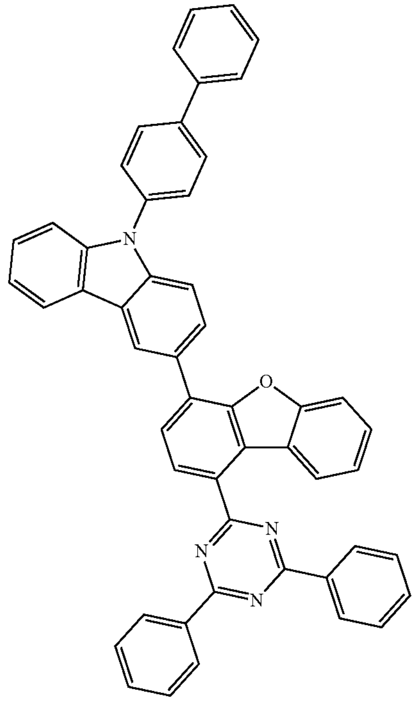
,
2e-10
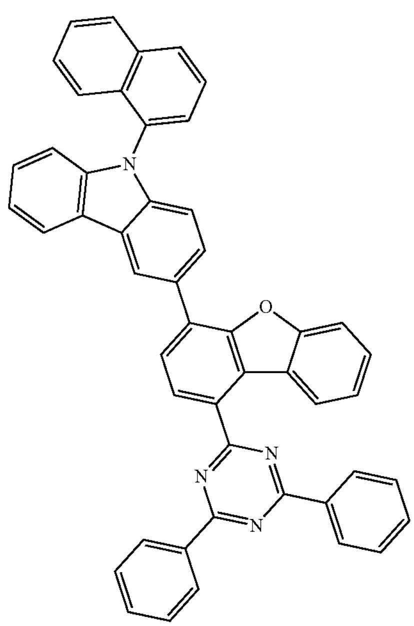
,
-continued
2e-11
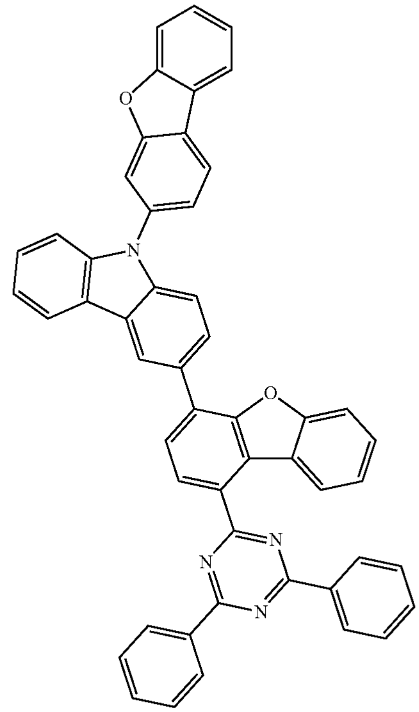
,
2e-12
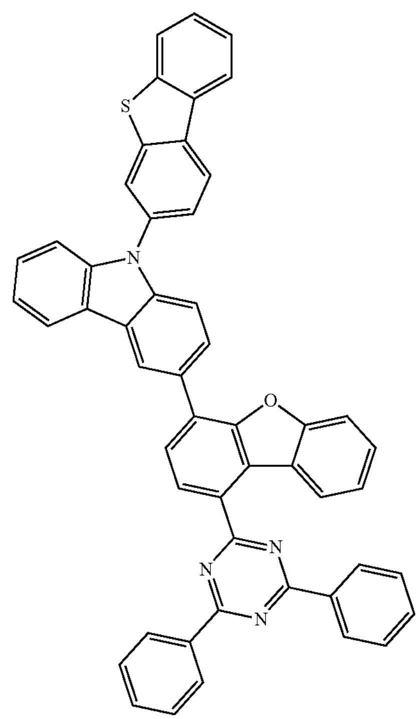
, -continued
2e-13
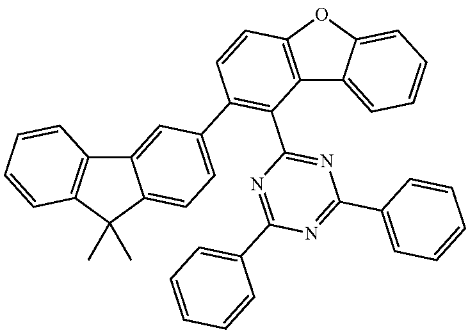
,
2e-14
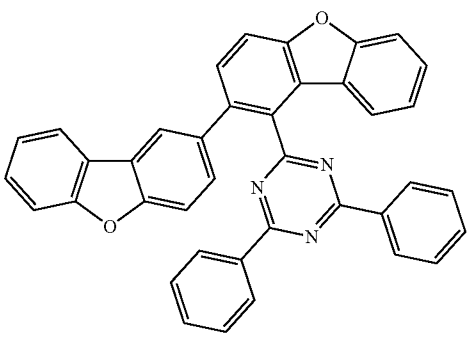
,
2e-15
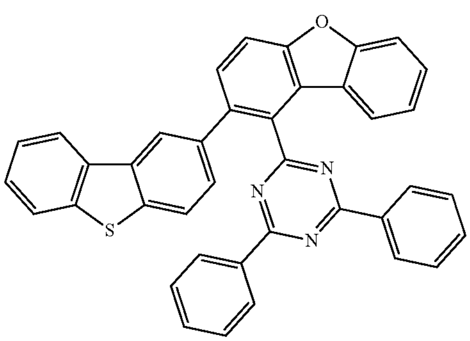
,
2e-16
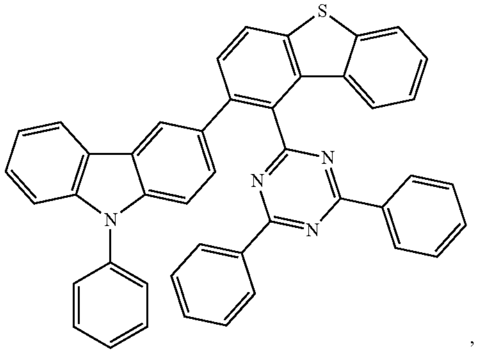
,
-continued
2e-17
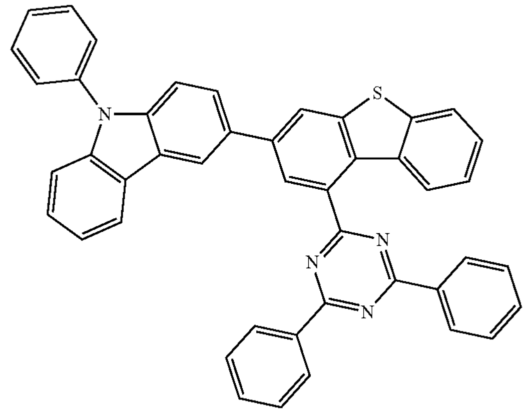
,
2e-18
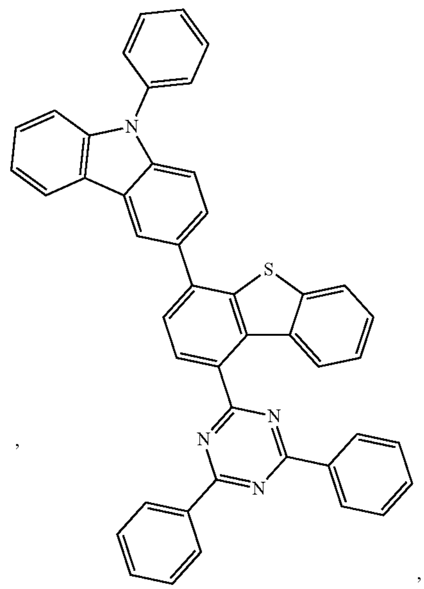
,
2e-19
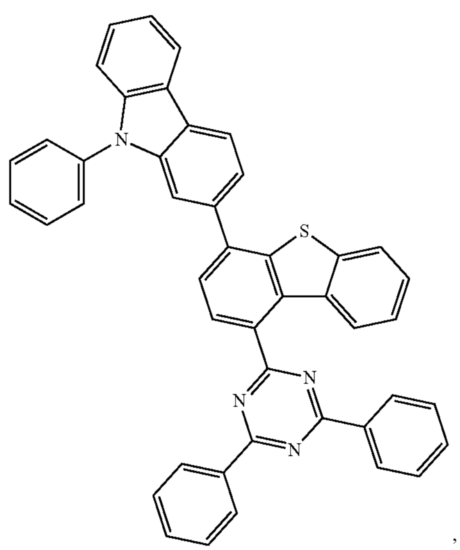
, -continued
2e-20
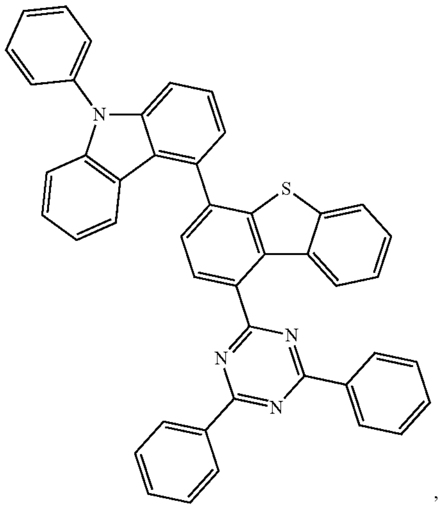
,
2e-21
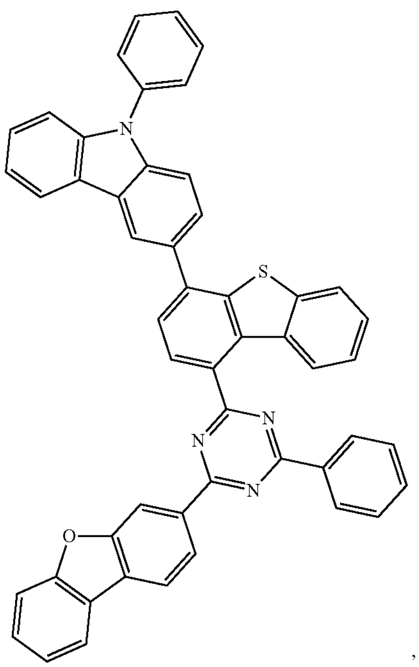
,
2e-22
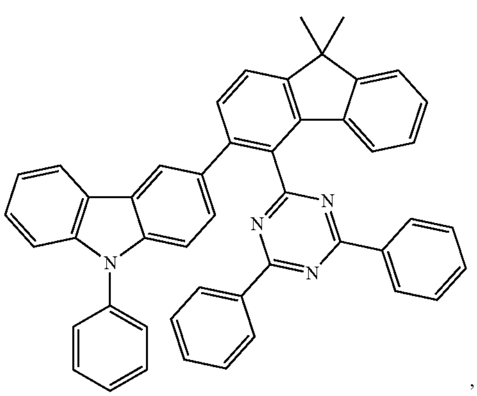
,
-continued
2e-23
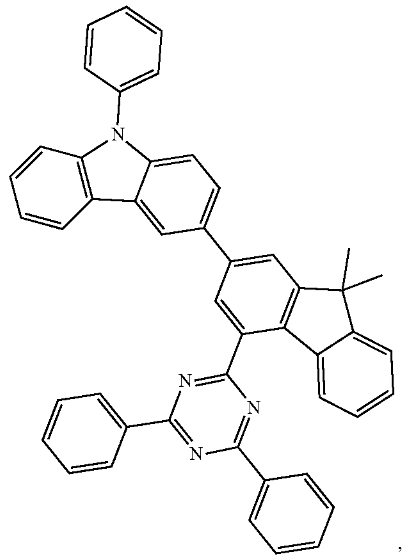
,
2e-24
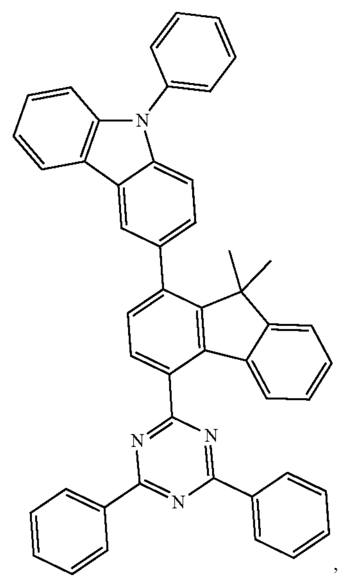
,
2e-25
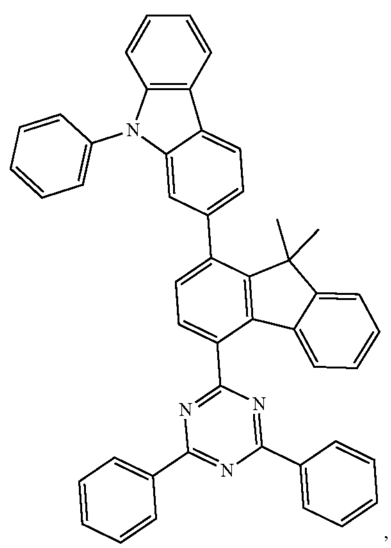
, -continued
2e-26
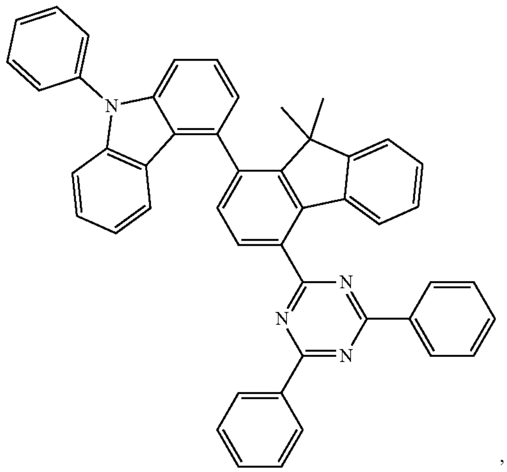
,
2e-27
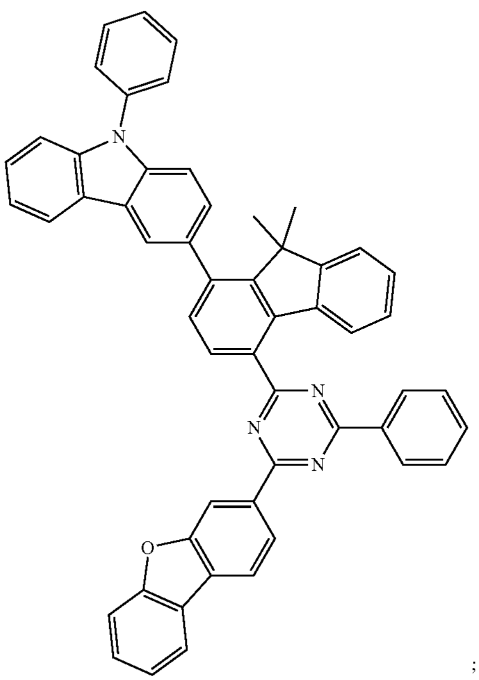
;
2f-1
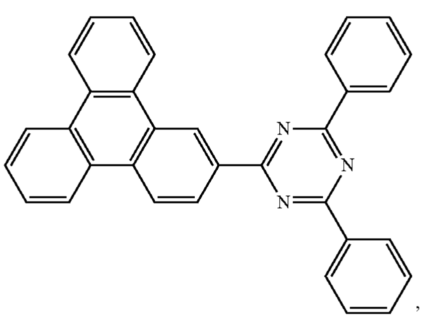
,
-continued
2f-2
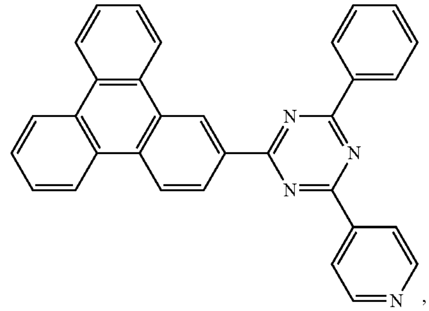
,
2f-3
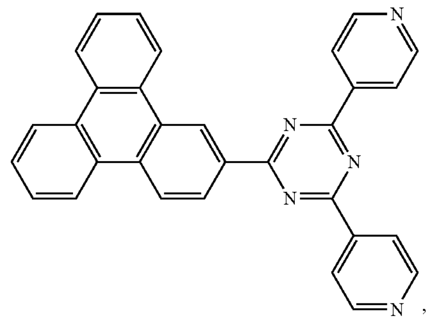
,
2f-4
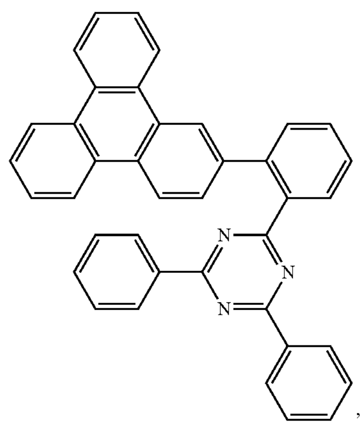
,
2f-5
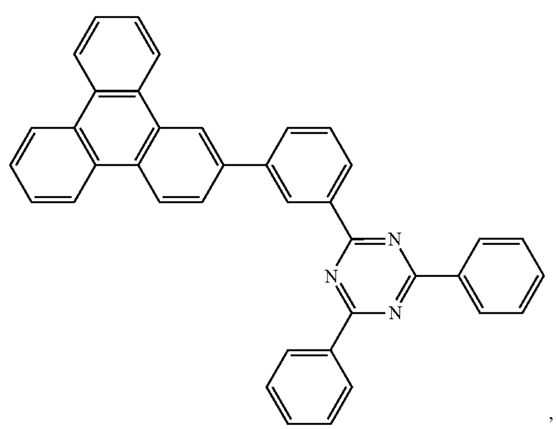
, -continued
2f-6
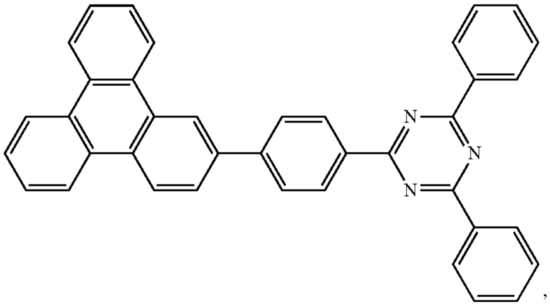
2f-7
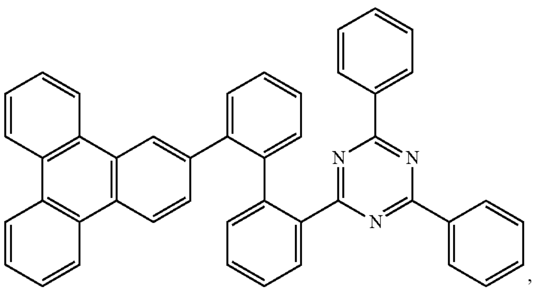
2f-8
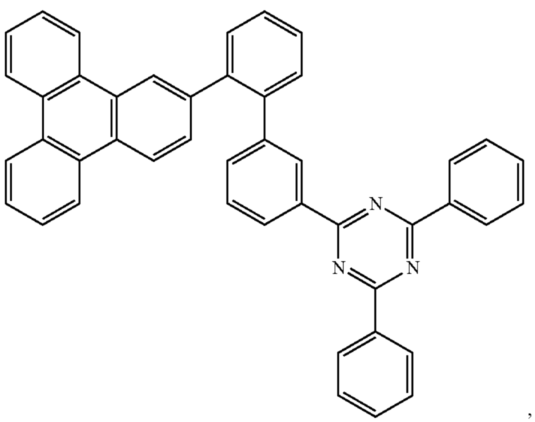
2f-9
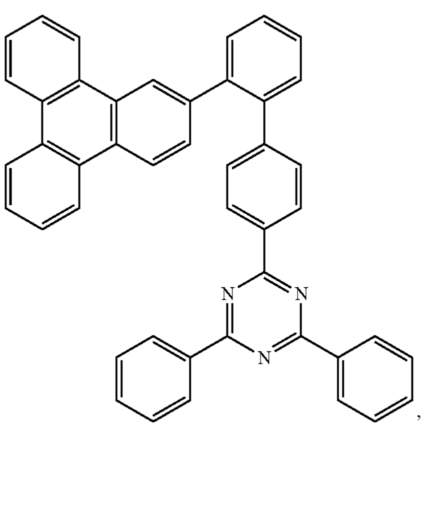
-continued
2f-10
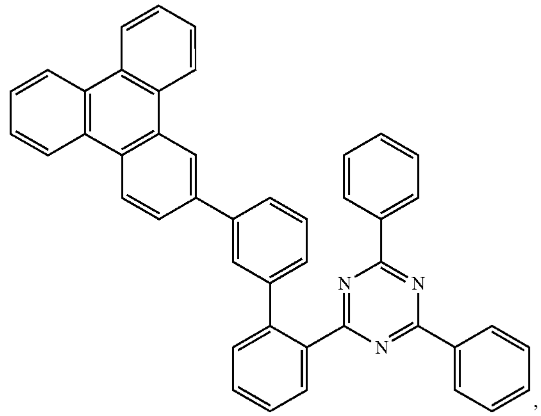
2f-11
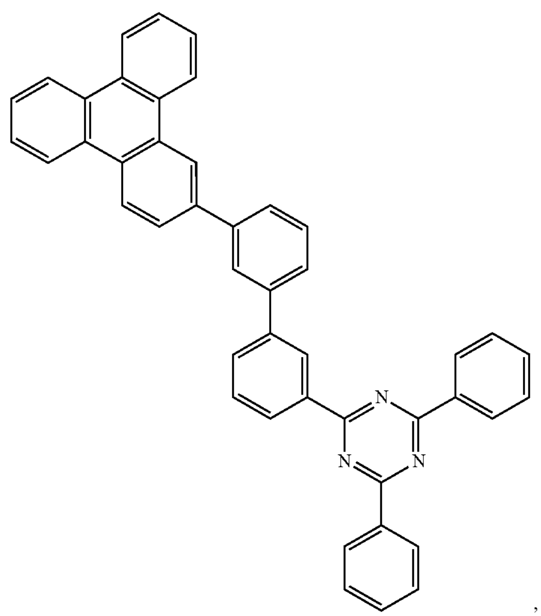

-continued
2f-12
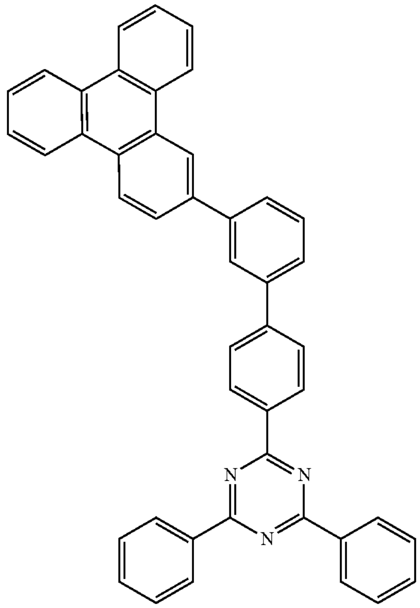
,
2f-13
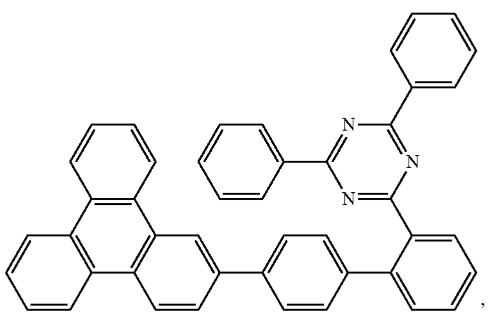
,
2f-14
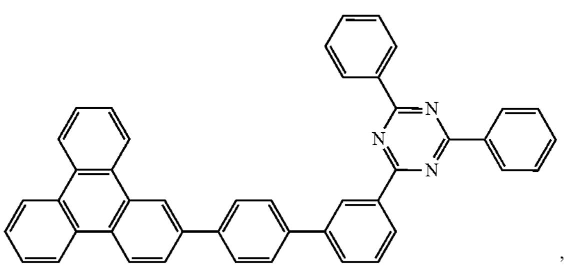
,
2f-15
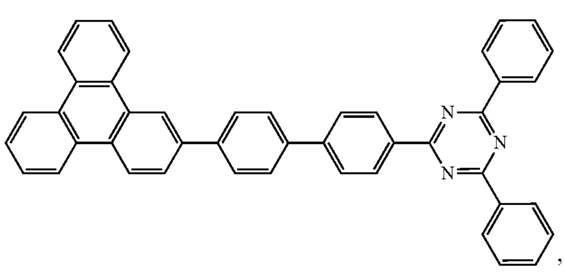
,
-continued
2f-16
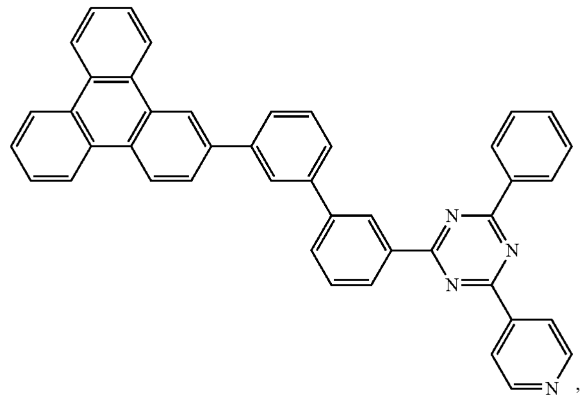
,
2f-17
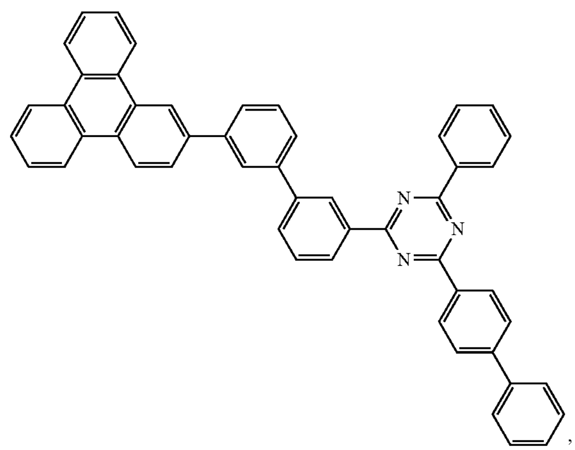
,
2f-18
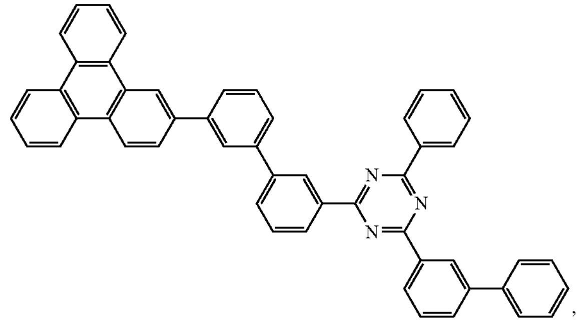
, -continued
2f-19
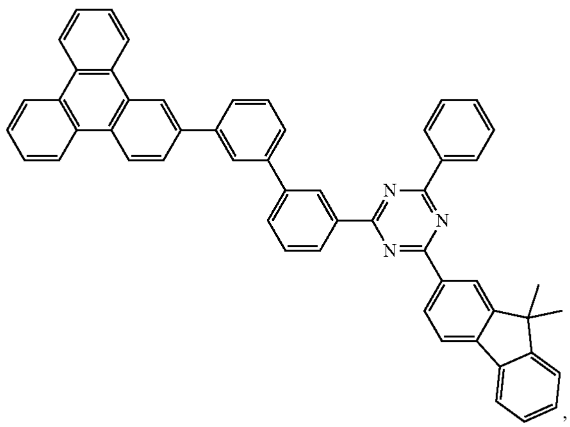,
2f-20
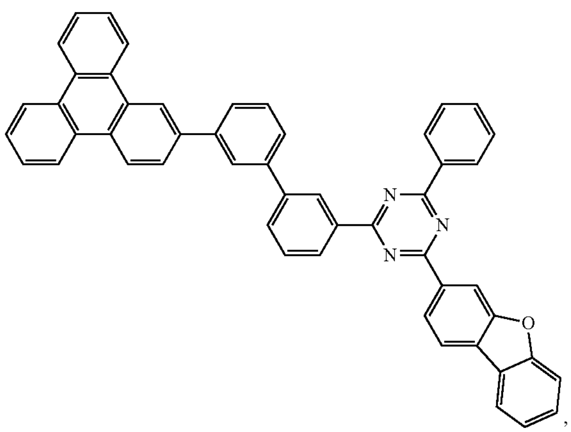,
2f-21
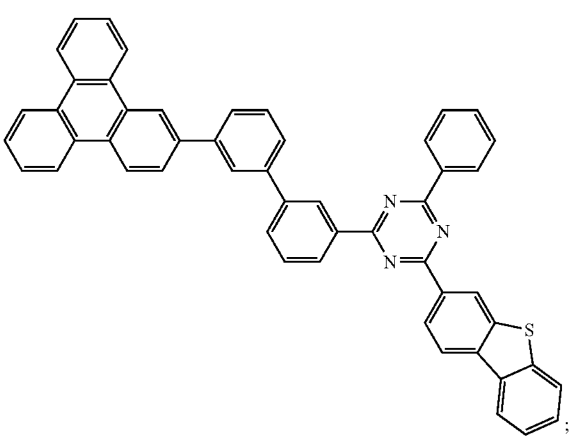;
-continued
2g-1
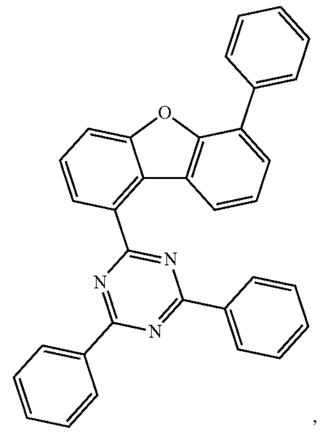,
2g-2
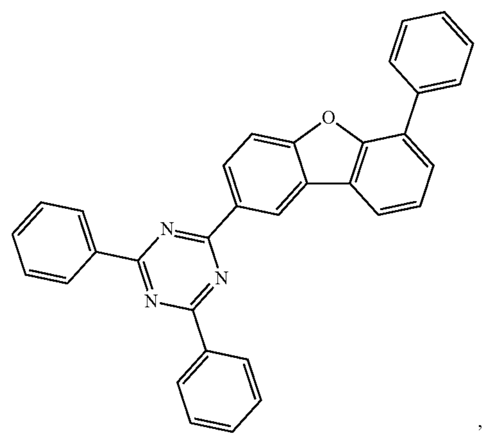,
2g-3
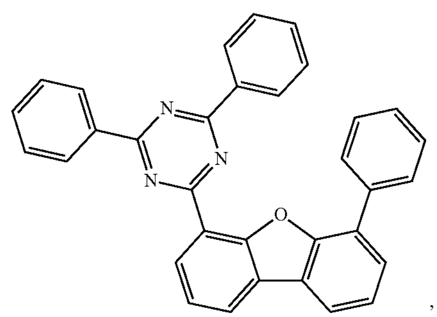,
2g-4
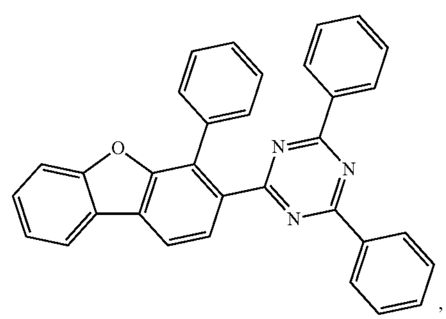, -continued
2g-5
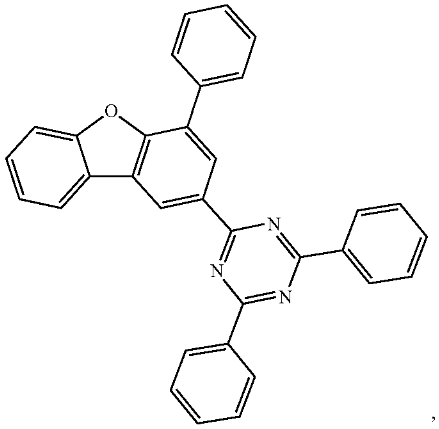
,
2g-6
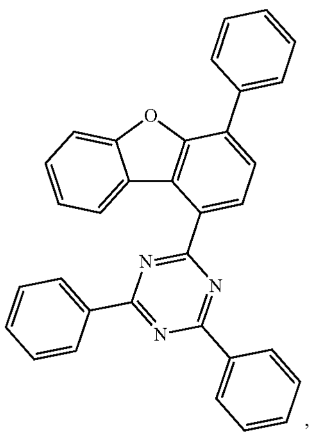
,
2g-7
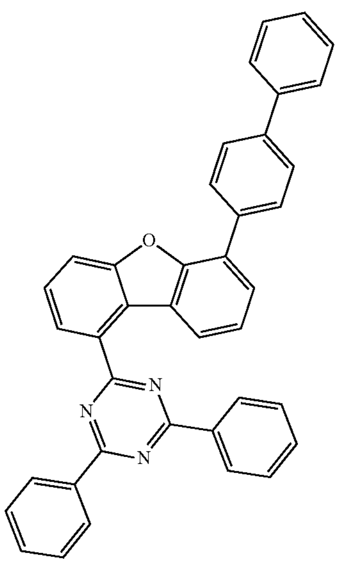
,
-continued
2g-8
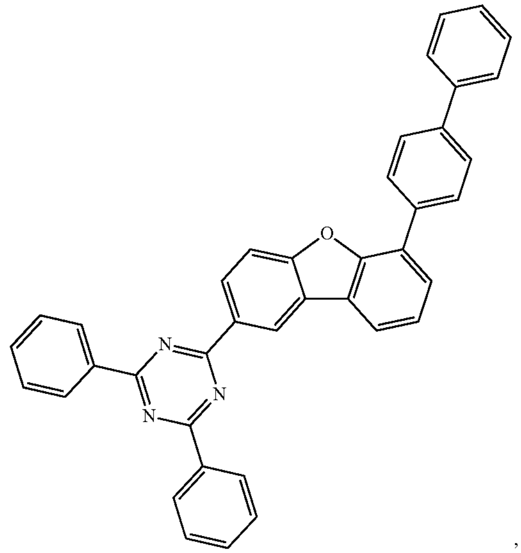
,
2g-9
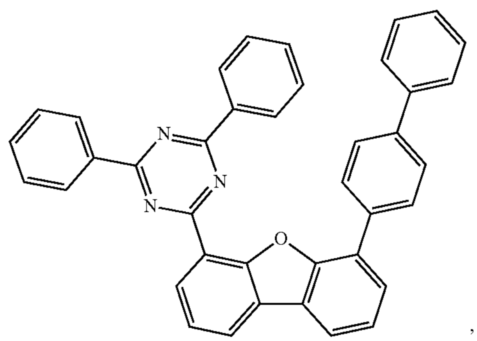
,
2g-10
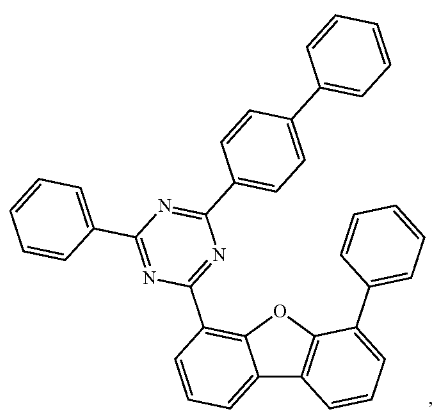
, -continued
2g-11
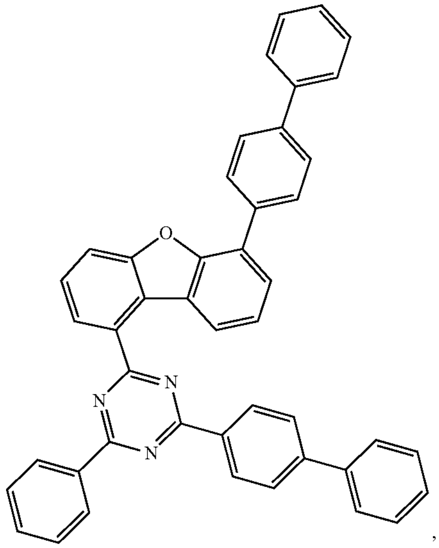
,
2g-12
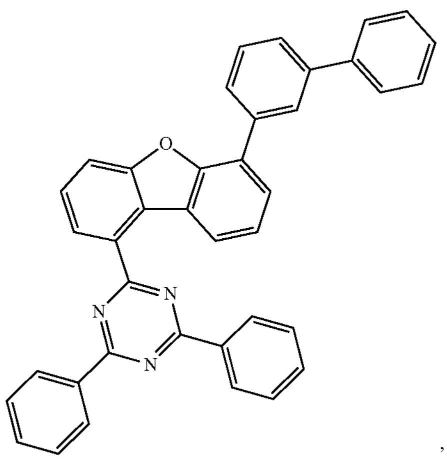
,
2g-13
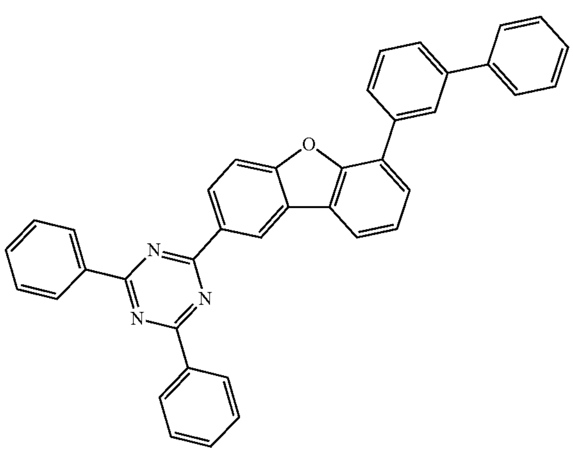
,
-continued
2g-14
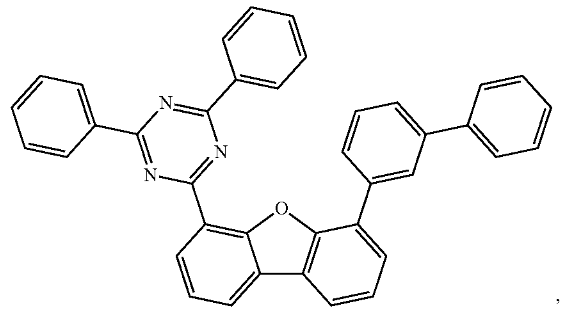
,
2g-15
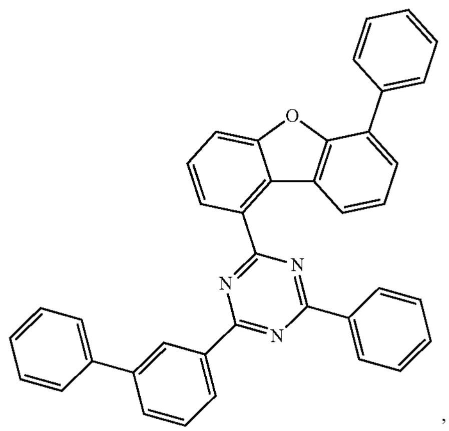
,
2g-16
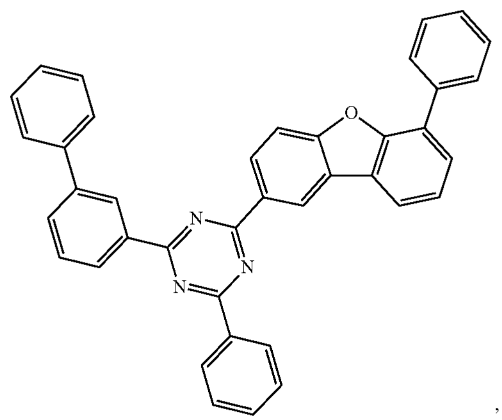
,
2g-17
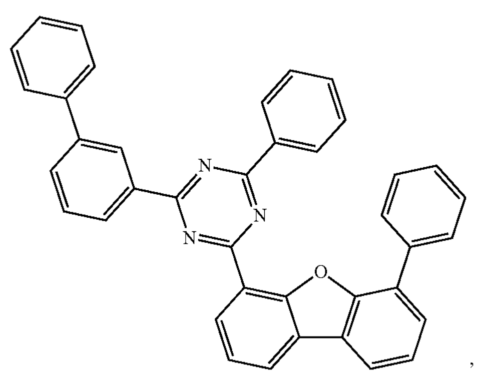
, -continued
2g-18
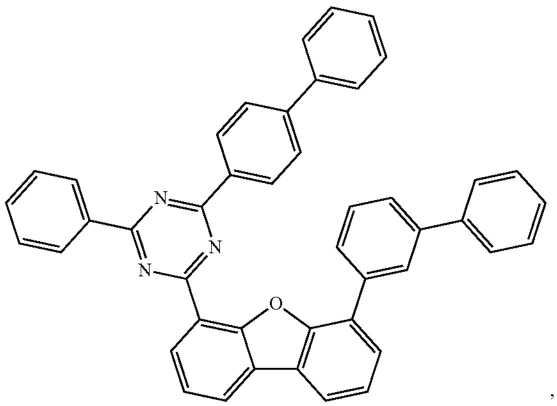
,
2g-19
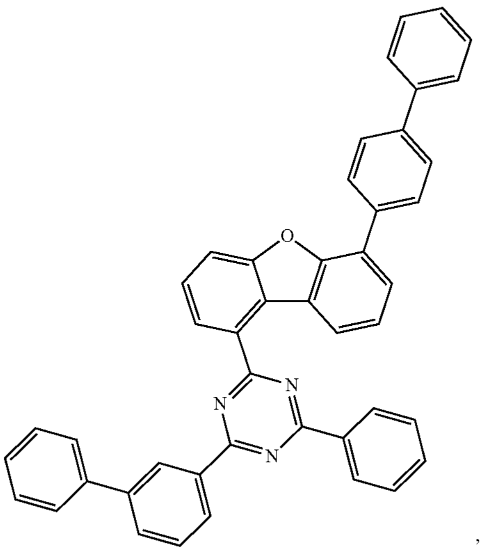
,
2g-20
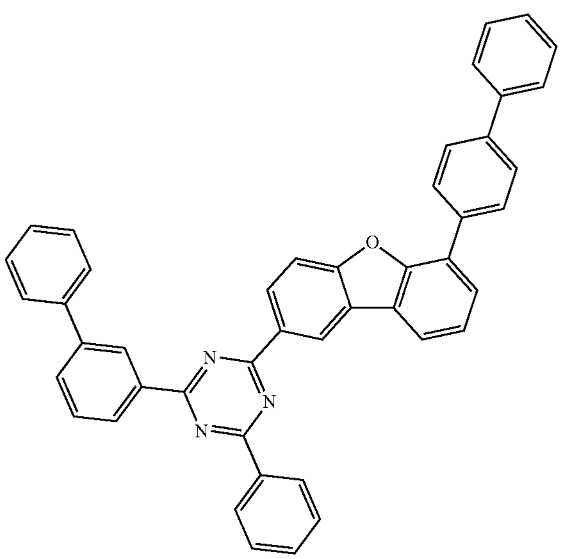
,
-continued
2g-21
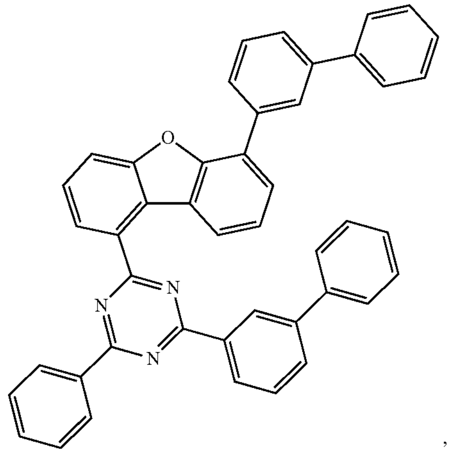
,
2g-22
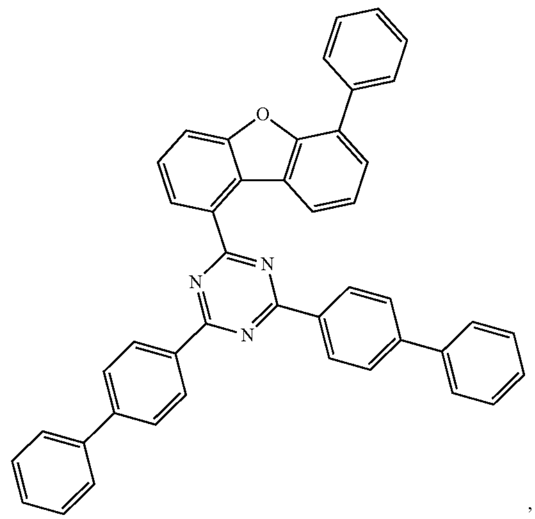
,
2g-23
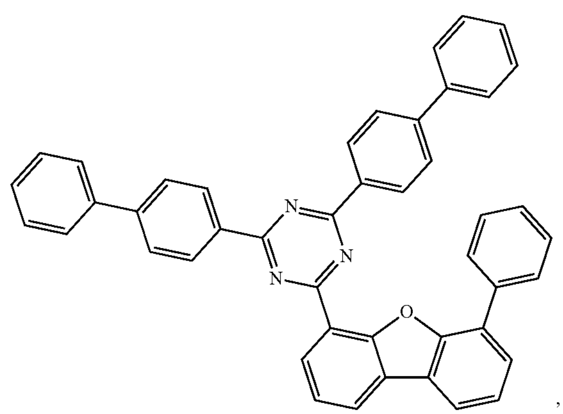
, -continued
2g-24
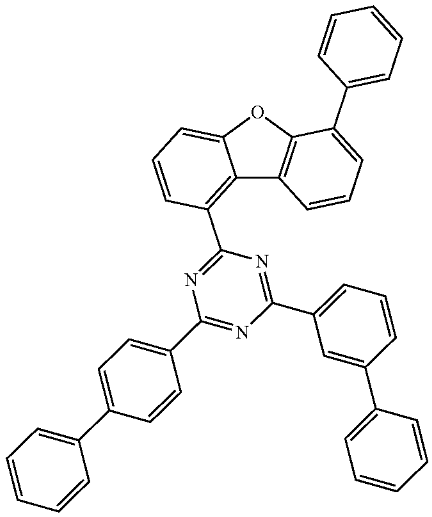
,
2g-25
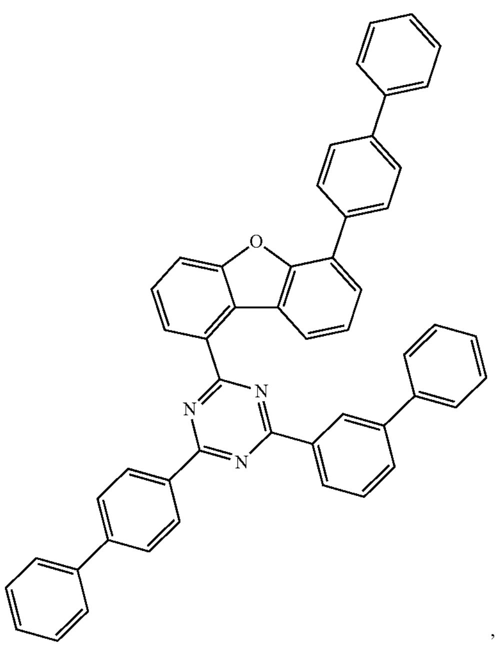
,
-continued
2g-26
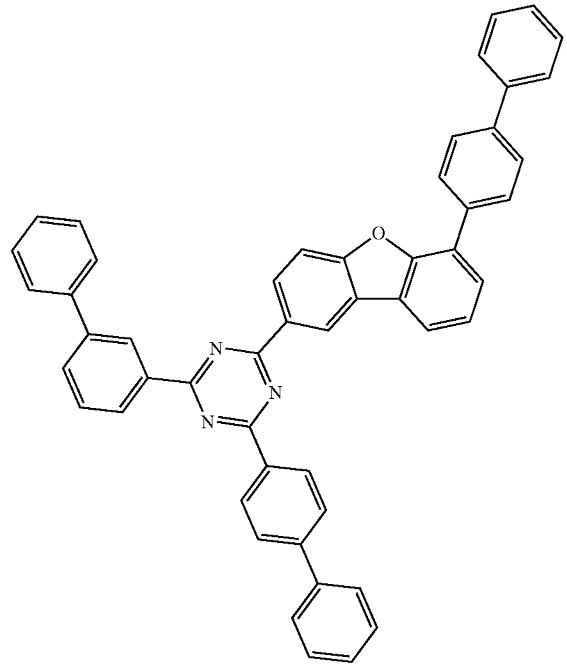
,
2g-27
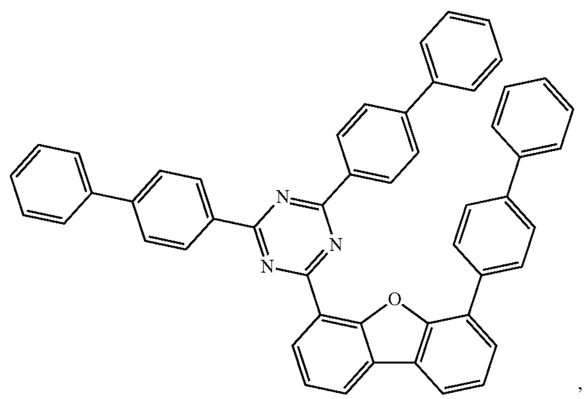
,
2g-28
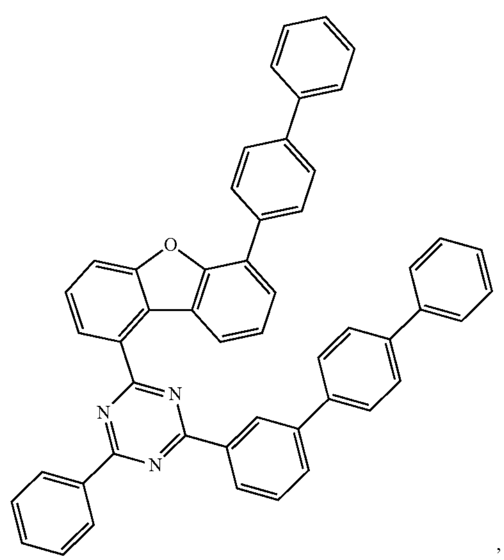
, -continued
2g-29
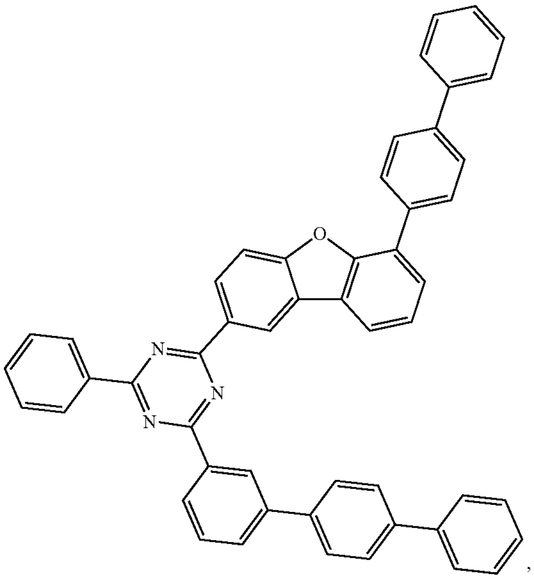
,
2g-30
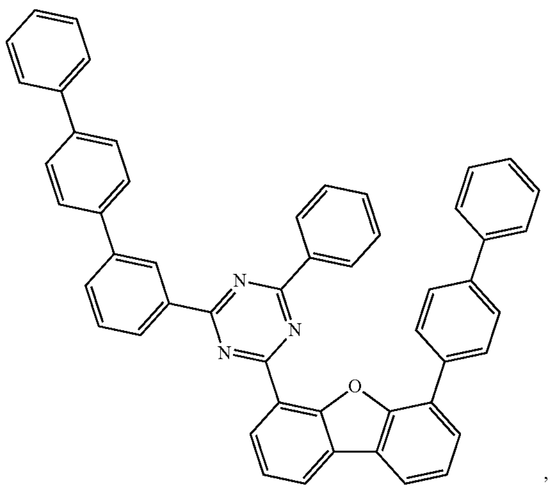
,
2g-31
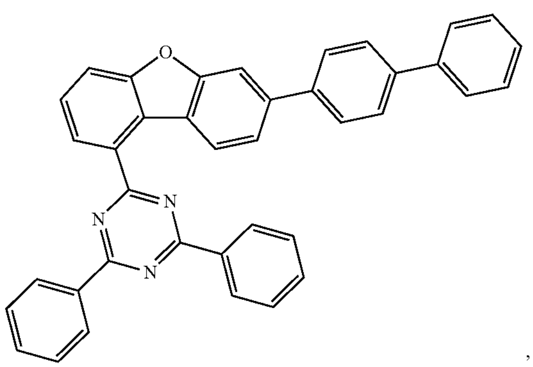
,
-continued
2g-32
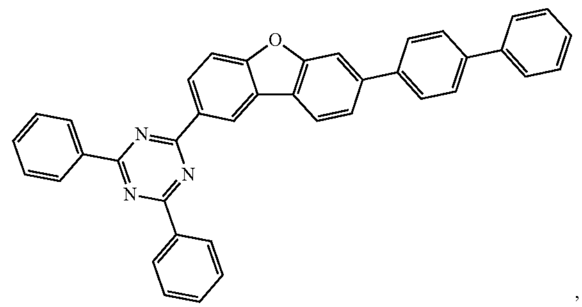
,
2g-33
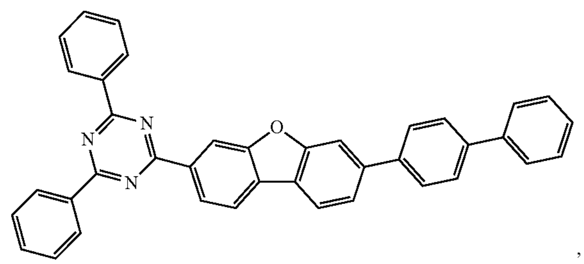
,
2g-34
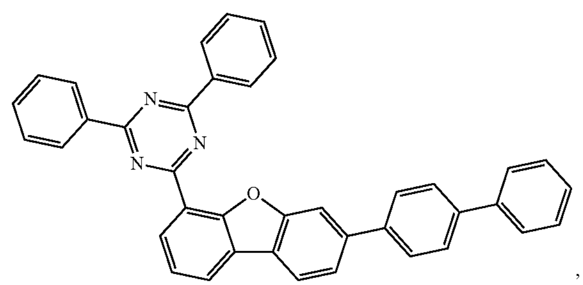
,
2g-35
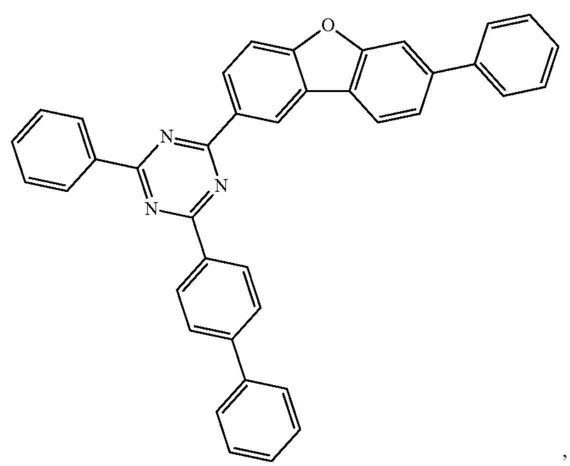
, -continued
2g-36
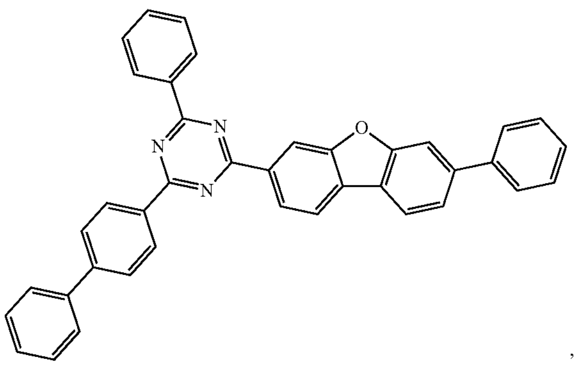
,
2g-37
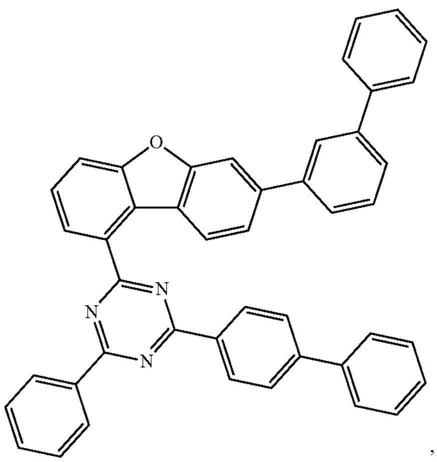
,
2g-38
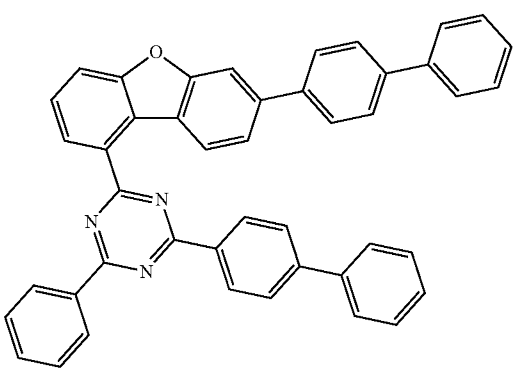
,
2g-39
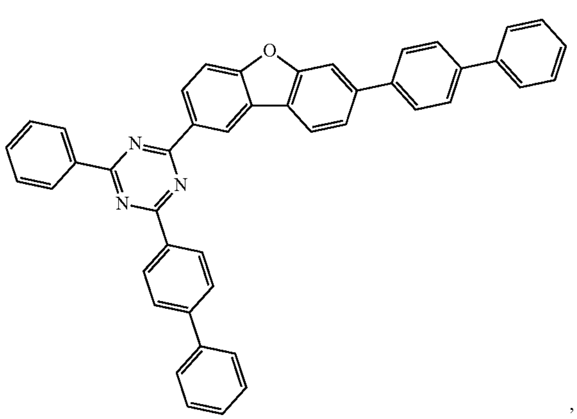
,
-continued
2g-40
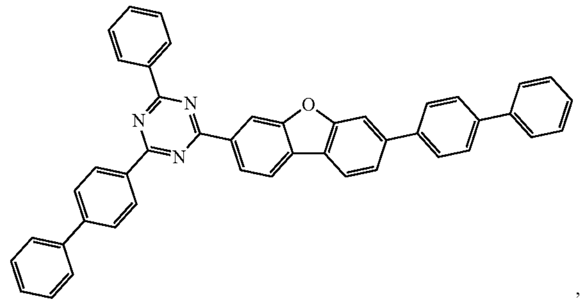
,
2g-41
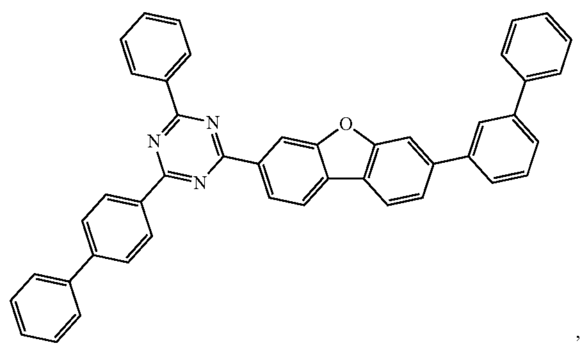
,
2g-42
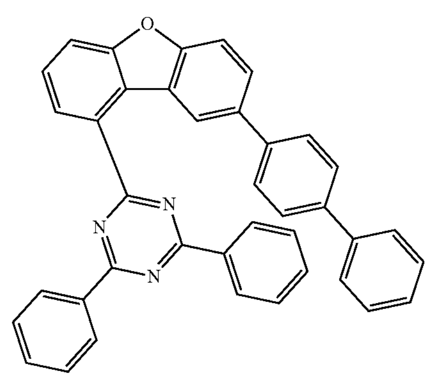
,
2g-43
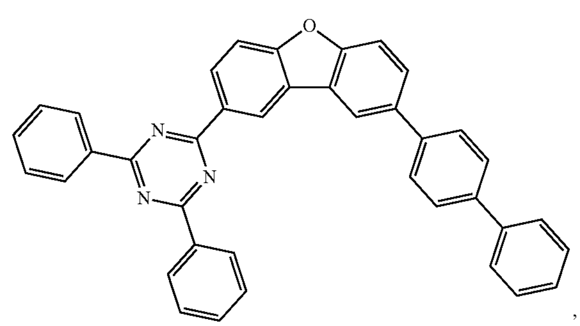
, -continued
2g-44
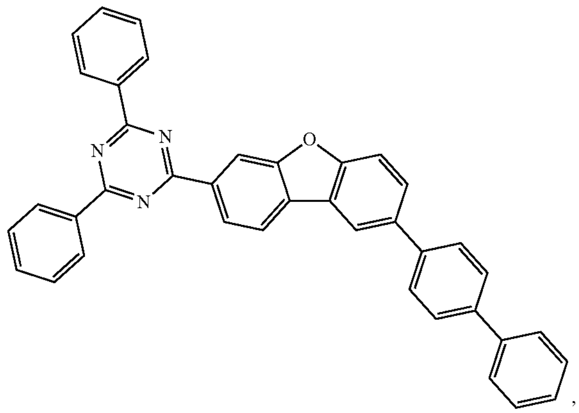
,
2g-45
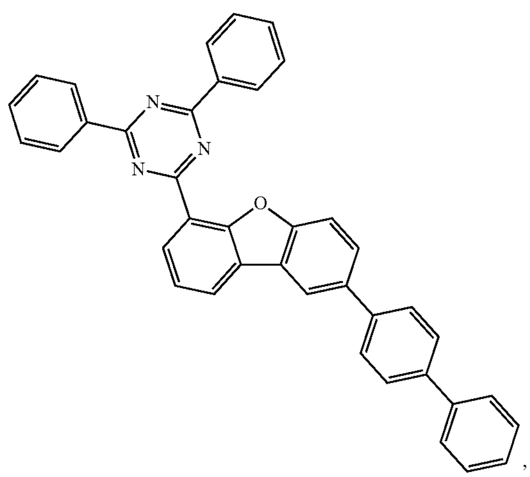
,
2g-46
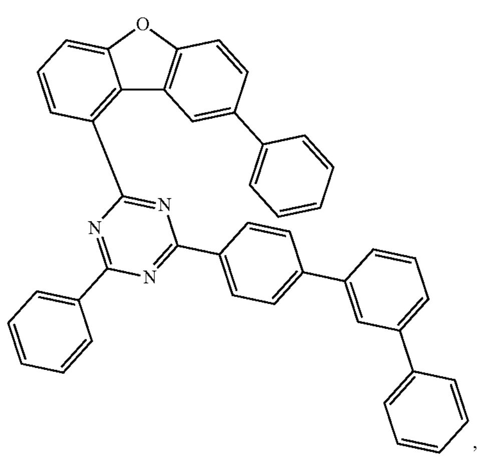
,
-continued
2g-47
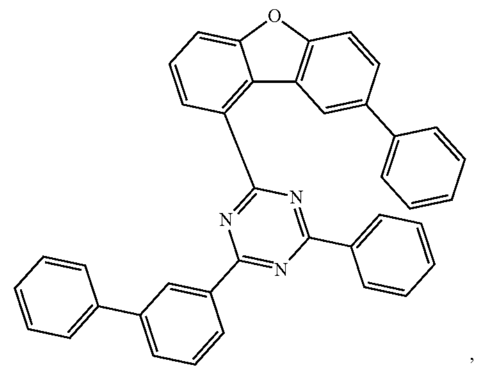
,
2g-48
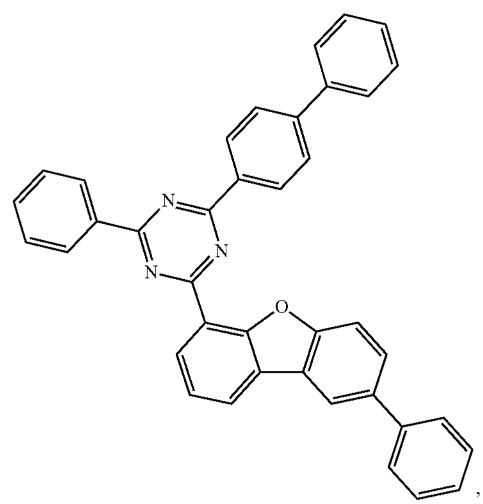
,
2g-49
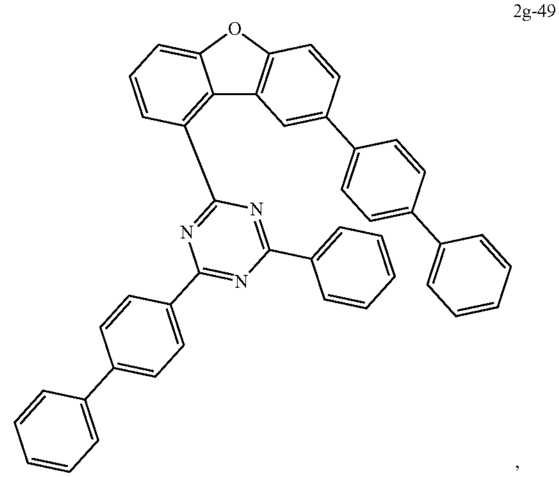
, -continued
2g-50
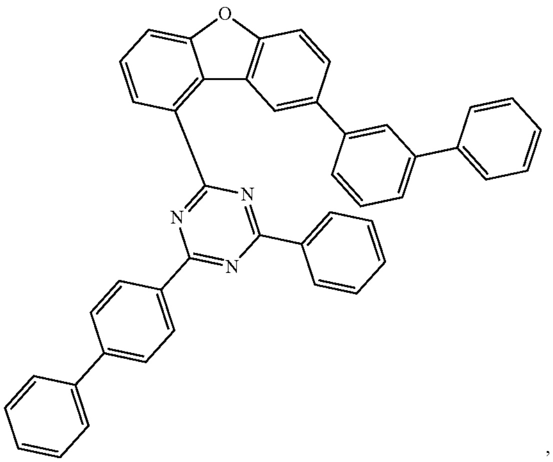
,
2g-51
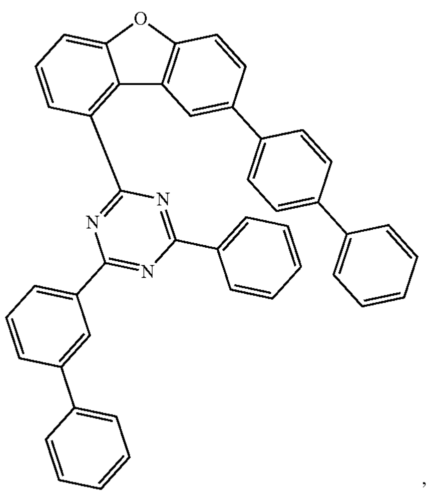
,
2g-52
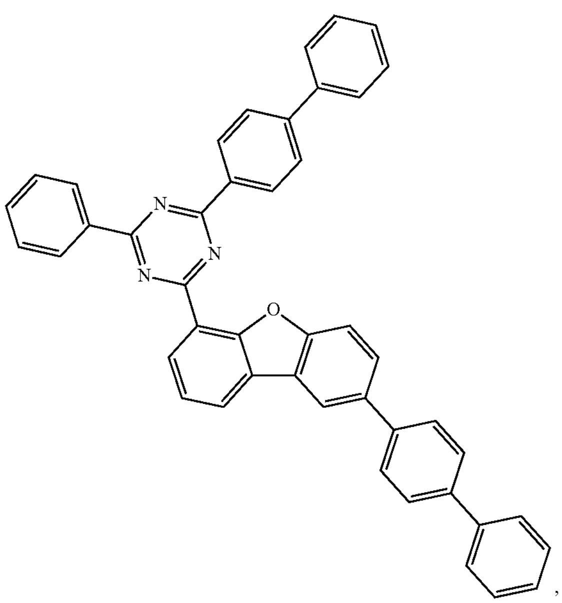
,
-continued
2g-53
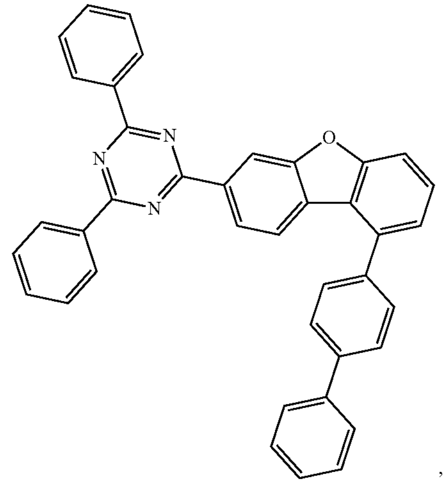
,
2g-54
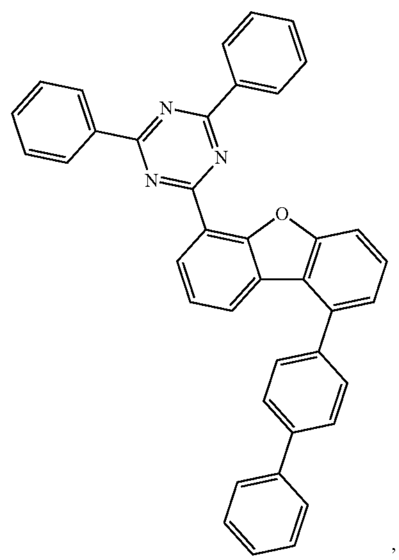
,
2g-55
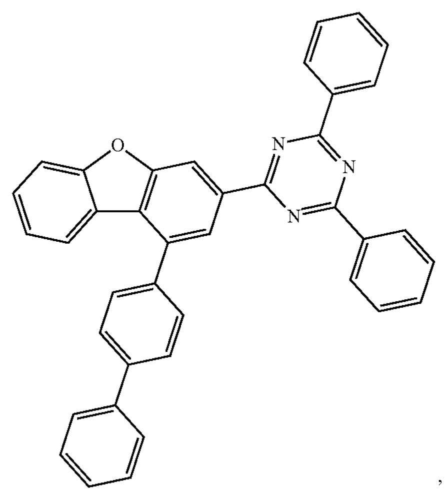
, -continued
2g-56
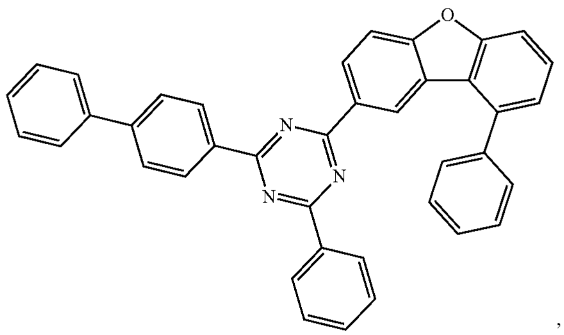
,
2g-57
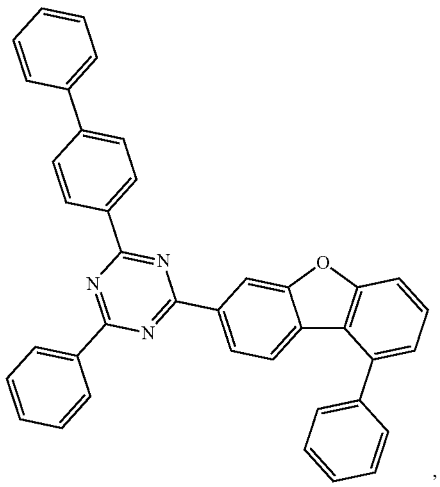
,
2g-58
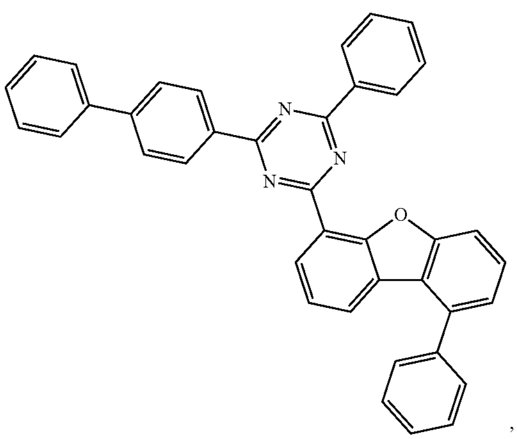
,
2g-59
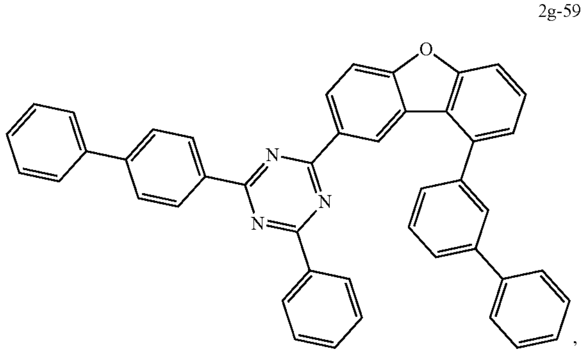
,
-continued
2g-60
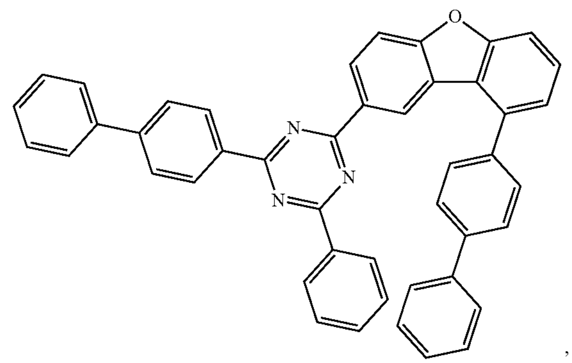
,
2g-61
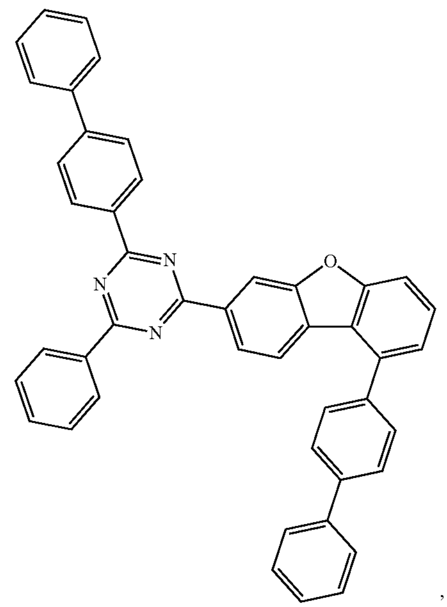
,
2g-62
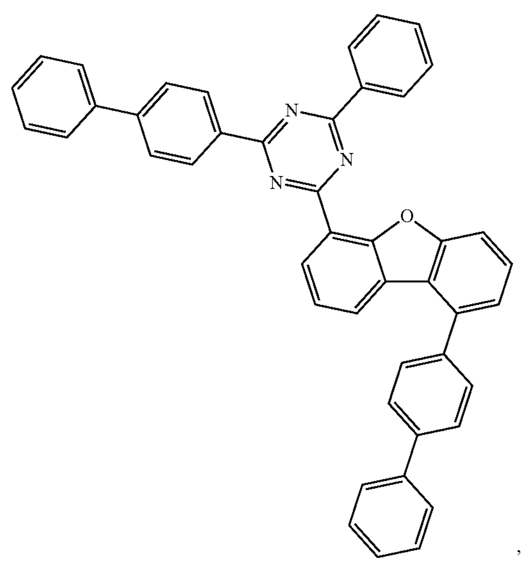
, -continued
2g-63
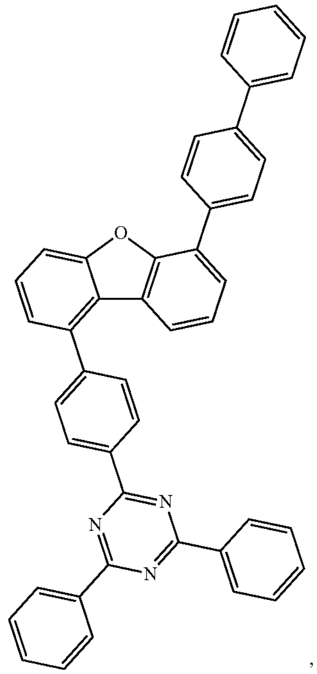
2g-64
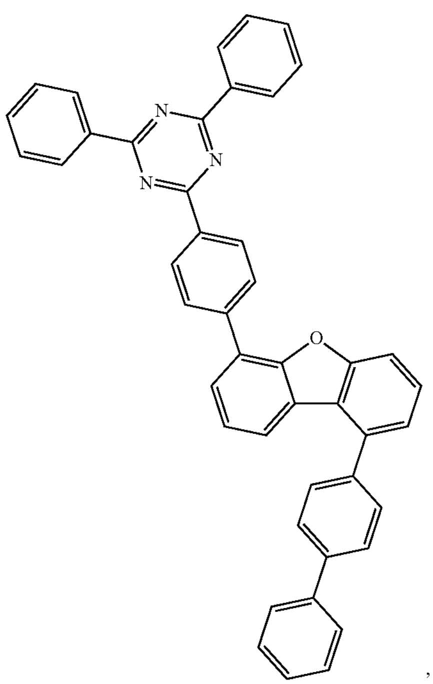
-continued
2g-65
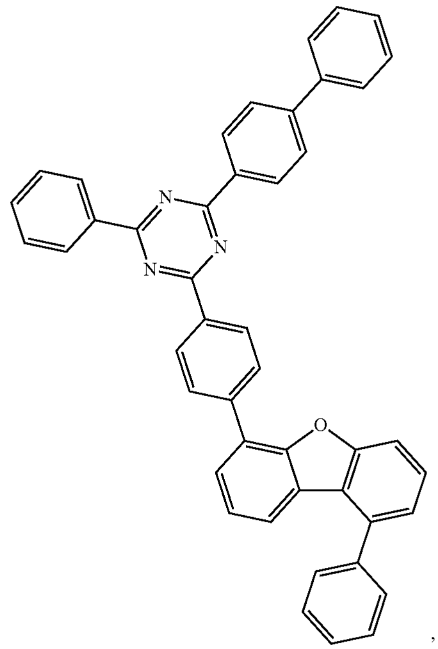
2g-66
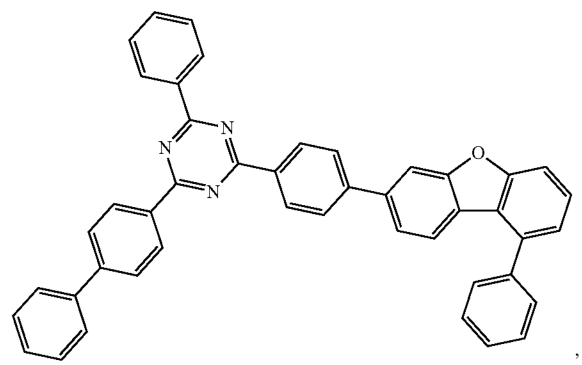
2g-67
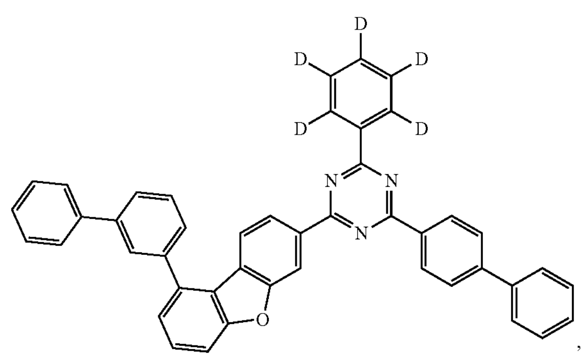

2g-68
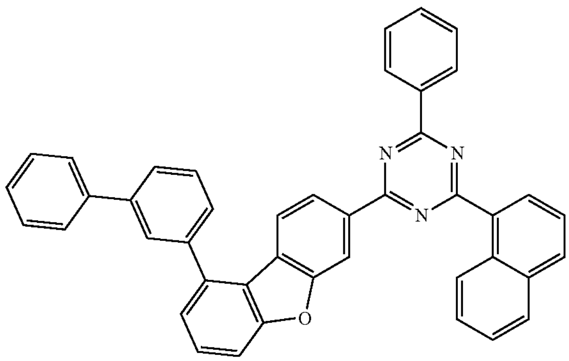
,
2g-69
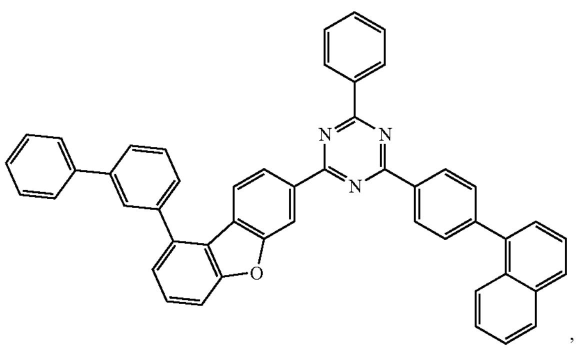
,
2g-70
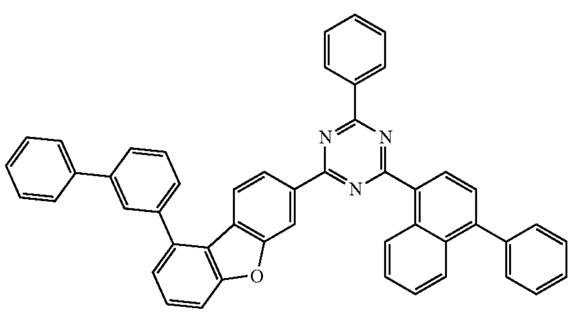
,
2g-71
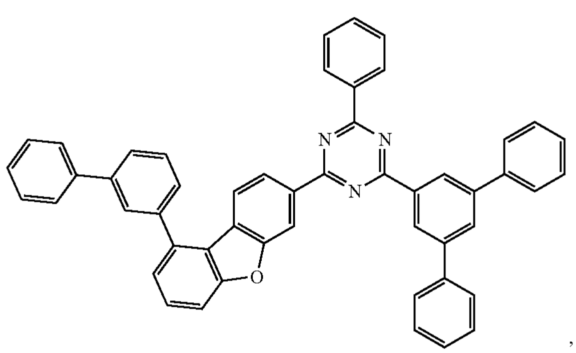
,
2g-72
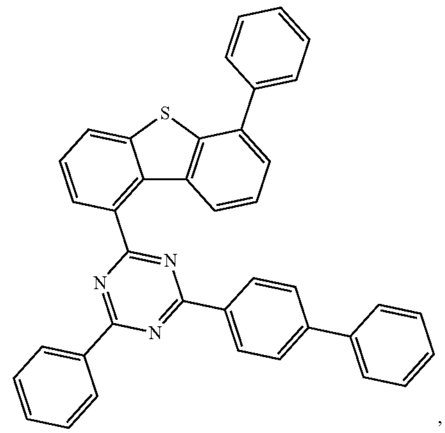
,
2g-73
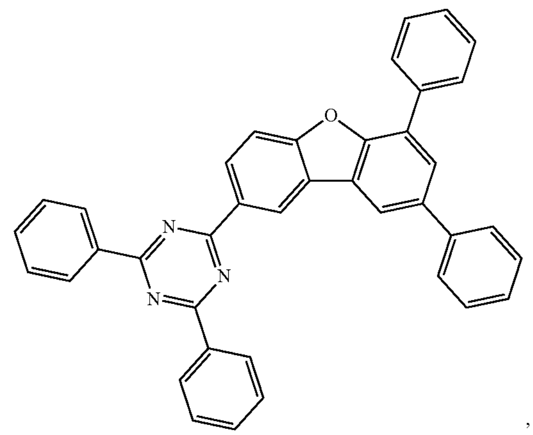
,
2g-74
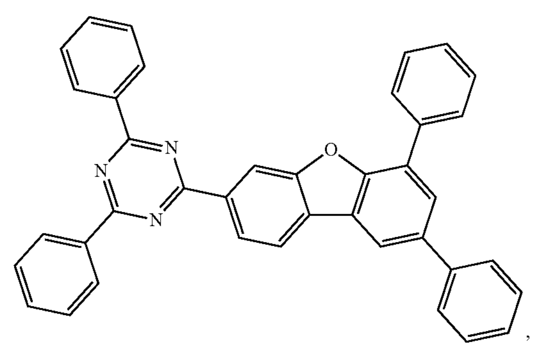
,
2g-75
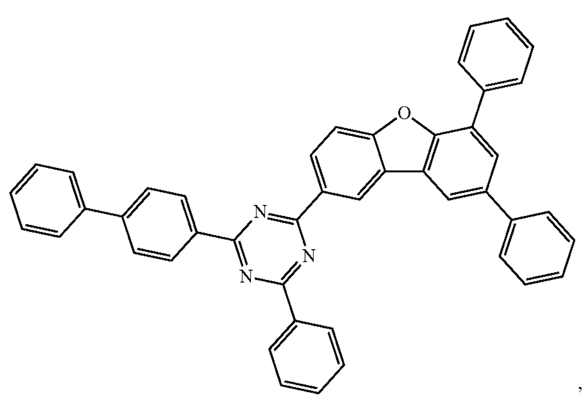
, -continued
2g-76
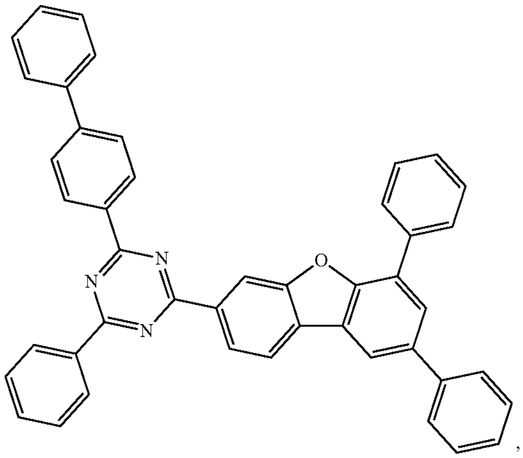
2g-77
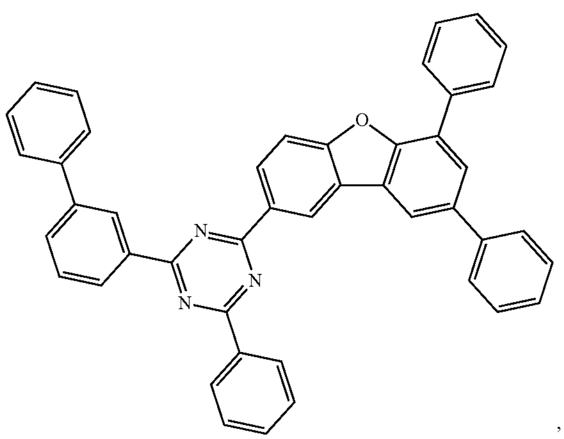
2g-78
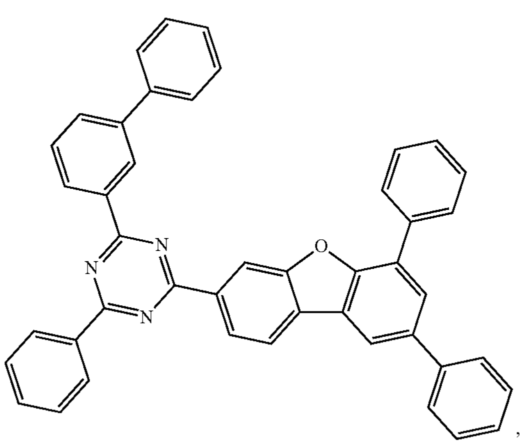
-continued
2g-79
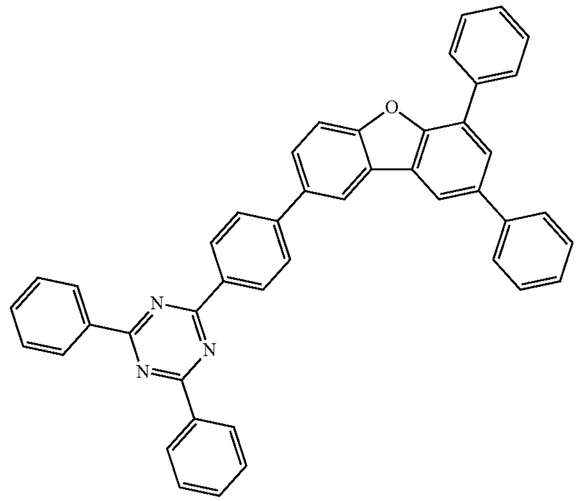
2g-80
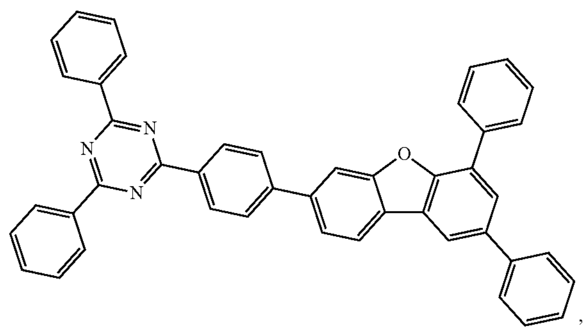
2g-81
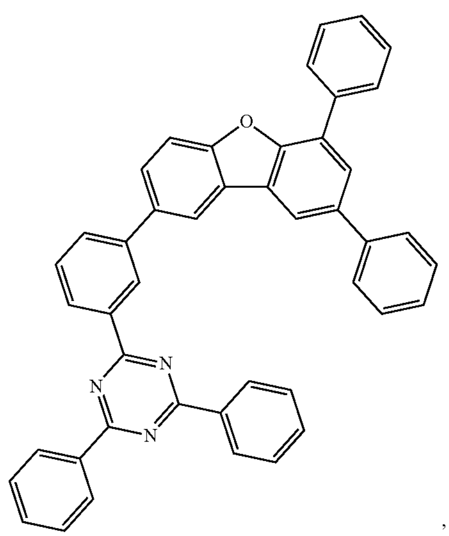
31. The electroluminescent device according to claim 17, wherein the second host compound is selected from the group consisting of the following structure:

X-1
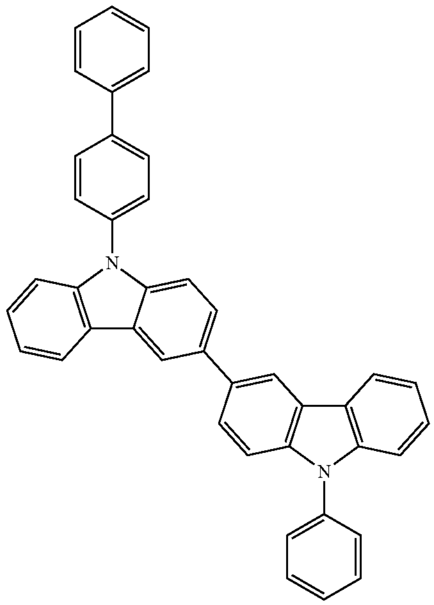
,
-continued
X-3
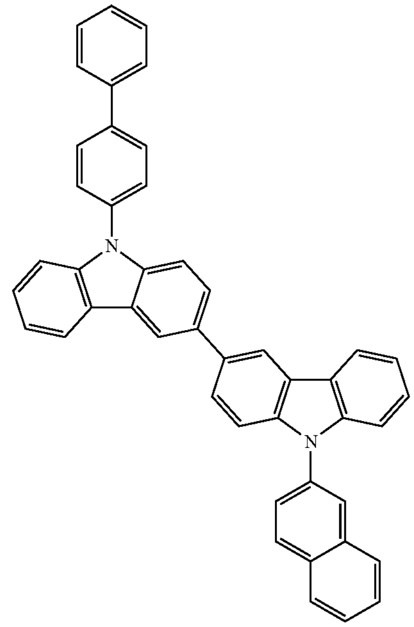
,
X-2
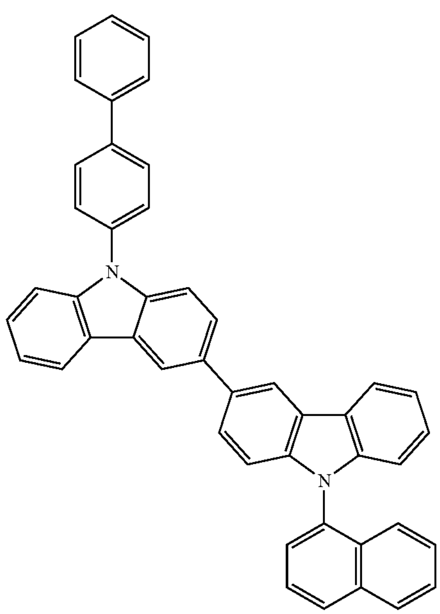
,
X-4
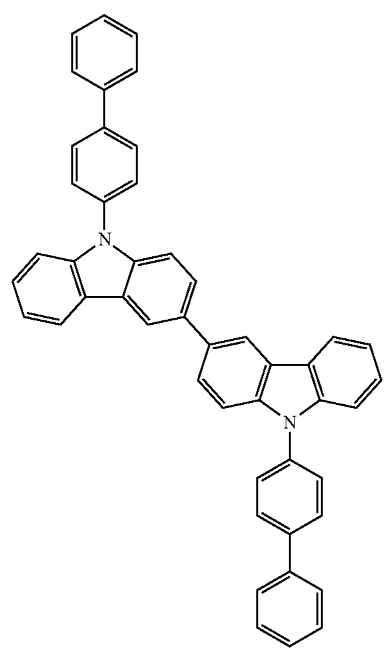
, -continued
X-5
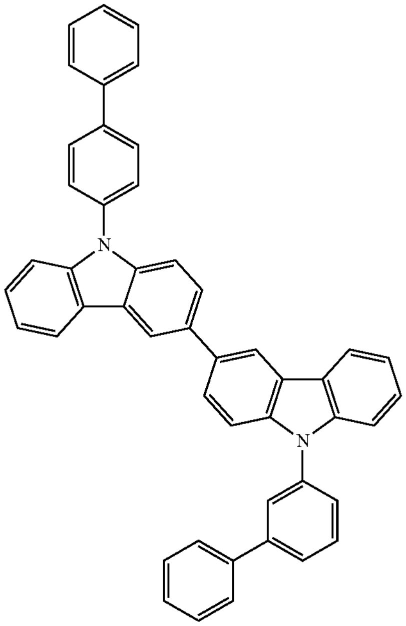
,
X-6
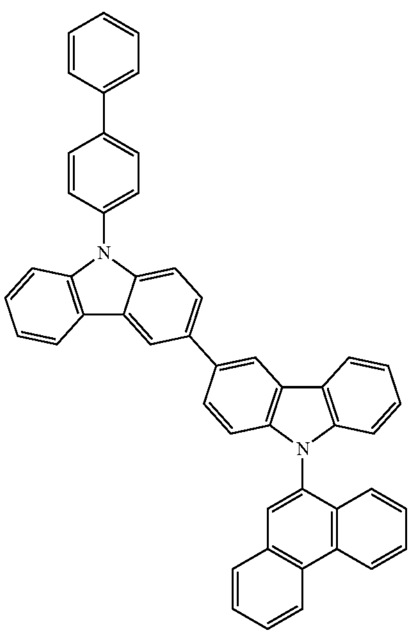
,
-continued
X-7
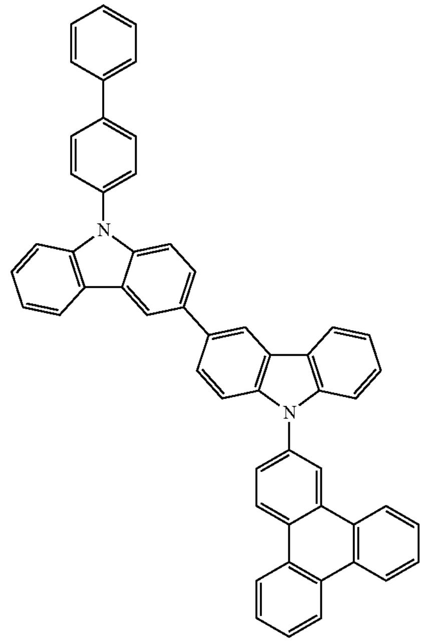
,
X-8
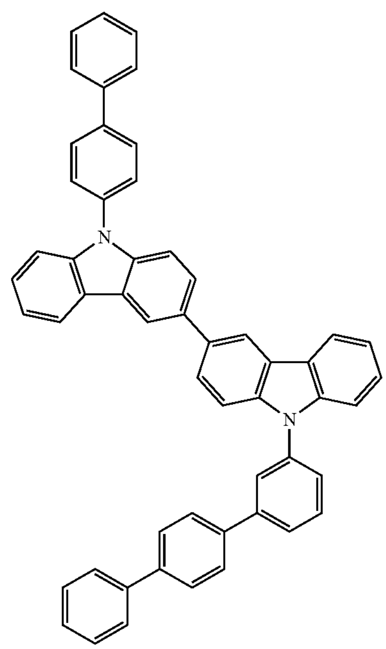
, -continued
X-9
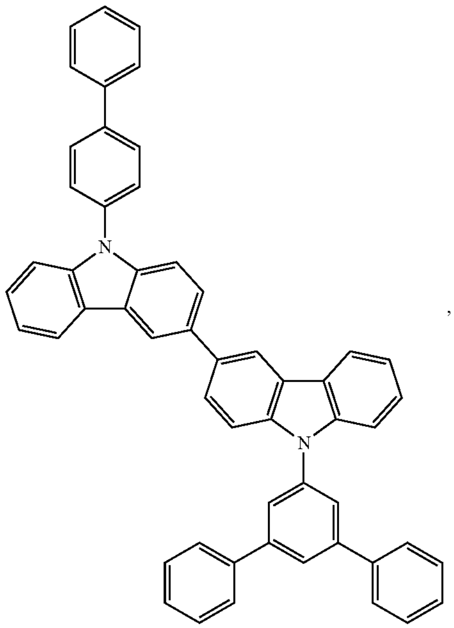
,
X-10
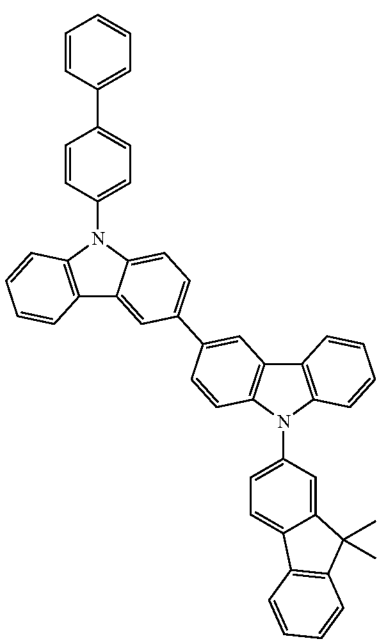
,
-continued
X-11
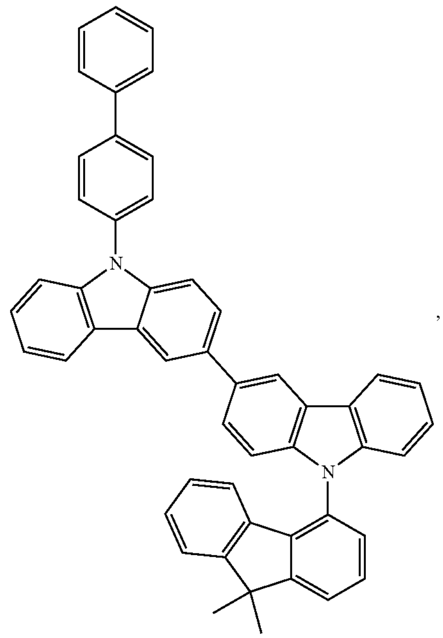
,
X-12
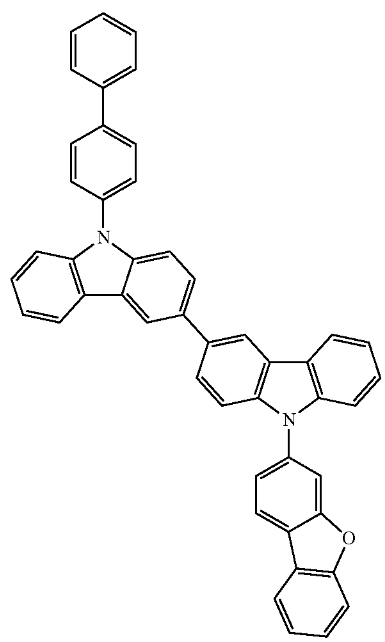
, -continued
X-13
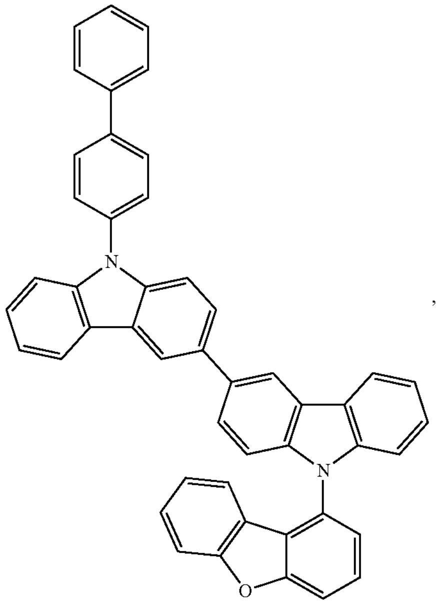
,
X-14
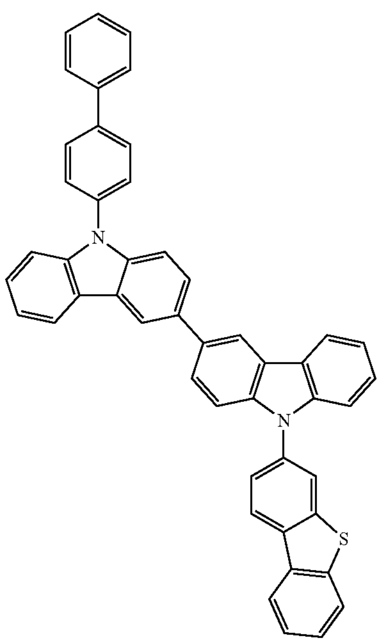
,
-continued
X-15
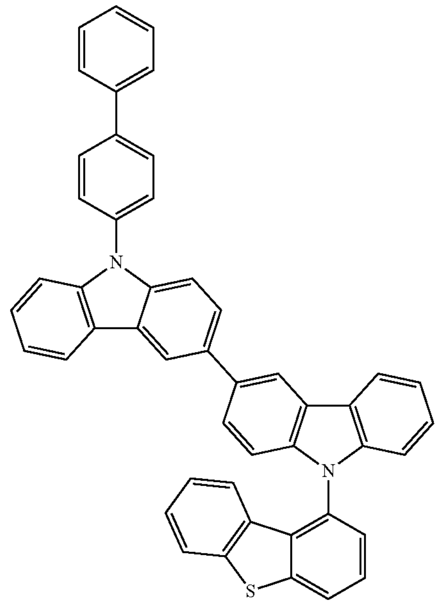
,
X-16
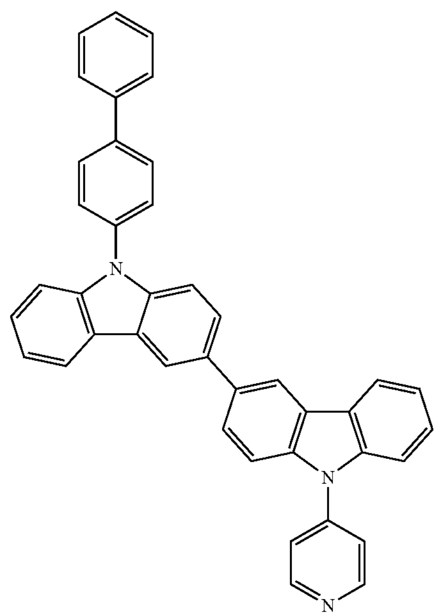
, -continued
X-17
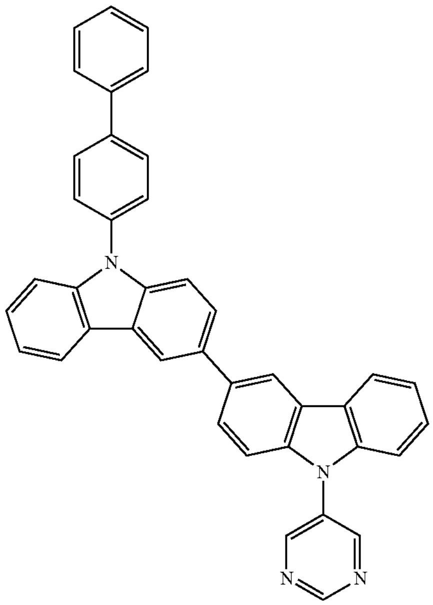
,
X-18
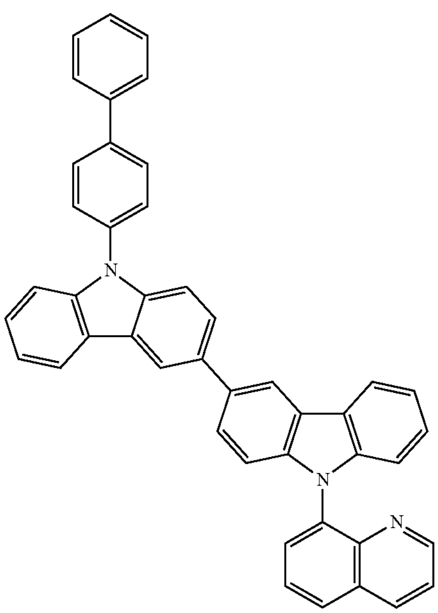
,
-continued
X-19
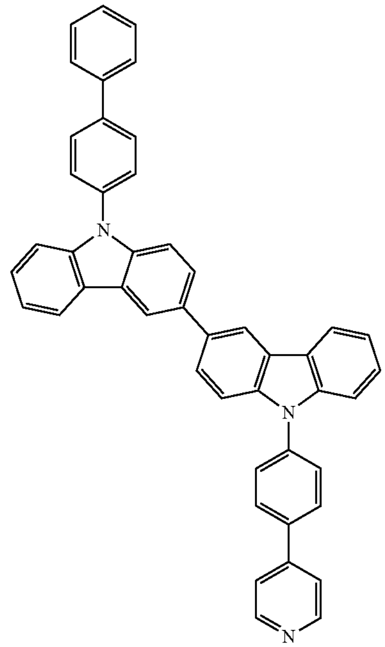
,
X-20
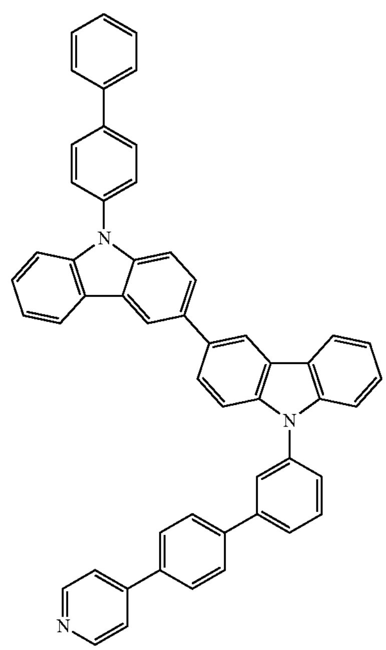
, -continued
X-21
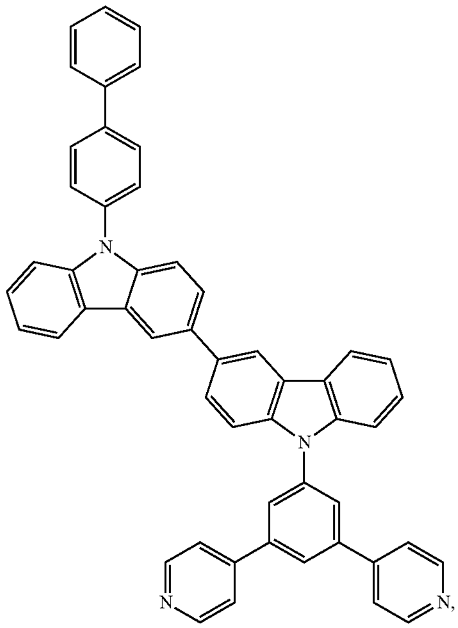
X-22
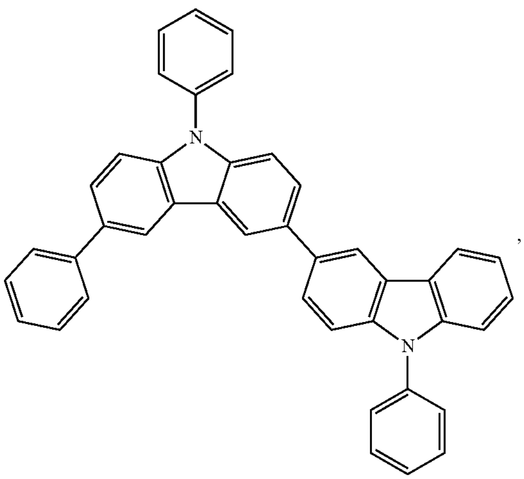
,
X-23
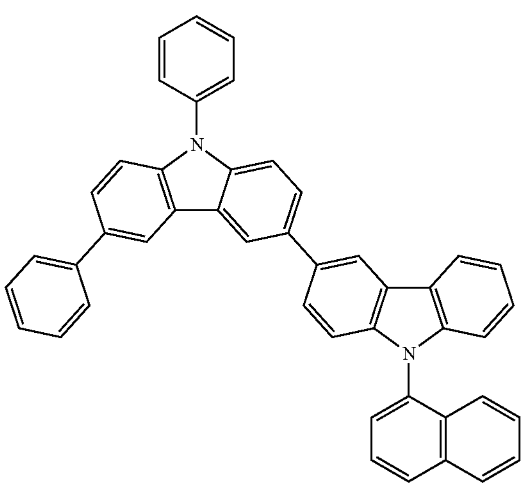
,
-continued
X-24
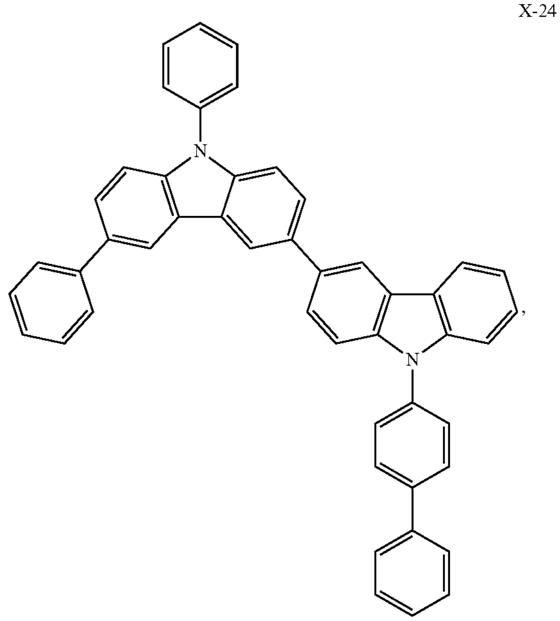
,
X-25
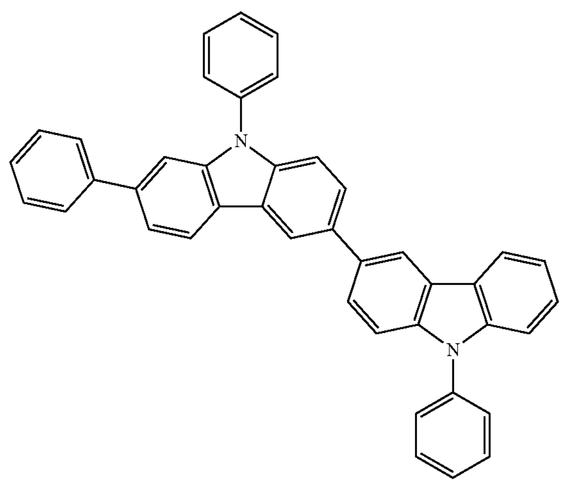
,
X-26
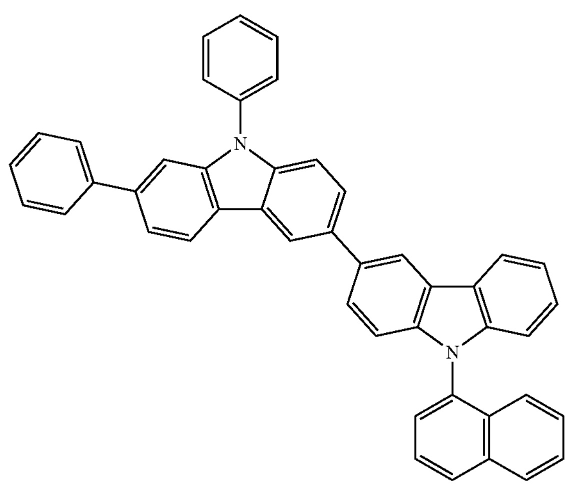
, -continued
X-27
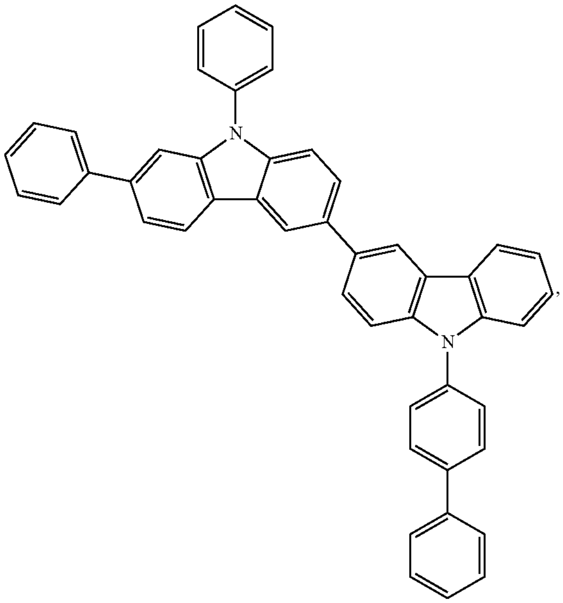
,
X-28
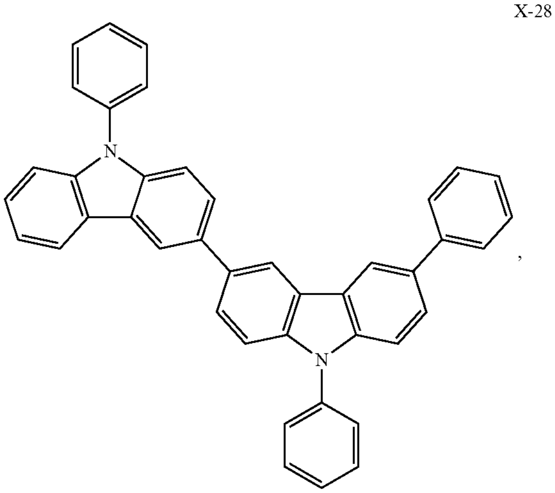
,
X-29
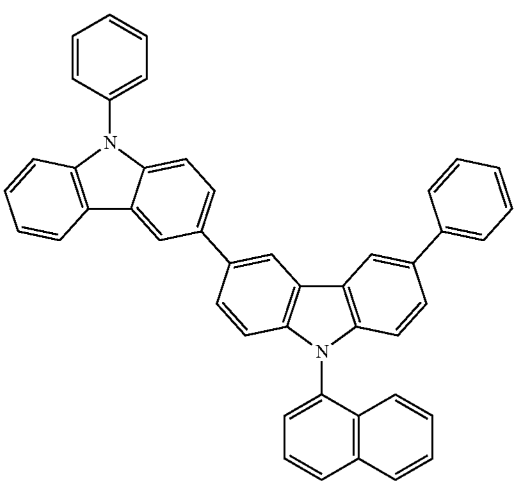
,
-continued
X-30
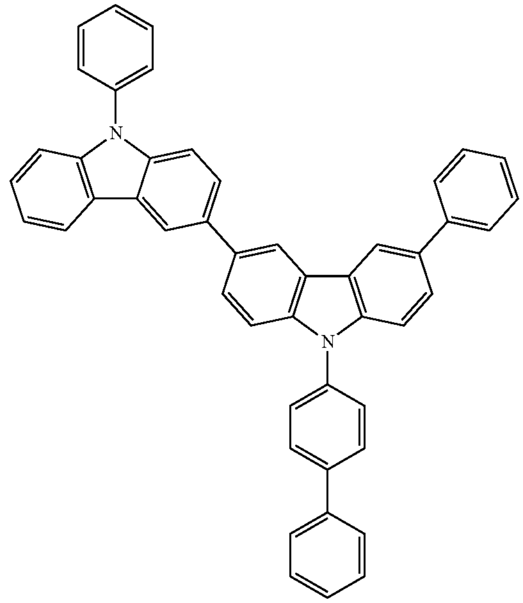
,
X-31
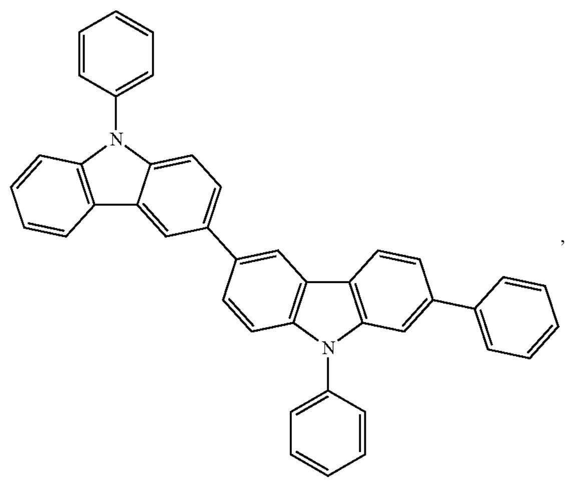
,
X-32
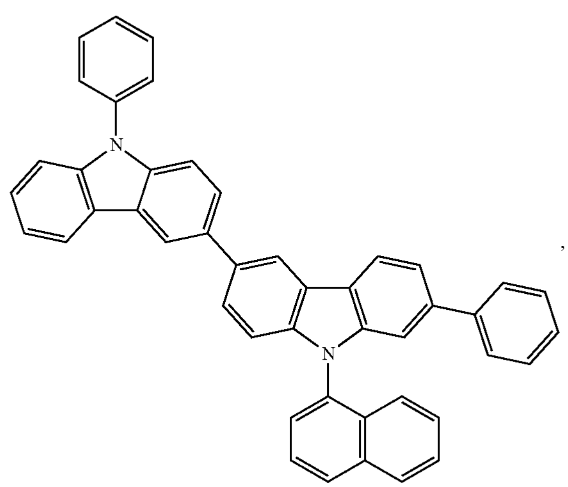
, -continued
X-33
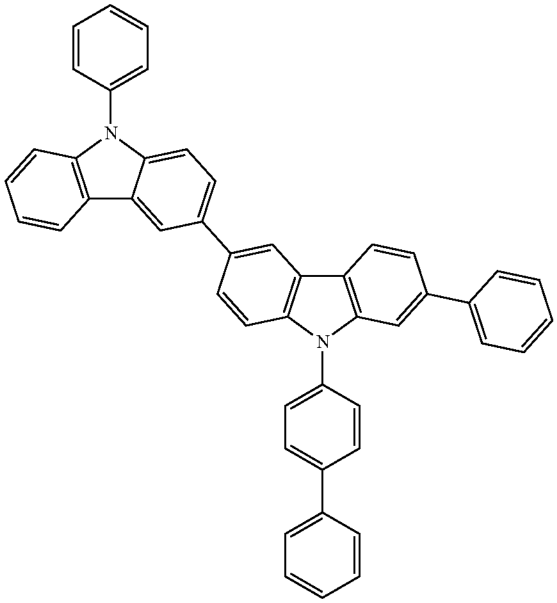
,
X-34
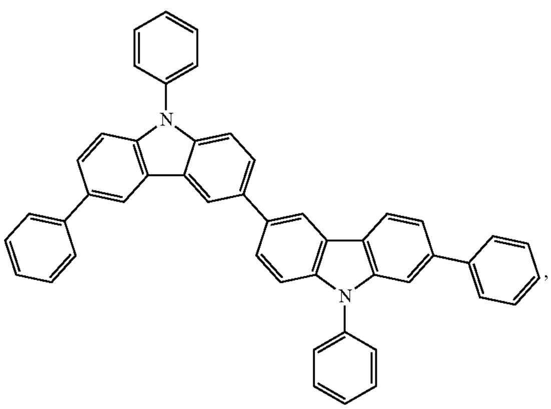
,
X-35
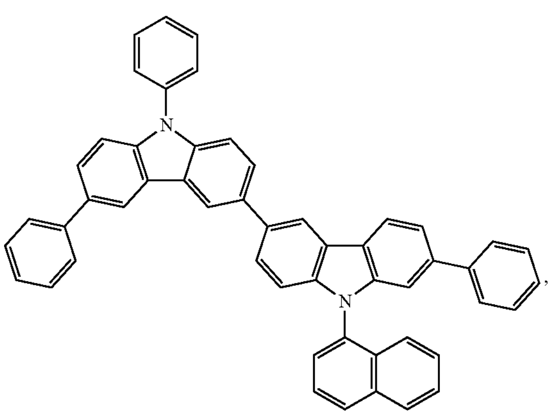
,
-continued
X-36
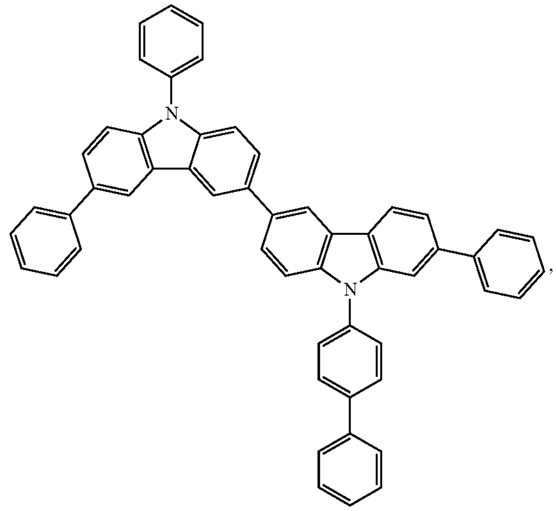
,
X-37
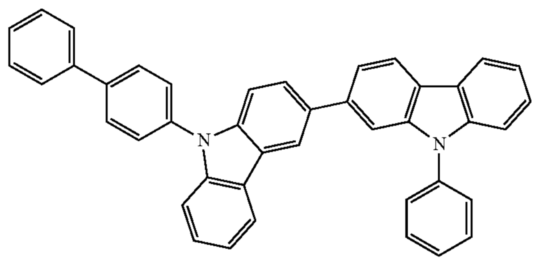
,
X-38
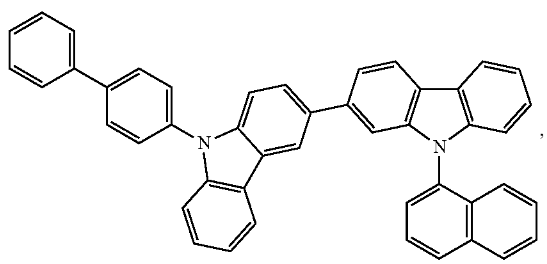
,
X-39
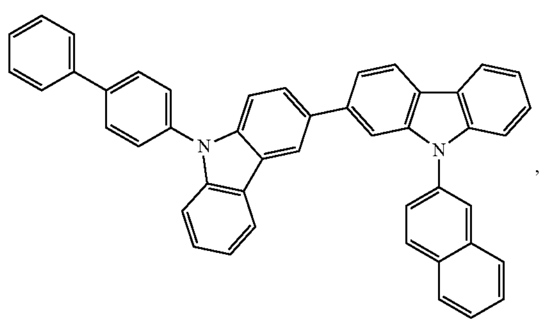
, -continued
X-40
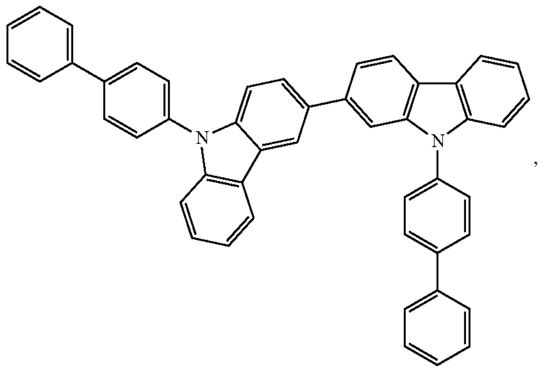
,
X-41
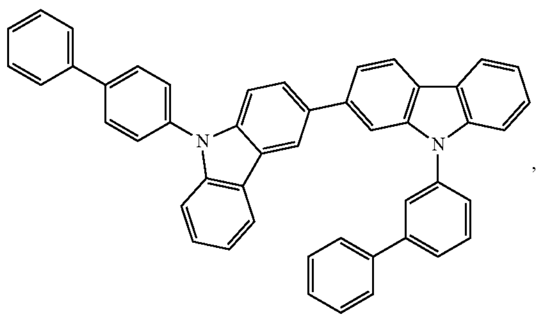
,
X-42
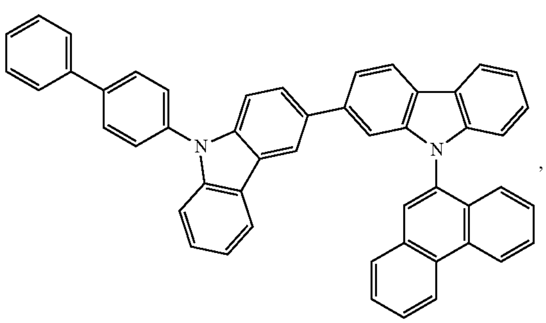
,
X-43
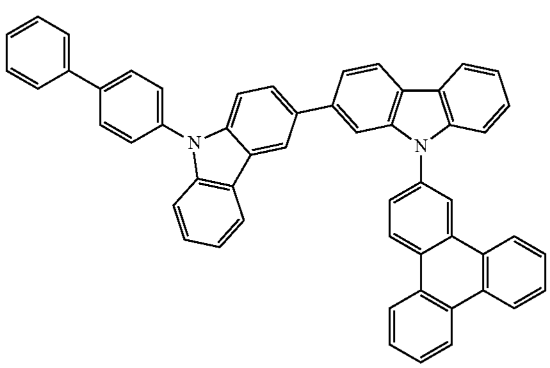
,
-continued
X-44
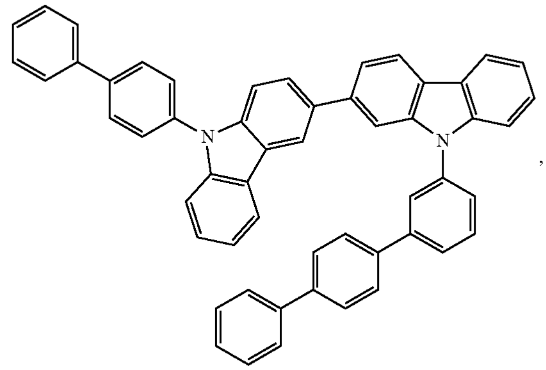
,
X-45
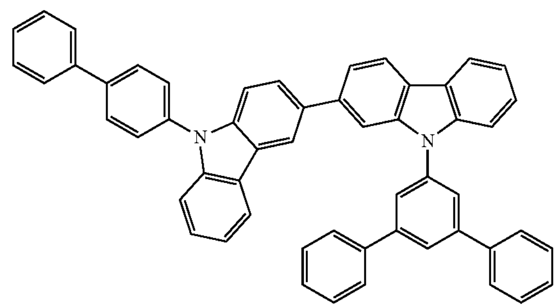
,
X-46
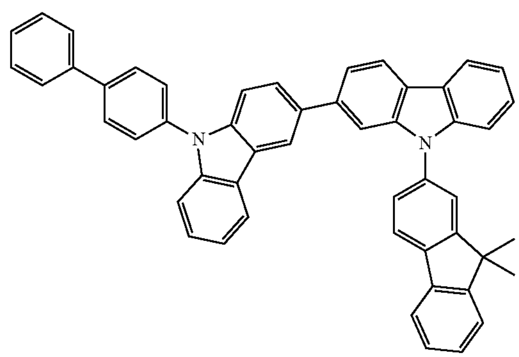
,
X-47
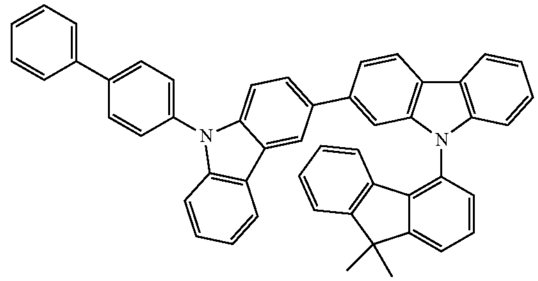
, -continued
X-48
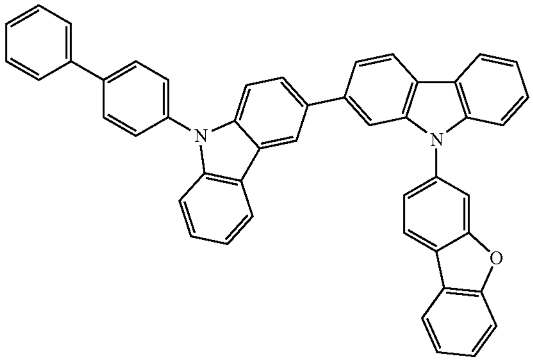
,
X-49
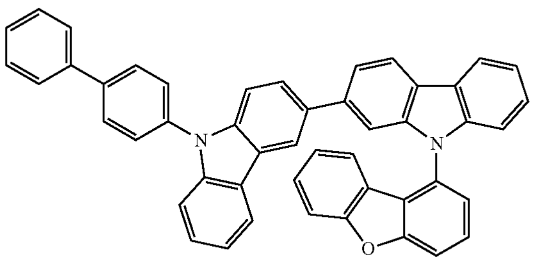
,
X-50
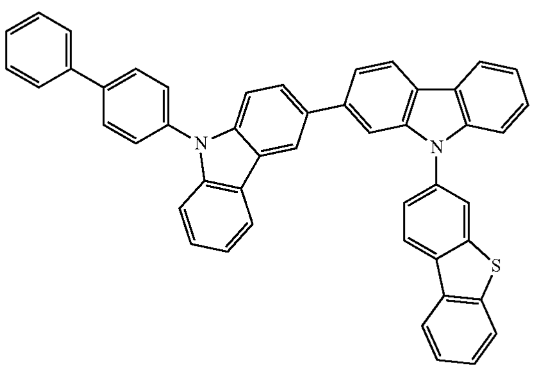
,
X-51
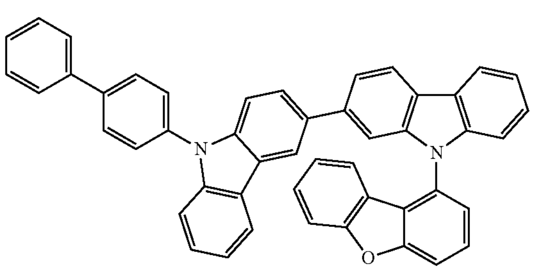
,
-continued
X-52
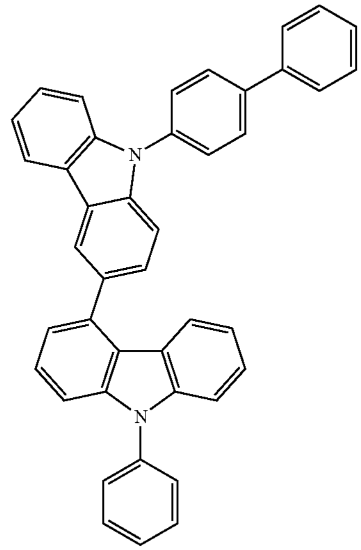
,
X-53
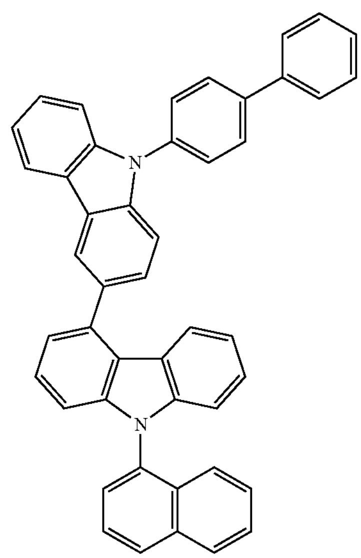
, -continued
X-54
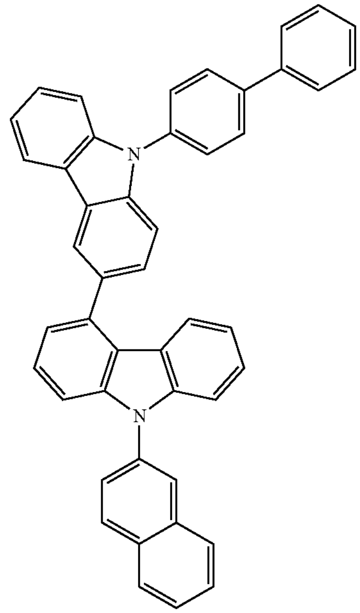
,
X-55
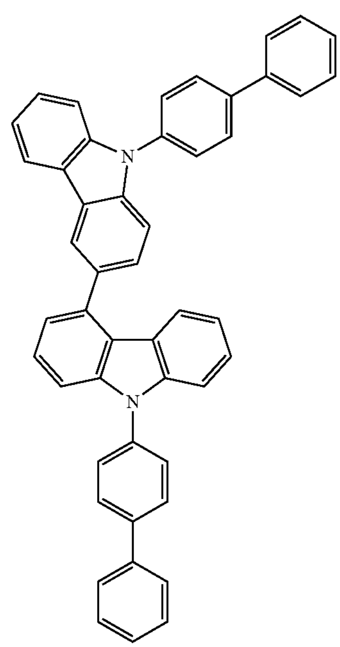
,
-continued
X-56
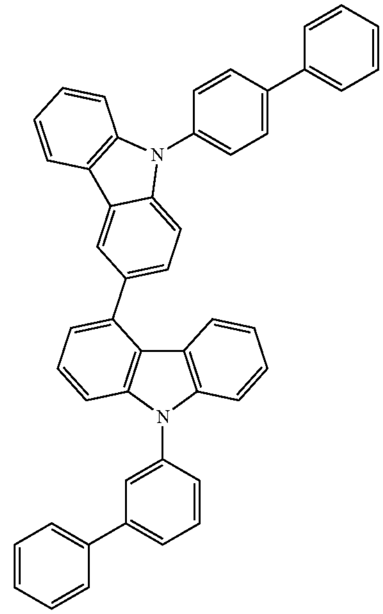
,
X-57
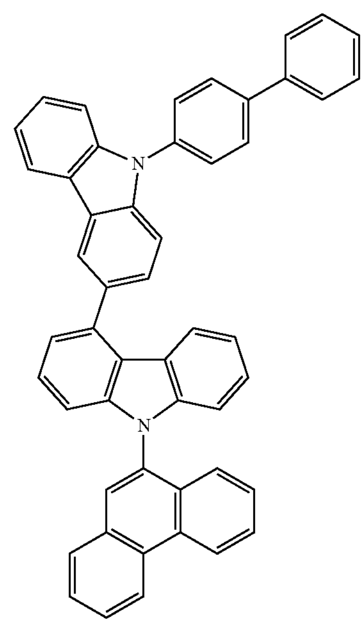
, -continued
X-58
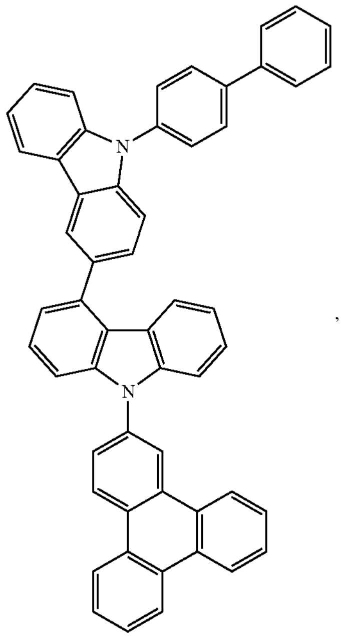
,
X-59
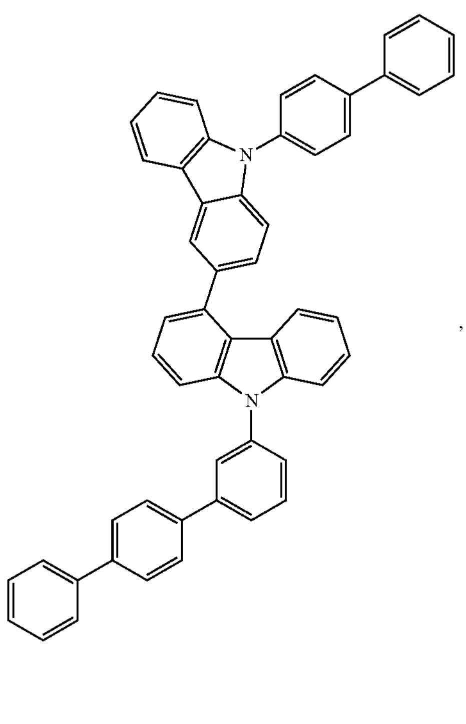
,
-continued
X-60
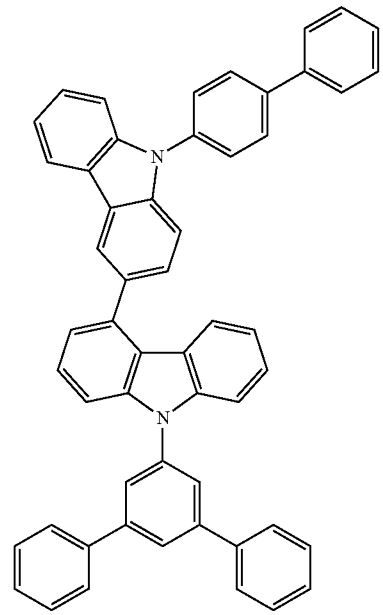
,
X-61
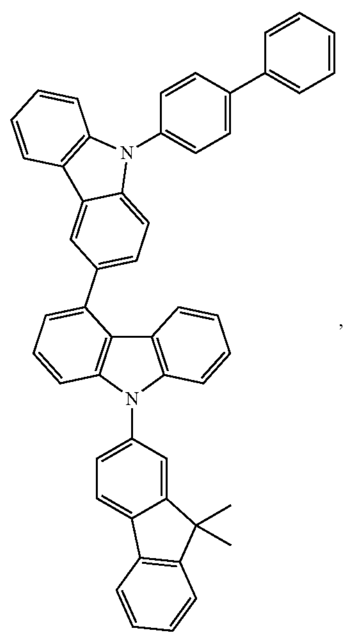
, -continued
X-62
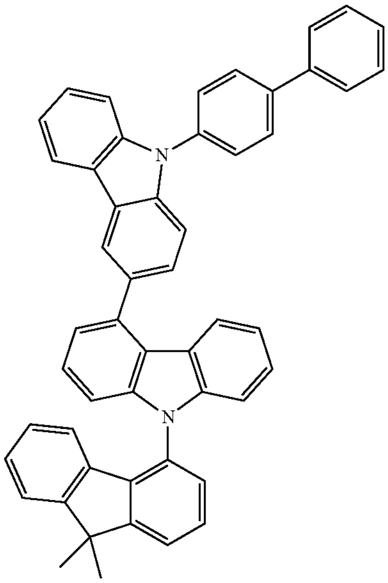
,
X-63
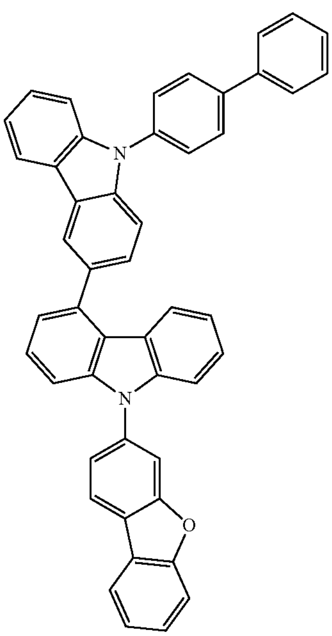
,
-continued
X-64
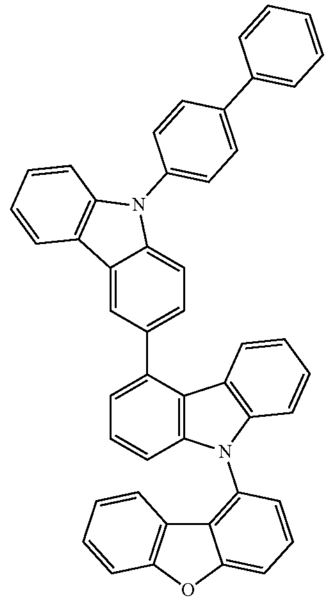
,
X-65
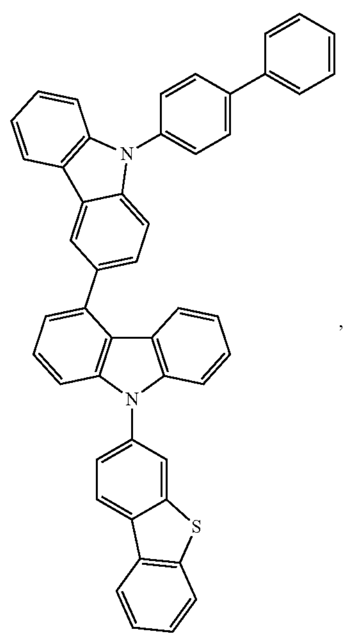
, X-66
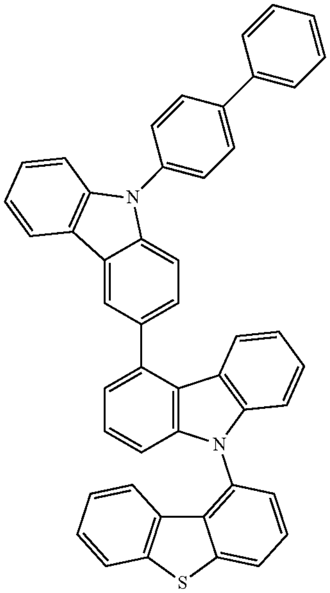
,
X-67
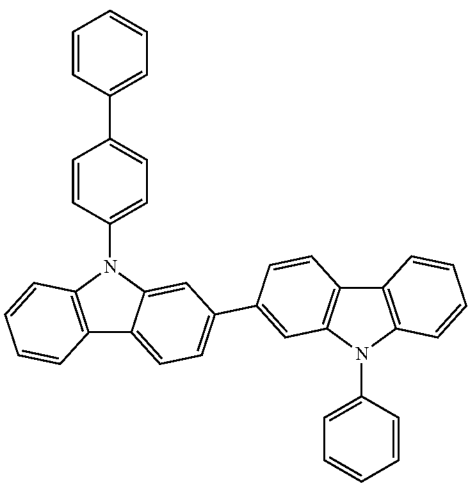
,
X-68
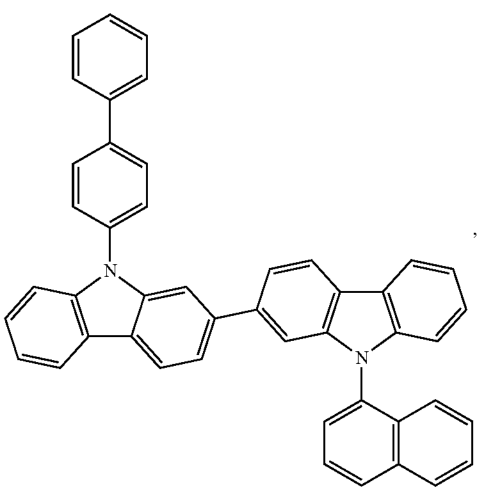
,
X-69
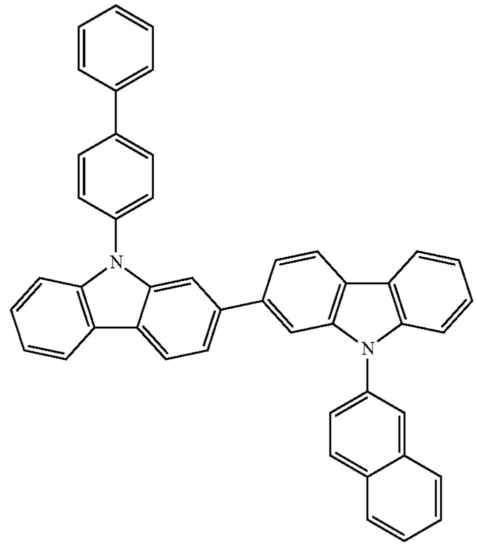
,
X-70
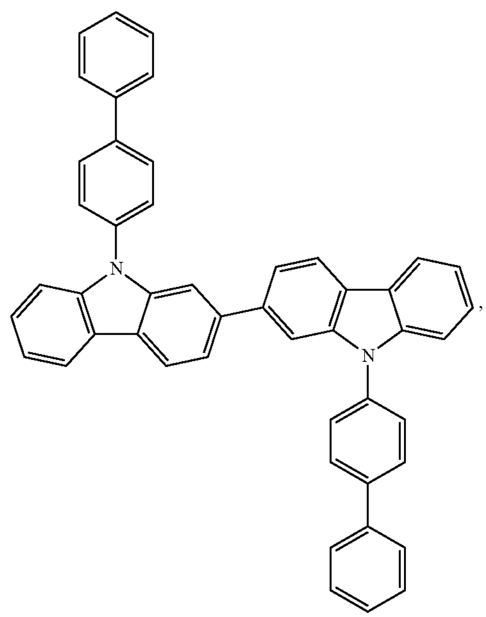
, -continued
X-71
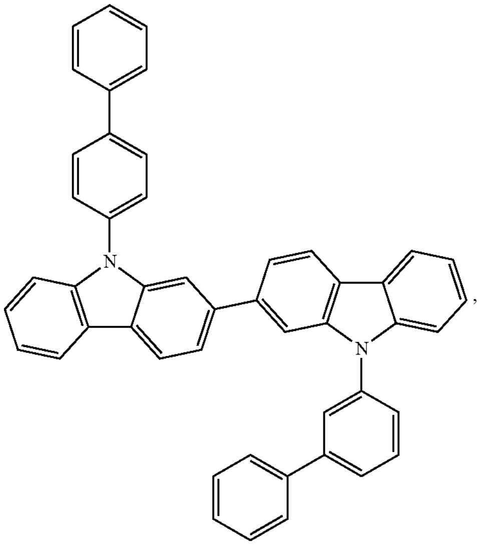
,
X-72
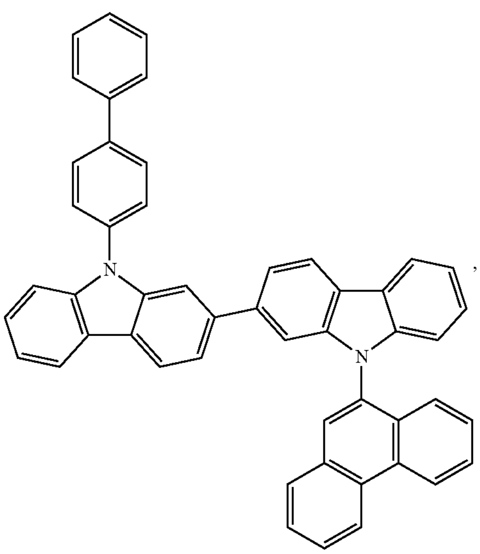
,
-continued
X-73
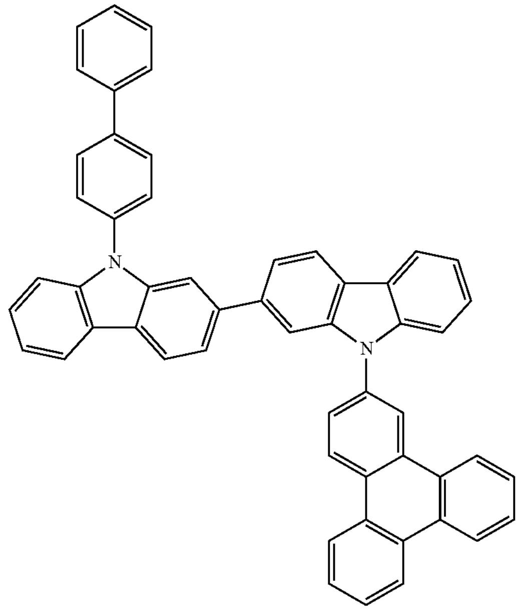
,
X-74
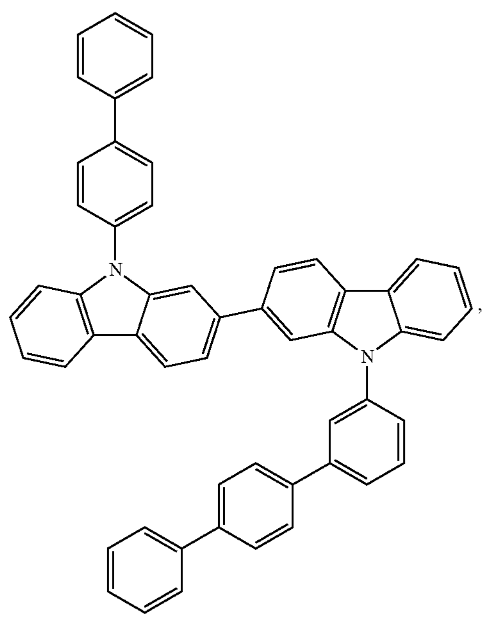
, -continued
X-75
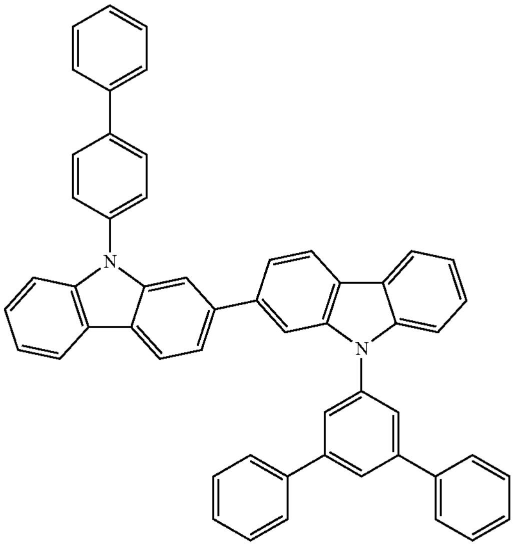
,
X-76
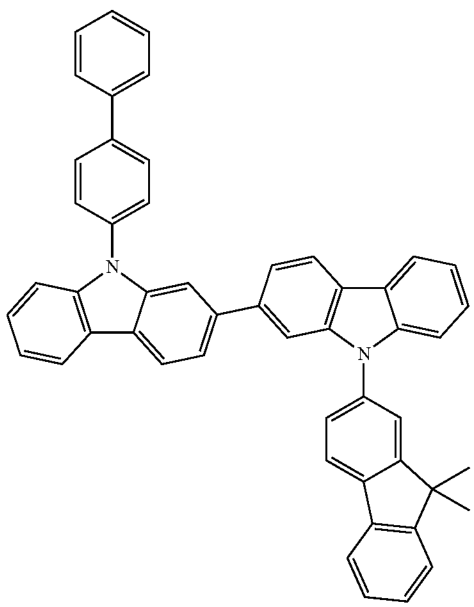
,
X-77
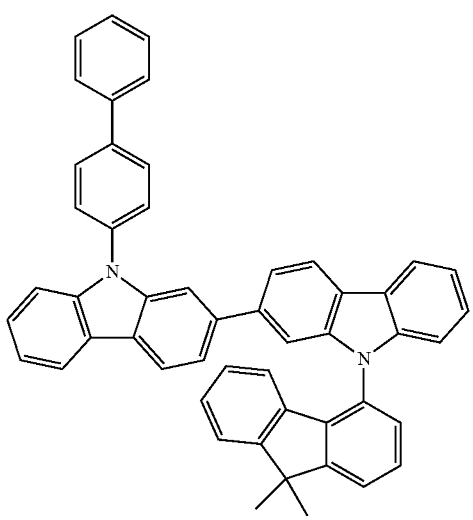
,
-continued
X-78
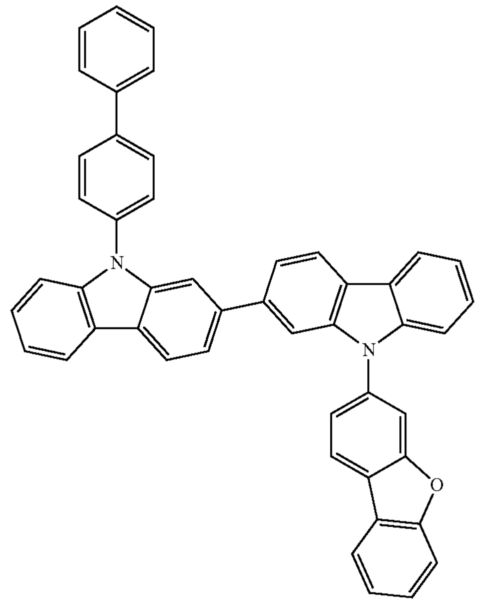
,
X-79
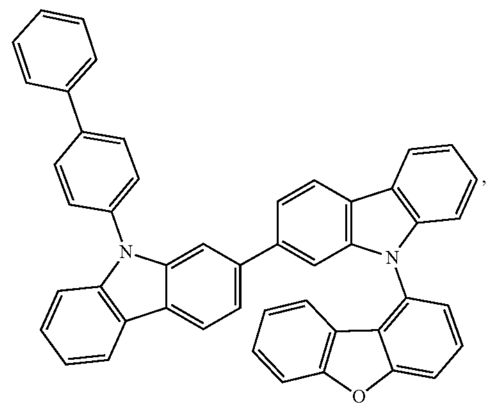
,
X-80
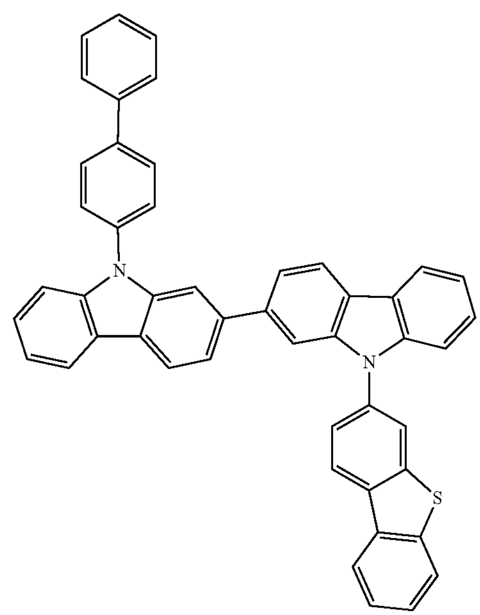
, -continued
X-81
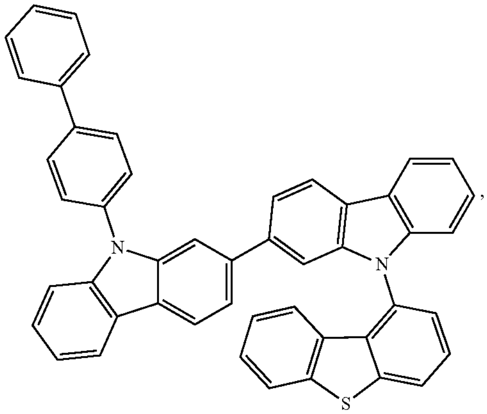
,
X-82
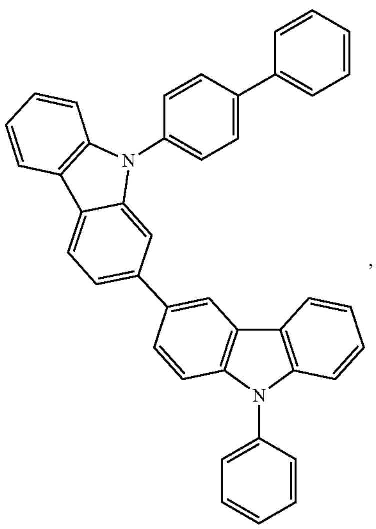
,
X-83
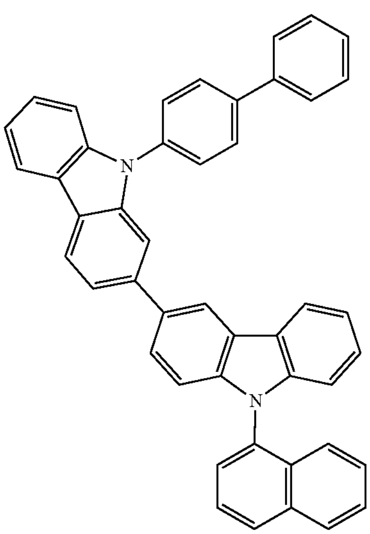
,
-continued
X-84
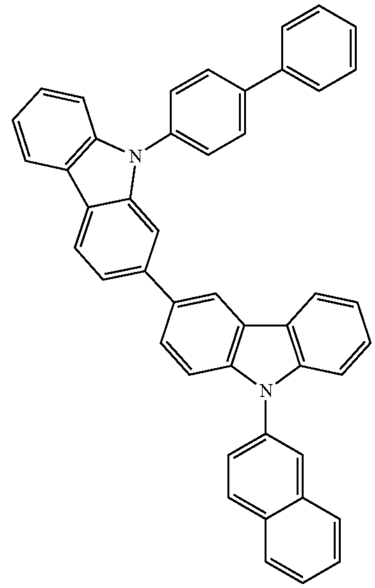
,
X-85
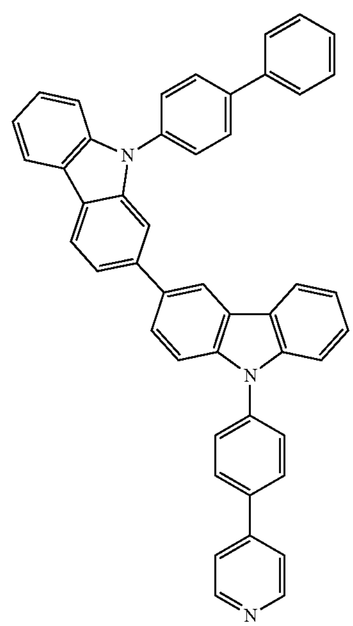
, -continued
X-86
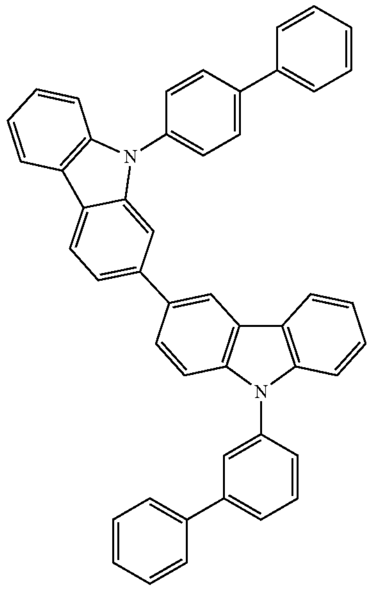
,
X-87
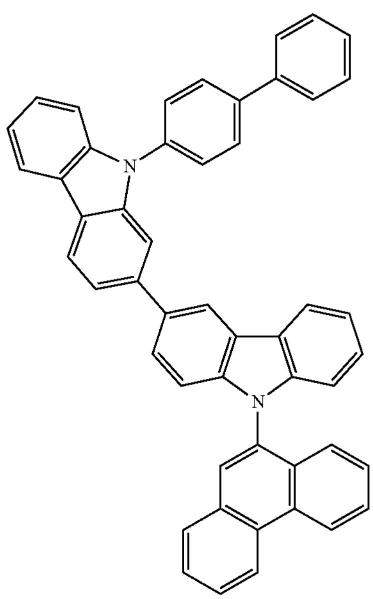
,
-continued
X-88
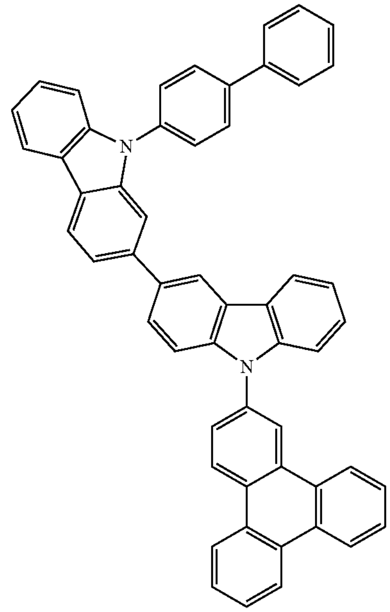
,
X-89
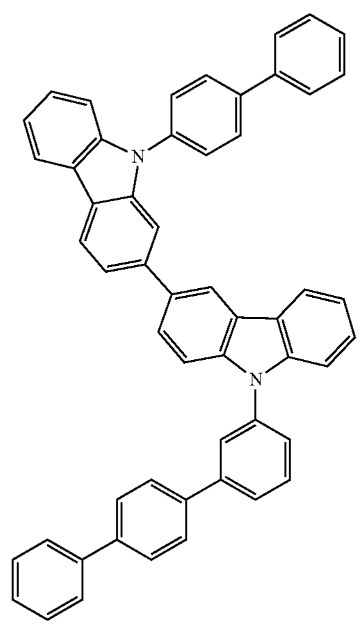
, -continued
X-90
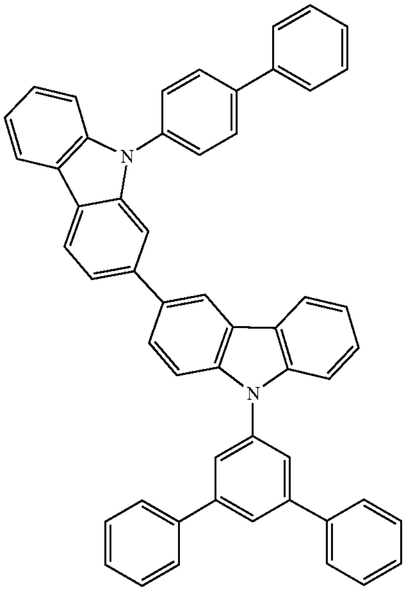
,
X-91
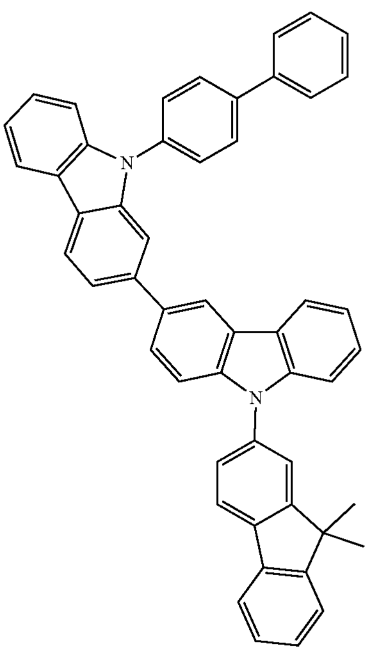
,
-continued
X-92
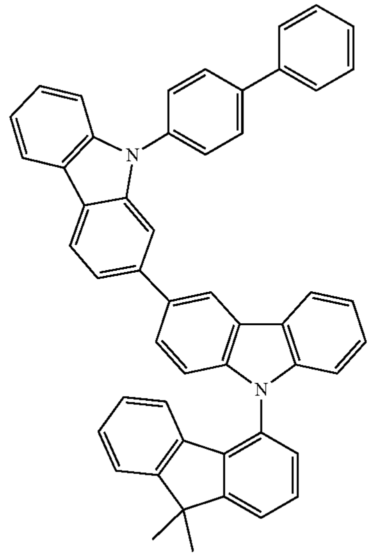
,
X-93
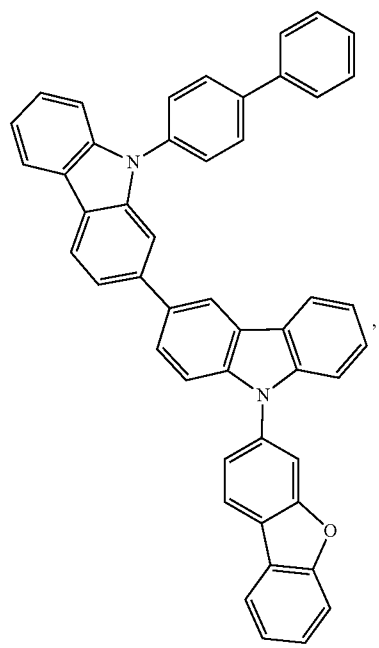
, -continued
X-94
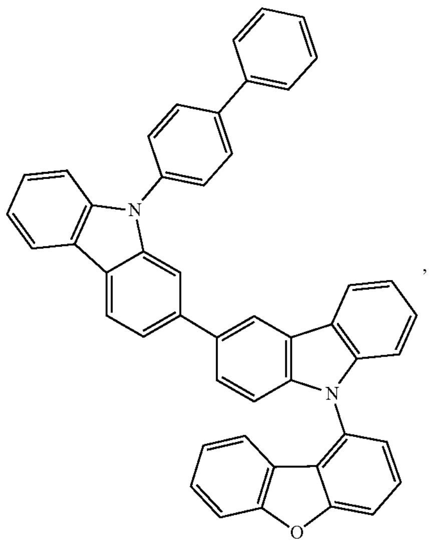
X-95
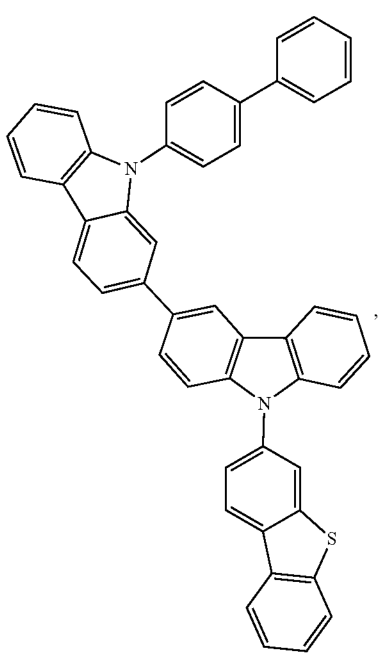
-continued
X-96
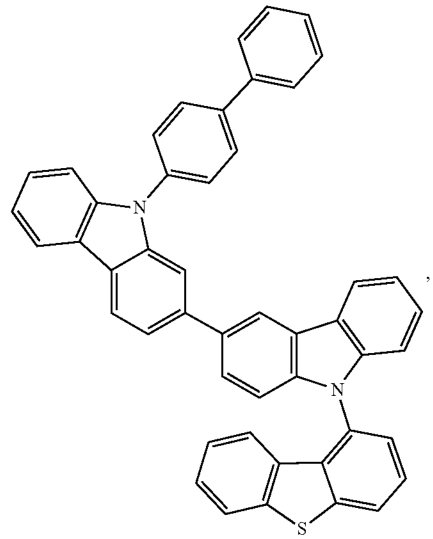
X-97
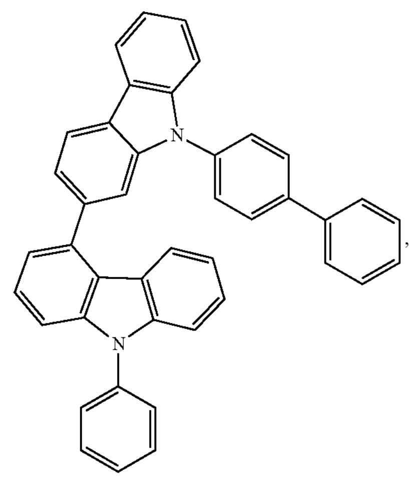
X-98
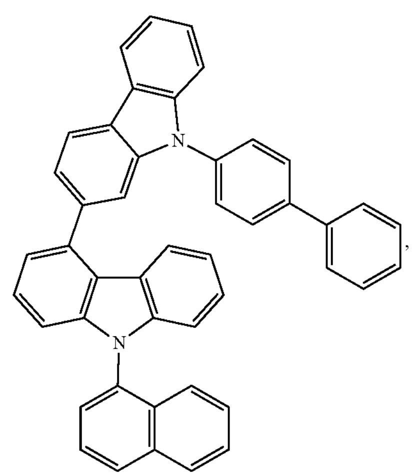

-continued
X-99
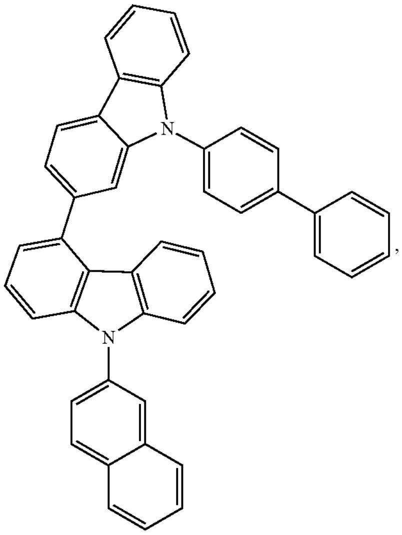
X-100
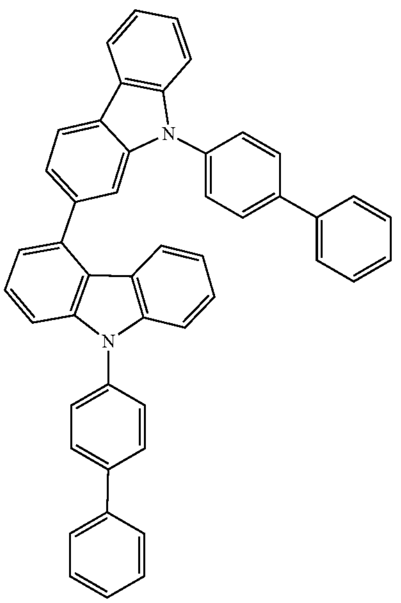
X-101
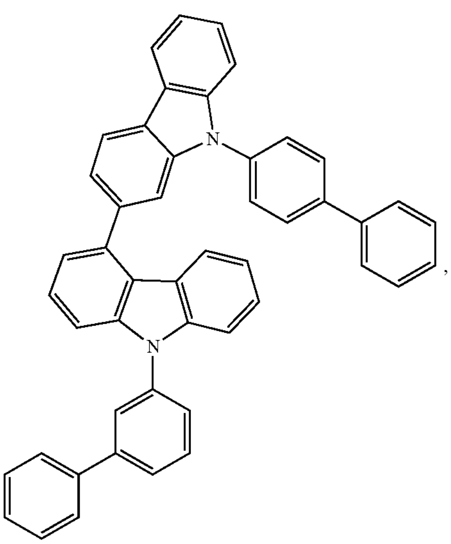
-continued
X-102
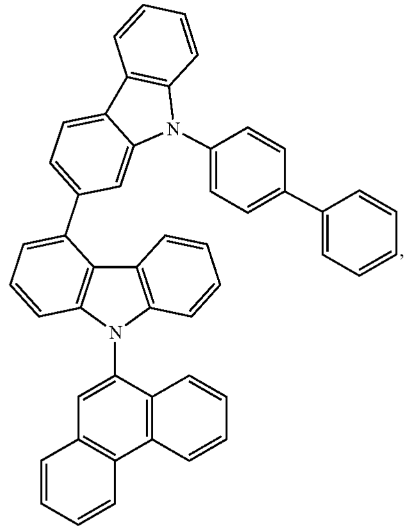
X-103
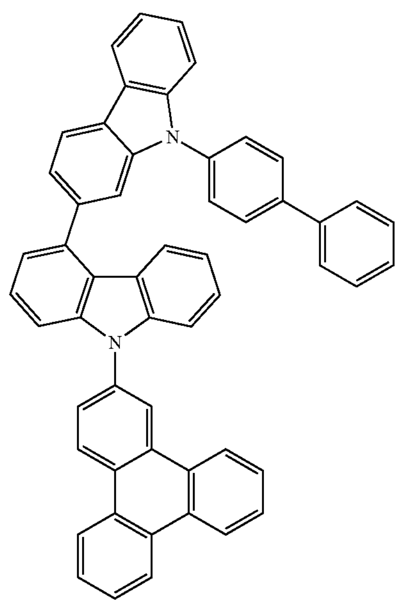

-continued
X-104
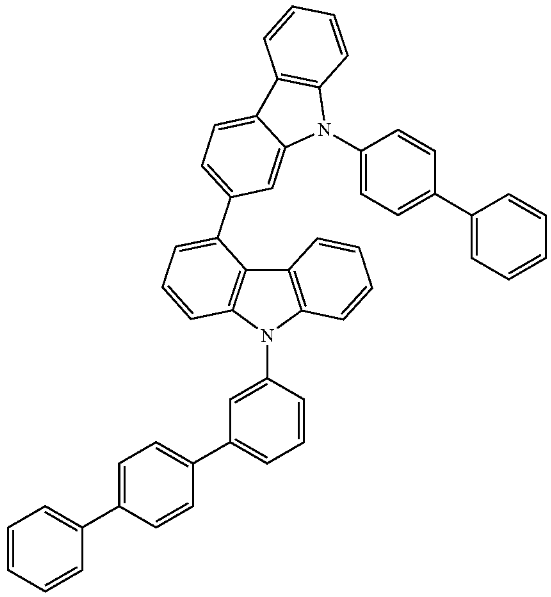
,
X-105
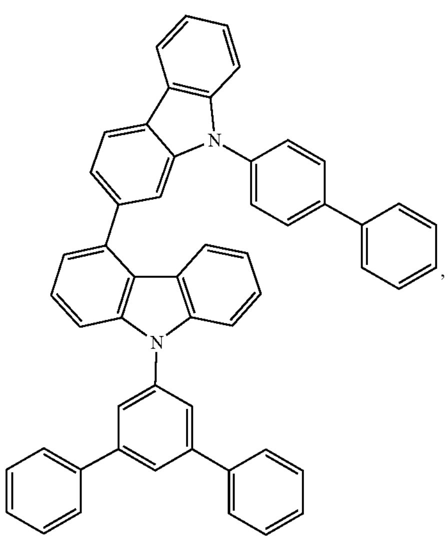
,
-continued
X-106
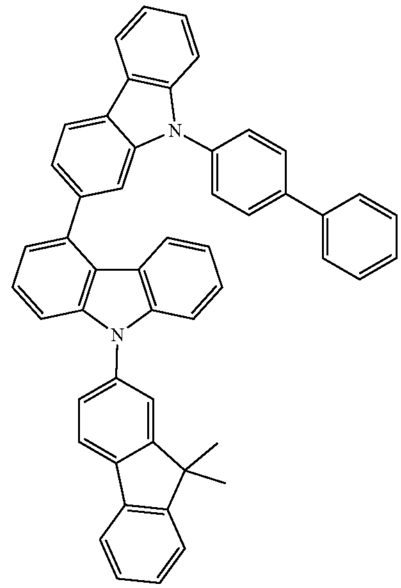
,
X-107
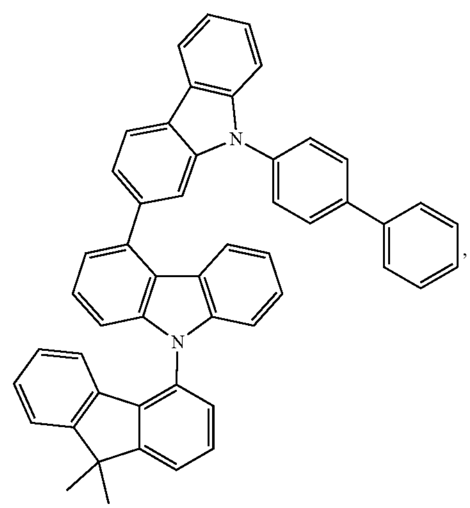
, -continued
X-108
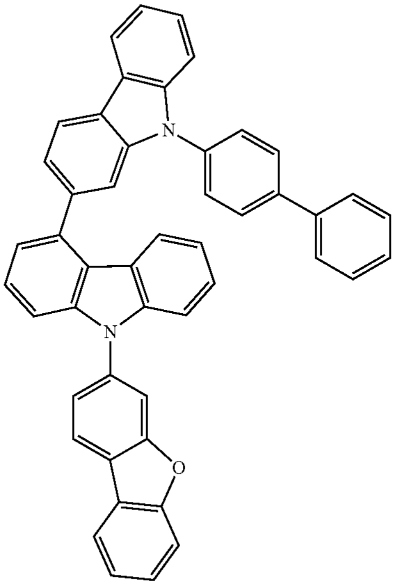
,
X-109
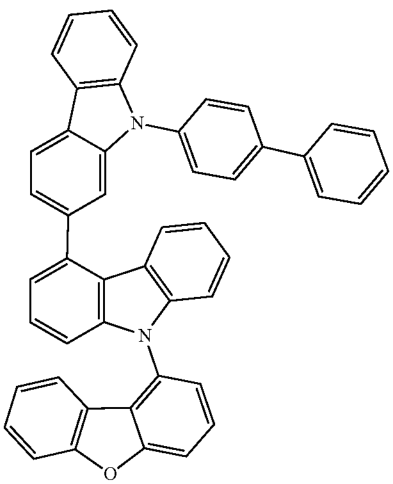
,
X-110
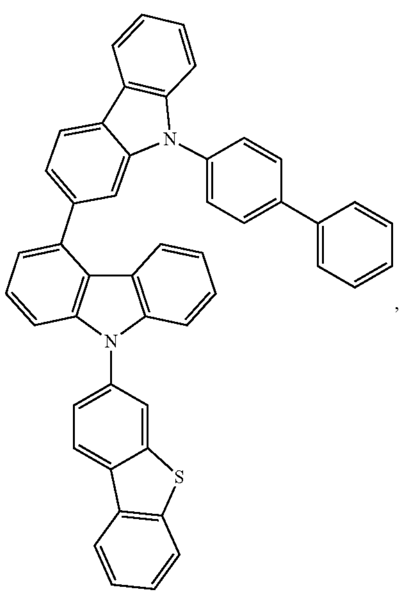
,
-continued
X-111
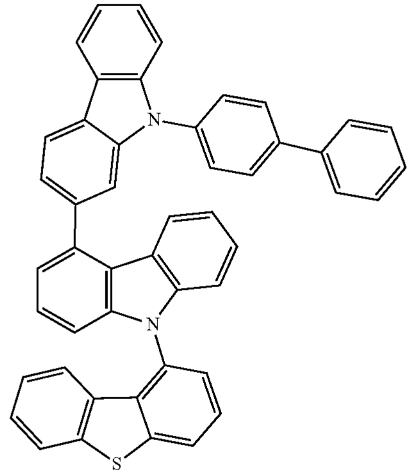
,
X-112
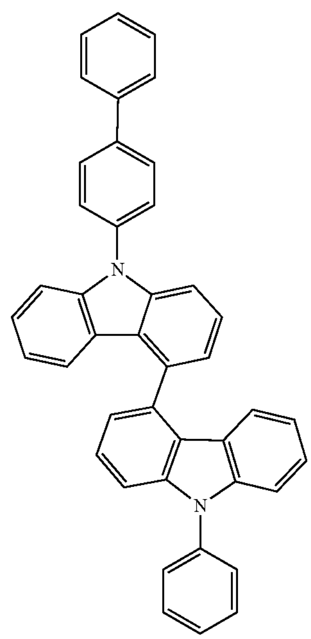
, -continued
X-113
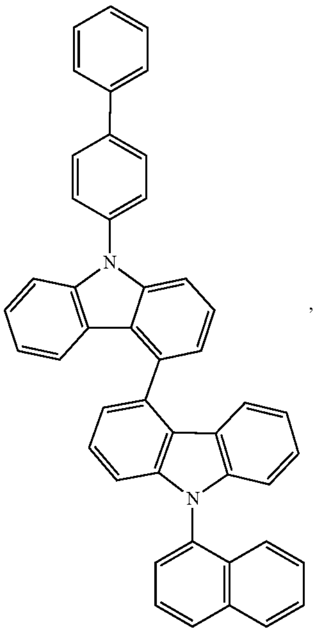
,
X-114
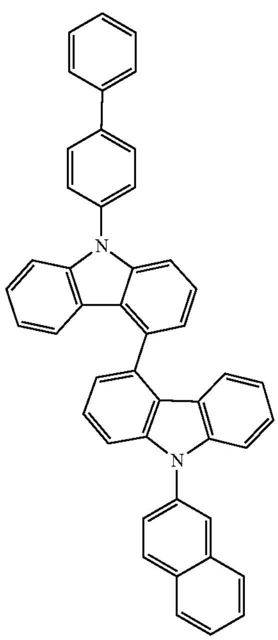
,
-continued
X-115
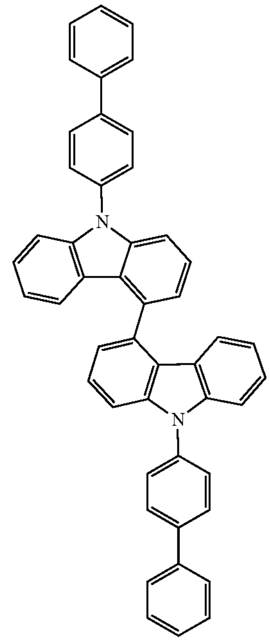
,
X-116
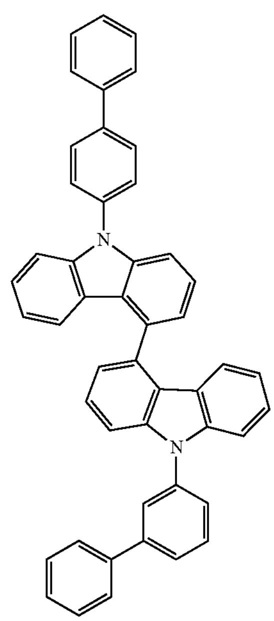
, -continued
X-117
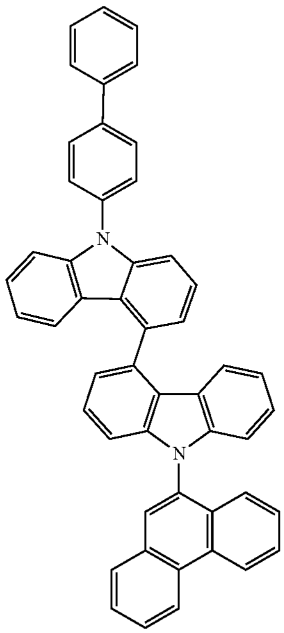
,
X-118
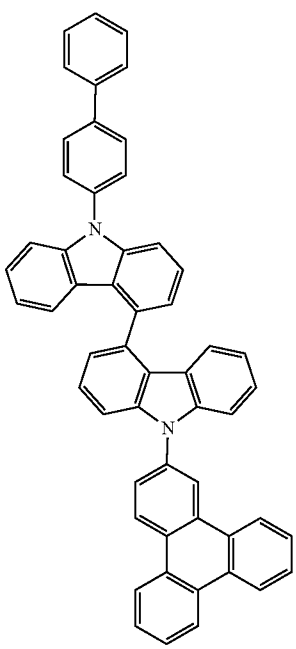
,
-continued
X-119
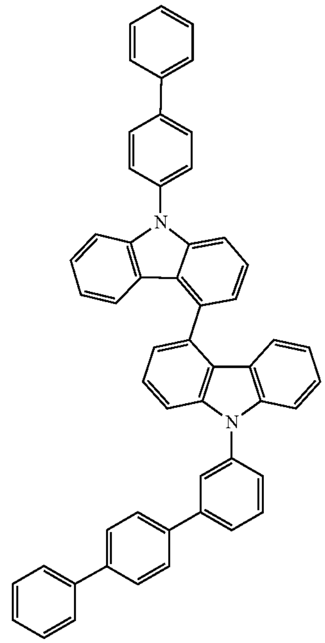
,
X-120
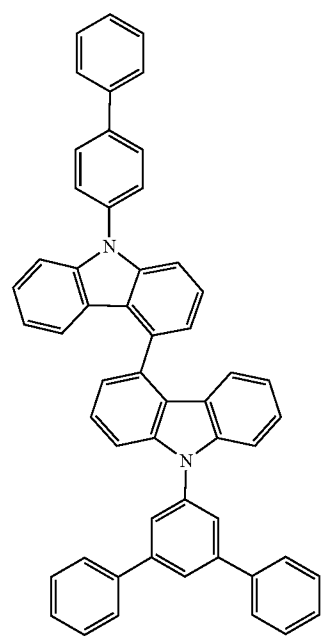
, -continued
X-121
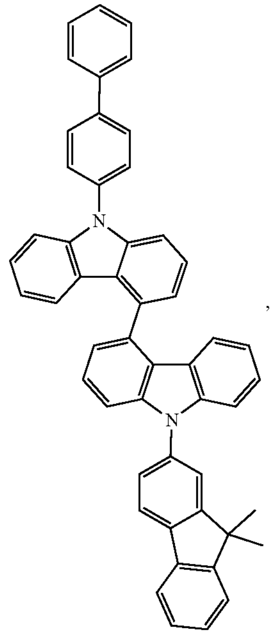
,
X-122
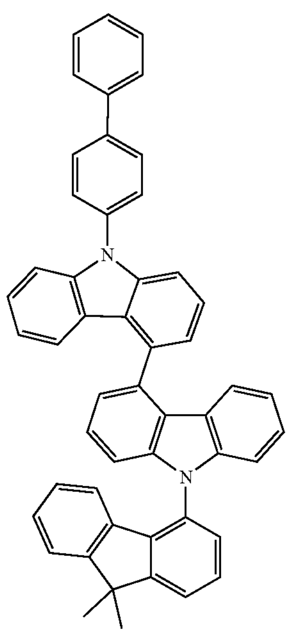
,
-continued
X-123
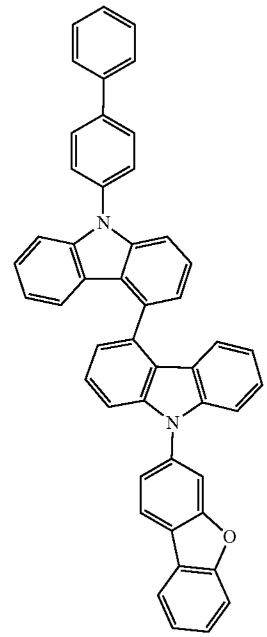
,
X-124
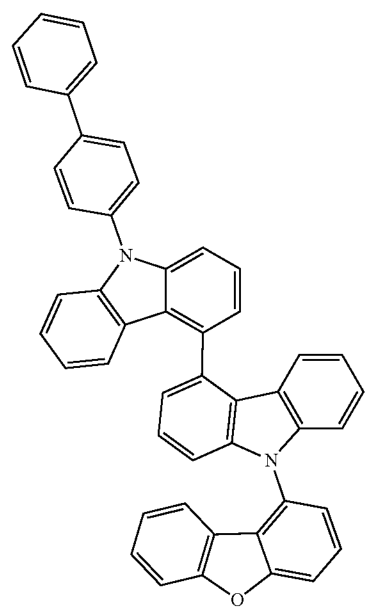
, -continued
X-125
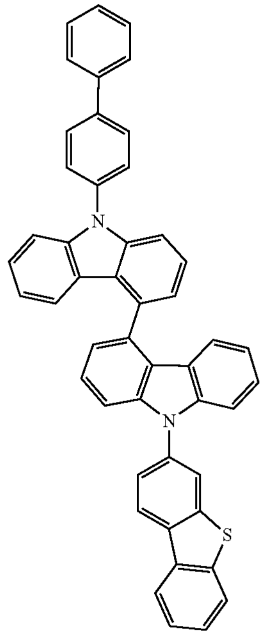
,
X-126
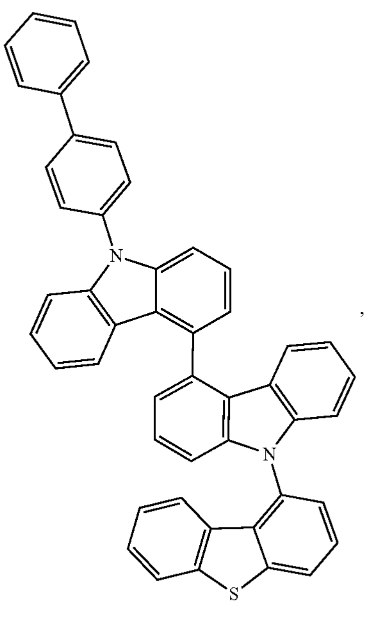
,
-continued
X-127
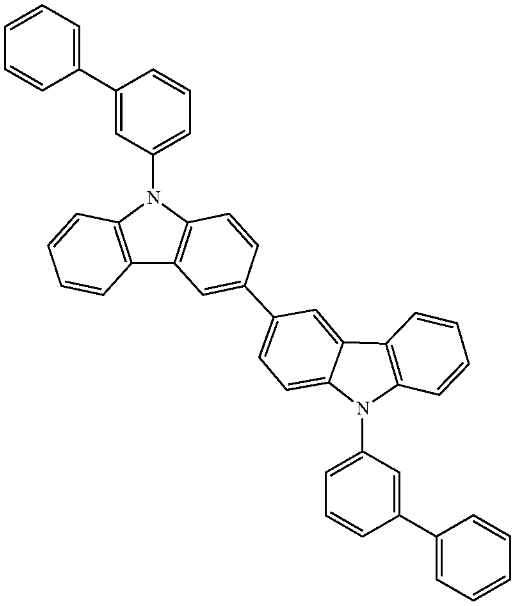
,
X-128
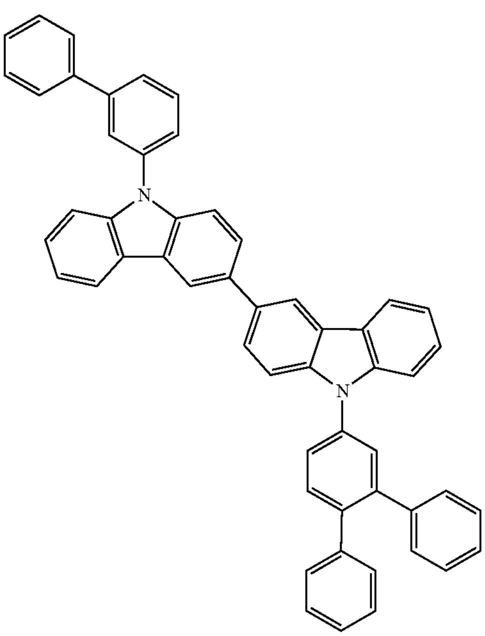
, -continued
X-129
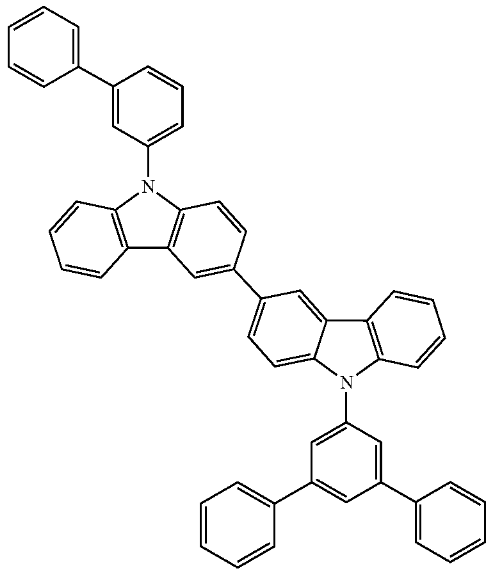
,
X-130
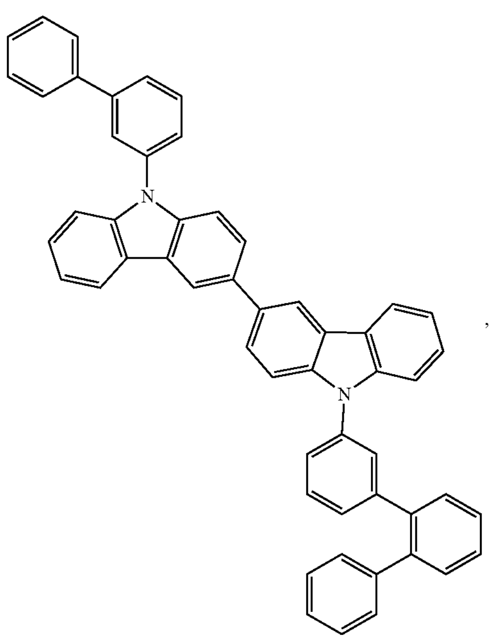
,
-continued
X-131
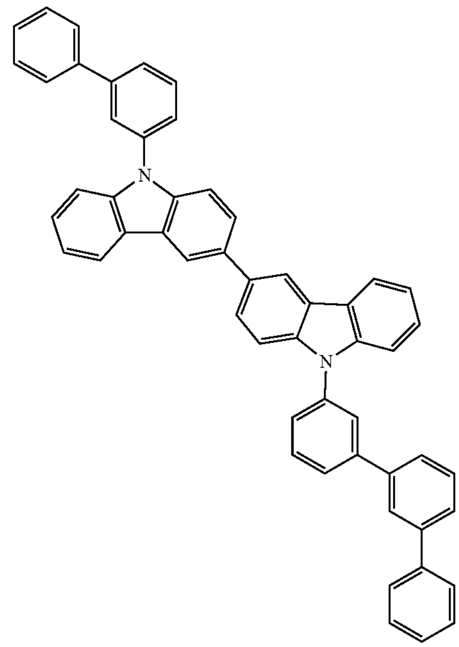
,
X-132
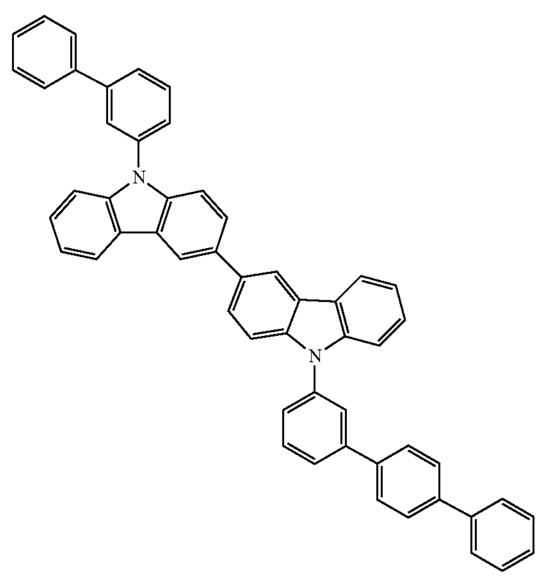
, -continued
X-133
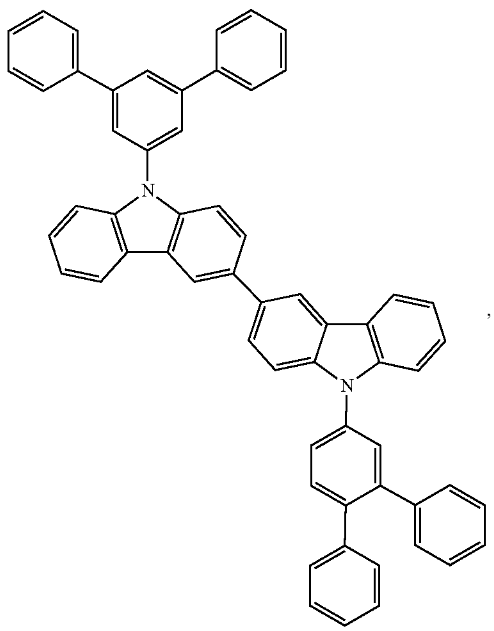
,
X-134
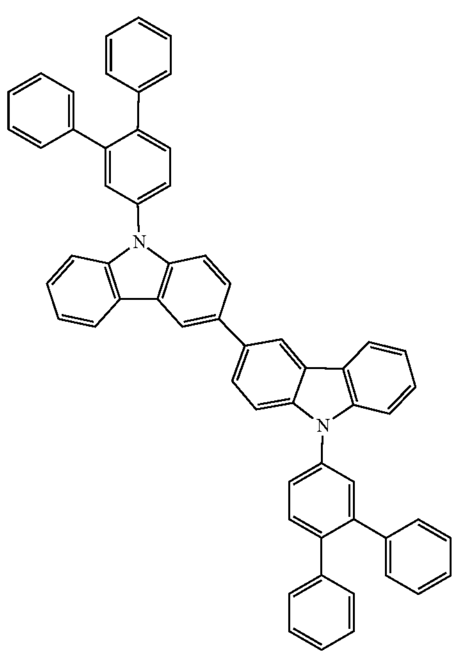
,
-continued
X-135
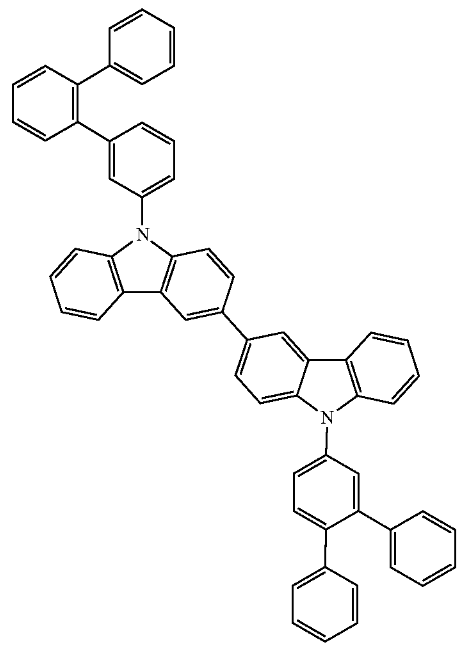
,
X-136
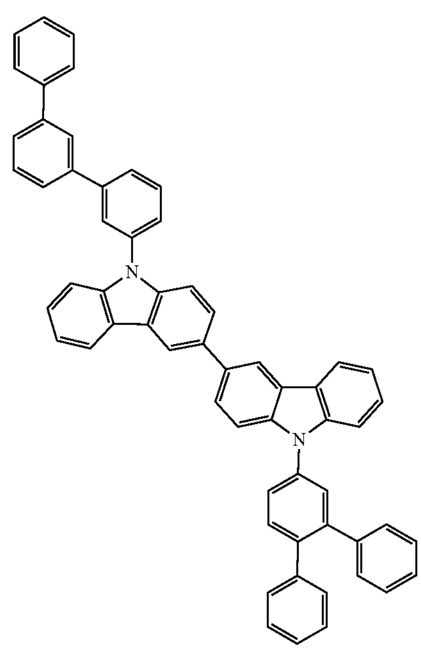
, -continued
X-137
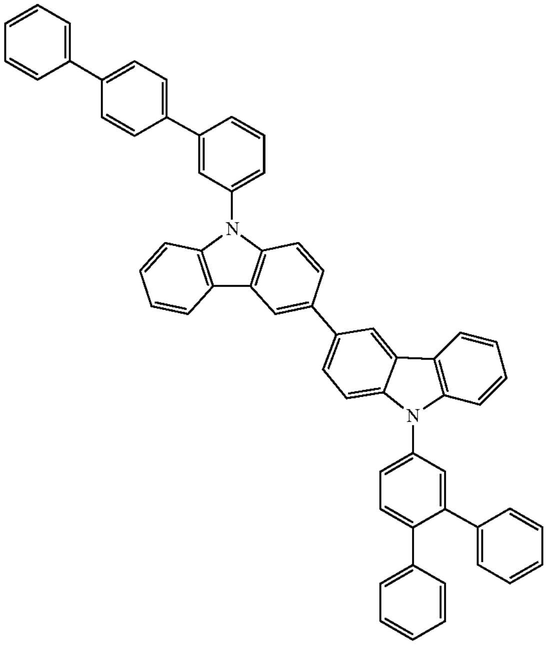
,
X-138
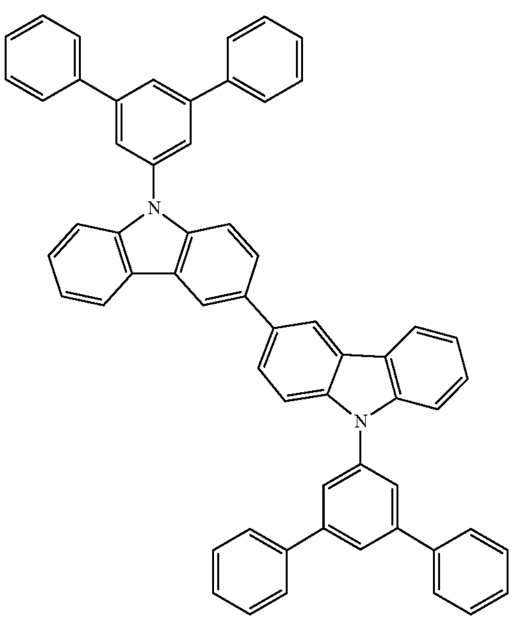
,
-continued
X-139
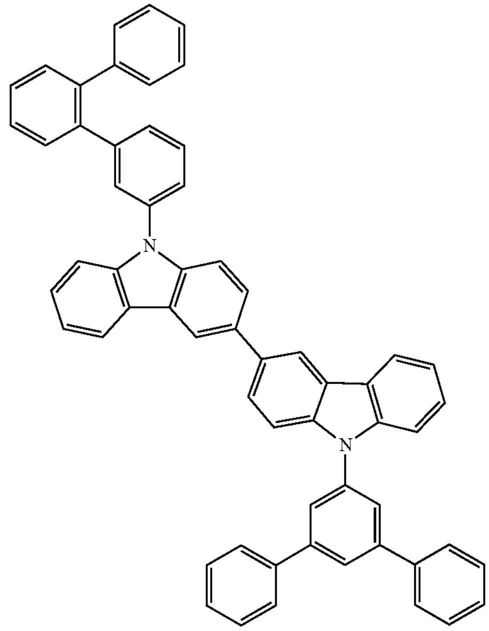
,
X-140
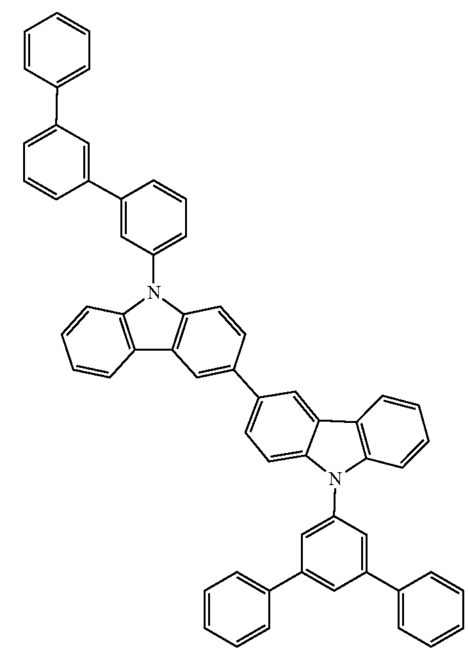
, -continued
X-141
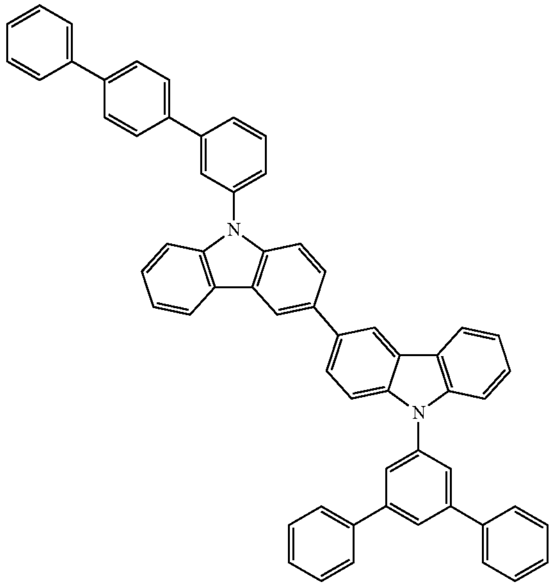
,
X-142
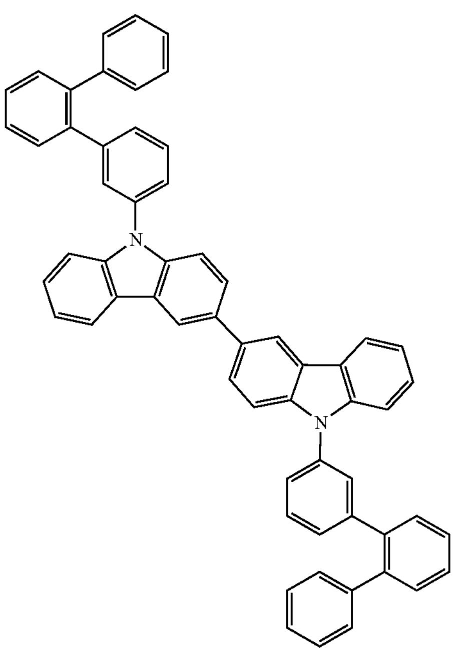
,
-continued
X-143
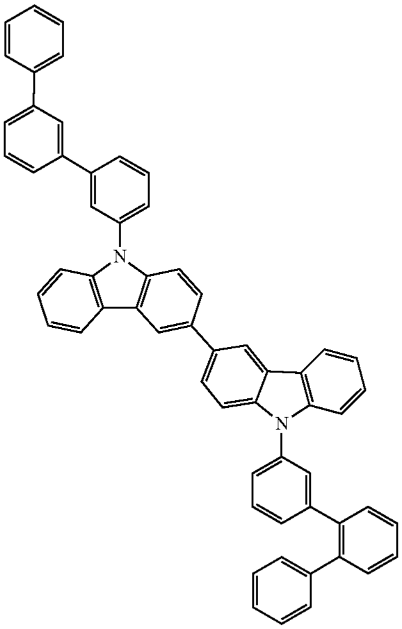
,
X-144
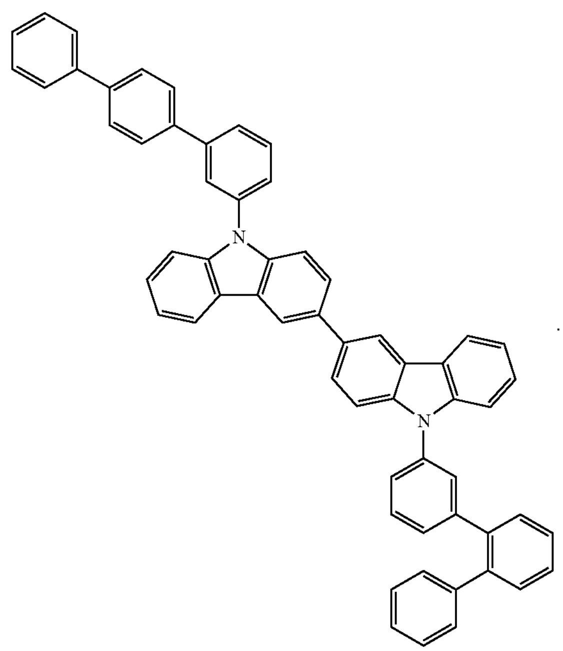
.
32. The electroluminescent device according to claim 20, wherein the second host compound has a structure represented by any one of Formula X-a to Formula X-j:

-continued
X-a
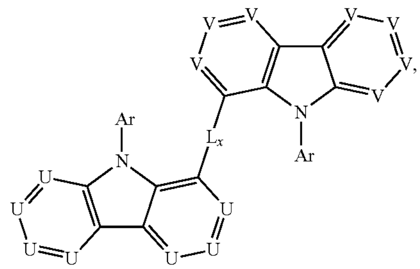
X-b
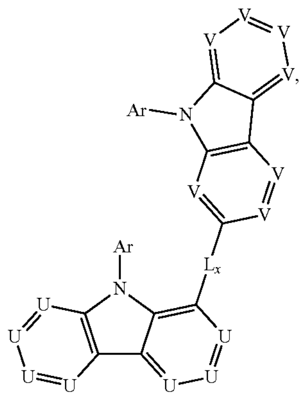
X-c
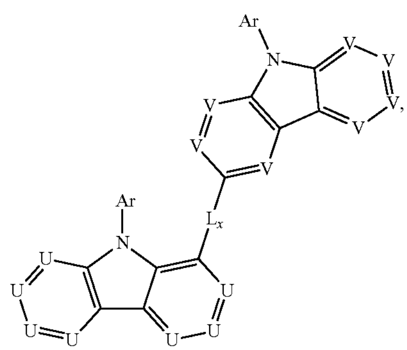
X-d
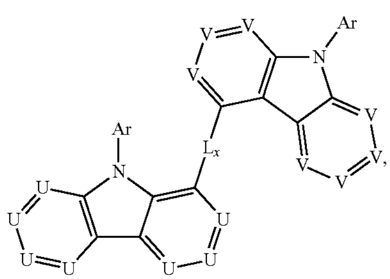
X-e
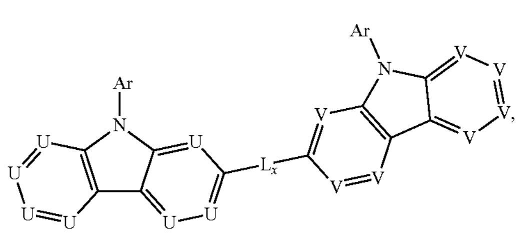
X-f
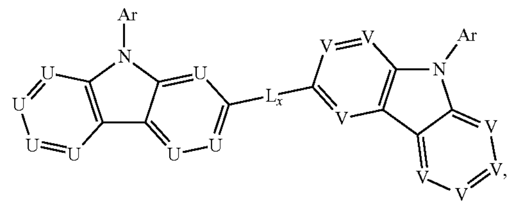
X-g
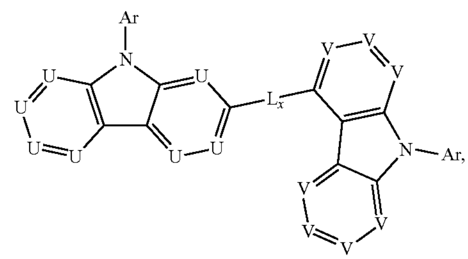
X-h
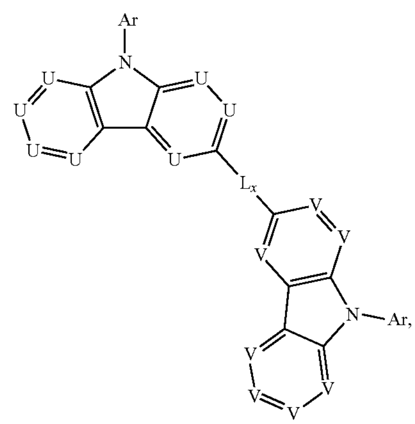
X-i
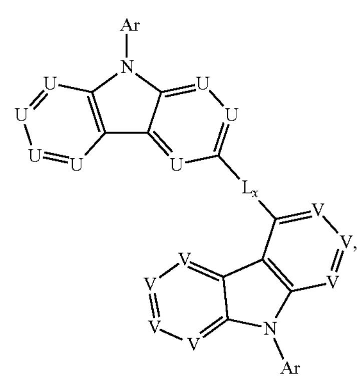

-continued
X-j
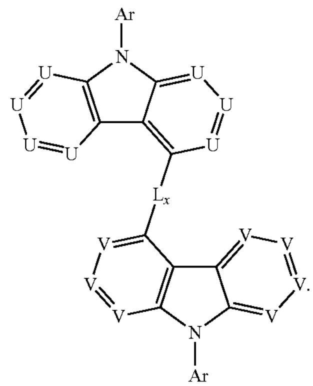
* * * * *